(12) United States Patent
Nakano et al.

(10) Patent No.: US 12,171,107 B2
(45) Date of Patent: Dec. 17, 2024

(54) IMAGING ELEMENT, STACKED IMAGING ELEMENT AND SOLID-STATE IMAGING DEVICE, AND METHOD OF MANUFACTURING IMAGING ELEMENT

(71) Applicant: Sony Group Corporation, Tokyo (JP)

(72) Inventors: Hiroshi Nakano, Tokyo (JP); Toshiki Moriwaki, Tokyo (JP)

(73) Assignee: Sony Group Corporation, Tokyo (JP)

( * ) Notice: Subject to any disclaimer, the term of this patent is extended or adjusted under 35 U.S.C. 154(b) by 582 days.

(21) Appl. No.: 17/614,084

(22) PCT Filed: Apr. 30, 2020

(86) PCT No.: PCT/JP2020/018226
§ 371 (c)(1),
(2) Date: Nov. 24, 2021

(87) PCT Pub. No.: WO2020/241169
PCT Pub. Date: Dec. 3, 2020

(65) Prior Publication Data
US 2022/0231085 A1  Jul. 21, 2022

(30) Foreign Application Priority Data

May 24, 2019  (JP) .................. 2019-097458

(51) Int. Cl.
H10K 39/32  (2023.01)
(52) U.S. Cl.
CPC ................... H10K 39/32 (2023.02)
(58) Field of Classification Search
None
See application file for complete search history.

(56) References Cited

U.S. PATENT DOCUMENTS 9,793,324 B2 * 10/2017 Joei ................... H10K 39/32
2007/0194400 A1 * 8/2007 Yokoyama ........ H01L 27/14601
257/E31.022

(Continued)

FOREIGN PATENT DOCUMENTS

DE  112019003868 T5  4/2021
EP      3783653 A1  2/2021
(Continued)

OTHER PUBLICATIONS

International Search Report in Application No. PCT/JP2020/018226, mailed Jul. 21, 2020.

(Continued)

*Primary Examiner* — Bilkis Jahan
(74) *Attorney, Agent, or Firm* — K&L Gates LLP

(57) ABSTRACT

An imaging element of the present disclosure includes a photoelectric conversion section including a first electrode 21, a photoelectric conversion layer 23A including an organic material, and a second electrode 22 that are stacked; an inorganic semiconductor material layer 23B is formed between the first electrode 21 and the photoelectric conversion layer 23A; and a value $\Delta EN$ (= $EN_{anion} - EN_{cation}$) is less than 1.695, and preferably 1.624 or less, which results from subtracting an average value $EN_{cation}$ of electronegativities of cationic species included in the inorganic semiconductor material layer from an average value $EN_{anion}$ of electronegativities of anionic species included in the inorganic semiconductor material layer 23B.

17 Claims, 80 Drawing Sheets

(56) References Cited

U.S. PATENT DOCUMENTS

| | | | |
|---|---|---|---|
| 2011/0156104 A1 | 6/2011 | Yamaguchi | |
| 2016/0037098 A1 | 2/2016 | Lee | |
| 2017/0162807 A1* | 6/2017 | Moriwaki | H10K 71/16 |
| 2018/0277604 A1* | 9/2018 | Joei | H04N 25/70 |
| 2018/0350881 A1* | 12/2018 | Nakayama | H10K 19/20 |
| 2020/0119078 A1 | 4/2020 | Moriwaki et al. | |
| 2020/0212108 A1 | 7/2020 | Bando et al. | |
| 2020/0258923 A1 | 8/2020 | Ono et al. | |
| 2020/0295219 A1 | 9/2020 | Moriwaki et al. | |
| 2021/0126040 A1 | 4/2021 | Moriwaki | |
| 2021/0167234 A1 | 6/2021 | Nakano et al. | |

FOREIGN PATENT DOCUMENTS

| | | |
|---|---|---|
| EP | 3783654 A1 | 2/2021 |
| JP | 2006165527 A | 6/2006 |
| JP | 2011138927 A | 7/2011 |
| JP | 2016063165 A | 4/2016 |
| JP | 2017108101 A | 6/2017 |
| WO | WO-2017150540 A1 | 9/2017 |
| WO | 2018194051 A1 | 10/2018 |
| WO | 2019035252 A1 | 2/2019 |
| WO | 2019035254 A1 | 2/2019 |
| WO | 2019035270 A1 | 2/2019 |
| WO | 2019203085 A1 | 10/2019 |
| WO | 2019203268 A1 | 10/2019 |

OTHER PUBLICATIONS

Aoi T et al: "DC sputter deposition of amorphous indiumgalliumzincoxide (a-IGZO) films with H"20 introduction", Thin Solid Films, Elsevier, Amsterdam, NL, vol. 518, No. 11, Mar. 31, 2010 (Mar. 31, 2010), pp. 3004-3007, XP026939331, ISSN: 0040-6090, DOI: 10.1016/J.TSF.2009.09.176.

Hsu Chao-Ming et al: "Investigation of the High Mobility IGZO Thin Films by Using Co-Sputtering Method", Materials, vol. 8, No. 5, May 21, 2015 (May 21, 2015), pp. 2769-2781, XP55936104, DOI: 10.3390/ma8052769.

Jiang Qingjun et al: "Amorphous ZnAlSnO thin-film transistors by a combustion solution process for future displays", Applied Physics Letters, American Institute of Physics, 2 Huntington Quadrangle, Melville, NY 11747, vol. 106, No. 5, Feb. 2, 2015 (Feb. 2, 2015), XP012194211, ISSN: 0003-6951, DOI: 10.1063/1.4906999.

Kikuchi Y et al: "Device characteristics improvement of a-InGaZnO TFTs by low-temperature annealing", Thin Solid Films, Elsevier, vol. 518, No. 11, Mar. 31, 2010 (Mar. 31, 2010), 3017-3021, XP026939334, ISSN: 0040-6090, DOI: 10.1016/J.TSF.2009.10.132.

Niu Jian-Wen et al: "Effects of parameters on the performance of amorphous IGZO thin films prepared by RF magnetron sputtering", Optoelectronics Letters, Springer, Germany, vol. 10, No. 5, Aug. 30, 2014 (Aug. 30, 2014), pp. 347-351, XP035377515, ISSN: 1673-1905, DOI: 10.1007/S11801-014-4125-4.

Park Won-Tae et al: "Facile Routes To Improve Performance of Solution-Processed Amorphous Metal Oxide Thin Film Transistors by Water Vapor Annealing", Applied Materials & Interfaces, vol. 7, No. 24, Jun. 12, 2015 (Jun. 12, 2015), pp. 13289-13294, XP055936243.

Satoh K et al: "Electrical and optical properties of Al-doped Zn0-Sn0"2 thin films deposited by RF magnetron sputtering", Thin Solid Films, Elsevier, Amsterdam, NL, vol. 516, No. 17, Jul. 1, 2008 (Jul. 1, 2008), pp. 5814-5817, XP022688400, ISSN: 0040-6090, DOI: 10.1016/J.TSF.2007.10.055.

* cited by examiner

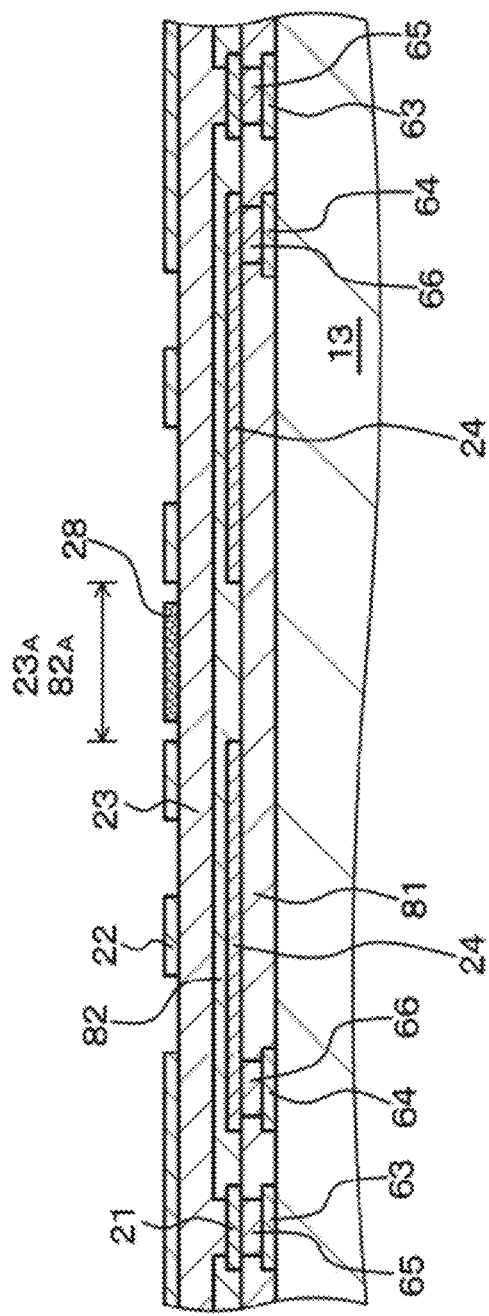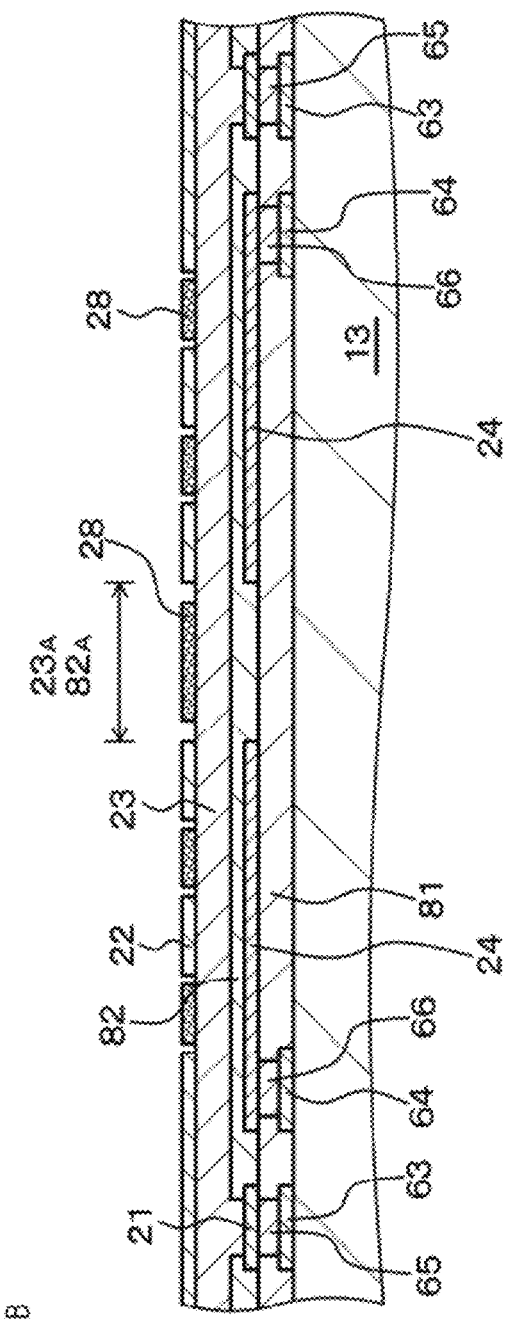
FIG. 46A
FIG. 46B

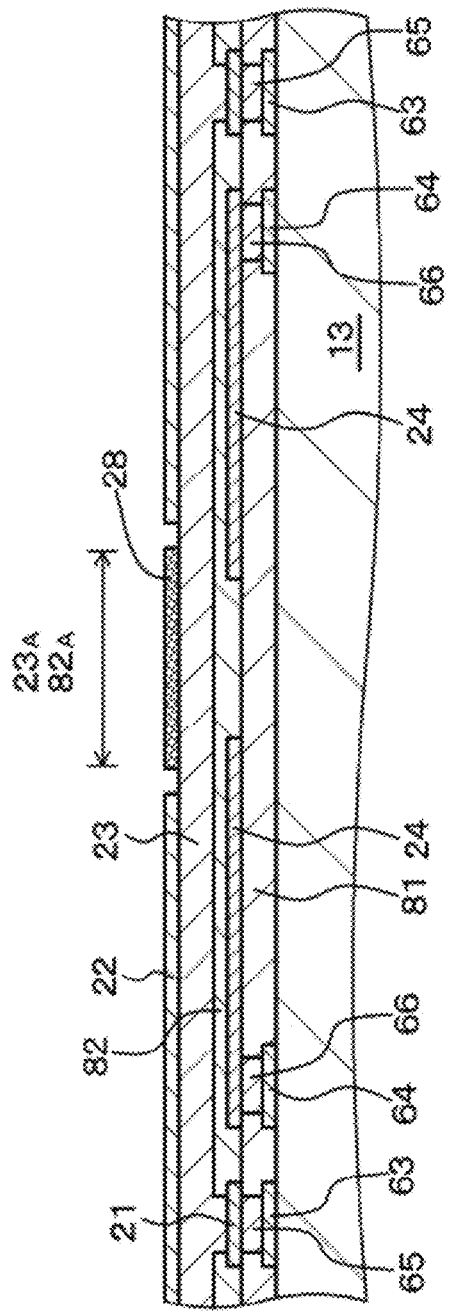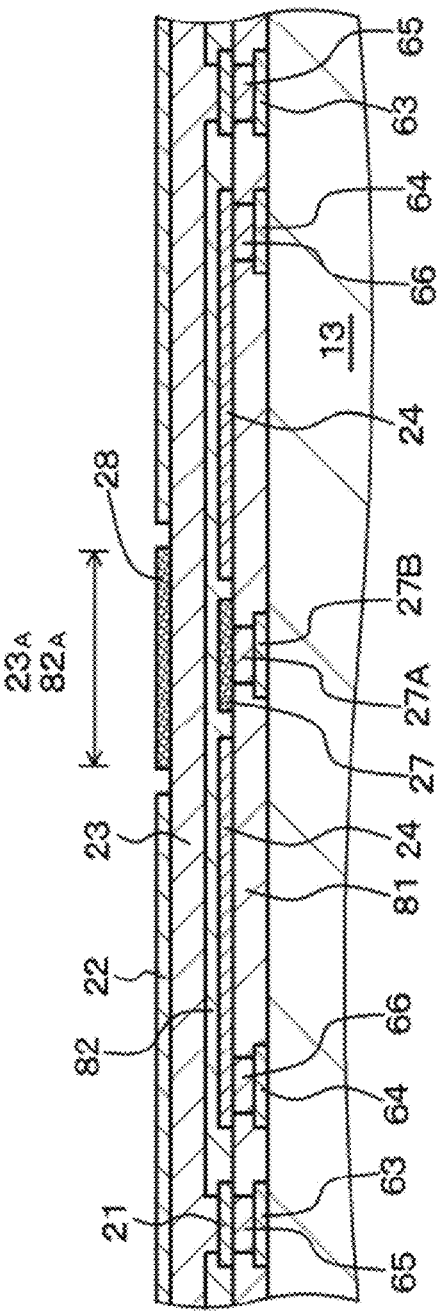

IMAGING ELEMENT, STACKED IMAGING ELEMENT AND SOLID-STATE IMAGING DEVICE, AND METHOD OF MANUFACTURING IMAGING ELEMENT

TECHNICAL FIELD

The present disclosure relates to an imaging element, a stacked imaging element and a solid-state imaging device, and to a method of manufacturing the imaging element.

BACKGROUND ART

In recent years, a stacked imaging element is drawing attention as an imaging element configuring an image sensor or the like. The stacked imaging element has a structure in which a photoelectric conversion layer (light receiving layer) is sandwiched between two electrodes. In addition, it is necessary that the stacked imaging element have a structure for accumulating and transferring signal charge generated in the photoelectric conversion layer on the basis of photoelectric conversion. In a currently available structure, it is necessary to provide a structure in which the signal charge is accumulated in and transferred to a FD (Floating Drain) electrode, and it is necessary to achieve such fast transfer as to avoid delay of the signal charge.

An imaging element (photoelectric conversion element) for solving such an issue is disclosed in, for example, Japanese Unexamined Patent Application Publication No. 2016-063165.

The imaging element in which an organic semiconductor material is used for a photoelectric conversion layer is able to perform photoelectric conversion of a specific color (wavelength band). Having such a characteristic, in the case where the imaging element is used as an imaging element in a solid-state imaging device, it is possible to obtain a structure including stacked subpixels (stacked imaging element) that is difficult to obtain with an existing solid-state imaging device. In the structure, a combination of an on-chip color filter layer (OCCF) and an imaging element constitutes a subpixel, and the subpixels are arranged in a two-dimensional pattern (see, for example, Japanese Unexamined Patent Application Publication No. 2011-138927). Furthermore, because a demosaic treatment is unnecessary, the imaging element has an advantage of not generating false colors. In the following description, in some cases, an imaging element including a photoelectric conversion section provided on or above a semiconductor substrate is referred to as an "imaging element of a first type" for the sake of convenience; the photoelectric conversion section included in the imaging element of the first type is referred to as a "photoelectric conversion section of the first type" for the sake of convenience; an imaging element provided in the semiconductor substrate is referred to as an "imaging element of a second type" for the sake of convenience; and a photoelectric conversion section included in the imaging element of the second type is referred to as a "photoelectric conversion section of the second type" for the sake of convenience.

Meanwhile, Japanese Unexamined Patent Application Publication No. 2006-165527 discloses an invention of a field-effect transistor, in which an amorphous oxide applicable to an active layer of the field-effect transistor is described. In addition, in paragraph number [0146] of this patent publication, there is a description "It is possible to add an element constituting at least one complex oxide, from among a Group 2 element M2 (M2 denotes Mg or Ca) having a smaller atomic number than that of Zn, a Group 3 element M3 (M3 denotes B, Al, Ga, or Y) having a smaller atomic number than that of In, a Group 4 element M4 (M4 denotes Si, Ge, or Zr) having a smaller atomic number than that of Sn, a Group 5 element M5 (M5 denotes V, Nb, or Ta), Lu, and W." In paragraph numbers [0147] and [0148], there is a description "This makes it possible to further stabilize the amorphous film at room temperature. In addition, it is possible to expand a composition range in which the amorphous film is obtained. In particular, the addition of B, Si, or Ge having a strong covalent bonding property is effective for stabilization of the amorphous phase, and a complex oxide containing ions having a large difference in ionic radii has stabilized amorphous phase."

CITATION LIST

Patent Literature

PTL 1: Japanese Unexamined Patent Application Publication No. 2016-063165
PTL 2: Japanese Unexamined Patent Application Publication No. 2011-138927
PTL 3: Japanese Unexamined Patent Application Publication No. 2006-165527

SUMMARY OF THE INVENTION

Problem to be Solved by the Invention

The technique disclosed in Japanese Unexamined Patent Application Publication No. 2006-165527 is a technique for further stabilizing the amorphous film at room temperature, and is a technique for expanding the composition range in which the amorphous film is obtained; no reference is made to the above-mentioned parameters related to improved transfer or the like of electric charge in a stacked structure of a photoelectric conversion layer including an organic material and an inorganic semiconductor material layer. In addition, Japanese Unexamined Patent Application Publication No. 2006-165527 describes an empirical rule in which addition of dopants B, Si, or Ge having a strong covalent bonding property allows an amorphous phase to appear more easily than a crystalline phase, but does not make any reference to an index $\Delta EN$ in which a covalent bonding property of the entire material is quantified or to a criterion for selecting a dopant.

Therefore, a first object of the present disclosure is to provide an imaging element, a stacked imaging element and a solid-state imaging device which have superior characteristics of transferring electric charge accumulated in a photoelectric conversion layer despite simple configuration and structure. Further, in addition to the first object of the present disclosure, a second object of the present disclosure is to provide a method of manufacturing an imaging element exhibiting superior characteristics even by annealing process at a low temperature.

Means for Solving the Problem

An imaging element of the present disclosure to achieve the above-described first object includes a photoelectric conversion section including a first electrode, a photoelectric conversion layer including an organic material, and a second electrode that are stacked, an inorganic semiconductor material layer is formed between the first electrode and the photoelectric conversion layer, and a value $\Delta EN(=EN_{anion}-EN_{cation})$ is less than 1.695, and preferably 1.624 or less, which results from subtracting an average value $EN_{cation}$ of electronegativities of cationic species included in the inorganic semiconductor material layer from an average value $EN_{anion}$ of electronegativities of anionic species included in the inorganic semiconductor material layer.

A stacked imaging element of the present disclosure to achieve the above-described first object includes at least one of the above-described imaging elements of the present disclosure.

A solid-state imaging device according to the first aspect of the present disclosure to achieve the above-described first object includes a plurality of the above-described imaging elements of the present disclosure. In addition, a solid-state imaging device according to a second aspect of the present disclosure to achieve the above-described first object includes a plurality of the above-described stacked imaging elements of the present disclosure.

A method of manufacturing an imaging element of the present disclosure to achieve the above-described second object includes:

sequentially forming, on an underlayer in which a first electrode is formed, an inorganic semiconductor material layer, a photoelectric conversion layer including an organic material, and a second electrode; and applying an annealing process at 250° C. or less in an atmosphere containing water vapor after the formation of the inorganic semiconductor material layer.

BRIEF DESCRIPTION OF THE DRAWINGS

FIGS. 46A and 46B are schematic cross-sectional views of portions of modification examples of the imaging element of Example 8 (two imaging elements arranged side by side).

FIGS. 47A and 47B are schematic cross-sectional views of portions of modification examples of the imaging element of Example 8 (two imaging elements arranged side by side).

Figure 71:
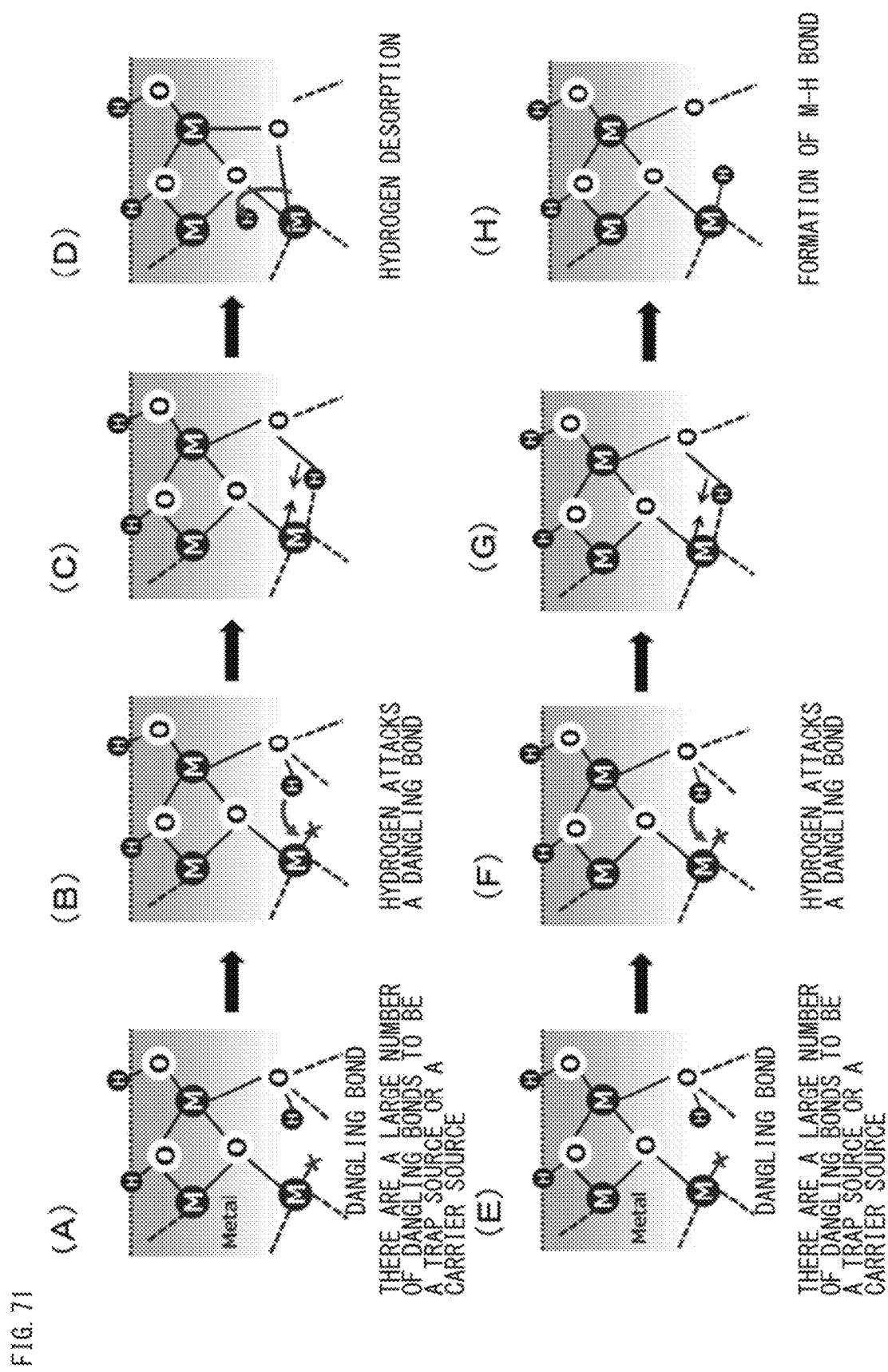

(A), (B), (C) and (D) of FIG. 71 schematically illustrate a state immediately after film formation of an inorganic semiconductor material layer and a state where dangling bonds disappear by applying an annealing process to the inorganic semiconductor material layer in an atmosphere containing water vapor, and (E), (F), (G) and (H) of FIG. 71 schematically illustrate a state immediately after film formation of an inorganic semiconductor material layer and a state where hydrogen is diffused and infiltrated to the inorganic semiconductor material layer in an atmosphere containing water vapor, thus accelerating formation of metal-hydrogen bonds.

Figure 72:
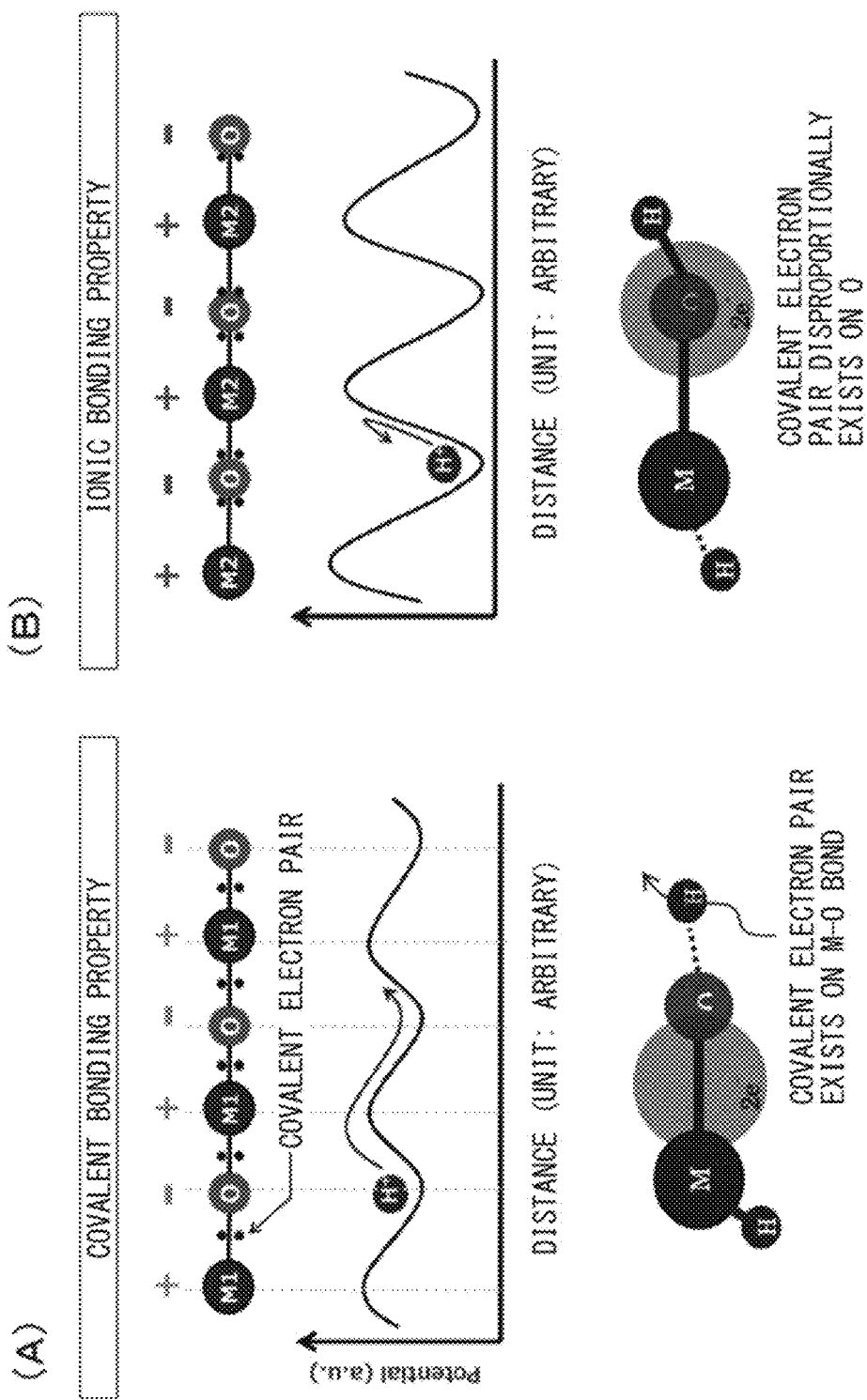

FIG. 72 schematically illustrates electric distributions (electrostatic potentials) of a material having a high covalent bonding property and a material having a high ionic bonding property.

Figure 73:
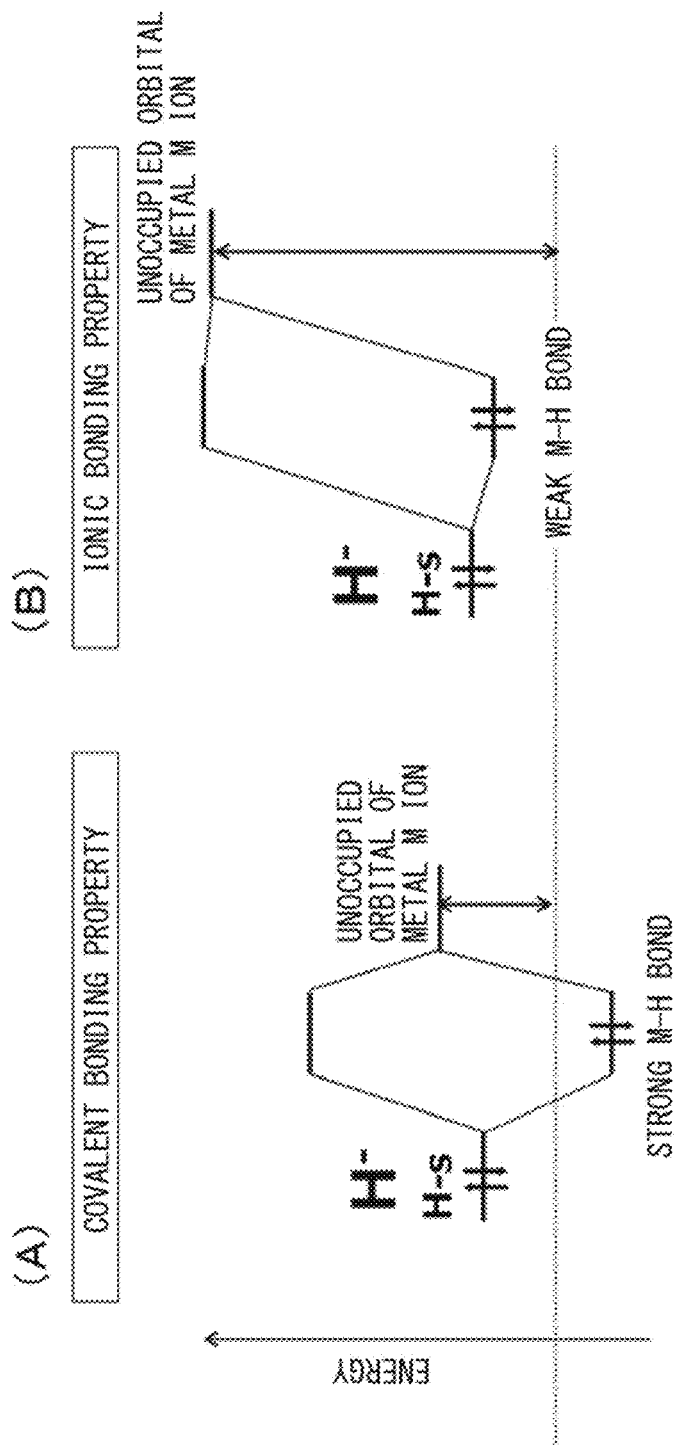

FIG. 73 is a diagram for describing the reason why an element having relatively high electronegativity among metal elements is more likely to generate a hydride ion.

Figure 74:
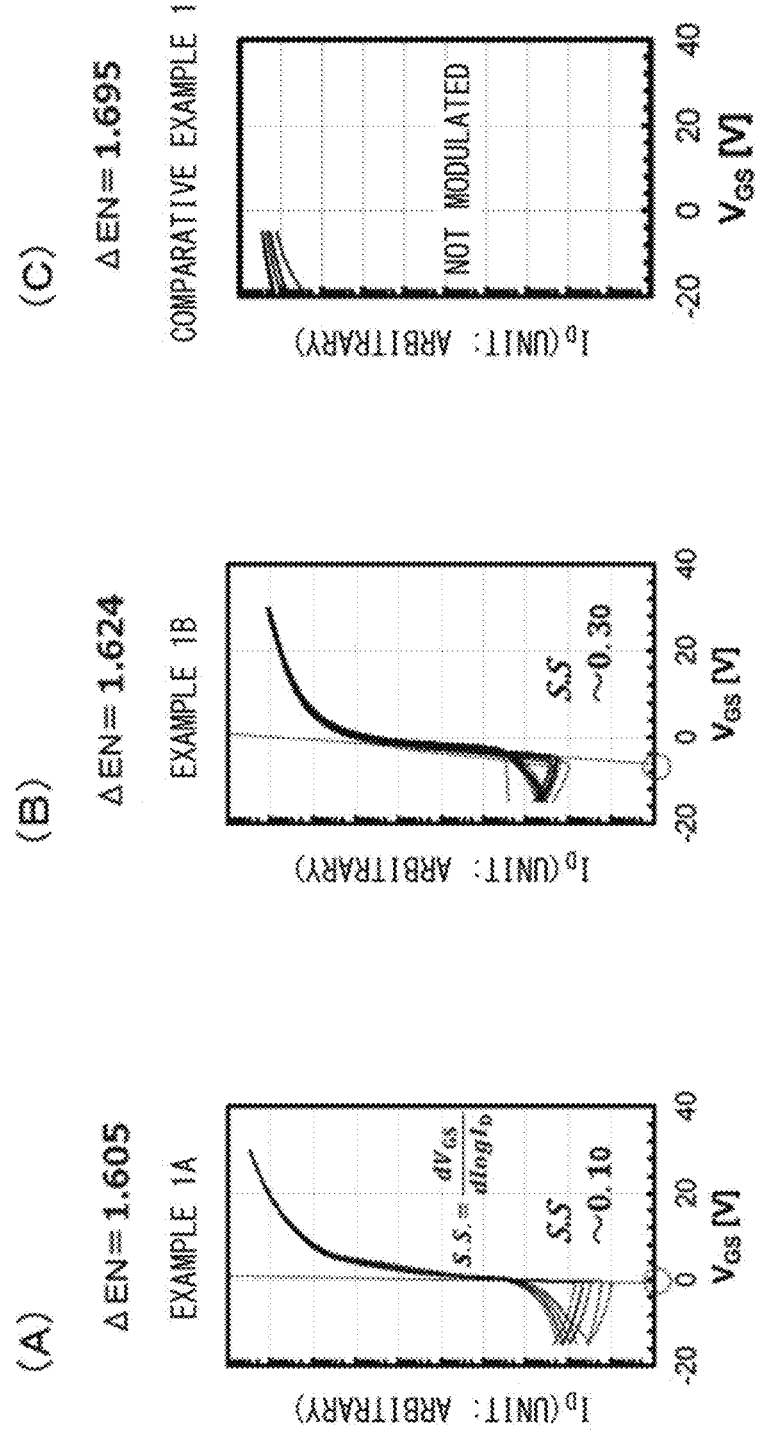

(A), (B) and (C) of FIG. 74 are graphs illustrating results of evaluation of TFT characteristics by forming a channel formation region of a TFT from an inorganic semiconductor material layer, in Example 1A, Example 1B, and Comparative Example 1.

Figure 75A:
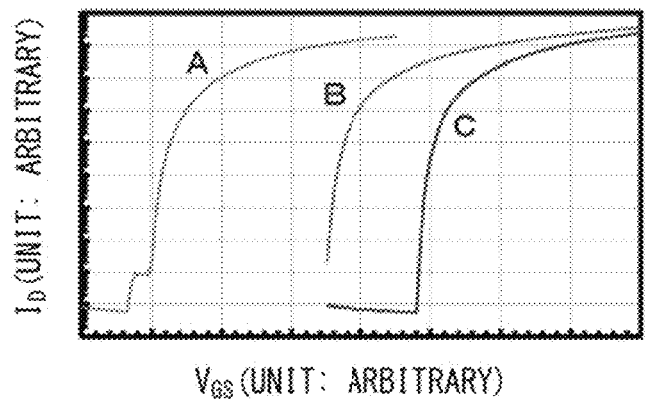
Figure 75B:
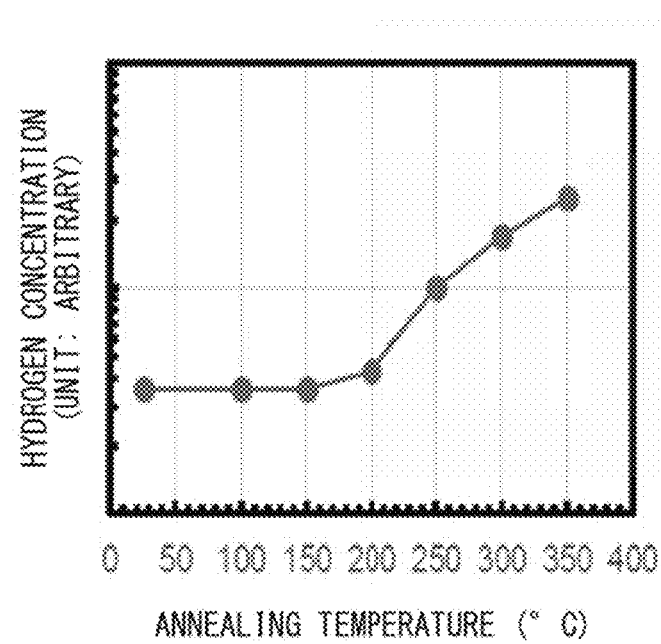

FIG. 75A and FIG. 75B are graphs illustrating results of evaluation of a relationship between VGS and ID in the TFT, as TFT characteristics, when setting an annealing temperature from 250° C. through 280° C. to 350° C., and results of determination of aryl temperature and hydrogen concentration, in Comparative Example 1 using $In_{a1}Ga_{a2}Zn_{a3}O_{b1}$.

Figure 76A:
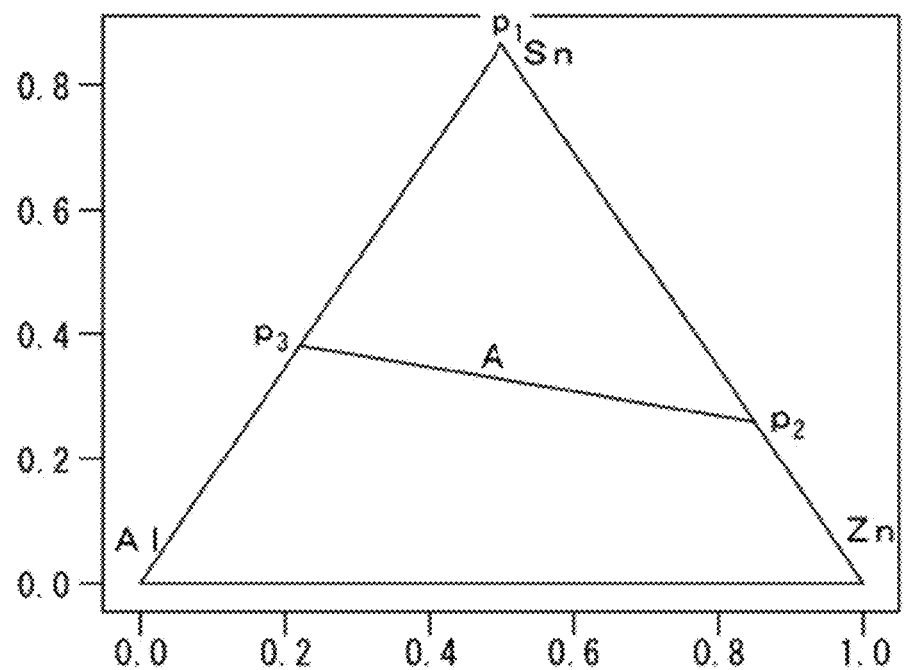
Figure 76B:
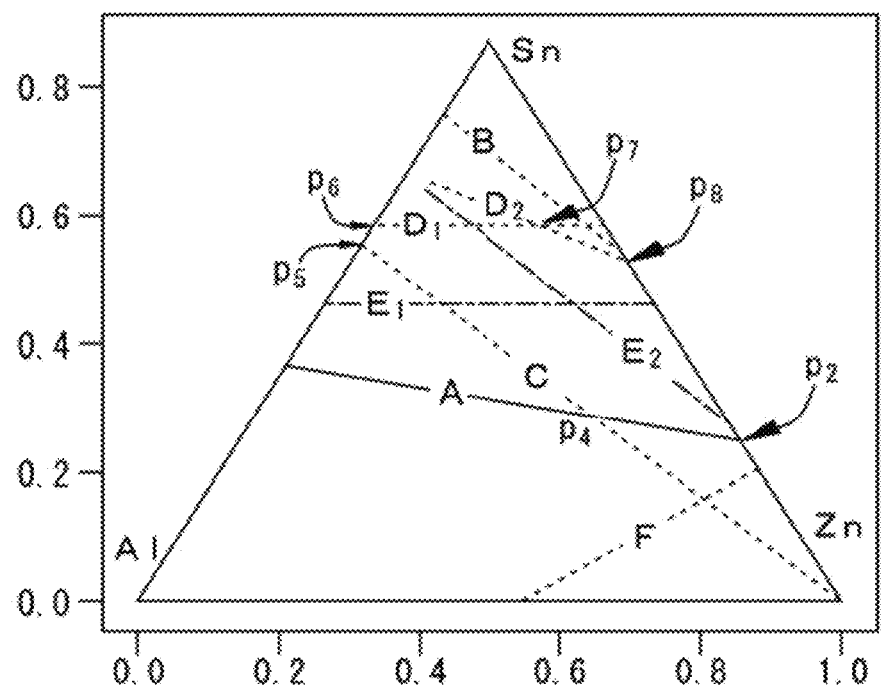

FIGS. 76A and 76B are, respectively, a graph plotting a relationship between values of (a1, a2, and a3) and a definition of ΔEN being less than 1.695 in a case where an inorganic semiconductor material layer contains $Al_{a1}Zn_{a2}Sn_{a3}O_{b1}$, and a graph indicating a region satisfying expressions (1), (2-1), (2-2), (3), and (4) of the values of (a1, a2, and a3).

Figure 77:
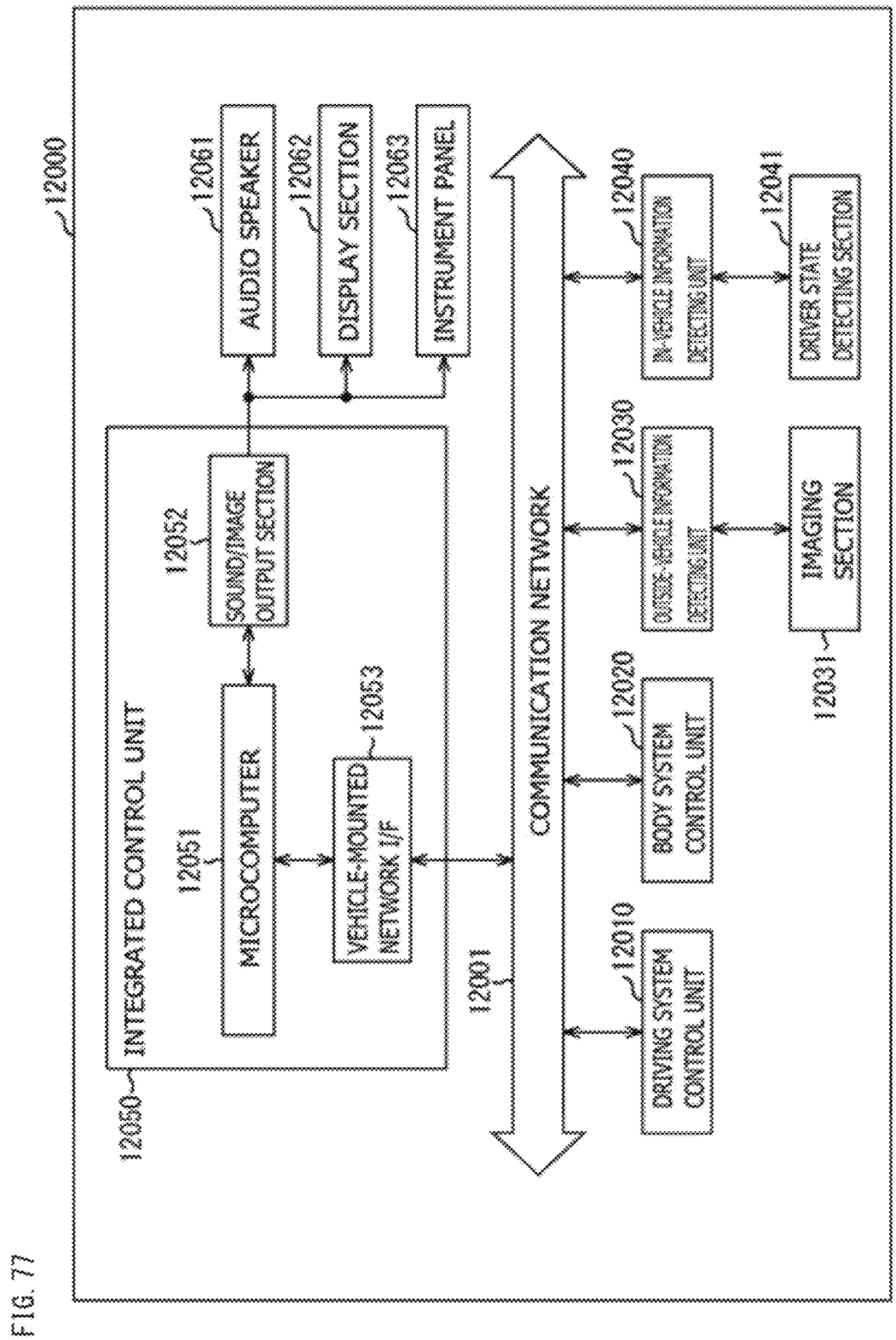

FIG. 77 is a block diagram depicting an example of schematic configuration of a vehicle control system.

Figure 78:
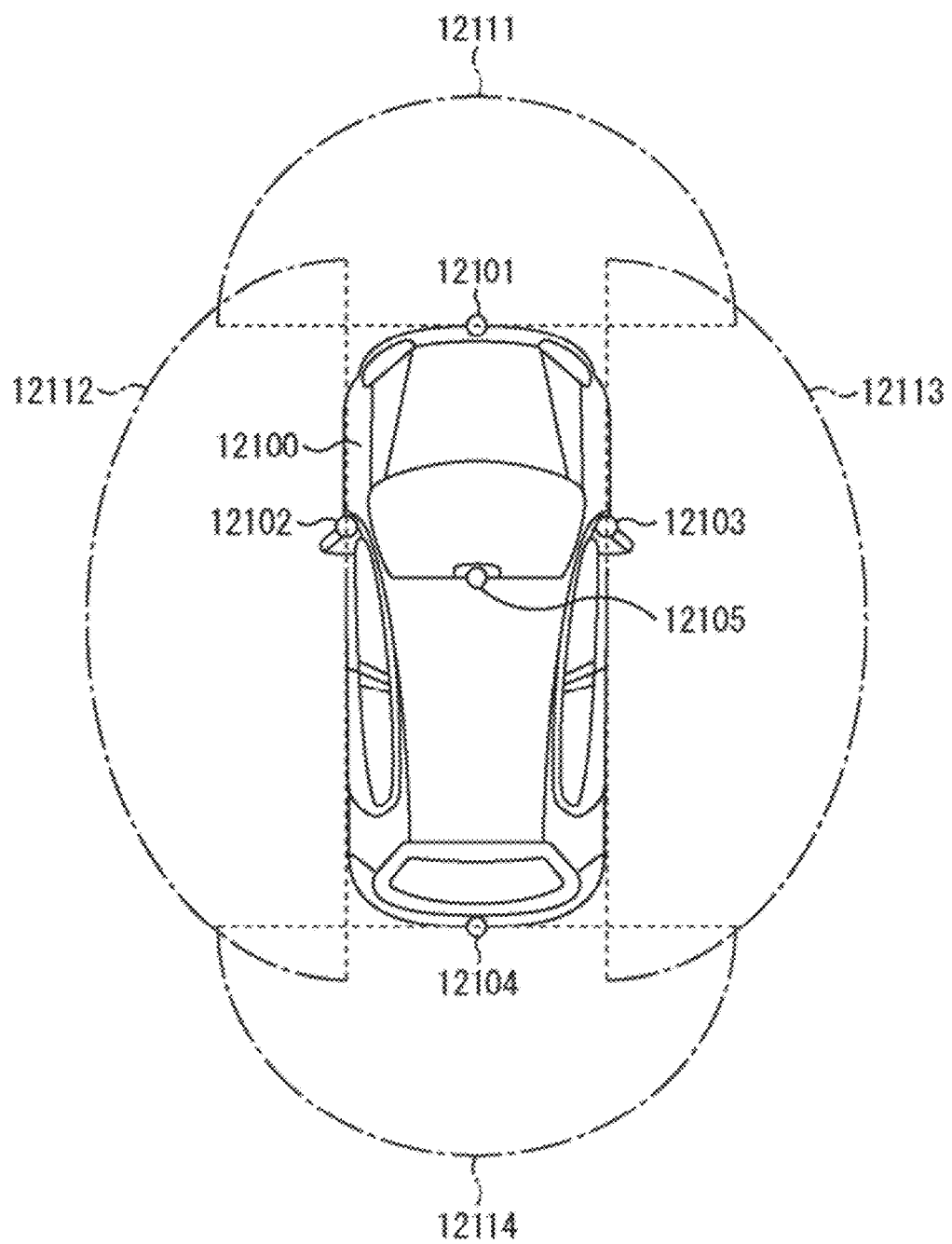

FIG. 78 is a diagram of assistance in explaining an example of installation positions of an outside-vehicle information detecting section and an imaging section.

Figure 79:
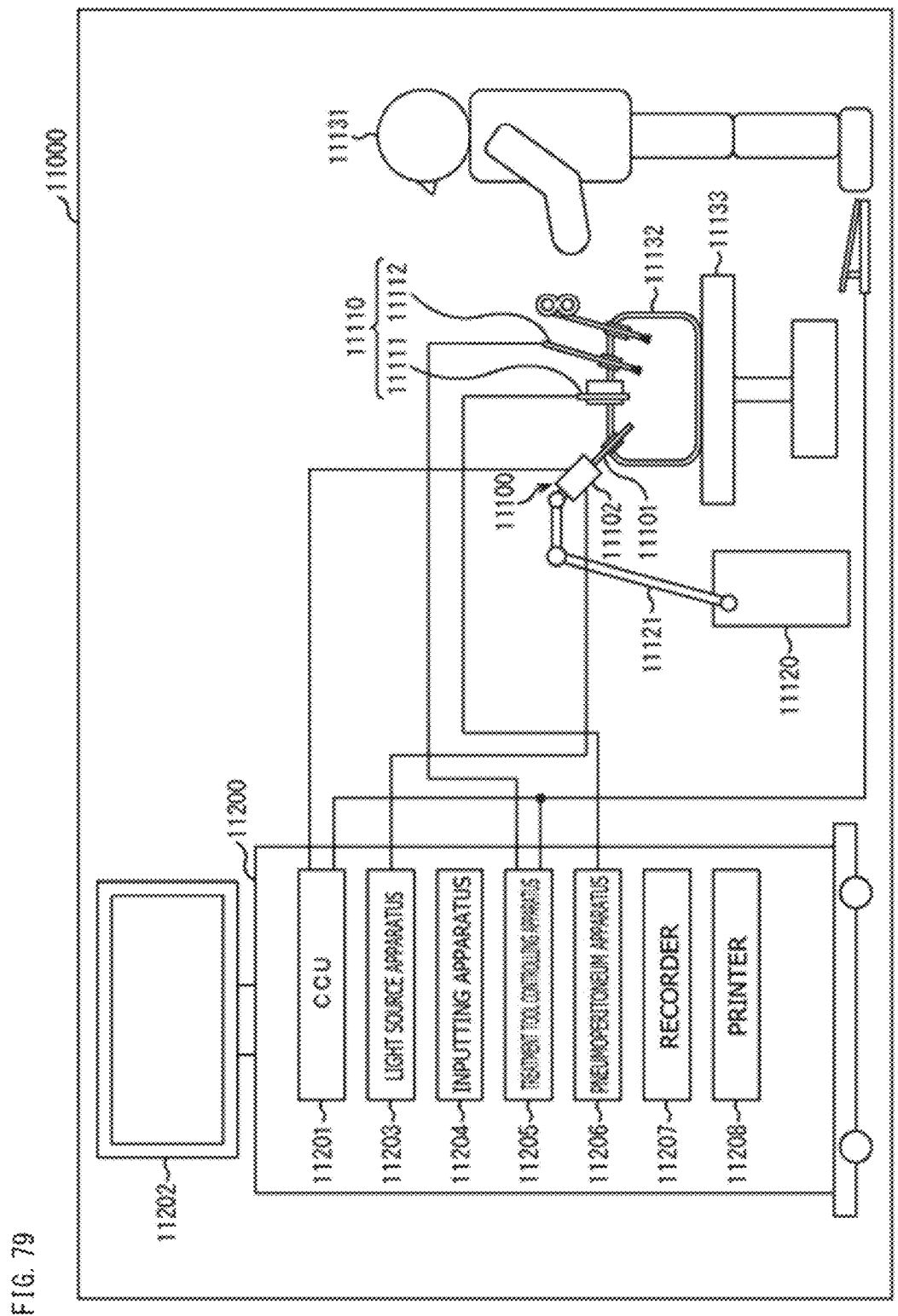

FIG. 79 is a view depicting an example of a schematic configuration of an endoscopic surgery system.

Figure 80:
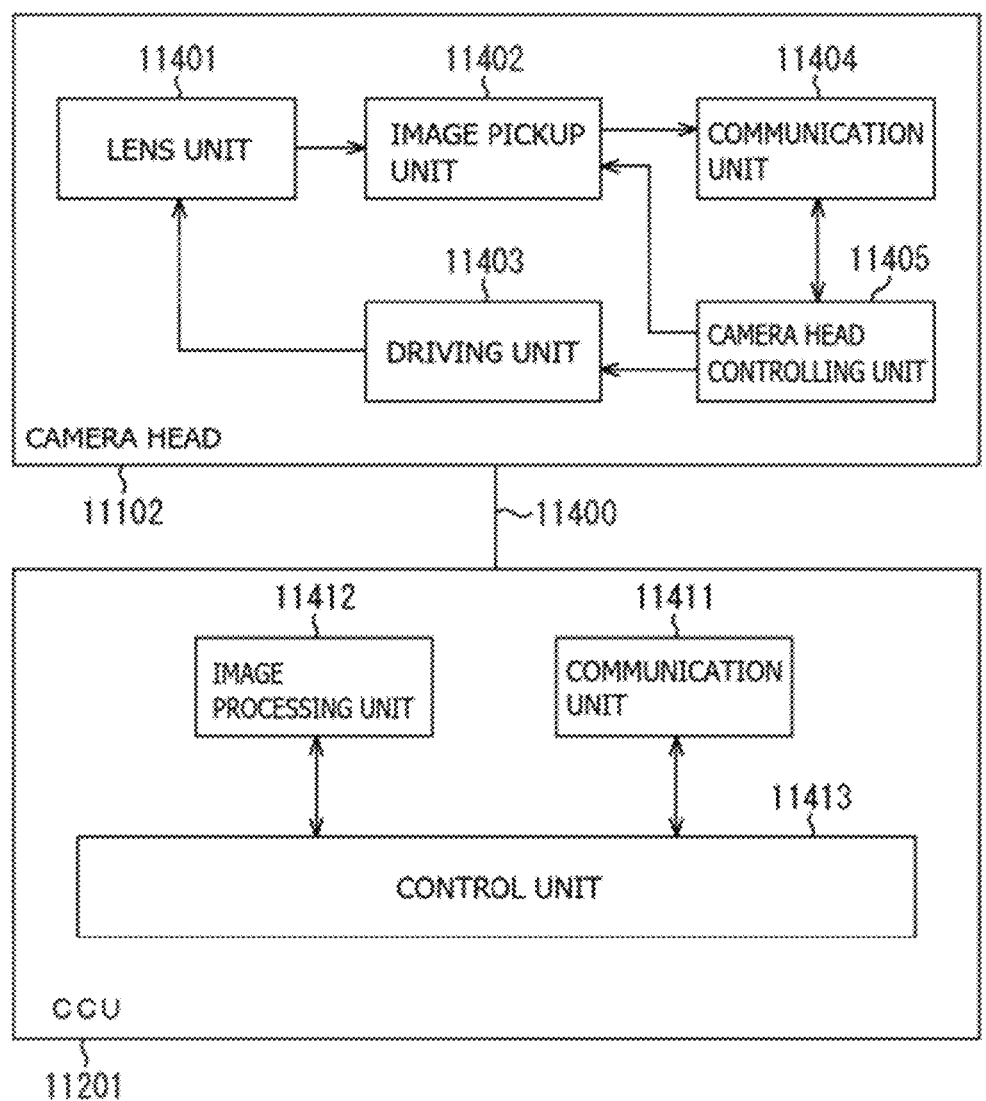

FIG. 80 is a block diagram depicting an example of a functional configuration of a camera head and a camera control unit (CCU).

MODES FOR CARRYING OUT THE INVENTION

In the following, description is given of the present disclosure on the basis of Examples with reference to the drawings. However, the present disclosure is not limited to Examples, and various numerical values and materials in Examples are illustrative. It is to be noted that the description is given in the following order.
1. General Description of Imaging Element of Present Disclosure, Stacked Imaging Element of Present Disclosure, Solid-State Imaging Devices According to First and Second Aspects of Present Disclosure, and Method of Manufacturing Imaging Element of Present Disclosure
2. Example 1 (Imaging Element of Present Disclosure, Stacked Imaging Element of Present Disclosure, Solid-State Imaging Device According to Second Aspect of Present Disclosure, and Method of Manufacturing Imaging Element of Present Disclosure)
3. Example 2 (Modification of Example 1)
4. Example 3 (Modification of Examples 1 and 2, Solid-State Imaging Device According to First Aspect of Present Disclosure)
5. Example 4 (Modification of Examples 1 to 3, Imaging Element Including Transfer Control Electrode)
6. Example 5 (Modification of Examples 1 to 4, Imaging Element Including Charge Drain Electrode)
7. Example 6 (Modification of Examples 1 to 5, Imaging Element Including a Plurality of Charge Accumulation Electrode Segments)
8. Example 7 (Modification of Examples 1 to 6, Imaging Element Including Charge Movement Control Electrode)
9. Example 8 (Modification of Example 7)
10. Example 9 (Solid-State Imaging Devices of First and Second Configurations)
11. Example 10 (Modification of Example 9)
12. Others <General Description of Imaging Element of Present Disclosure, Stacked Imaging Element of Present Disclosure, Solid-State Imaging Devices According to First and Second Aspects of Present Disclosure, and Method of Manufacturing Imaging Element of Present Disclosure>

In the following, a term "an imaging element or the like of the present disclosure" is used in some cases to collectively refer to an imaging element of the present disclosure, the imaging element of the present disclosure included in a stacked imaging element of the present disclosure, and the imaging element of the present disclosure included in a solid-state imaging device according to the first aspect or a second aspect of the present disclosure.

In a method of manufacturing the imaging element of the present disclosure, an annealing process may be at any stage of manufacturing processes after formation of an inorganic semiconductor material layer; the annealing process may be either after the formation of an inorganic semiconductor material layer, after formation of a photoelectric conversion layer, after formation of a second electrode, or after elapse of various manufacturing steps after the formation of the second electrode. Specific examples of an atmosphere containing water vapor include an atmospheric atmosphere containing water vapor.

In the imaging element or the like of the present disclosure, a mode may be adopted in which, when the inorganic semiconductor material layer is represented by $(A^1_{a1}A^2_{a2}A^3_{a3} \ldots A^M_{aM})(B^1_{b1}B^2_{b2}B^3_{b3} \ldots B^N_{bN})$ [where $A^1, A^2, A^3, \ldots,$ and $A^M$ are cationic species, $B^1, B^2, B^3, \ldots,$ and $B^N$ are anionic species, and a1, a2, a3, ..., and aM, and b1, b2, b3, ..., and bN are values corresponding to atomic percentages, with the total thereof being 1.00], $$EN_{anion} = \frac{(B1 \times b1 + B2 \times b2 + B3 \times b3 \ldots + BN \times bN)}{(b1 + b2 + b3 \ldots + bN)}$$

$$EN_{cation} = \frac{(A1 \times a1 + A2 \times a2 + A3 \times a3 \ldots + AM \times aM)}{(a1 + a2 + a3 \ldots + aM)}$$

hold true, where B1, B2, B3, ..., and BN are electronegativities of the anionic species $B^1, B^2, B^3 \ldots,$ and $B^N$, and A1, A2, A3, ..., and $A^M$ are electronegativities of cationic species $A^1, A^2, A^3 \ldots,$ and $A^M$.

In the imaging element or the like of the present disclosure including the preferred modes described above, a configuration may be adopted in which the cationic species include at least one type of cationic species selected from the group consisting of Zn, Ga, Ge, Cd, In, Al, Ti, B, Si, Sn, Hg, Tl, and Pb. In addition, a configuration may be adopted in which the anionic species include at least one type of anionic species selected from the group consisting of O, N, S, and F Alternatively, in the imaging element or the like of the present disclosure including the preferred modes described above, a configuration may be adopted in which the cationic species include Ga, In, and Sn, and the anionic species include O. Alternatively, a configuration may be adopted in which the cationic species include Zn, Al, and Sn, and the anionic species include O.

In the imaging element or the like of the present disclosure including various preferred modes and configurations described above, a mode may be adopted in which a photoelectric conversion section further includes an insulating layer, and a charge accumulation electrode disposed at a distance from a first electrode and disposed to be opposed to the inorganic semiconductor material layer with the insulating layer interposed therebetween.

Description is given later in detail of the first electrode, the second electrode, the charge accumulation electrode, and the photoelectric conversion layer.

Further, in the imaging element or the like of the present disclosure including the preferred modes and configurations described above, a mode may be adopted in which electric charge generated in the photoelectric conversion layer moves to the first electrode via the inorganic semiconductor material layer. In this case, a mode may be adopted in which the electric charge is an electron.

Further, when it is defined that, with a vacuum level as a zero reference, energy becomes higher as being away from the vacuum level, a mode may be adopted in which a LUMO value $E_0$ of a material included in the photoelectric conversion layer and a minimum energy value $E_1$ of a conduction band of an inorganic semiconductor material included in the inorganic semiconductor material layer (hereinafter, simply referred to as "inorganic semiconductor material" in some cases) satisfy the following expressions:

$$E_1 \geq E_0$$

desirably, $$E_1 - E_0 \geq 0.1 \text{ (eV)}$$

and more desirably, $$E_1 - E_0 > 0.1 \text{ (eV)}.$$

The minimum energy value $E_1$ of the conduction band of the inorganic semiconductor material is an average value in the inorganic semiconductor material layer. In addition, the LUMO value $E_0$ of the material included in the photoelectric conversion layer is an average value in a portion of the photoelectric conversion layer positioned in the vicinity of the inorganic semiconductor material layer. Here, the "portion of the photoelectric conversion layer positioned in the vicinity of the inorganic semiconductor material layer" refers to a portion of the photoelectric conversion layer positioned in a region corresponding to 10% or less of the thickness of the photoelectric conversion layer (i.e., a region extending from 0% to 10% of the thickness of the photoelectric conversion layer) with an interface between the inorganic semiconductor material layer and the photoelectric conversion layer as a reference.

A valence band energy and a HOMO value are determinable on the basis of, for example, ultraviolet photoelectron spectroscopy (UPS method). In addition, a conduction band energy and a LUMO value are determinable from {(valence band energy, HOMO value)+$E_b$}. Further, the bandgap energy $E_b$ is determinable, from an optically absorbing wavelength λ (an optical absorption edge wavelength in nm), on the basis of the following expression:

$$E_b = hv = h(c/\lambda) = 1239.8/\lambda \text{ [eV]}.$$

The inorganic semiconductor material layer is provided to transfer electric charge generated in the photoelectric conversion layer to the first electrode; therefore, when a transfer rate is slow, it takes time to read out a signal from the imaging element, thus making it hardly possible to obtain an appropriate frame rate required by the solid-state imaging device. In order to increase the transfer rate, carrier mobility of the inorganic semiconductor material layer, i.e., field mobility needs to be increased. Therefore, in the imaging element or the like of the present disclosure including the various preferred modes and configurations described above, it is preferred that the inorganic semiconductor material layer have a carrier mobility of 10 cm²/V·s or more, which enables electric charge accumulated in the inorganic semiconductor material layer to be quickly moved to the first electrode.

In the imaging element or the like of the present disclosure including the various preferred modes and configurations described above, the inorganic semiconductor material layer preferably has a carrier density (carrier concentration) of $1 \times 10^{16}$/cm³ or less, which enables an increase in the amount of electric charge accumulated in the inorganic semiconductor material layer.

In the imaging element or the like of the present disclosure including the various preferred modes and configurations described above, it is desirable that the inorganic semiconductor material layer have a thickness of $1 \times 10^{-8}$ m to $1.5 \times 10^{-7}$ m, preferably $2 \times 10^{-8}$ m to $1.0 \times 10^{-7}$ m, and more preferably, $3 \times 10^{-8}$ m to $1.0 \times 10^{-7}$ m.

In the imaging element or the like of the present disclosure including the various preferred modes and configurations described above, it is preferred that:

light be incident from a second electrode; and
a surface roughness Ra of a surface of the inorganic semiconductor material layer at the interface between the photoelectric conversion layer and the inorganic semiconductor material layer be 1.5 nm or less, and a root mean square roughness Rq of the surface of the inorganic semiconductor material layer be 2.5 nm or less. The surface roughnesses Ra and Rq are based on the provisions of JIS B0601:2013. Such smoothness of the surface of the inorganic semiconductor material layer at the interface between the photoelectric conversion layer and the inorganic semiconductor material layer makes it possible to suppress scattering reflection at the surface of the inorganic semiconductor material layer, and to enhance light current characteristic in photoelectric conversion. It is preferred that a surface roughness Ra of a surface of the charge accumulation electrode be 1.5 nm or less, and the root mean square roughness Rq of the surface of the charge accumulation electrode be 2.5 nm or less.

In the imaging element or the like of the present disclosure, the inorganic semiconductor material preferably has an optical gap of 2.8 eV or more and 3.2 eV or less, which enables the inorganic semiconductor material layer to be a transparent layer with respect to incident light, and eliminates the possibility of causing a barrier to movement of electric charge from the photoelectric conversion layer to the inorganic semiconductor material layer. Alternatively, it is preferred that the inorganic semiconductor material have an optical gap of 3.0 eV or more and 3.2 eV or less to allow the inorganic semiconductor material layer to be a layer transparent to incident light in a still wider wavelength range. That is, in order for the inorganic semiconductor material layer to reliably receive electric charge generated in the photoelectric conversion layer, the level of a conduction band of the inorganic semiconductor material is required to be deeper than the level of a conduction band of a material included in the photoelectric conversion layer; for that purpose, the inorganic semiconductor material preferably has an optical gap of 3.2 eV or less, for example.

In addition, in the imaging element or the like of the present disclosure, the inorganic semiconductor material preferably has an oxygen deficiency generation energy of 2.6 eV or more, and desirably 3.0 eV or more. Alternatively, a higher value of the oxygen deficiency generation energy may lead to a case of a lower value of the carrier mobility; therefore, in such a case, the inorganic semiconductor material preferably has an oxygen deficiency generation energy of 2.6 eV or more and 3.0 eV or less. Here, the oxygen deficiency generation energy is energy required to generate oxygen deficiency; a higher value of the oxygen deficiency generation energy makes it more difficult to generate oxygen deficiency and makes it more difficult to incorporate oxygen atoms, oxygen molecules, or other atoms or molecules, which can be said to bring stability. The oxygen deficiency generation energy is determinable, for example, from first principle calculation. It is to be noted that the inorganic semiconductor material layer contains a plurality of kinds of metal atoms, and thus "oxygen deficiency generation energy of metal atoms" refers to an average value of oxygen deficiency generation energies of the plurality of kinds of metal atoms in the inorganic semiconductor material.

A composition of the inorganic semiconductor material layer is determinable on the basis of, for example, ICP emission spectroscopy (high-frequency inductively coupled plasma atomic emission spectroscopy, ICP-AES) or X-ray photoelectron spectroscopy (X-ray Photoelectron Spectroscopy, XPS). In the process of forming the inorganic semiconductor material layer, an intrusion of hydrogen or other metal, or other impurities such as a metal compound can occur in some cases; however, the intrusion of the impurities may be acceptable as long as the amount thereof is very small (e.g., 3% or less in molar fraction).

In the imaging element or the like of the present disclosure, a mode may be adopted in which the inorganic semiconductor material layer is amorphous (e.g., amorphous having no local crystalline structures). Whether or not the inorganic semiconductor material layer is amorphous is determinable on the basis of X-ray diffraction analysis. However, the inorganic semiconductor material layer is not limited to being amorphous, and may have a crystalline structure or a polycrystalline structure.

Figure 70:
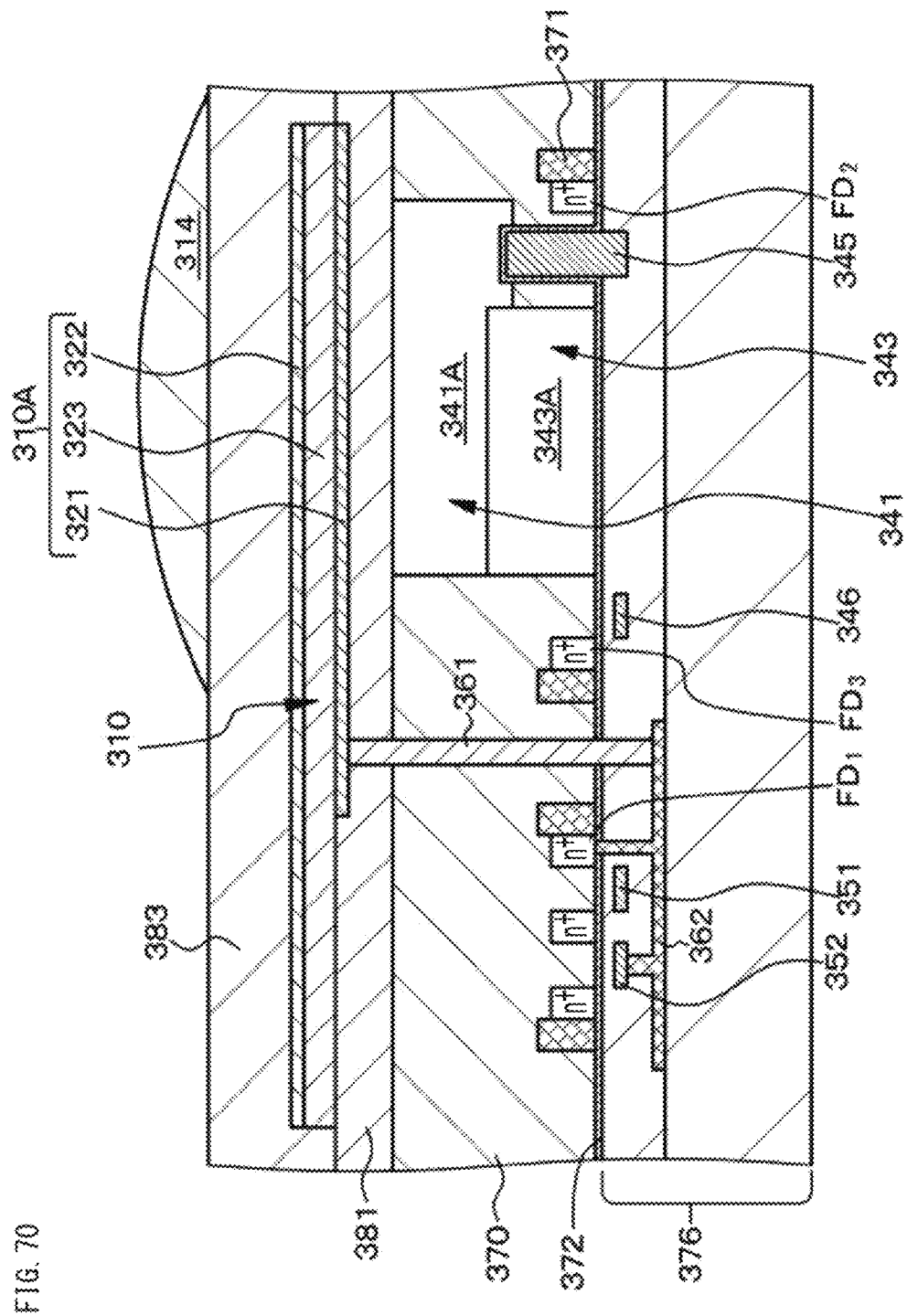
FIG. 70 is a conceptual diagram of a stacked imaging element (stacked solid-state imaging device) of a comparative example.

FIG. 70 illustrates a configuration example of a stacked imaging element (stacked solid-state imaging device) as a comparative example. In the example illustrated in FIG. 70, a third photoelectric conversion section 343A and a second photoelectric conversion section 341A are stacked and formed in a semiconductor substrate 370. The third photoelectric conversion section 343A and the second photoelectric conversion section 341A are photoelectric conversion sections of the second type, and are included in a third imaging element 343 and a second imaging element 341 that are imaging elements of the second type. In addition, a first photoelectric conversion section 310A, which is a photoelectric conversion section of the first type, is disposed above the semiconductor substrate 370 (specifically, above the second imaging element 341). Here, the first photoelectric conversion section 310A includes a first electrode 321, a photoelectric conversion layer 323 including an organic material, and a second electrode 322. The first photoelectric conversion section 310A is included in a first imaging element 310 that is an imaging element of the first type. The second photoelectric conversion section 341A and the third photoelectric conversion section 343A photoelectrically convert, for example, blue light and red light, respectively, owing to a difference in absorption coefficient. In addition, the first photoelectric conversion section 310A photoelectrically converts, for example, green light.

The electric charge generated by the photoelectric conversion in the second photoelectric conversion section 341A and the third photoelectric conversion section 343A is temporarily accumulated in the second photoelectric conversion section 341A and the third photoelectric conversion section 343A. Thereafter, a vertical transistor (a gate section 345 is illustrated) and a transfer transistor (a gate section 346 is illustrated) transfer the electric charge to a second floating diffusion layer (Floating Diffusion) $FD_2$ and a third floating diffusion layer $FD_3$, respectively, and the electric charge is further outputted to an external readout circuit (not illustrated). The transistors and the floating diffusion layers $FD_2$ and $FD_3$ are also formed in the semiconductor substrate 370.

The electric charge generated by the photoelectric conversion in the first photoelectric conversion section 310A is accumulated in a first floating diffusion layer $FD_1$ formed in the semiconductor substrate 370 through a contact hole section 361 and a wiring layer 362. In addition, the first photoelectric conversion section 310A is also coupled to a gate section 352 of an amplification transistor that converts the electric charge amount into voltage through the contact hole section 361 and the wiring layer 362. In addition, the first floating diffusion layer $FD_1$ constitutes a portion of a reset transistor (a gate section 351 is illustrated). Reference numeral 371 denotes an element separation region. Reference numeral 372 denotes an oxide film formed on a surface of the semiconductor substrate 370. Reference numerals 376 and 381 denote interlayer insulating layers. Reference numeral 383 denotes a protection material layer. Reference numeral 314 denotes an on-chip microlens.

In the imaging element of the comparative example illustrated in FIG. 70, the electric charge generated by the photoelectric conversion in the second photoelectric conversion section 341A and the third photoelectric conversion section 343A is once accumulated in the second photoelectric conversion section 341A and the third photoelectric conversion section 343A, and is thereafter transferred to the second floating diffusion layer $FD_2$ and the third floating diffusion layer $FD_3$. It is therefore possible to completely deplete the second photoelectric conversion section 341A and the third photoelectric conversion section 343A. However, the electric charge generated by photoelectric conversion in the first photoelectric conversion section 310A is accumulated directly in the first floating diffusion layer $FD_1$. It is therefore difficult to completely deplete the first photoelectric conversion section 310A. As a result, kTC noise becomes greater and random noise deteriorates, which may possibly cause reduction in quality of captured images.

In the imaging element or the like of the present disclosure, as described above, as long as the charge accumulation electrode is provided that is disposed at a distance from the first electrode and disposed to be opposed to the inorganic semiconductor material layer with the insulating layer interposed therebetween, it is possible to accumulate electric charge in the inorganic semiconductor material layer (in some cases, in the inorganic semiconductor material layer and the photoelectric conversion layer) when the photoelectric conversion section is irradiated with light and photoelectric conversion occurs in the photoelectric conversion section. It is therefore possible to completely deplete the charge accumulation section and eliminate the electric charge when exposure is started. As a result, it is possible to suppress the occurrence of the phenomenon that the kTC noise becomes greater and the random noise deteriorates to cause reduction in quality of captured images. It is to be noted that, in the following description, the inorganic semiconductor material layer, or the inorganic semiconductor material layer and the photoelectric conversion layer, may be collectively referred to as an "inorganic semiconductor material layer or the like" in some cases.

The inorganic semiconductor material layer may have a single-layer configuration or a multilayer configuration. In addition, the inorganic semiconductor material positioned above the charge accumulation electrode and the inorganic semiconductor material positioned above the first electrode may be different from each other.

It is possible to form the inorganic semiconductor material layer on the basis of, for example, a physical vapor deposition method (PVD method), specifically, a sputtering method. More specifically, examples of the sputtering method include one using a parallel flat plate sputtering device, a DC magnetron sputtering device or an RF sputtering device as a sputtering device, an argon (Ar) gas as a process gas, and a desired sintered body as a target. However, it is also possible to form the inorganic semiconductor material layer on the basis of a coating method or the like, not being limited only to the PVD method such as the sputtering method or a vapor deposition method.

It is to be noted that it is possible to control the energy level of the inorganic semiconductor material layer by controlling the amount of an oxygen gas to be introduced (oxygen gas partial pressure) in forming the inorganic semiconductor material layer on the basis of a sputtering method. Specifically, it is preferred that the oxygen gas partial pressure at the time of formation on the basis of a sputtering method =($O_2$ gas pressure)/(total pressure of Ar gas and $O_2$ gas) be 0.005 to 0.10. Further, in the imaging element or the like of the present disclosure, a mode may be adopted in which the oxygen content of the inorganic semiconductor material layer is lower than the stoichiometric oxygen content. Here, the energy level of the inorganic semiconductor material layer is controllable on the basis of the oxygen content, and it is possible to allow the energy level to be deeper as the oxygen content becomes lower than the stoichiometric oxygen content, namely, as oxygen deficiency becomes larger.

Further, in the imaging element or the like of the present disclosure including the various preferred modes and configurations described above, a mode may be adopted in which the inorganic semiconductor material layer includes a first layer and a second layer from side of the first electrode, and $$\rho_1 \geq 5.9 \text{ g/cm}^3 \text{ and}$$

$$\rho_1 - \rho_2 \geq 0.1 \text{ g/cm}^3,$$

and preferably $$\rho_1 \geq 6.1 \text{ g/cm}^3 \text{ and}$$

$$\rho_1 - \rho_2 \geq 0.2 \text{ g/cm}^3$$

are satisfied, where $\rho_1$ denotes an average film density of the first layer and $\rho_2$ denotes an average film density of the second layer in a portion extending for 3 nm, preferably 5 nm, or more preferably 10 nm from an interface between the first electrode and the inorganic semiconductor material layer. It is to be noted that although the first layer is preferably as small as possible in thickness, a minimum thickness thereof is defined as 3 nm because it is necessary to prevent formation of a discontinuous layer. In addition, a maximum thickness of the first layer is defined as 10 nm because an excessively large thickness degrades the characteristic of the inorganic semiconductor material layer. It is to be noted that, in this case, a mode may be adopted in which a composition of the first layer and a composition of the second layer are the same. Alternatively, a mode may be adopted in which the inorganic semiconductor material layer includes a first layer and a second layer,
a composition of the first layer and a composition of the second layer are the same, and $$\rho_1 - \rho_2 \geq 0.1 \text{ g/cm}^3,$$

and preferably $$\rho_1 - \rho_2 \geq 0.2 \text{ g/cm}^3$$

is satisfied, where $\rho_1$ denotes an average film density of the first layer and $\rho_2$ denotes an average film density of the second layer in a portion extending for 3 nm, preferably 5 nm, or more preferably 10 nm from an interface between the first electrode and the inorganic semiconductor material layer.

Film densities are determinable on the basis of an XRR (X-Ray Reflectivity) method. Here, the XRR method is a method of determining a film thickness and a film density of a sample by causing X-rays to be incident on a sample surface at an extremely shallow angle, measuring an intensity profile of the X-rays reflected in a mirror plane direction versus the incident angle, comparing the obtained intensity profile of the X-rays with simulation results, and optimizing the simulation parameters.

The imaging element of the present disclosure provided with such an inorganic semiconductor material layer including the first layer and second layer is obtainable by a method of manufacturing an imaging element that includes a photoelectric conversion section including a first electrode, a photoelectric conversion layer including an organic material, and a second electrode that are stacked, in which an inorganic semiconductor material layer including the first layer and the second layer, from the side of the first electrode, is formed between the first electrode and the photoelectric conversion layer, the method including, after forming the first layer on the basis of a sputtering method, forming the second layer on the basis of a sputtering method at input electric power lower than input electric power used in forming the first layer.

As a result of various tests, it is appreciated that there is such a relationship that the average film density increases linearly as the input electric power increases, between the input electric power and the average film density in forming the inorganic semiconductor material layer on the basis of the sputtering method. Here, in a case where the input electric power is high, the orientations of the inorganic semiconductor materials become uniform, and the inorganic semiconductor material layer becomes dense. In contrast, in a case where the input electric power is low, it is difficult for the orientations of the inorganic semiconductor materials to be uniform, and thus the inorganic semiconductor material layer is considered to become rough.

Forming the inorganic semiconductor material layer including the first layer and the second layer from the side of the first electrode between the first electrode and the photoelectric conversion layer and defining the thickness of the first layer, the relationship between the average film density $\rho_1$ of the first layer and the average film density $\rho_2$ of the second layer in this manner eliminate the possibility of damaging an underlayer when forming the first layer, thus making it possible to obtain an imaging element having superior characteristics.

Examples of the imaging element or the like of the present disclosure include a CCD element, a CMOS image sensor, a CIS (Contact Image Sensor), and a signal amplification image sensor of a CMD (Charge Modulation Device) type. The solid-state imaging devices according to the first and second aspects of the present disclosure and the solid-state imaging devices of first and second configurations described later are able to be included in, for example, a digital still camera, a video camera, a camcorder, a monitoring camera, an on-vehicle camera, a smartphone camera, a user interface camera for games, and a biometric authentication camera.

Example 1

Figure 1:
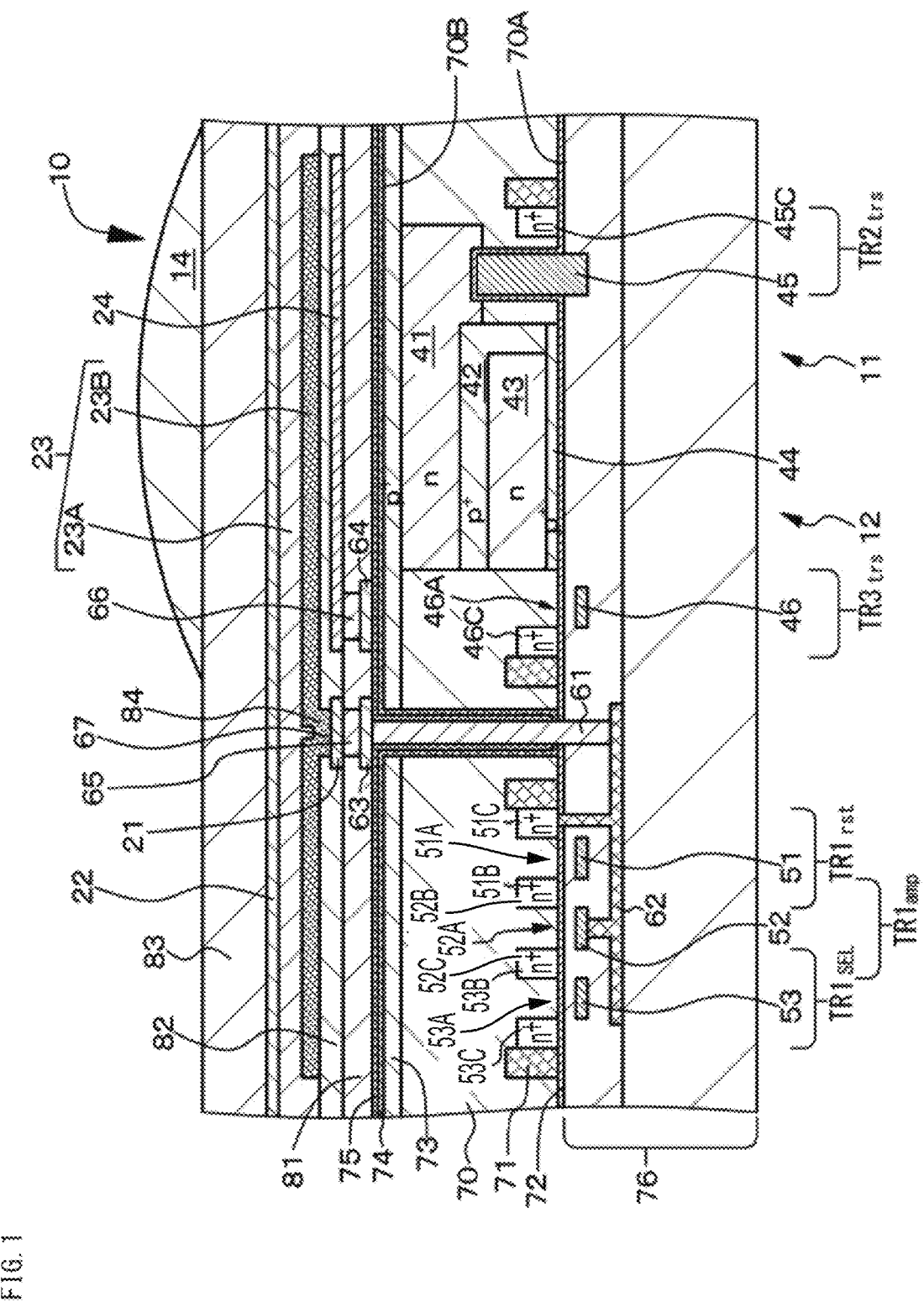
FIG. 1 is a schematic partial cross-sectional view of an imaging element of Example 1.
Figure 2:
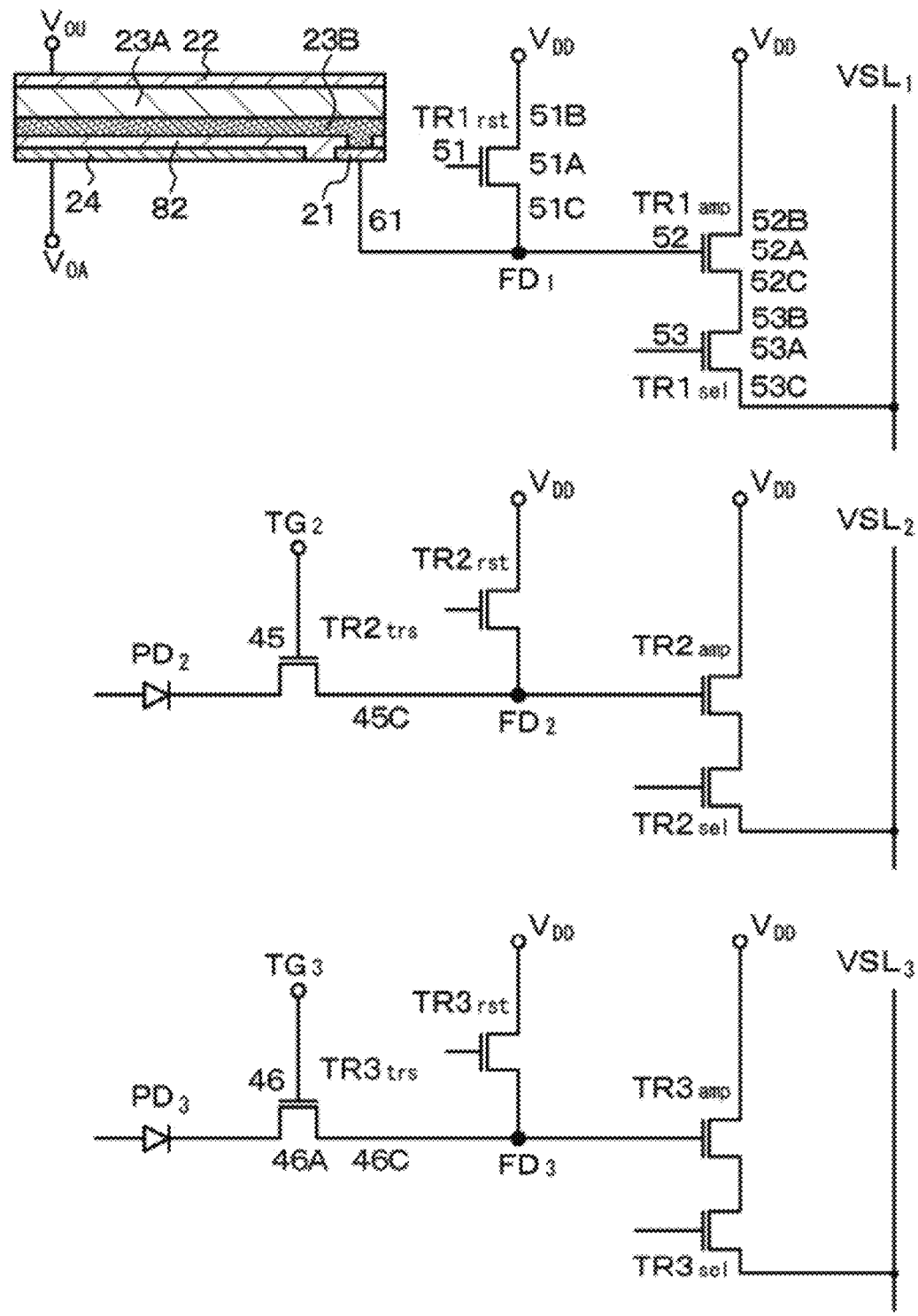
FIG. 2 is an equivalent circuit diagram of the imaging element of Example 1.
Figure 3:
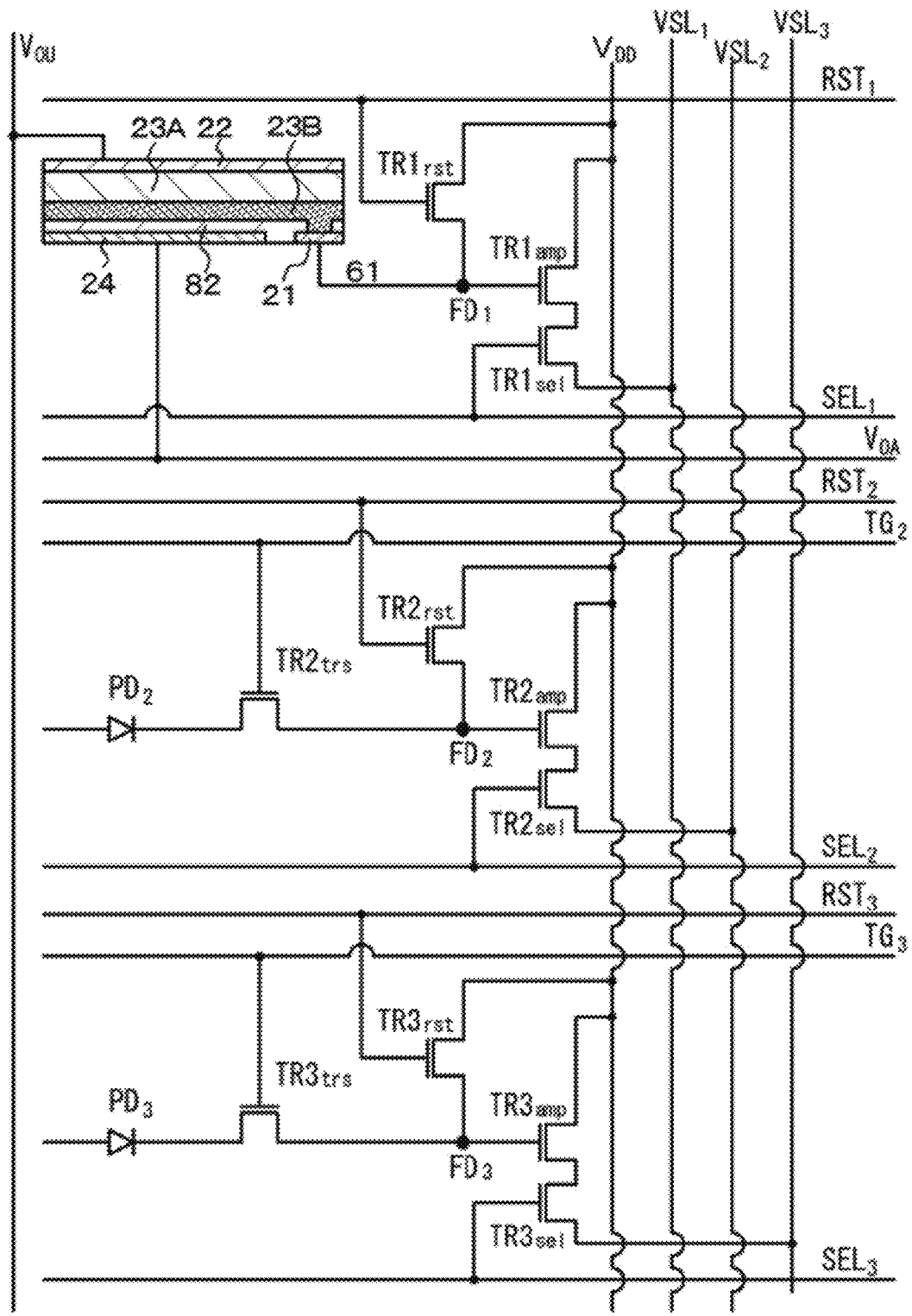
FIG. 3 is an equivalent circuit diagram of the imaging element of Example 1.
Figure 4:
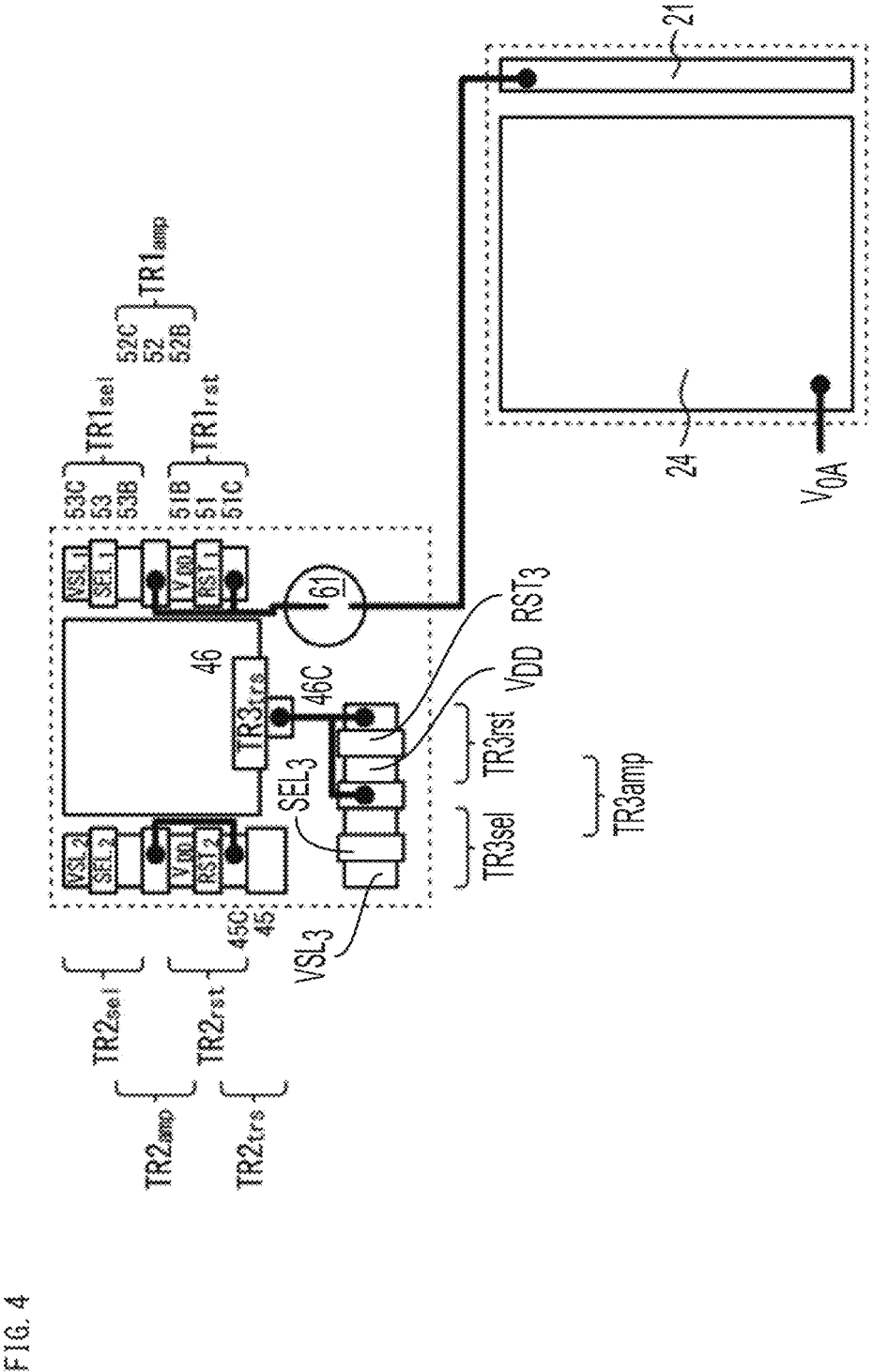
FIG. 4 is a schematic layout diagram of a first electrode and a charge accumulation electrode, and transistors included in a control section that are included in the imaging element of Example 1.
Figure 5:
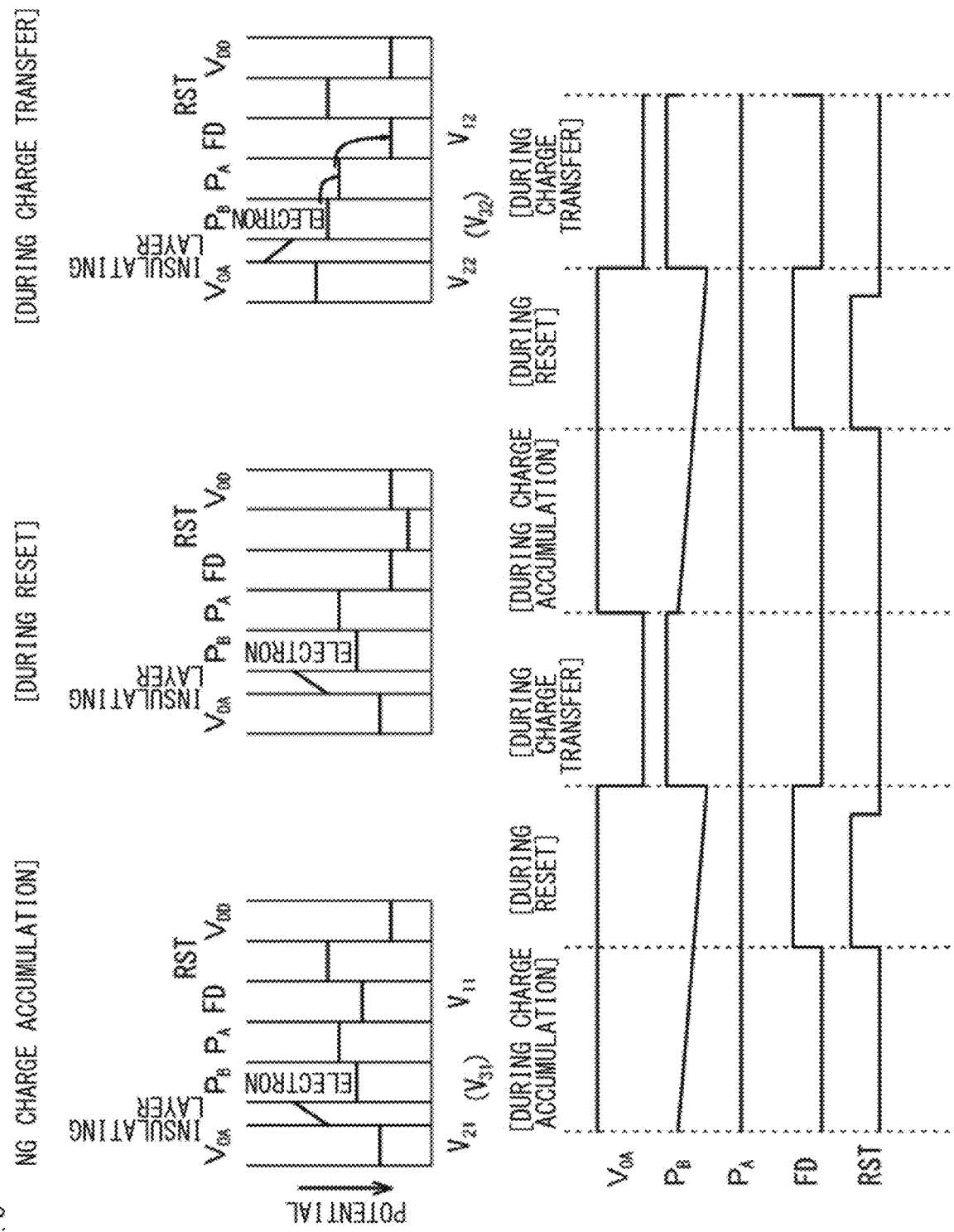
FIG. 5 schematically illustrates a state of potential at each part during operation of the imaging element of Example 1.
Figure 6A:
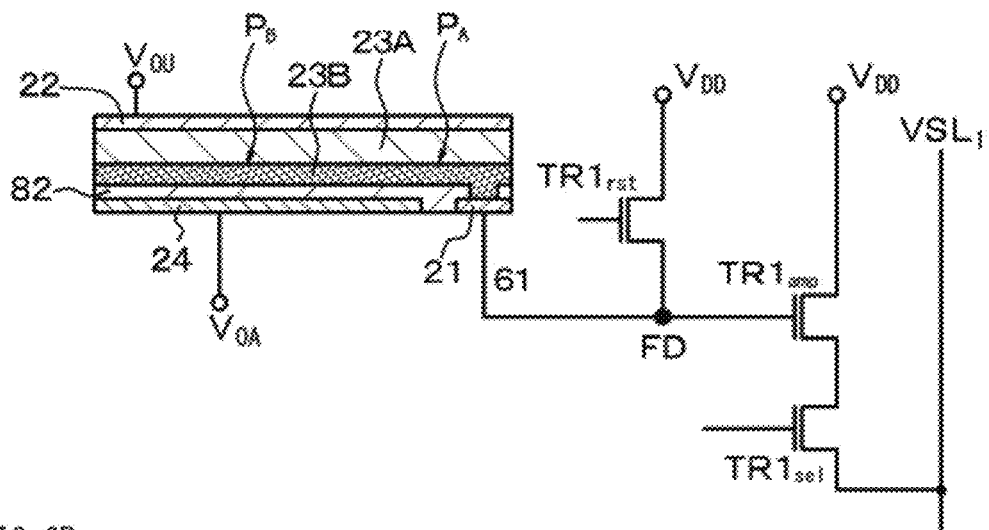
FIGS. 6A, 6B, and 6C are equivalent circuit diagrams of imaging elements of Example 1, Example 4, and Example 6 for describing respective parts of FIG. 5 (Example 1), FIGS. 20 and 21 (Example 4), and FIGS. 32 and 33 (Example 6).
Figure 7:
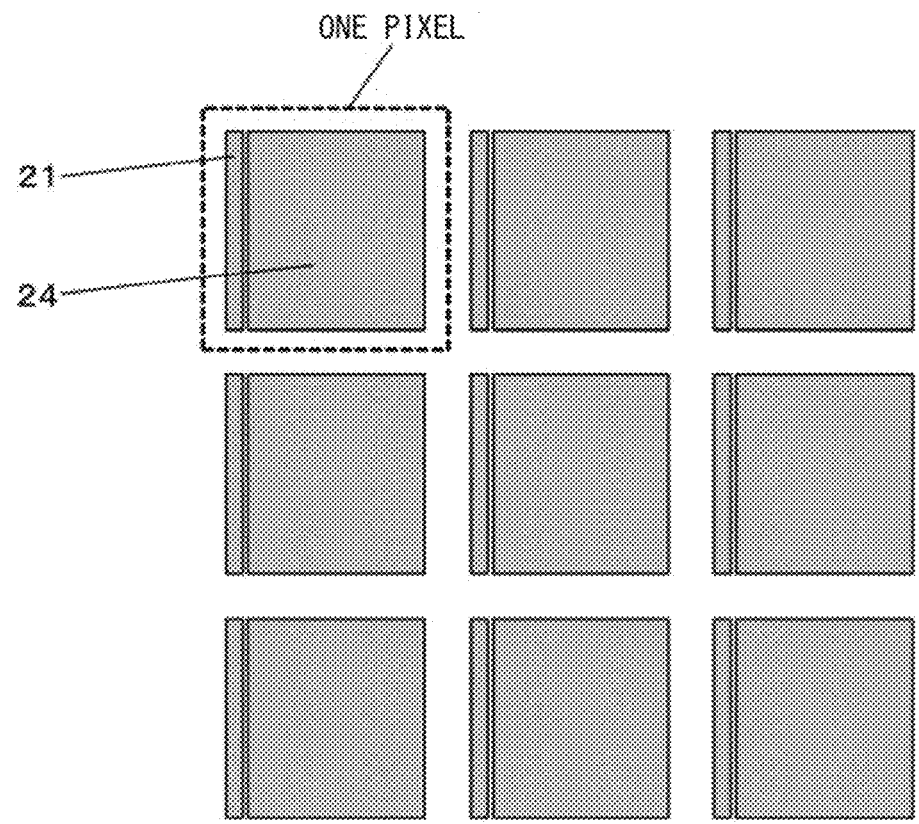
FIG. 7 is a schematic layout diagram of the first electrode and the charge accumulation electrode included in the imaging element of Example 1.
Figure 8:
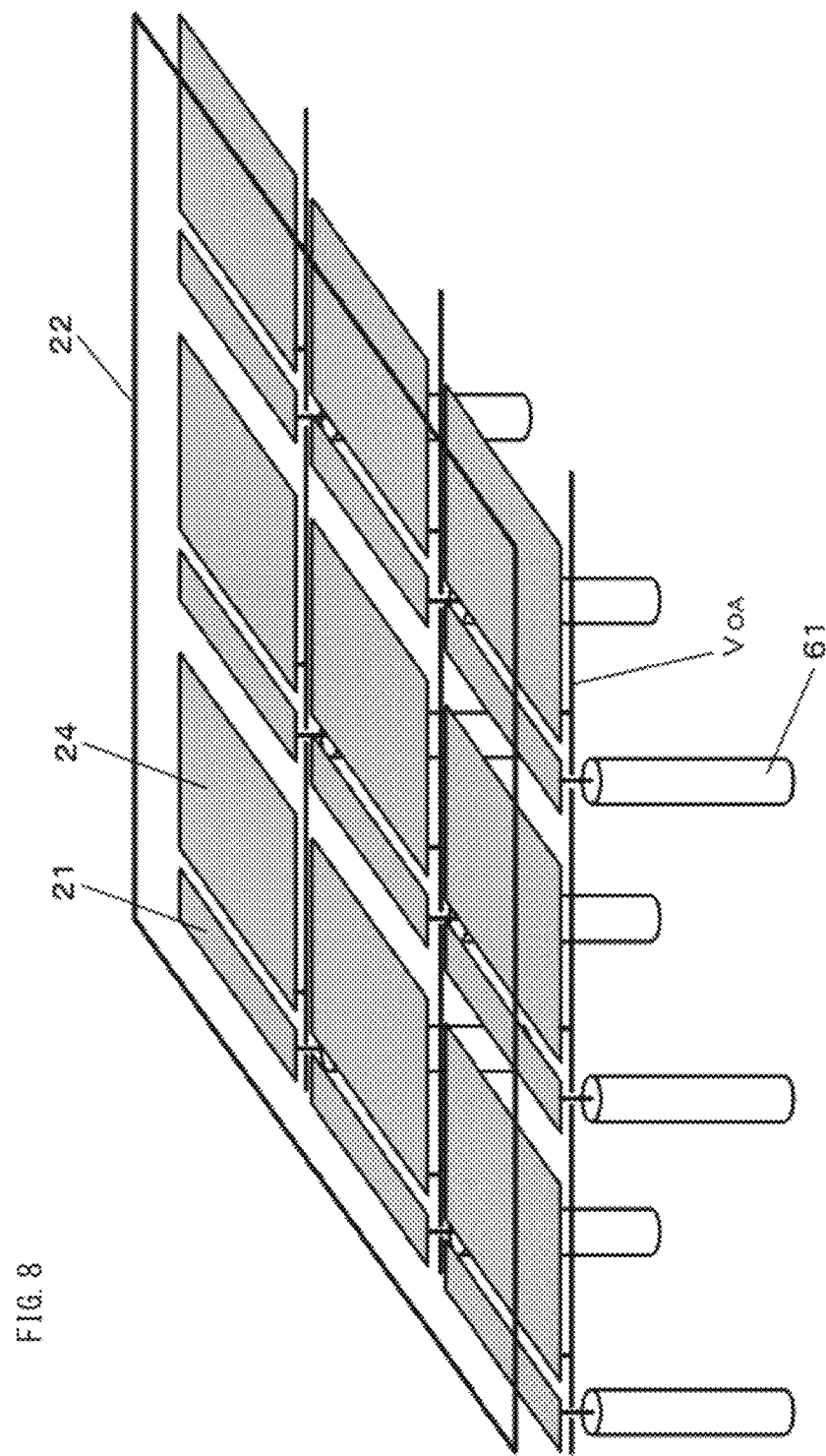
FIG. 8 is a schematic transparent perspective view of the first electrode, the charge accumulation electrode, a second electrode, and a contact hole section included in the imaging element of Example 1.
Figure 68:
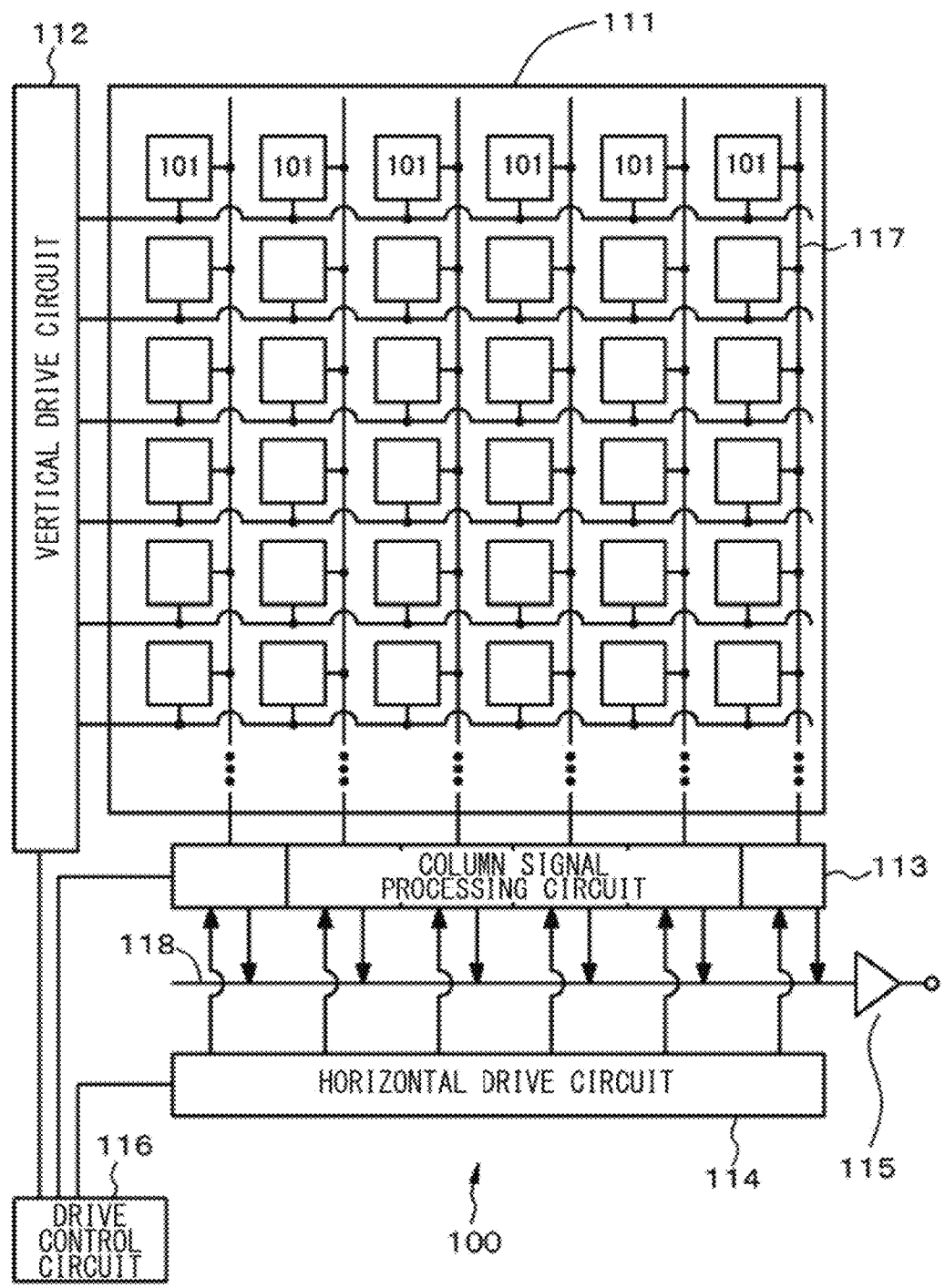
FIG. 68 is a conceptual diagram of a solid-state imaging device of Example 1.

Example 1 relates to the imaging elements of the present disclosure, the stacked imaging element of the present disclosure, the solid-state imaging device according to the second aspect of the present disclosure, and the method of manufacturing the imaging element of the present disclosure. FIG. 1 is a schematic partial cross-sectional view of the imaging element and the stacked imaging element (hereinafter simply referred to as an "imaging element") of Example 1. FIGS. 2 and 3 are equivalent circuit diagrams of the imaging element of Example 1. FIG. 4 is a schematic layout diagram of the first electrode and the charge accumulation electrode included in the photoelectric conversion section, and transistors included in the control section of the imaging element of Example 1. FIG. 5 schematically illustrates a state of potential at each part during operation of the imaging element of Example 1. FIG. 6A is an equivalent circuit diagram for describing each part of the imaging element of Example 1. FIG. 7 is a schematic layout diagram of the first electrode and the charge accumulation electrode included in the photoelectric conversion section of the imaging element of Example 1. FIG. 8 is a schematic transparent perspective view of the first electrode, the charge accumulation electrode, the second electrode, and a contact hole section. Further, FIG. 68 illustrates a conceptual diagram of the solid-state imaging device of Example 1.

It is to be noted that, FIGS. 37, 43, 46A, 46B, 47A, and 47B omit illustration of a photoelectric conversion layer 23A and an inorganic semiconductor material layer 23B, and the photoelectric conversion layer 23A and the inorganic semiconductor material layer 23B are collectively represented by a photoelectric conversion stack 23. In addition, In FIGS. 16, 25, 28, 37, 43, 46A, 46B, 47A, 47B, 66, and 67, various constituent elements of the imaging element positioned below an interlayer insulating layer 81 are collectively denoted by Reference numeral 13 for the sake of convenience in order to simplify the drawings.

The imaging element of Example 1 includes a photoelectric conversion section including a first electrode 21, the photoelectric conversion layer 23A including an organic material, and a second electrode 22 that are stacked, and the inorganic semiconductor material layer 23B is formed between the first electrode 21 and the photoelectric conversion layer 23A.

The photoelectric conversion layer 23A includes C60 having a thickness of 0.1 μm.

The stacked imaging element of Example 1 includes at least one imaging element of Example 1. In addition, the solid-state imaging device of Example 1 includes a plurality of stacked imaging elements of Example 1. Then, the solid-state imaging device of Example 1 is to be included in, for example, a digital still camera, a video camera, a camcorder, a monitoring camera, an on-vehicle camera (vehicle-mounted camera), a smartphone camera, a user interface camera for games, and a biometric authentication camera.

In the imaging element of Example 1, the value ΔEN (=$EN_{anion}$−$EN_{cation}$) is less than 1.695, and preferably 1.624 or less, which results from subtracting the average value $EN_{cation}$ of electronegativities of the cationic species included in the inorganic semiconductor material layer 23B from the average value $EN_{anion}$ of electronegativities of the anionic species included in the inorganic semiconductor material layer 23B.

Here, when the inorganic semiconductor material layer 23B is represented by $(A^1_{a1}A^2_{a2}A^3_{a3} \ldots A^M_{aM})(B^1_{b1}B^2_{b2}B^3_{b3} \ldots B^N_{bN})$ [where $A^1, A^2, A^3, \ldots,$ and $A^M$ are cationic species, $B^1, B^2, B^3, \ldots,$ and $B^N$ are anionic species, and a1, a2, a3, ..., and aM, and b1, b2, b3, ..., and bN are values corresponding to atomic percentages, with the total thereof being 1.00], $$EN_{anion} = \frac{(B1 \times b1 + B2 \times b2 + B3 \times b3 \ldots + BN \times bN)}{(b1 + b2 + b3 \ldots + bN)}$$

$$EN_{cation} = \frac{(A1 \times a1 + A2 \times a2 + A3 \times a3 \ldots + AM \times aM)}{(a1 + a2 + a3 \ldots + aM)}$$

hold true, where B1, B2, B3, ..., and BN are electronegativities of the anionic species $B^1, B^2, B^3, \ldots,$ and $B^N$, and A1, A2, A3, ..., and $A^M$ are electronegativities of the cationic species $A^1, A^2, A^3, \ldots,$ and $A^M$.

The cationic species include at least one type of cationic species selected from the group consisting of Zn, Ga, Ge, Cd, In, Al, Ti, B, Si, Sn, Hg, Tl, and Pb, and the anionic species include at least one type of anionic species selected from the group consisting of O, N, S, and F. Specifically, for example, a configuration $(In_{a1}Ga_{a2}Sn_{a3}O_{b1})$ may be adopted in which the cationic species include Ga, In, and Sn, and the anionic species include O. Alternatively, a configuration $(A^1{}_{a1}Zn_{a2}Sn_{a3}O_{b1})$ may be adopted in which the cationic species include Zn, Al, and Sn, and the anionic species include O.

Electric charge generated in the photoelectric conversion layer 23A moves to the first electrode 21 via the inorganic semiconductor material layer 23B; in this case, the electric charge is an electron. The inorganic semiconductor material layer 23B has a thickness of $1\times10^{-8}$ m to $1.5\times10^{-7}$ m. The inorganic semiconductor material layer 23B has a carrier mobility of 10 cm²/V·s or more; the inorganic semiconductor material layer 23B has a carrier density (carrier concentration) of $1\times10^{16}/cm^3$ or less; and the inorganic semiconductor material layer 23B is amorphous. The inorganic semiconductor material has an optical gap of 2.8 eV or more and 3.2 eV or less, and preferably 3.0 eV or more and 3.2 eV or less; and the inorganic semiconductor material has an oxygen deficiency generation energy of 2.6 eV or more, and desirably 3.0 eV or more.

$$E_1 \geq E_0$$

desirably, $$E_1 - E_0 \geq 0.1 \text{ (eV)}$$

and more desirably, $$E_1 - E_0 > 0.1 \text{ (eV)}$$

is satisfied, where $E_0$ denotes a LUMO value of a material included in the photoelectric conversion layer 23A, and $E_1$ denotes a minimum energy value of a conduction band of an inorganic semiconductor material included in the inorganic semiconductor material layer 23B.

The photoelectric conversion section further includes an insulating layer 82, and a charge accumulation electrode 24 disposed at a distance from the first electrode 21 and disposed to be opposed to the inorganic semiconductor material layer 23B with the insulating layer 82 interposed therebetween. Specifically, the inorganic semiconductor material layer 23B includes a region in contact with the first electrode 21, a region that is in contact with the insulating layer 82 and below which the charge accumulation electrode 24 is not present, and a region that is in contact with the insulating layer 82 and below which the charge accumulation electrode 24 is present. Then, light enters from the second electrode 22. The surface roughness Ra of a surface of the inorganic semiconductor material layer 23B at an interface between the photoelectric conversion layer 23A and the inorganic semiconductor material layer 23B is 1.5 nm or less, and the root mean square roughness Rq of the surface of the inorganic semiconductor material layer 23B is 2.5 nm or less. The surface roughness Ra of a surface of the charge accumulation electrode 24 is 1.5 nm or less, and the root mean square roughness Rq of the surface of the charge accumulation electrode 24 is 2.5 nm or less.

The inorganic semiconductor material layer 23B is formed on the basis of a sputtering method, a vacuum deposition method, or the like, for example, in a state of an amorphous thin film. As illustrated in (A) of FIG. 71, in a state immediately after film formation (As depo), there are a large amount of unstable dangling bonds in the inorganic semiconductor material layer 23B, and thus the inorganic semiconductor material layer 23B exhibits no electric conductivity. Therefore, applying an annealing process to the inorganic semiconductor material layer 23B in an atmosphere containing water vapor (in an atmospheric atmosphere, etc.) causes hydrogen from the water vapor to be diffused and infiltrated to the inside of the inorganic semiconductor material layer 23B as indicated by the formula below, thus making it possible to accelerate structural changes, eliminate the unstable dangling bonds (see (B) of FIG. 71), and convert them into stable metal-oxygen bonds (see (C) of FIG. 71 and (D) of FIG. 71). This makes it possible to impart favorable characteristics to the inorganic semiconductor material layer 23B. In order to thus diffuse and infiltrate the hydrogen required to stabilize an atomic structure of the inorganic semiconductor material layer 23B into an accumulation layer, a temperature higher than 250° C. is necessary, for example, in $InGaZnO_4$.

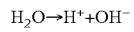

$$H_2O \rightarrow H^+ + OH^-$$

In addition, as illustrated in (E) of FIG. 71, (F) of FIG. 71, (G) of FIG. 71, and (H) of FIG. 71, the diffusion and infiltration of hydrogen also accelerate formation of metal-hydrogen bonds. In the metal-hydrogen bonds, hydrogen serves as a hydride ion ($H^-$), which is effective in stabilizing and deactivating excess carriers. This leads to a reduction in the carrier density in the inorganic semiconductor material layer 23B, which enables an increase in the amount of electric charge accumulated in the inorganic semiconductor material layer 23B. On the contrary, suppose a case where a material included in the inorganic semiconductor material layer 23B is used for a channel structure part of a thin film transistors (TFT), a carrier density of about $10^{19}/cm^3$ or more is required unlike the case where the inorganic semiconductor material layer 23B is used for the imaging element. Therefore, such an annealing process is a suitable for the manufacture of the imaging element, rather than a process for the manufacture of the thin film transistor.

In addition, the annealing process at 250° C. or lower enables prevention of damage occurrence to a drive circuit for driving the imaging element or to a semiconductor substrate and enables improvement in a degree of freedom of process such as enabling the use of a plastic substrate as the substrate.

The present disclosure thus provides a criterion for selecting a material that enables a low-temperature annealing process, such as an annealing process at 250° C. or lower suitable for the inorganic semiconductor material layer 23B. The selection criterion is used to allow the inorganic semiconductor material layer 23B to have a high covalent bonding property; the ΔEN, which is an index thereof, may be calculated from a composition of the material of the inorganic semiconductor material layer 23B. Specifically, in a case where the composition of the material included in the inorganic semiconductor material layer 23B is $In_{a1}Ga_{a2}Zn_{a3}O_{b1}N_{b2}$, the following hold true:

electronegativity of indium (In) = 1.78 electronegativity of gallium (Ga) = 1.81 electronegativity of zinc (Zn) = 1.65 electronegativity of oxygen (O) = 3.44 electronegativity of nitrogen (N) = 3.04 and $$EN_{anion} = \frac{(3.44 \times b1 + 3.04 \times b2)}{(b1 + b2)}$$

$$EN_{cation} = \frac{(1.78 \times a1 + 1.81 \times a2 + 1.65 \times a3)}{(a1 + a2 + a3)}.$$

The electronegativity of each element is set forth, for example, in A. L. Allred, Journal of Inorganic and Nuclear Chemisty, vol. 17, 1961, p 215. In addition, the ΔEN, which is an index of a covalent bonding property, is represented by:

$$\Delta EN = EN_{anion} - EN_{cation}.$$

Here, a smaller value of the ΔEN indicates a higher covalent bonding property.

The electronegativity is defined as force that attracts a covalent electron pair. For example, a bond between an oxygen (O) atom having a high electronegativity of 3.44 and a zinc (Zn) atom having a relatively low electronegativity of 1.65 exhibits a ΔEN value of 1.79 (=3.44−1.65). The zinc (Zn) atom has weak force to attract a covalent electron pair, whereas the oxygen (O) atom has strong force to attract. Accordingly, the covalent electron pair is positioned on side of the oxygen atom, and thus the oxygen atom is largely negatively charged, whereas the zinc atom is positively charged. As a result, bonds are formed by electrostatic interactions. This is a feature of "ionic bond", and ZnO has a high ionic bonding property.

Meanwhile, a bond between an oxygen (O) atom having a high electronegativity of 3.44 and a tin (Sn) atom having a relatively high electronegativity of 1.96 exhibits a ΔEN value of 1.48 (=3.44−1.48), which is a value lower than the ΔEN value of ZnO. That is, covalent electron pairs mediating cation-anion bonding in the inorganic semiconductor material layer 23B is biased toward the middle of the bond as compared with ZnO, and the negative charge of the oxygen atom and the positive charge of the tin atom are small (close to neutral than both of them). This case is referred to as having a high covalent bonding property. Therefore, a material having a high covalent bonding property may be defined as having a small ΔEN. Description is given later, on the basis of Examples, of a range to be taken by the ΔEN in order to allow an annealing process to be performed at a low temperature and in an atmospheric atmosphere in the inorganic semiconductor material layer 23B.

Next, description is given, with reference to FIG. 72, of the reason why hydrogen is more easily diffused and infiltrated to the inorganic semiconductor material layer 23B in the case of a high covalent bonding property. FIG. 72 schematically illustrates electric distributions (electrostatic potentials) of a material having a high covalent bonding property and a material having a high ionic bonding property. As illustrated in (A) of FIG. 72, in a material having a higher covalent bonding property, the covalent electron pair exists between a metal element M1 and an oxygen atom O, thus causing polarization to be small and undulation of the electrostatic potential to be also small. Hydrogen is diffused in a state of H⁺ protons; thus, in a case where the undulation of the electrostatic potential is small, hydrogen is easily diffused in the inorganic semiconductor material layer 23B. On the contrary, as illustrated in (B) of FIG. 72, in a material having a high ionic bonding property, the covalent electron pair is biased toward the side of the oxygen atom between a metal element M2 and an oxygen atom O, thus causing undulation of the electrostatic potential to be large, and high energy is required for hydrogen to be diffused. Accordingly, the higher covalent bonding property (i.e., smaller ΔEN value) enables hydrogen to be diffused despite a low annealing temperature.

Further, unlike the TFT, the inorganic semiconductor material layer 23B in the imaging element needs to have reduced carrier density. For this reason, it is necessary to increase the number of hydrogen (H⁻; hydride ion) to be directly bonded to a cation. Unlike a proton (H⁺), the hydride ion (H⁻) is an ion having two electrons and being negatively charged. When being diffused by an annealing process in the atmospheric atmosphere, hydrogen exists mainly in a state of proton (H⁺), but deactivates carriers (i.e., electrons existing in a conduction band) to become the hydride ion (H⁻), thus enabling a decrease in the carrier density in the conduction band. This effect leads to deterioration of the characteristics of a TFT due to lowered carrier mobility in the TFT, but gives a desirable effect of lowered carrier density in the inorganic semiconductor material layer 23B.

Here, a cation likely to generate the hydride ion is an element having "relatively high electronegativity among metal elements". That is, as an index, it is sufficient to select an element having high $EN_{cation}$, and thus to consequently lower the ΔEN. This is equivalent to the above-described index of the hydrogen diffusion. Accordingly, the material-design guideline for lowering the ΔEN is a suitable guideline for simultaneously enhancing the two effects of the hydrogen diffusion and the generation of the hydride ion (H⁻) that are necessary for the inorganic semiconductor material layer 23B.

Description is given of the reason why an element having relatively high electronegativity among metal elements is more likely to generate the hydride ion (H⁻), in accordance with the basic theory of chemistry, such as the basic theory of quantum chemistry and HSAB (Hard and Soft, Acids and Basis). A metal element M having an unoccupied orbital on low-energy side is likely to form a bond of a covalent bonding property when being bonded to an anion, and has high electronegativity (see (A) of FIG. 73). On the contrary, a metal element having an unoccupied orbital on high-energy side is likely to form a bond of an ionic bonding property when being bonded to an anion, and has low electronegativity (see (B) of FIG. 73). It is to be noted that, in FIG. 73, "H-s" indicates an s orbital of hydrogen. For example, an alkali metal or an alkaline earth metal such as Li or Mg is very likely to form an ionic bond. Meanwhile, Si or Tn is likely to form a covalent bond. In addition, there are also ions, in anions, that are likely to form covalent bonds and ions that are likely to form ionic bonds. An anion having a stable occupied orbital such as fluorine (F) or chlorine (Cl) is likely to form an ionic bond, and has high electronegativity. Nitrogen (N) and sulfur (S) are likely to form a covalent bond, and has low electronegativity. An anion that is likely to form a covalent bond (an ion having lower electronegativity among anions) and a cation that is likely to form a covalent bond (an ion having relatively high electronegativity among cations) have favorable compatibility, and are likely to form a strong covalent bond. The anion that is likely to form a covalent bond is referred to as a "soft" acid, and a cation that is likely to form a covalent bond is referred to as a "soft" base.

Here, the hydride ion is an anion in a category of a very high covalent bonding property, i.e., the very "soft" acid, and thus has favorable compatibility with the "soft" cation. The "soft" cation is the same meaning as that of a metal ion having high electronegativity, and thus selection of a metal element or a composition that makes $EN_{cation}$ higher enables an increase in hydride ions in the inorganic semiconductor material layer 23B. As described above, the hydride ion has an effect of stabilizing and deactivating carrier electric charge (electron), and thus is able to contribute to achieving physical properties suitable for the inorganic semiconductor material layer 23B having lower carrier density.

In addition, it is desirable for the inorganic semiconductor material layer 23B to have high carrier mobility because of necessity of transferring signal charge within a limited period of time. For this purpose, it is preferred to use an inorganic semiconductor material (or an inorganic oxide semiconductor material) to be included in the inorganic semiconductor material layer 23B. Among those, it is preferred to use a metal element having a closed-shell d orbital, for example. Specific examples of the metal element having the closed-shell d orbital include Cu, Ag, Au, Zn, Ga, Ge, Cd, In, Sn, Hg, Tl, and Pb.

Thin-film transistors (TFTs) of samples for evaluation (Examples 1A and 1B and Comparative Example 1) were prepared experimentally on the basis of various inorganic semiconductor materials. Specifically, the samples for evaluation were back-gate type TFTs in which an n-Si substrate was used as a gate electrode, an insulating film including $SiO_2$ and having a thickness of 150 nm was formed as a gate insulating film on the substrate, an inorganic semiconductor material layer (thickness: 60 nm) was formed on the insulating film, and a source electrode and a drain electrode were formed on the inorganic semiconductor material layer. After the preparation of the samples for evaluation, the inorganic semiconductor material layers were subjected to an anneal process (an anneal process in an atmospheric atmosphere containing water vapor) at 250° C. for 2 hours. Results of determination of subthreshold values (unit: volt/dec.) of the resulting samples for evaluation are listed in Table 1 below. It is to be noted that the subthreshold values (SS values) are determined by [d $(V_{GS})$/{d($\log_{10}$(ID)}], and it can be said that a smaller value is superior in the switching property. Further, (A) of FIG. 74 (Example 1A), (B) of FIG. 74 (Example 1B), and (C) of FIG. 74 (Comparative Example 1) illustrate results of evaluation of a relationship between VGS and ID in the TFT, as TFT characteristics. Note that, in Example 1B, the following hold true:

$a1 = 0.04$ or less $a2 = 0.5$ to $0.7$ $a3 = 0.3$ to $0.5$ $b1 = d = 1.5 \times a1 + a2 + a3$.

TABLE 1

|  |  | ΔEN | SS Value |
| --- | --- | --- | --- |
| Example 1A | InGaSnO | 1.605 | 0.10 |
| Example 1B | $Al_{a1}Zn_{a2}Sn_{a3}O_{b1}$ | 1.624 | 0.30 |
| Comparative example 1 | $In_{1.0}Ga_{1.0}Zn_{1.0}O_{4.0}$ | 1.695 | not modulated |

Here, as a value of the rising part of the TFT characteristics (VON) is shifted to negative side, the carrier density becomes larger. Therefore, it is obvious from (A), (B), and (C) of FIG. 74 that the carrier density is the lowest in Example 1A, and becomes higher in the order of Example 1B and Comparative Example 1. In Comparative Example 1, the carrier density is too high, and thus the carrier density is not zero in a region illustrated in (C) of FIG. 74 even when the voltage VGS is applied to the negative side, causing a current to continue to flow.

The characteristics of Comparative Example 1 do not enable accumulation of electric charge in the inorganic semiconductor material layer 23B, and thus using as the inorganic semiconductor material layer 23B is not possible. In contrast, in Example 1B, ΔEN=1.624 holds true; the TFT was modulated, and the SS value was also 0.30 volts/dec. That is, it is possible to accumulate electric charge in the inorganic semiconductor material layer 23B, and thus using as the inorganic semiconductor material layer 23B is possible. Further, in Example 1A in which ΔEN=1.605 holds true, the SS value is 0.10 volts/dec., thus enabling faster switching. In Example 1A, it is possible to acquire an image/picture with less residual image as compared with Example 1B.

For reference, FIG. 75A illustrates results of evaluation of a relationship between VGS and ID in the TFT, as TFT characteristics, when setting an annealing temperature from 250° C. through 280° C. to 350° C., and FIG. 75B illustrates results of determination of aryl temperature and hydrogen concentration, in Comparative Example 1 using $In_{1.0}Ga_{1.0}Zn_{1.0}O_{4.0}$ (IGZO). It is to be noted that, in FIG. 75A, "A" is data at an annealing temperature of 250° C., "B" is data at an annealing temperature of 280° C., and "C" is data at an annealing temperature of 350° C.; it was appreciated that a higher annealing temperature causes the TFT to operates at a lower value of VGS. In addition, it was appreciated that a higher annealing temperature causes the hydrogen concentration to be higher.

As described above, the method of manufacturing the imaging element in Example 1 is a method of manufacturing an imaging element including sequentially forming, on an underlayer (specifically, insulating layer 82) in which the first electrode 21 is formed, the inorganic semiconductor material layer 23B, the photoelectric conversion layer 23A including an organic material, and the second electrode 22. Then, after the formation of the inorganic semiconductor material layer 23B, an annealing process is applied at 250° C. or less, preferably at 150° C. or more in an atmosphere containing water vapor. Specifically, for example, it is sufficient to apply an annealing process by means of an atmospheric atmosphere containing water vapor after the formation of the inorganic semiconductor material layer 23B and before the formation of the photoelectric conversion layer 23A.

In a case where $In_{a1}Ga_{a2}Sn_{a3}O_{b1}$ is included in the inorganic semiconductor material layer 23B, it is preferred to satisfy a1>a2 and a1>a3. In this case, it is preferred to satisfy a1>a2>a3, or it is preferred to satisfy a1>a3>a2, and it is more preferred to satisfy a1>a2>a3. Alternatively, in these cases, a mode may be adopted in which:

$$a1 + a2 + a3 + b1 = 1.00$$
$$0.4 < a1/(a1 + a2 + a3) < 0.5$$
$$0.3 < a2/(a1 + a2 + a3) < 0.4$$
$$0.2 < a3/(a1 + a2 + a3) < 0.3$$

are satisfied. Alternatively, a mode may be adopted in which:

$$a1 + a2 + a3 + b1 = 1.00$$
$$0.30 < a1/(a1 + a2 + a3) < 0.55$$
$$0.20 < a2/(a1 + a2 + a3) < 0.35$$
$$0.25 < a3/(a1 + a2 + a3) < 0.45$$

are satisfied.

In addition, in a case where $Al_{a1}Zn_{a2}Sn_{a3}O_{b1}$ is included in the inorganic semiconductor material layer 23B, satisfying:

$$0.88 \times (a3 - 0.3) > 0.12 \times a1 \qquad (1)$$

where a1+a2+a3=1.00 as well as a1>0, a2>0, and a3>0 hold true (the same applies to the following) makes it possible to satisfy a definition of ΔEN being less than 1.695. Here, in FIG. 76A, a solid line "A" indicates a straight line satisfying:

$$0.88 \times (a3 - 0.3) = 0.12 \times a1.$$

A region satisfying expression (1) is a region surrounded by a point $p_1$, a point $p_2$, and a point $p_3$ of FIG. 76A.

It is to be noted that, a simulation is performed to determine electronic state density, or first principle calculation is performed, in $Al_{a1}Zn_{a2}Sn_{a3}O_{b1}$ in which values of the composition (a1, a2, and a3) are changed variously, to thereby determine values correlated with values of the optical gap, the carrier mobility, and the oxygen deficiency generation energy. On the basis of the determined values, the values of (a1, a2, and a3) are linearly determined, from which the optical gap, the oxygen deficiency generation energy, and the carrier mobility of desired values are obtained. This makes it possible to obtain later-described expression (2), expression (2'), expressions (3-1) and (3-2), expressions (3-1') and (3-2'), expressions (3-1), (3-2), (3-1") and (3-2"), and expression (4).

Here, in a case where $Al_{a1}Zn_{a2}Sn_{a3}O_{b1}$ is to be included in the inorganic semiconductor material layer 23B, an optical gap of an inorganic semiconductor material (simply referred to as the "inorganic semiconductor material" in some cases) included in the inorganic semiconductor material layer 23B is determined mainly by a ratio between aluminum atoms and tin atoms (proportion of the number of atoms) in the composition of the inorganic semiconductor material; as the ratio of aluminum atoms becomes higher, the value of the optical gap becomes larger. In order for the inorganic semiconductor material layer to be transparent in a visible-light range, the optical gap is required to be 2.8 eV or more. Meanwhile, in order for the inorganic semiconductor material layer to reliably receive electric charge generated in the photoelectric conversion layer, the level of a conduction band of the inorganic semiconductor material is required to be deeper than the level of a conduction band of a material included in the photoelectric conversion layer; for that purpose, the inorganic semiconductor material preferably has an optical gap of, for example, 3.2 eV or less. In addition, the likelihood of occurrence of oxygen deficiency (in other words, low value in the oxygen deficiency generation energy) of the inorganic semiconductor material is determined mainly by the ratio between aluminum atoms and tin atoms (proportion of atomic numbers) in the composition of the inorganic semiconductor material; as the ratio of tin atoms becomes higher, the oxygen deficiency of the inorganic semiconductor material is more likely to occur, resulting in crystal defect being more likely to occur. The inorganic semiconductor material layer is provided to accumulate electric charge generated in the photoelectric conversion layer and to transfer the electric charge to a first electrode, and thus generation of carriers due to the crystal defect and the oxygen deficiency of the inorganic semiconductor material layer leads to an increase in carrier density and to an increase in a dark current, thus deteriorating an S/N ratio of the imaging element. Further, the inorganic semiconductor material layer is provided to transfer electric charge generated in the photoelectric conversion layer to the first electrode; therefore, when a transfer rate is slow, it takes time to read out a signal from the imaging element, thus making it hardly possible to obtain an appropriate frame rate required by the solid-state imaging device. In order to increase the transfer rate, carrier mobility of the inorganic semiconductor material layer, i.e., field mobility needs to be increased. As for a relationship between the ratio between aluminum atoms and zinc atoms (proportion of the number of atoms) in the composition of the inorganic semiconductor material and the carrier mobility, as the ratio of zinc atoms becomes higher, the value of the carrier mobility becomes lower. As for a relationship between the ratio between tin atoms and zinc atoms (proportion of the number of atoms) in the composition of the inorganic semiconductor material and the carrier mobility, as the ratio of zinc atoms becomes higher, the value of the carrier mobility becomes lower.

In addition, adopting a mode in which:

$$0.36 \times (a3 - 0.62) \leq 0.64 \times a1 \leq 0.36 \times a3 \qquad (2)$$

is satisfied enables the inorganic semiconductor material to achieve the optical gap of 2.8 eV or more and 3.2 eV or less. Employing the mode enables the inorganic semiconductor material layer to be a transparent layer with respect to incident light, and eliminates the possibility of causing a barrier to movement of electric charge from the photoelectric conversion layer to the inorganic semiconductor material layer. Here, in FIG. 76B, a dotted line "B" indicates a straight line satisfying:

$$0.36 \times (a3 - 0.62) = 0.64 \times a1,$$

and a dotted line "C" indicates a straight line satisfying:

$$64 \times a1 = 0.36 \times a3.$$

Alternatively, a mode may be adopted in which the inorganic semiconductor material has an optical gap of 3.0 eV or more and 3.2 eV or less to allow the inorganic semiconductor material layer to be a layer transparent to incident light in a still wider wavelength range. In addition, in the imaging element or the like of the present disclosure including such a preferred mode, adopting a mode in which:

$$0.36 \times (a3 - 0.25) \le 0.64 \times a1 \le 0.36 \times a3 \quad (2')$$

is satisfied enables the inorganic semiconductor material to achieve the optical gap of 3.0 eV or more and 3.2 eV or less.
In addition, adopting a mode in which:

$$a3 \le 0.67 \quad (3\text{-}1)$$

and $$0.60 \times (a3 - 0.61) \le 0.40 \times a1 \quad (3\text{-}2)$$

are satisfied enables the inorganic semiconductor material to achieve the oxygen deficiency generation energy of 2.6 eV or more. Here, in FIG. 76B, a dotted line "$D_1$" indicates a straight line satisfying:

$$a3 = 0.67,$$

and a dotted line "$D_2$" indicates a straight line satisfying:

$$0.60 \times (a3 - 0.61) = 0.40 \times a1.$$

Alternatively, a mode may be adopted in which the inorganic semiconductor material has an oxygen deficiency generation energy of 3.0 eV or more. In addition, in the imaging element or the like of the present disclosure including such a preferred mode, adopting a mode in which:

$$a3 \le 0.53 \quad (3\text{-}1')$$

and $$0.35 \times (a3 - 0.32) \le 0.65 \times a1 \quad (3\text{-}2')$$

are satisfied enables the inorganic semiconductor material to achieve the oxygen deficiency generation energy of 3.0 eV or more. Here, in FIG. 76B, a dotted line "$E_1$" indicates a straight line satisfying:

$$a3 = 0.53,$$

and a dotted line "$E_2$" indicates a straight line satisfying:

$$0.35 \times (a3 - 0.32) = 0.65 \times a1.$$

Alternatively, a higher value of the oxygen deficiency generation energy may lead to a case of a lower value of the carrier mobility; in such a case, a mode may be adopted in which the inorganic semiconductor material has an oxygen deficiency generation energy of 2.6 eV or more and 3.0 eV or less. In addition, in the imaging element or the like of the present disclosure including such a preferred mode, adopting a mode in which:

$$a3 \le 0.67 \quad (3\text{-}1)$$

$$0.60 \times (a3 - 0.61) \le 0.40 \times a1 \quad (3\text{-}2)$$

$$a3 \ge 0.53 \quad (3\text{-}1'')$$

and $$0.35 \times (a3 - 0.32) \ge 0.65 \times a1 \quad (3\text{-}2'')$$

are satisfied enables the inorganic semiconductor material to achieve the oxygen deficiency generation energy of 2.6 eV or more and 3.0 eV or less.
Further, adopting a mode in which:

$$a3 \ge a2 - 0.54 \quad (4)$$

is satisfied makes it possible to impart, to the inorganic semiconductor material layer, high carrier mobility, specifically, a high carrier mobility of 10 cm$^2$/V·s or more. As a result, it is possible to quickly move electric charge accumulated in the inorganic semiconductor material layer to the first electrode. Here, in FIG. 76B, a dotted line "F" indicates a straight line satisfying:

$$a3 = a2 - 0.54.$$

In addition, the inorganic semiconductor material layer preferably has a carrier density of $1 \times 10^{16}$/cm$^3$ or less, which enables an increase in the amount of electric charge accumulated in the inorganic semiconductor material layer.

Here, a region of (a1, a2, and a3) satisfying expression (1), expression (2), expression (3-1), expression (3-2), and expression (4) illustrated in FIG. 76B is a region surrounded by a point $p_2$, a point $p_4$, a point $p_5$, a point $p_6$, a point $p_7$, and a point $p_8$.

Alternately, when the composition of the inorganic semiconductor material included in the inorganic semiconductor material layer is represented by $M_{a1}N_{a2}Sn_{a3}O_{b1}$ (where M denotes an aluminum atom, and N denotes a gallium atom or a zinc atom, or a gallium atom and a zinc atom), it is preferred to satisfy:

$$a1 + a3 + a2 = 1.00$$

$$0.01 \le a1 \le 0.04$$

and $$a3 < a2,$$

and it is preferred to further satisfy a1<a3<a2.

In the imaging element of Example 1, defining the ΔEN as being less than 1.695 makes it is possible to form the inorganic semiconductor material layer under an annealing condition at a low temperature. As a result, it is possible to suppress occurrence of damage to other layers included in the imaging element, thus making it possible to achieve improvement in yield and improvement in durability of the imaging element, and to further decrease the SS value, thereby enabling high-speed operation. Therefore, it is possible to achieve an imaging element that allows for a picture/image with less residual image. In addition, it is possible to obtain an inorganic semiconductor material layer having superior balance of characteristics such as the carrier mobility, the carrier density, the SS value, and the transparency with respect to incident light. Further, it is possible to achieve, in a well-balanced manner, optimization of the carrier density of the inorganic semiconductor material layer (optimization of a degree of depletion of the inorganic semiconductor material layer), high carrier mobility of an inorganic semiconductor material layer included in the inorganic semiconductor material layer, control of the minimum energy value $E_1$ of the conduction band of the inorganic semiconductor material included in the inorganic semiconductor material layer, and suppression of generation of the oxygen deficiency in the inorganic semiconductor material layer. Therefore, despite the simple configuration and structure, it is possible to provide an imaging element, a stacked imaging element, and a solid-state imaging device having less loss of incident light and being superior in transfer characteristic for the electric charge accumulated in the photoelectric conversion layer. Moreover, the inorganic semiconductor material layer is stable with respect to a manufacturing process of the imaging element after formation of the inorganic semiconductor material layer, and it is also possible to suppress aged deterioration of the imaging element, the stacked imaging element, and the solid-state imaging device. In addition, the energy level $E_1$ of the conduction band of the inorganic semiconductor material is formed to be deeper than the LUMO value $E_0$ of the material included in the photoelectric conversion layer. As a result, an energy barrier between the inorganic semiconductor material layer and the adjacent photoelectric conversion layer is reduced, and it is thus possible to achieve reliable movement of electric charge from the photoelectric conversion layer to the inorganic semiconductor material layer. Also, the escape of holes is suppressed. In addition, because the photoelectric conversion section has a two-layer structure of the inorganic semiconductor material layer and the photoelectric conversion layer, it is possible to prevent recombination during charge accumulation, and it is possible to further increase the efficiency of transfer of the electric charge accumulated in the photoelectric conversion layer to the first electrode. Further, it is possible to temporarily hold the electric charge generated in the photoelectric conversion layer to thereby control the timing of transfer and the like. It is also possible to suppress the generation of a dark current. Moreover, in the method of manufacturing the imaging element of Example 1, the annealing process is applied at 250° C. or less in an atmosphere containing water vapor after the formation of the inorganic semiconductor material layer, thus making it possible to suppress occurrence of damage to other layers included in the imaging element, and to achieve improvement in the yield and improvement in durability of the imaging element. In addition, it is possible to manufacture an imaging element having superior characteristics.

Furthermore, even under the annealing condition at a low temperature such as 250° C., it is possible to achieve characteristics that obviously exceed IGZO. In addition, in the present disclosure, accelerating the diffusion of hydrogen and increasing the covalent bonding property make it possible to increase the rate of direct bonding of H as an H⁻ ion to a metal element. As a result, it is possible to reduce the carrier density. This is opposite to the characteristics required for the thin film transistor (TFT) that needs to have higher carrier density. That is, it can be said that a material having a higher covalent bonding property is suitable for the inorganic semiconductor material layer but is not suitable for the thin film transistor.

In the following, an overall description is given of the imaging element of the present disclosure, the stacked imaging element of the present disclosure, and the solid-state imaging device according to the second aspect of the present disclosure, and thereafter, a detailed description is given of the imaging element and the solid-state imaging device of Example 1. Symbols representing potentials to be applied to various electrodes described below are listed in the following Table 2.

TABLE 2

|  | Charge accumulation period | Charge transfer period |
| --- | --- | --- |
| First electrode | $V_{11}$ | $V_{12}$ |
| Second electrode | $V_{21}$ | $V_{22}$ |
| Charge accumulation electrode | $V_{31}$ | $V_{32}$ |
| Charge movement control electrode | $V_{41}$ | $V_{42}$ |
| Transfer control electrode | $V_{51}$ | $V_{52}$ |
| Charge drain electrode | $V_{61}$ | $V_{62}$ |

For the sake of convenience, the imaging element or the like of the present disclosure that includes the preferred mode described above and that includes the charge accumulation electrode is hereinafter referred to as an "imaging element or the like including the charge accumulation electrode of the present disclosure" in some cases.

In the imaging element or the like of the present disclosure, it is preferred that the inorganic semiconductor material layer have a light transmittance of 65% or more for light having a wavelength of 400 nm to 660 nm. In addition, it is preferred that the charge accumulation electrode also have a light transmittance of 65% or more for light having a wavelength of 400 nm to 660 nm. It is preferred that the charge accumulation electrode have a sheet resistance of $3 \times 10 \Omega/\square$ to $1 \times 10^3 \Omega/\square$.

In the imaging element or the like of the present disclosure, a mode may be adopted in which the imaging element or the like further includes a semiconductor substrate, and the photoelectric conversion section is disposed above the semiconductor substrate. It is to be noted that the first electrode, the charge accumulation electrode, the second electrode, and the various electrodes are coupled to a drive circuit described later.

The second electrode positioned on light incident side may be shared by a plurality of imaging elements. That is, the second electrode may be a so-called solid electrode except for the imaging elements or the like including an upper charge movement control electrode of the present disclosure described later. The photoelectric conversion layer may be shared by a plurality of imaging elements, i.e., one photoelectric conversion layer may be formed for a plurality of imaging elements. Alternatively, the photoelectric conversion layer may be provided for each imaging element. The inorganic semiconductor material layer is preferably provided for each imaging element; however, in some cases, may be shared by a plurality of imaging elements. In other words, one inorganic semiconductor material layer may be formed for a plurality of imaging elements by providing, for example, a charge movement control electrode described later between an imaging element and an imaging element. In the case where one inorganic semiconductor material layer is formed that is shared by a plurality of imaging elements, it is desirable that an end part of the inorganic semiconductor material layer be covered with at least the photoelectric conversion layer from the viewpoint of protection of the end part of the inorganic semiconductor material layer.

Further, in the imaging element or the like of the present disclosure including the various preferred modes described above, a mode may be adopted in which the first electrode extends in an opening provided in the insulating layer and is coupled to the inorganic semiconductor material layer. Alternatively, a mode may be adopted in which the inorganic semiconductor material layer extends in the opening provided in the insulating layer and is coupled to the first electrode. In this case, a mode may be adopted in which:

an edge of a top surface of the first electrode is covered with the insulating layer, the first electrode is exposed at a bottom surface of the opening, and a side surface of the opening is sloped to widen the opening from a first surface toward a second surface, where the first surface is a surface of the insulating layer in contact with the top surface of the first electrode, and the second surface is a surface of the insulating layer in contact with a portion of the inorganic semiconductor material layer opposed to the charge accumulation electrode, and further the side surface of the opening that is sloped to widen the opening from the first surface toward the second surface is positioned on side of the charge accumulation electrode.

Further, in the imaging element or the like including the various preferred modes described above, a configuration may be adopted in which:

the imaging element or the like further includes a control section provided in the semiconductor substrate and including a drive circuit, the first electrode and the charge accumulation electrode are coupled to the drive circuit, during a charge accumulation period, from the drive circuit, a potential $V_{11}$ is applied to the first electrode, a potential $V_{31}$ is applied to the charge accumulation electrode, and electric charge is accumulated in the inorganic semiconductor material layer or the like, and during a charge transfer period, from the drive circuit, a potential $V_{12}$ is applied to the first electrode, a potential $V_{32}$ is applied to the charge accumulation electrode, and the electric charge accumulated in the inorganic semiconductor material layer or the like is read out to the control section via the first electrode. Note that the potential of the first electrode is higher than the potential of the second electrode, and $$V_{31} \geq V_{11} \text{ and } V_{32} < V_{12}$$

hold true.

Further, in the imaging element or the like including the various preferred modes described above, a mode may be adopted in which the charge movement control electrode is formed in a region opposed to, with the insulating layer interposed therebetween, a region of the photoelectric conversion layer positioned between adjacent imaging elements. It is to be noted that such a mode is referred to as an "imaging element or the like including a lower charge movement control electrode of the present disclosure" for the sake of convenience in some cases. Alternatively, a mode may be adopted in which the charge movement control electrode is formed, instead of the second electrode, on the region of the photoelectric conversion layer positioned between adjacent imaging elements. It is to be noted that such a mode is referred to as an "imaging element or the like including an upper charge movement control electrode of the present disclosure" for the sake of convenience in some cases.

In the following description, the "region of the photoelectric conversion layer positioned between adjacent imaging elements" is referred to as a "region-A of the photoelectric conversion layer" for the sake of convenience, and a "region of the insulating layer positioned between adjacent imaging elements" is referred to as a "region-A of the insulating layer" for the sake of convenience. The region-A of the photoelectric conversion layer corresponds to the region-A of the insulating layer. Further, a "region between adjacent imaging elements" is referred to as a "region-a" for the sake of convenience.

In the imaging element or the like including the lower charge movement control electrode (lower side/charge movement control electrode, a charge movement control electrode positioned on side opposite to the light incident side with respect to the photoelectric conversion layer) of the present disclosure, the lower charge movement control electrode is formed in a region opposed to the region-A of the photoelectric conversion layer with the insulating layer interposed therebetween. In other words, the lower charge movement control electrode is formed below a portion of the insulating layer (region-A of the insulating layer) in a region (region-a) sandwiched between a charge accumulation electrode and a charge accumulation electrode that are included in respective adjacent imaging elements. The lower charge movement control electrode is provided at a distance from the charge accumulation electrode. Or in other words, the lower charge movement control electrode surrounds the charge accumulation electrode and is provided at a distance from the charge accumulation electrode. The lower charge movement control electrode is disposed to be opposed to the region-A of the photoelectric conversion layer with the insulating layer interposed therebetween.

Then, a mode may be adopted in which:

the imaging element or the like including the lower charge movement control electrode of the present disclosure further includes a control section provided in the semiconductor substrate and including a drive circuit, the first electrode, the second electrode, the charge accumulation electrode, and the lower charge movement control electrode are coupled to the drive circuit, during a charge accumulation period, from the drive circuit, a potential $V_{11}$ is applied to the first electrode, a potential $V_{31}$ is applied to the charge accumulation electrode, a potential $V_{41}$ is applied to the lower charge movement control electrode, and electric charge is accumulated in the inorganic semiconductor material layer or the like, and during a charge transfer period, from the drive circuit, a potential $V_{12}$ is applied to the first electrode, a potential $V_{32}$ is applied to the charge accumulation electrode, a potential $V_{42}$ is applied to the lower charge movement control electrode, and the electric charge accumulated in the inorganic semiconductor material layer or the like is read out to the control section via the first electrode. Note that:

$$V_{31} \geq V_{11}, V_{31} > V_{41} \text{ and } V_{12} > V_{32} > V_{42}$$

hold true. The lower charge movement control electrode may be formed at a level the same as or different from that of the first electrode or the charge accumulation electrode.

In the imaging element or the like including the upper charge movement control electrode (upper side/charge movement control electrode, a charge movement control electrode positioned on the light incident side with respect to the photoelectric conversion layer) of the present disclosure, the upper charge movement control electrode is formed on the region of the photoelectric conversion layer positioned between adjacent imaging elements, instead of the second electrode. The upper charge movement control electrode is provided at a distance from the second electrode. In other words:

[A] a mode may be adopted in which: the second electrode is provided for each imaging element; and the upper charge movement control electrode surrounds at least a portion of the second electrode and is provided, at a distance from the second electrode, on the region-A of the photoelectric conversion layer. Alternatively,

[B] a mode may be adopted in which: the second electrode is provided for each imaging element; the upper charge movement control electrode surrounds at least a portion of the second electrode and is provided at a distance from the second electrode; and a portion of the charge accumulation electrode is present below the upper charge movement control electrode. Alternatively,

[C] a mode may be adopted in which: the second electrode is provided for each imaging element; the upper charge movement control electrode surrounds at least a portion of the second electrode and is provided at a distance from the second electrode; a portion of the charge accumulation electrode is present below the upper charge movement control electrode; and furthermore, the lower charge movement control electrode is formed below the upper charge movement control electrode. In some cases, a potential generated by coupling between the upper charge movement control electrode and the second electrode may be applied to a region of the photoelectric conversion layer positioned below a region between the upper charge movement control electrode and the second electrode.

In addition, a mode may be adopted in which:

the imaging element or the like including the upper charge movement control electrode of the present disclosure further includes a control section provided in the semiconductor substrate and including a drive circuit, the first electrode, the second electrode, the charge accumulation electrode, and the upper charge movement control electrode are coupled to the drive circuit, during a charge accumulation period, from the drive circuit, a potential $V_{21}$ is applied to the second electrode, a potential $V_{41}$ is applied to the upper charge movement control electrode, and electric charge is accumulated in the inorganic semiconductor material layer or the like, and during a charge transfer period, from the drive circuit, a potential $V_{22}$ is applied to the second electrode, a potential $V_{42}$ is applied to the upper charge movement control electrode, and the electric charge accumulated in the inorganic semiconductor material layer or the like is read out to the control section via the first electrode. Note that:

$$V_{21} \geq V_{41} \text{ and } V_{22} \geq V_{42}$$

hold true. The upper charge movement control electrode is formed at a level the same as that of the second electrode.

Further, in the imaging element or the like of the present disclosure including the various preferred modes described above, a mode may be adopted in which the imaging element or the like further includes, between the first electrode and the charge accumulation electrode, a transfer control electrode (charge transfer electrode) disposed at a distance from the first electrode and the charge accumulation electrode and disposed to be opposed to the inorganic semiconductor material layer with the insulating layer interposed therebetween. The imaging element or the like of the present disclosure in such a mode is referred to as an "imaging element or the like including the transfer control electrode of the present disclosure" for the sake of convenience.

Then, in the imaging element or the like including the transfer control electrode of the present disclosure, a mode may be adopted in which:

the imaging element or the like further includes a control section provided in the semiconductor substrate and including a drive circuit, the first electrode, the charge accumulation electrode, and the transfer control electrode are coupled to the drive circuit, during a charge accumulation period, from the drive circuit, a potential $V_{11}$ is applied to the first electrode, a potential $V_{31}$ is applied to the charge accumulation electrode, a potential $V_{51}$ is applied to the transfer control electrode, and electric charge is accumulated in the inorganic semiconductor material layer or the like, and during a charge transfer period, from the drive circuit, a potential $V_{12}$ is applied to the first electrode, a potential $V_{32}$ is applied to the charge accumulation electrode, a potential $V_{52}$ is applied to the transfer control electrode, and the electric charge accumulated in the inorganic semiconductor material layer or the like is read out to the control section via the first electrode. Note that the potential of the first electrode is higher than the potential of the second electrode, and $$V_{31} > V_{51} \text{ and } V_{32} \leq V_{52} \leq V_{12}$$

hold true.

Further, in the imaging element or the like including the various preferred modes described above, a mode may be adopted in which the imaging element or the like further includes a charge drain electrode coupled to the inorganic semiconductor material layer and disposed at a distance from the first electrode and the charge accumulation electrode. The imaging element or the like of the present disclosure in such a mode is referred to as an "imaging element or the like including the charge drain electrode of the present disclosure" for the sake of convenience. Then, in the imaging element or the like including the charge drain electrode of the present disclosure, a mode may be adopted in which the charge drain electrode is disposed to surround the first electrode and the charge accumulation electrode (i.e., in a picture frame form). The charge drain electrode may be shared by (common to) a plurality of imaging elements. Then, in this case, a mode may be adopted in which:

the inorganic semiconductor material layer extends in a second opening provided in the insulating layer and is coupled to the charge drain electrode, an edge of a top surface of the charge drain electrode is covered with the insulating layer, the charge drain electrode is exposed at a bottom surface of the second opening, and a side surface of the second opening is sloped to widen the second opening from a third surface toward a second surface, where the third surface is a surface of the insulating layer in contact with the top surface of the charge drain electrode, and the second surface is a surface of the insulating layer in contact with a portion of the inorganic semiconductor material layer opposed to the charge accumulation electrode.

Further, in the imaging element or the like including the charge drain electrode of the present disclosure, a mode may be adopted in which:

the imaging element or the like further includes a control section provided in the semiconductor substrate and including a drive circuit, the first electrode, the charge accumulation electrode, and the charge drain electrode are coupled to the drive circuit, during a charge accumulation period, from the drive circuit, a potential $V_{11}$ is applied to the first electrode, a potential $V_{31}$ is applied to the charge accumulation electrode, a potential $V_{61}$ is applied to the charge drain electrode, and electric charge is accumulated in the inorganic semiconductor material layer or the like, and during a charge transfer period, from the drive circuit, a potential $V_{12}$ is applied to the first electrode, a potential $V_{32}$ is applied to the charge accumulation electrode, a potential $V_{62}$ is applied to the charge drain electrode, and the electric charge accumulated in the inorganic semiconductor material layer or the like is read out to the control section via the first electrode. Note that the potential of the first electrode is higher than the potential of the second electrode, and $$V_{61} > V_{11} \text{ and } V_{62} < V_{12}$$

hold true.

Further, in the above-described various preferred modes of the imaging element or the like of the present disclosure, a mode may be adopted in which the charge accumulation electrode includes a plurality of charge accumulation electrode segments. The imaging element or the like of the present disclosure in such a mode is referred to as an "imaging element or the like including a plurality of charge accumulation electrode segments of the present disclosure" for the sake of convenience. It is sufficient that the number of the charge accumulation electrode segments is two or more. In the imaging element or the like including a plurality of charge accumulation electrode segments of the present disclosure, in a case where different potentials are applied to N charge accumulation electrode segments, a mode may be adopted in which:

in a case where the potential of the first electrode is higher than the potential of the second electrode, during the charge transfer period, the potential to be applied to a charge accumulation electrode segment (a first photoelectric conversion section segment) positioned closest to the first electrode is higher than the potential to be applied to a charge accumulation electrode segment (an N-th photoelectric conversion section segment) positioned farthest from the first electrode, and in a case where the potential of the first electrode is lower than the potential of the second electrode, during the charge transfer period, the potential to be applied to the charge accumulation electrode segment (the first photoelectric conversion section segment) positioned closest to the first electrode is lower than the potential to be applied to the charge accumulation electrode segment (the N-th photoelectric conversion section segment) positioned farthest from the first electrode.

In the imaging element or the like of the present disclosure including the various preferred modes described above, a configuration may be adopted in which:

at least a floating diffusion layer and an amplification transistor included in the control section are provided in the semiconductor substrate, and the first electrode is coupled to the floating diffusion layer and a gate section of the amplification transistor. Then, in this case, furthermore, a configuration may be adopted in which:

a reset transistor and a selection transistor included in the control section are further provided in the semiconductor substrate, the floating diffusion layer is coupled to one of source/drain regions of the reset transistor, and one of source/drain regions of the amplification transistor is coupled to one of source/drain regions of the selection transistor, and another one of the source/drain regions of the selection transistor is coupled to a signal line.

Further, in the imaging element or the like of the present disclosure including the various preferred modes described above, a mode may be adopted in which the charge accumulation electrode is larger in size than the first electrode. Although not limited, $$4 \leq s_1'/s_1$$

is preferably satisfied, where $s_1'$ denotes the area of the charge accumulation electrode, and $s_1$ denotes the area of the first electrode.

Alternatively, as modification examples of the imaging element or the like of the present disclosure including the various preferred modes described above, imaging elements of first to sixth configurations described below may be adopted. That is, in the imaging elements of the first to sixth configurations in the imaging element or the like of the present disclosure including the various preferred modes described above, the photoelectric conversion section includes N (where N≥2) photoelectric conversion section segments, the inorganic semiconductor material layer and the photoelectric conversion layer include N photoelectric conversion layer segments, the insulating layer includes N insulating layer segments, in the imaging elements of the first to third configurations, the charge accumulation electrode includes N charge accumulation electrode segments, in the imaging elements of the fourth and fifth configurations, the charge accumulation electrode includes N charge accumulation electrode segments disposed at a distance from each other, an n-th (where n=1, 2, 3 . . . N) photoelectric conversion section segment includes an n-th charge accumulation electrode segment, an n-th insulating layer segment, and an n-th photoelectric conversion layer segment, and the photoelectric conversion section segment with a larger value of n is positioned farther away from the first electrode. Here, the "photoelectric conversion layer segment" refers to a segment including the photoelectric conversion layer and the inorganic semiconductor material layer that are stacked.

Then, in the imaging element of the first configuration, the thicknesses of the insulating layer segments gradually change from the first photoelectric conversion section segment to the N-th photoelectric conversion section segment. In addition, in the imaging element of the second configuration, the thicknesses of the photoelectric conversion layer segments gradually change from the first photoelectric conversion section segment to the N-th photoelectric conversion section segment. It is to be noted that, in the photoelectric conversion layer segment, the thickness of the photoelectric conversion layer segment may be changed by changing the thickness of the portion of the photoelectric conversion layer while making the thickness of the portion of the inorganic semiconductor material layer constant. The thickness of the photoelectric conversion layer segment may be changed by changing the thickness of the portion of the inorganic semiconductor material layer while making the thickness of the portion of the photoelectric conversion layer constant. The thickness of the photoelectric conversion layer segment may be changed by changing the thickness of the portion of the photoelectric conversion layer and changing the thickness of the portion of the inorganic semiconductor material layer. Further, in the imaging element of the third configuration, materials included in the insulating layer segments are different between adjacent photoelectric conversion section segments. In addition, in the imaging element of the fourth configuration, materials included in the charge accumulation electrode segments are different between adjacent photoelectric conversion section segments. Further, in the imaging element of the fifth configuration, the areas of the charge accumulation electrode segments gradually decrease from the first photoelectric conversion section segment to the N-th photoelectric conversion section segment. The areas may decrease continuously or may decrease stepwise.

Alternatively, in the imaging element of the sixth configuration in the imaging element or the like of the present disclosure including the various preferred modes described above, the cross-sectional area of a stacked portion in which the charge accumulation electrode, the insulating layer, the inorganic semiconductor material layer, and the photoelectric conversion layer are stacked, as cut along a Y-Z virtual plane, changes in accordance with a distance from the first electrode, where a Z direction is a stacking direction of the charge accumulation electrode, the insulating layer, the inorganic semiconductor material layer, and the photoelectric conversion layer, and an X direction is a direction away from the first electrode. The change in the cross-sectional area may be a continuous change or may be a stepwise change.

In the imaging elements of the first and second configurations, the N photoelectric conversion layer segments are continuously provided, the N insulating layer segments are also continuously provided, and the N charge accumulation electrode segments are also continuously provided. In the imaging elements of the third to fifth configurations, the N photoelectric conversion layer segments are continuously provided. In addition, in the imaging elements of the fourth and fifth configurations, the N insulating layer segments are continuously provided, whereas in the imaging element of the third configuration, the N insulating layer segments are provided to correspond to the respective photoelectric conversion section segments. Further, in the imaging elements of the fourth and fifth configurations, and in the imaging element of the third configuration depending on the case, the N charge accumulation electrode segments are provided to correspond to the respective photoelectric conversion section segments. Then, in the imaging elements of the first to sixth configurations, the same potential is applied to all of the charge accumulation electrode segments. Alternatively, in the imaging elements of the fourth and fifth configurations, and in the imaging element of the third configuration depending on the case, different potentials may be applied to the N charge accumulation electrode segments.

In the imaging element or the like of the present disclosure including any of the imaging elements of the first to sixth configurations, the thicknesses of the insulating layer segments are defined. Alternatively, the thicknesses of the photoelectric conversion layer segments are defined. Alternatively, the materials included in the insulating layer segments are different. Alternatively, the materials included in the charge accumulation electrode segments are different. Alternatively, the areas of the charge accumulation electrode segments are defined. Alternatively, the cross-sectional area of the stacked portion is defined. Therefore, a kind of charge transfer gradient is formed, and it becomes possible to transfer the electric charge generated by the photoelectric conversion to the first electrode more easily and with reliability. Then, as a result, it is possible to prevent generation of residual image or prevent some electric charge from remaining untransferred.

In the imaging elements of the first to fifth configurations, the photoelectric conversion section segment with a larger value of n is positioned farther away from the first electrode. Whether or not the photoelectric conversion section segment is positioned away from the first electrode is determined with respect to the X direction. In addition, while the direction away from the first electrode is the X direction in the imaging element of the sixth configuration, the "X direction" is defined as follows. That is, a pixel region in which a plurality of imaging elements or stacked imaging elements are arranged includes a plurality of pixels arranged in a two-dimensional array, i.e., arranged systematically in the X direction and the Y direction. In a case where the plane shape of the pixels is rectangular, the direction in which the side closest to the first electrode extends is the Y direction, and the direction orthogonal to the Y direction is the X direction. Alternatively, in a case where the pixels have any plane shape, an overall direction including the line segment or curve closest to the first electrode is the Y direction, and the direction orthogonal to the Y direction is the X direction.

In relation to the imaging elements of the first to sixth configurations, description is given below of a case where the potential of the first electrode is higher than the potential of the second electrode.

In the imaging element of the first configuration, the thicknesses of the insulating layer segments gradually change from the first photoelectric conversion section segment to the N-th photoelectric conversion section segment. It is preferred that the thicknesses of the insulating layer segments gradually increase. This forms a kind of charge transfer gradient. Then, when a state of $V_{31} \geq V_{11}$ is established in the charge accumulation period, the n-th photoelectric conversion section segment is able to accumulate more electric charge and is subjected to a more intense electric field than the (n+1)-th photoelectric conversion section segment. This makes it possible to prevent the flow of electric charge from the first photoelectric conversion section segment to the first electrode with reliability. In addition, when a state of $V_{32} < V_{12}$ is established in the charge transfer period, it is possible to secure the flow of electric charge from the first photoelectric conversion section segment to the first electrode and the flow of electric charge from the (n+1)-th photoelectric conversion section segment to the n-th photoelectric conversion section segment with reliability.

In the imaging element of the second configuration, the thicknesses of the photoelectric conversion layer segments gradually change from the first photoelectric conversion section segment to the N-th photoelectric conversion section segment. It is preferred that the thicknesses of the photoelectric conversion layer segments gradually increase. This forms a kind of charge transfer gradient. Then, when a state of $V_{31} \geq V_{11}$ is established in the charge accumulation period, a more intense electric field is applied to the n-th photoelectric conversion section segment than to the (n+1)-th photoelectric conversion section segment. This makes it possible to prevent the flow of electric charge from the first photoelectric conversion section segment to the first electrode with reliability. In addition, when a state of $V_{32} < V_{12}$ is established in the charge transfer period, it is possible to secure the flow of electric charge from the first photoelectric conversion section segment to the first electrode and the flow of electric charge from the (n+1)-th photoelectric conversion section segment to the n-th photoelectric conversion section segment with reliability.

In the imaging element of the third configuration, the materials included in the insulating layer segments are different between adjacent photoelectric conversion section segments, and this forms a kind of charge transfer gradient. It is preferred that the values of dielectric constant of the materials included in the insulating layer segments gradually decrease from the first photoelectric conversion section segment to the N-th photoelectric conversion section segment. With such a configuration employed, when a state of $V_{31} \geq V_{11}$ is established in the charge accumulation period, the n-th photoelectric conversion section segment is able to accumulate more electric charge than the (n+1)-th photoelectric conversion section segment. In addition, when a state of $V_{32} < V_{12}$ is established in the charge transfer period, it is possible to secure the flow of electric charge from the first photoelectric conversion section segment to the first electrode and the flow of electric charge from the (n+1)-th photoelectric conversion section segment to the n-th photoelectric conversion section segment with reliability.

In the imaging element of the fourth configuration, the materials included in the charge accumulation electrode segments are different between adjacent photoelectric conversion section segments, and this forms a kind of charge transfer gradient. It is preferred that the values of work function of the materials included in the insulating layer segments gradually increase from the first photoelectric conversion section segment to the N-th photoelectric conversion section segment. With such a configuration employed, it is possible to form a potential gradient advantageous for signal charge transfer regardless of whether the voltage (potential) is positive or negative.

In the imaging element of the fifth configuration, the areas of the charge accumulation electrode segments gradually decrease from the first photoelectric conversion section segment to the N-th photoelectric conversion section segment, and this forms a kind of charge transfer gradient. Therefore, when the state of $V_{31} \geq V_{11}$ is established in the charge accumulation period, the n-th photoelectric conversion section segment is able to accumulate more electric charge than the (n+1)-th photoelectric conversion section segment. In addition, when a state of $V_{32} < V_{12}$ is established in the charge transfer period, it is possible to secure the flow of electric charge from the first photoelectric conversion section segment to the first electrode and the flow of electric charge from the (n+1)-th photoelectric conversion section segment to the n-th photoelectric conversion section segment with reliability.

In the imaging element of the sixth configuration, the cross-sectional area of the stacked portion changes in accordance with the distance from the first electrode, and this forms a kind of charge transfer gradient. Specifically, by employing a configuration in which the thickness of the cross section of the stacked portion is constant and the width of the cross section of the stacked portion decreases as being away from the first electrode, it becomes possible for a region near the first electrode to accumulate more electric charge than a region far from the first electrode when the state of $V_{31} \geq V_{11}$ is established in the charge accumulation period, similarly to the description of the imaging element of the fifth configuration. Therefore, when the state of $V_{32} < V_{12}$ is established in the charge transfer period, it is possible to secure the flow of electric charge from the region near the first electrode to the first electrode and the flow of electric charge from the far region to the near region with reliability. In contrast, by employing a configuration in which the width of the cross section of the stacked portion is constant and the thickness of the cross section of the stacked portion, specifically, the thickness of the insulating layer segment is gradually increased, when the state of $V_{31} \geq V_{11}$ is established in the charge accumulation period, the region near the first electrode is able to accumulate more electric charge and is subjected to a more intense electric field than the region far from the first electrode, making it possible to prevent the flow of electric charge from the region near the first electrode to the first electrode with reliability, similarly to the description of the imaging element of the first configuration. Then, when the state of $V_{32} < V_{12}$ is established in the charge transfer period, it is possible to secure the flow of electric charge from the region near the first electrode to the first electrode and the flow of electric charge from the far region to the near region with reliability. In addition, by employing the configuration in which the thicknesses of the photoelectric conversion layer segments are gradually increased, a more intense electric field is applied to the region near the first electrode than to the region far from the first electrode when the state of $V_{31} \geq V_{11}$ is established in the charge accumulation period, making it possible to prevent the flow of electric charge from the region near the first electrode to the first electrode with reliability, similarly to the description of the imaging element of the second configuration. Then, when the state of $V_{32}<V_{12}$ is established in the charge transfer period, it is possible to secure the flow of electric charge from the region near the first electrode to the first electrode and the flow of electric charge from the far region to the near region with reliability.

Two or more of the imaging elements of the first to sixth configurations including the preferred modes described above may be appropriately combined as desired.

As a modification example of the solid-state imaging devices according to the first and second aspects of the present disclosure, a solid-state imaging device may have a configuration in which the solid-state imaging device includes any of a plurality of the imaging elements of the first to sixth configurations, the plurality of imaging elements constitute an imaging element block, and the first electrode is shared by the plurality of imaging elements constituting the imaging element block. The solid-state imaging device having such a configuration is referred to as a "solid-state imaging device of a first configuration" for the sake of convenience. Alternatively, as a modification example of the solid-state imaging devices according to the first and second aspects of the present disclosure, a solid-state imaging device may have a configuration in which the solid-state imaging device includes any of a plurality of the imaging elements of the first to sixth configurations or a plurality of stacked imaging elements including at least one of the imaging elements of the first to sixth configurations, the plurality of imaging elements or stacked imaging elements constitutes an imaging element block, and the first electrode is shared by the plurality of imaging elements or stacked imaging elements constituting the imaging element block. The solid-state imaging device having such a configuration is referred to as a "solid-state imaging device of a second configuration" for the sake of convenience. Then, by allowing the first electrode to be shared by the plurality of imaging elements constituting the imaging element block as described above, it is possible to simplify and miniaturize the configuration and structure of the pixel region in which a plurality of imaging elements are arranged.

In the solid-state imaging devices of the first and second configurations, one floating diffusion layer is provided for a plurality of imaging elements (one imaging element block). Here, the plurality of imaging elements provided for one floating diffusion layer may include a plurality of imaging elements of a first type described later, or may include at least one imaging element of the first type and one or two or more imaging elements of a second type described later. Then, appropriately controlling the timing of the charge transfer period allows for sharing of one floating diffusion layer among the plurality of imaging elements. The plurality of imaging elements is caused to operate together and is coupled as an imaging element block to a drive circuit described later. That is, the plurality of imaging elements constituting the imaging element block is coupled to one drive circuit. However, control of the charge accumulation electrode is performed for each imaging element. In addition, it is possible for the plurality of imaging elements to share one contact hole section. The arrangement relationship between the first electrode shared by the plurality of imaging elements and the charge accumulation electrode of each imaging element may be such that, in some cases, the first electrode is disposed to be adjacent to the charge accumulation electrode of each imaging element. Alternatively, the first electrode may be disposed to be adjacent to the charge accumulation electrodes of some of the plurality of imaging elements and not disposed to be adjacent to the charge accumulation electrodes of the rest of the plurality of imaging elements. In this case, the movement of electric charge from the rest of the plurality of imaging elements to the first electrode is movement via some of the plurality of imaging elements. In order to ensure movement of electric charge from each imaging element to the first electrode, it is preferred that a distance between a charge accumulation electrode included in an imaging element and a charge accumulation electrode included in an imaging element (referred to as a "distance A" for the sake of convenience) be longer than a distance between the first electrode and the charge accumulation electrode in an imaging element adjacent to the first electrode (referred to as a "distance B" for the sake of convenience). In addition, it is preferred that the value of the distance A be larger in the imaging element positioned farther away from the first electrode. It is to be noted that the description above is applicable not only to the solid-state imaging devices of the first and second configurations but also to the solid-state imaging devices of the first and second aspects of the present disclosure.

Further, in the imaging element or the like of the present disclosure including the various preferred modes described above, a mode may be adopted in which light enters from side of the second electrode, and a light-blocking layer is formed on the light incident side closer to the second electrode. Alternatively, a mode may be adopted in which light enters from the side of the second electrode, and no light enters the first electrode (depending on the case, light enters neither of the first electrode and the transfer control electrode). Then, in this case, a configuration may be adopted in which the light-blocking layer is formed on the light incident side closer to the second electrode and above the first electrode (depending on the case, the first electrode and the transfer control electrode). Alternatively, a configuration may be adopted in which an on-chip microlens is provided above the charge accumulation electrode and the second electrode, and the light entering the on-chip microlens is condensed onto the charge accumulation electrode. Here, the light-blocking layer may be disposed above the surface of the second electrode on the light incident side, or may be disposed on the surface of the second electrode on the light incident side. The light-blocking layer may be formed in the second electrode depending on the case. Examples of a material to be included in light-blocking layer include chromium (Cr), copper (Cu), aluminum (Al), tungsten (W), and non-light-transmitting resins (e.g., polyimide resin).

Specific examples of the imaging element or the like of the present disclosure include: an imaging element (referred to as a "blue light imaging element of a first type" for the sake of convenience) that has sensitivity to blue light and includes a photoelectric conversion layer or a photoelectric conversion section (referred to as a "blue light photoelectric conversion layer of a first type" or a "blue light photoelectric conversion section of a first type" for the sake of convenience) that absorbs blue light (light at 425 nm to 495 nm); an imaging element (referred to as a "green light imaging element of a first type" for the sake of convenience) that has sensitivity to green light and includes a photoelectric conversion layer or a photoelectric conversion section (referred to as a "green light photoelectric conversion layer of a first type" or a "green light photoelectric conversion section of a first type" for the sake of convenience) that absorbs green light (light at 495 nm to 570 nm); and an imaging element (referred to as a "red light imaging element of a first type" for the sake convenience) that has sensitivity to red light and includes a photoelectric conversion layer or a photoelectric conversion section (referred to as a "red light photoelectric conversion layer of a first type" or a "red light photoelectric conversion section of a first type" for the sake of convenience) that absorbs red light (light at 620 nm to 750 nm). In addition, an existing imaging element that does not include the charge accumulation electrode and that has sensitivity to blue light is referred to as a "blue light imaging element of a second type" for the sake convenience. An existing imaging element that does not include the charge accumulation electrode and that has sensitivity to green light is referred to as a "green light imaging element of a second type" for the sake of convenience. An existing imaging element that does not include the charge accumulation electrode and that has sensitivity to red light is referred to as a "red light imaging element of a second type" for the sake of convenience. A photoelectric conversion layer or a photoelectric conversion section included in the blue light imaging element of the second type is referred to as a "blue light photoelectric conversion layer of a second type" or a "blue light photoelectric conversion section of a second type" for the sake of convenience. A photoelectric conversion layer or a photoelectric conversion section included in the green light imaging element of the second type is referred to as a "green light photoelectric conversion layer of a second type" or a "green light photoelectric conversion section of a second type" for the sake of convenience. A photoelectric conversion layer or a photoelectric conversion section included in the red light imaging element of the second type is referred to as a "red light photoelectric conversion layer of a second type" or a "red light photoelectric conversion section of a second type" for the sake of convenience.

The stacked imaging element of the present disclosure includes at least one imaging element or the like (photoelectric conversion element) of the present disclosure, and specific examples of the configuration and structure of the stacked imaging element include:

[A] a configuration and a structure in which the blue light photoelectric conversion section of the first type, the green light photoelectric conversion section of the first type, and the red light photoelectric conversion section of the first type are stacked in a vertical direction, and the control sections of the blue light imaging element of the first type, the green light imaging element of the first type, and the red light imaging element of the first type are each provided in the semiconductor substrate;

[B] a configuration and a structure in which the blue light photoelectric conversion section of the first type and the green light photoelectric conversion section of the first type are stacked in the vertical direction, the red light photoelectric conversion section of the second type is disposed below these two layers of photoelectric conversion sections of the first type, and the control sections of the blue light imaging element of the first type, the green light imaging element of the first type, and the red light imaging element of the second type are each provided in the semiconductor substrate;

[C] a configuration and a structure in which the blue light photoelectric conversion section of the second type and the red light photoelectric conversion section of the second type are disposed below the green light photoelectric conversion section of the first type, and the control sections of the green light imaging element of the first type, the blue light imaging element of the second type, and the red light imaging element of the second type are each provided in the semiconductor substrate; and

[D] a configuration and a structure in which the green light photoelectric conversion section of the second type and the red light photoelectric conversion section of the second type are disposed below the blue light photoelectric conversion section of the first type, and the control sections of the blue light imaging element of the first type, the green light imaging element of the second type, and the red light imaging element of the second type are each provided in the semiconductor substrate. It is preferred that the arrangement order of the photoelectric conversion sections of these imaging elements in the vertical direction be the order of the blue light photoelectric conversion section, the green light photoelectric conversion section, and the red light photoelectric conversion section from light incident direction, or the order of the green light photoelectric conversion section, the blue light photoelectric conversion section, and the red light photoelectric conversion section from the light incident direction. One reason for this is that the light of a shorter wavelength is efficiently absorbed on incident surface side. Red has the longest wavelength among the three colors, and it is therefore preferred that the red light photoelectric conversion section be positioned in the lowest layer as viewed from light incident surface. One pixel is configured by the stacked structure of these imaging elements. In addition, a near-infrared photoelectric conversion section (alternatively, an infrared photoelectric conversion section) of a first type may be provided. Here, it is preferred that the photoelectric conversion layer of the infrared photoelectric conversion section of the first type include, for example, an organic material and be disposed in the lowest layer of the stacked structure of the imaging elements of the first type and above the imaging elements of the second type. Alternatively, a near-infrared photoelectric conversion section (alternatively, an infrared photoelectric conversion section) of a second type may be provided below the photoelectric conversion sections of the first type.

In the imaging elements of the first type, the first electrode is formed on, for example, an interlayer insulating layer provided on the semiconductor substrate. The imaging element formed on the semiconductor substrate may be of a back illuminated type or a front illuminated type.

In a case where the photoelectric conversion layer includes an organic material, any one of the following four aspects may be adopted for the photoelectric conversion layer.

(1) The photoelectric conversion layer includes a p-type organic semiconductor.

(2) The photoelectric conversion layer includes an n-type organic semiconductor.

(3) The photoelectric conversion layer includes a stacked structure of a p-type organic semiconductor layer/an n-type organic semiconductor layer. The photoelectric conversion layer includes a stacked structure of a p-type organic semiconductor layer/a mixed layer (bulk hetero structure) of a p-type organic semiconductor and an n-type organic semiconductor/an n-type organic semiconductor layer. The photoelectric conversion layer includes a stacked structure of a p-type organic semiconductor layer/a mixed layer (bulk hetero structure) of a p-type organic semiconductor and an n-type organic semiconductor. The photoelectric conversion layer includes a stacked structure of an n-type organic semiconductor layer/a mixed layer (bulk hetero structure) of a p-type organic semiconductor and an n-type organic semiconductor.

(4) The photoelectric conversion layer includes a mixture (bulk hetero structure) of a p-type organic semiconductor and an n-type organic semiconductor. Note that the order of stacking may be changed arbitrarily.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex including heterocyclic compounds as ligands, a polythiophene derivative, a polybenzothiadiazole derivative, and a polyfluorene derivative. Examples of the n-type organic semiconductor include a fullerene and a fullerene derivative <for example, fullerene (higher fullerene), such as C60, C70, and C74, endohedral fullerene, or the like) or fullerene derivative (e.g., fullerene fluoride, PCBM fullerene compound, fullerene multimer, or the like)>, an organic semiconductor with larger (deeper) HOMO and LUMO than the p-type organic semiconductor, and transparent inorganic metal oxide. Specific examples of the n-type organic semiconductor include organic molecules including, as part of molecular framework, a heterocyclic compound containing nitrogen atoms, oxygen atoms, and sulfur atoms, such as a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, and a polyfluorene derivative, an organic metal complex, and a subphthalocyanine derivative. Examples of groups and the like included in the fullerene derivative include: halogen atoms; a straight-chain, branched, or cyclic alkyl group or phenyl group; a group including a straight-chain or condensed aromatic compound; a group including halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group including chalcogenide; a phosphine group; a phosphon group; and derivatives thereof. Thickness of the photoelectric conversion layer including an organic material (which is referred to as an "organic photoelectric conversion layer" in some cases) is not limited and may be, for example, $1\times10^{-8}$ m to $5\times10^{-7}$ m, preferably, $2.5\times10^{-8}$ m to $3\times10^{-7}$ m, more preferably, $2.5\times10^{-8}$ m to $2\times10^{-7}$ m, still more preferably, $1\times10^{-7}$ m to $1.8\times10^{-7}$ m. It is to be noted that the organic semiconductors are often classified into p-type and n-type. The p-type means that the holes are easily transportable, and the n-type means that the electrons are easily transportable. The organic semiconductor is not limited to the interpretation that it has holes or electrons as majority carriers of thermal excitation, as in inorganic semiconductors.

Alternatively, examples of a material to be included in the organic photoelectric conversion layer for performing photoelectric conversion of green light include a rhodamine-based dye, a merocyanine-based dye, a quinacridone derivative, a subphthalocyanine-based dye (subphthalocyanine derivative), and the like. Examples of a material to be included in the organic photoelectric conversion layer for performing photoelectric conversion of blue light include a coumaric acid dye, tris-8-hydroxyquinoline aluminum (Alq3), a merocyanine-based dye, and the like. Examples of a material to be included in the organic photoelectric conversion layer for performing photoelectric conversion of red light include a phthalocyanine-based dye, a subphthalocyanine-based dye (subphthalocyanine derivative), and the like.

Alternatively, examples of the inorganic material to be included in the photoelectric conversion layer include crystalline silicon, amorphous silicon, microcrystalline silicone, crystalline selenium, amorphous selenium, chalcopyrite compounds, such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, or group III-V compounds, such as GaAs, InP, AlGaAs, InGaP, AlGaInP, and InGaAsP, and furthermore, compound semiconductors of CdSe, CdS, In$_2$Se$_3$, In$_2$S$_3$, Bi$_2$Se$_3$, Bi$_2$S$_3$, ZnSe, ZnS, PbSe, PbS, and the like. In addition, quantum dots including these materials are also usable for the photoelectric conversion layer.

The solid-state imaging devices according to the first and second aspects of the present disclosure and the solid-state imaging devices of the first and second configurations are able to configure single-plate color solid-state imaging devices.

In the solid-state imaging device according to the second aspect of the present disclosure including the stacked imaging element, the imaging elements having sensitivity to light of a plurality of types of wavelengths are stacked in the direction in which light enters within the same pixel to constitute one pixel, unlike in a solid-state imaging device including imaging elements in Bayer arrangement (i.e., not using a color filter layer for performing blue, green, or red spectral separation). It is therefore possible to achieve improvement of sensitivity and improvement of the pixel density per unit volume. In addition, organic materials are high in absorption coefficient, and thus make it possible to reduce the thickness of the organic photoelectric conversion layer compared with an existing Si-based photoelectric conversion layer. This reduces leakage of light from adjacent pixels and eases restrictions on a light incident angle. Further, while existing Si-based imaging elements suffer from generation of false colors because an interpolation process is performed for pixels of three colors to create color signals, the generation of the false colors is suppressed in the solid-state imaging device according to the second aspect of the present disclosure including the stacked imaging element. The organic photoelectric conversion layer itself also serves as a color filter layer, and therefore it is possible to separate the colors without disposing a color filter layer.

Meanwhile, in the solid-state imaging device according to the first aspect of the present disclosure, employing the color filter layer makes it possible to ease requirements on the spectral characteristics of blue, green, and red, and provides high mass productivity. Examples of arrangement of the imaging elements in the solid-state imaging device according to the first aspect of the present disclosure include an interline arrangement, a G stripe RB checkered arrangement, a G stripe RB full checkered arrangement, a checkered complementary color arrangement, a stripe arrangement, a diagonal stripe arrangement, a primary color difference arrangement, a field color difference sequential arrangement, a frame color difference sequential arrangement, a MOS arrangement, an improved MOS arrangement, a frame interleave arrangement, and a field interleave arrangement, as well as the Bayer arrangement. Here, one imaging element constitutes one pixel (or subpixel).

Examples of the color filter layers (wavelength selection means) include filter layers that transmit not only red, green, and blue, but also specific wavelengths, such as cyan, magenta, and yellow, depending on the case. It is possible for the color filter layer to be configured not only by an organic material-based color filter layer using an organic compound such as a pigment or a dye, but also by a thin film including an inorganic material such as a photonic crystal, a wavelength selection element based on application of plasmon (color filter layer having a conductor lattice structure with a lattice-like hole structure in a conductive thin film; see, for example, Japanese Unexamined Patent Application Publication No. 2008-177191), or amorphous silicon.

The pixel region in which a plurality of imaging elements or the like of the present disclosure or stacked imaging elements of the present disclosure are arranged includes a plurality of pixels systematically arranged in a two-dimensional array. The pixel region typically includes: an effective pixel region in which light is actually received to generate signal charge through photoelectric conversion, and the signal charge is amplified and read out to the drive circuit; and a black reference pixel region (also called an optical black pixel region (OPB)) for outputting optical black serving as a black level reference. The black reference pixel region is typically disposed on the outer periphery of the effective pixel region.

In the imaging element or the like of the present disclosure including the various preferred modes described above, irradiation with light is performed, photoelectric conversion is generated in the photoelectric conversion layer, and holes and electrons are subjected to carrier separation. Then, an electrode from which the holes are extracted is an anode, and an electrode from which the electrons are extracted is a cathode. The first electrode constitutes the cathode, and the second electrode constitutes the anode.

A configuration may be adopted in which the first electrode, the charge accumulation electrode, the transfer control electrode, the charge movement control electrode, the charge drain electrode, and the second electrode include transparent electrically-conductive materials. The first electrode, the charge accumulation electrode, the transfer control electrode, and the charge drain electrode are collectively referred to as a "first electrode or the like" in some cases. Alternatively, in a case where the imaging elements or the like of the present disclosure are arranged on a plane as in, for example, a Bayer arrangement, a configuration may be adopted in which the second electrode includes a transparent electrically-conductive material, and the first electrode or the like includes a metal material. In this case, specifically, a configuration may be adopted in which the second electrode positioned on the light incident side includes a transparent electrically-conductive material, and the first electrode or the like includes, for example, Al—Nd (alloy of aluminum and neodymium) or ASC (alloy of aluminum, samarium, and copper). An electrode including a transparent electrically-conductive material is referred to as a "transparent electrode" in some cases. Here, it is desirable that the band-gap energy of the transparent electrically-conductive material be 2.5 eV or more, preferably, 3.1 eV or more. Examples of the transparent electrically-conductive material to be included in the transparent electrode include electrically-conductive metal oxides. Specifically, examples of the transparent electrically-conductive material include indium oxide, indium-tin oxide (ITO, Indium Tin Oxide, including Sn-doped $In_2O_3$, crystalline ITO, and amorphous ITO), indium-zinc oxide (IZO, Indium Zinc Oxide) in which indium is added as a dopant to zinc oxide, indium-gallium oxide (IGO) in which indium is added as a dopant to gallium oxide, indium-gallium-zinc oxide (IGZO, In—$GaZnO_4$) in which indium and gallium are added as dopants to zinc oxide, indium-tin-zinc oxide (ITZO) in which indium and tin are added as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with another element), aluminum-zinc oxide (AZO) in which aluminum is added as a dopant to zinc oxide, gallium-zinc oxide (GZO) in which gallium is added as a dopant to zinc oxide, titanium oxide ($TiO_2$), niobium-titanium oxide (TNO) in which niobium is added as a dopant to titanium oxide, antimony oxide, CuI, $InSbO_4$, ZnMgO, $CuInO_2$, $MgIn_2O_4$, CdO, $ZnSnO_3$, spinel oxide, and an oxide having $YbFe_2O_4$ structure. Alternatively, the transparent electrode may include gallium oxide, titanium oxide, niobium oxide, nickel oxide, or the like as a mother layer. An example of the thickness of the transparent electrode may be $2\times10^{-8}$ m to $2\times10^{-7}$ m, preferably, $3\times10^{-8}$ m to $1\times10^{-7}$ m. In a case where the first electrode has to be transparent, it is preferred that the charge drain electrode also include a transparent electrically-conductive material, from the viewpoint of simplification of the manufacturing process.

Alternatively, in a case where transparency is not necessary, it is preferred to use an electrically-conductive material with a low work function (e.g., $\phi=3.5$ eV to 4.5 eV) as an electrically-conductive material to be included in the cathode which functions as an electrode for extracting electrons. Specifically, examples of such an electrically-conductive material include alkali metal (e.g., Li, Na, K, and the like) and fluorides or oxides thereof, alkaline earth metal (e.g., Mg, Ca, and the like) and fluorides or oxides thereof, aluminum (Al), zinc (Zn), tin (Sn), thallium (Tl), a sodium-potassium alloy, an aluminum-lithium alloy, a magnesium-silver alloy, indium, rare earth metal such as ytterbium, and alloys thereof. Alternatively, examples of the material to be included in the cathode include electrically-conductive materials, including metal such as platinum (Pt), gold (Au), palladium (Pd), chromium (Cr), nickel (Ni), silver (Ag), tantalum (Ta), tungsten. (W), copper (Cu), titanium (Ti), iron (Fe), cobalt (Co), or molybdenum (Mo), alloys including these metal elements, electrically-conductive particles including these metals, electrically-conductive particles of alloys containing these metals, polysilicon including impurities, carbon materials, oxide semiconductor materials, carbon nanotubes, graphene, and the like, and stacked structures of layers including these elements. Further examples of the material to be included in the cathode include organic materials (electrically-conductive polymers) such as poly(3, 4-ethylenedioxythiophene)/polystyrenesulfonic acid [PEDOT/PSS]. In addition, these electrically-conductive materials may be mixed with a binder (polymer) into a paste or an ink, and the paste or the ink may be cured and used as an electrode.

A dry method or a wet method is usable as a film-formation method for the first electrode or the like and the second electrode (cathode or anode). Examples of the dry method include a physical vapor deposition method (PVD method) and a chemical vapor deposition method (CVD method). Examples of the film-formation method using the principle of the PVD method include a vacuum deposition method using resistance heating or radio frequency heating, an EB (electron beam) deposition method, various sputtering methods (magnetron sputtering method, RF-DC coupled bias sputtering method, ECR sputtering method, facing-target sputtering method, and high frequency sputtering method), an ion plating method, a laser ablation method, a molecular beam epitaxy method, and a laser transfer method. In addition, examples of the CVD method include a plasma CVD method, a thermal CVD method, an organic metal (MO) CVD method, and an optical CVD method. Meanwhile, examples of the wet method include an electrolytic plating method and an electroless plating method, a spin coating method, an ink jet method, a spray coating method, a stamping method, a micro contact printing method, a flexographic printing method, an offset printing method, a gravure printing method, a dipping method, etc. Examples of patterning methods include chemical etching, including shadow mask, laser transfer, photolithography, and the like, and physical etching by ultraviolet light, laser, or the like. Examples of planarization techniques for the first electrode or the like and the second electrode include a laser planarization method, a reflow method, a CMP (Chemical Mechanical Polishing) method, etc.

Examples of the material to be included in the insulating layer include not only inorganic insulating materials exemplified by metal oxide high dielectric insulating materials including: silicon oxide-based materials; silicon nitride (SiNy); and aluminum oxide ($Al_2O_3$), but also organic insulating materials (organic polymers) exemplified by polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) including N-2 (aminoethyl) 3-aminopropyltrimethoxysilane (AEAPTMS), 3-mercaptopropyltrimethoxysilane (MPTMS), octadecyltrichlorosilane (OTS) and the like; novolac-type phenolic resins; fluoro resins; straight-chain hydrocarbons having a functional group being able to bond to the control electrode at one end, including octadecanethiol, dodecyl isocyanate and the like, and combinations thereof. Examples of the silicon oxide-based materials include silicon oxide (SiOx), BPSG, PSG, BSG, AsSG, PbSG, silicon oxynitride (SiON), SOG (spin-on-glass), and low dielectric constant insulating materials (e.g., polyaryl ether, cycloperfluorocarbon polymers and benzocyclobutene, cyclic fluoro resins, polytetrafluoroethylene, fluorinated aryl ether, fluorinated polyimide, amorphous carbon, and organic SOG). The insulating layer may have a single-layer configuration, or a configuration including a plurality of layers (e.g., two layers) stacked. In the latter case, an insulating layer/lower layer may be formed at least over the charge accumulation electrode and in a region between the charge accumulation electrode and the first electrode. A planarization process may be performed on the insulating layer/lower layer to allow the insulating layer/lower layer to remain at least in the region between the charge accumulation electrode and the first electrode. It is sufficient that an insulating layer/upper layer is formed over the remaining insulating layer/lower layer and the charge accumulation electrode. In this way, it is possible to planarize the insulating layer with reliability. It is sufficient that materials forming the protection material layer, various interlayer insulating layers, and insulating material films are appropriately selected from these materials.

The configurations and structures of the floating diffusion layer, the amplification transistor, the reset transistor, and the selection transistor included in the control section may be similar to the configurations and structures of existing floating diffusion layers, amplification transistors, reset transistors, and selection transistors. The drive circuit may also have a well-known configuration and structure.

While the first electrode is coupled to the floating diffusion layer and a gate section of the amplification transistor, it is sufficient that a contact hole section is formed for the coupling of the first electrode to the floating diffusion layer and the gate section of the amplification transistor. Examples of a material for forming the contact hole section include polysilicon doped with impurities, a high melting point metal and a metal silicide such as tungsten, Ti, Pt, Pd, Cu, TiW, TiN, TiNW, $WSi_2$, or $MoSi_2$, and a stacked structure of layers including these materials (e.g., Ti/TiN/W).

A first carrier blocking layer may be provided between the inorganic semiconductor material layer and the first electrode, and a second carrier blocking layer may be provided between the organic photoelectric conversion layer and the second electrode. In addition, a first charge injection layer may be provided between the first carrier blocking layer and the first electrode, and a second charge injection layer may be provided between the second carrier blocking layer and the second electrode. For example, examples of the materials to be included in the electron injection layers include alkali metal, including lithium (Li), sodium (Na), and potassium (K), fluorides or oxides thereof, alkaline earth metal, including magnesium (Mg) and calcium (Ca), and fluorides or oxides thereof.

Examples of a film-formation method for various organic layers include a dry film-forming method and a wet film-forming method. Examples of the dry film-forming method include a vacuum deposition method using resistance heating, high frequency heating, or electron beam heating, a flash deposition method, a plasma deposition method, an EB deposition method, various sputtering methods (bipolar sputtering method, direct current sputtering method, direct current magnetron sputtering method, high frequency sputtering method, magnetron sputtering method, RF-DC coupled bias sputtering method, ECR sputtering method, facing-target sputtering method, high frequency sputtering method, and ion beam sputtering method), a DC (Direct Current) method, an RF method, a multi-cathode method, an activation reaction method, an electric field deposition method, various ion plating methods including a high-frequency ion plating method and a reactive ion plating method, a laser ablation method, a molecular beam epitaxy method, a laser transfer method, and a molecular beam epitaxy (MBE) method. In addition, examples of the CVD methods include a plasma CVD method, a thermal CVD method, an MOCVD method, and a photo CVD method. Meanwhile, specific examples of the wet method include a spin coating method; a dipping method; a casting method; a micro contact printing method; a drop casting method; various printing methods including a screen printing method, an ink jet printing method, an offset printing method, a gravure printing method, and a flexographic printing method; a stamping method; a spray method; various coating methods including an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Examples of a solvent in the coating method include nonpolar or low polar organic solvents including toluene, chloroform, hexane, and ethanol. Examples of patterning methods include chemical etching including shadow mask, laser transfer, photolithography, and the like, and physical etching by ultraviolet light, laser, or the like. Examples of planarization techniques for various organic layers include a laser planarization method, a reflow method, etc.

As described above, the on-chip microlens and the light-blocking layer may be provided on the imaging element or the solid-state imaging device as necessary, and the drive circuit and wiring lines for driving the imaging element are provided. A shutter for controlling incidence of light on the imaging element may be disposed as necessary, and an optical cut filter may be provided according to the purpose of the solid-state imaging device.

In addition, for the solid-state imaging devices of the first and second configurations, a mode may be adopted in which one on-chip microlens is disposed above one imaging element or the like of the present disclosure. Alternatively, a mode may be adopted in which two imaging elements or the like of the present disclosure constitute an imaging element block, and one on-chip microlens is disposed above the imaging element block.

For example, in a case of stacking the solid-state imaging device and a readout integrated circuit (ROIC), the stacking may be performed by laying a driving substrate having the readout integrated circuit and a connection section including copper (Cu) formed thereon and an imaging element having a connection section formed thereon over each other such that their respective connection sections come into contact with each other, and joining the connection sections. The connection sections may be joined to each other using a solder bump or the like.

Further, a driving method for driving the solid-state imaging devices according to the first and second aspects of the present disclosure may be a driving method of the solid-state imaging device repeating the steps of:

draining electric charge in the first electrodes out of the system all at once while accumulating electric charge in the inorganic semiconductor material layers (alternatively, the inorganic semiconductor material layers and the photoelectric conversion layers) in all of the imaging elements; and thereafter, transferring the electric charge accumulated in the inorganic semiconductor material layers (alternatively, the inorganic semiconductor material layers and the photoelectric conversion layers) all at once to the first electrodes in all of the imaging elements, and after completion of the transferring, sequentially reading out the electric charge transferred to the first electrodes in the respective imaging elements.

In such a driving method of the solid-state imaging device, each imaging element has a structure in which light having entered from side of the second electrode does not enter the first electrode and, in all of the imaging elements, electric charge in the first electrodes is drained out of the systems all at once while accumulating electric charge in the inorganic semiconductor material layers or the like. This makes it possible to perform resetting of the first electrodes with reliability in all of the imaging elements simultaneously. Thereafter, in all of the imaging elements, the electric charge accumulated in the inorganic semiconductor material layers or the like is transferred all at once to the first electrodes, and after completion of the transferring, the electric charge transferred to the first electrodes is sequentially read out in the respective imaging elements. It is therefore possible to achieve a so-called global shutter function easily.

A detailed description of the imaging element and the solid-state imaging device of Example 1 is given below.

The imaging element 10 of Example 1 further includes a semiconductor substrate (more specifically, a silicon semiconductor layer) 70, and the photoelectric conversion section is disposed above the semiconductor substrate 70. In addition, the imaging element 10 further includes the control section provided in the semiconductor substrate 70 and including the drive circuit to which the first electrode 21 and the second electrode 22 are coupled. Here, a light incident surface of the semiconductor substrate 70 is defined as above, and opposite side of the semiconductor substrate 70 is defined as below. A wiring layer 62 including a plurality of wiring lines is provided below the semiconductor substrate 70.

At least a floating diffusion layer $FD_1$ and an amplification transistor $TR1_{amp}$ included in the control section are provided in the semiconductor substrate 70, and the first electrode 21 is coupled to the floating diffusion layer $FD_1$ and a gate section of the amplification transistor $TR1_{amp}$. A reset transistor $TR1_{rst}$ and a selection transistor $TR1_{sel}$ included in the control section are further provided in the semiconductor substrate 70. The floating diffusion layer $FD_1$ is coupled to one of source/drain regions of the reset transistor $TR1_{rst}$. Another one of source/drain regions of the amplification transistor $TR1_{amp}$ is coupled to one of source/drain regions of the selection transistor $TR1_{sel}$. Another one of source/drain regions of the selection transistor $TR1_{sel}$ is coupled to a signal line $VSL_1$. The amplification transistor $TR1_{amp}$, the reset transistor $TR1_{rst}$, and the selection transistor $TR1_{sel}$ constitute the drive circuit.

Specifically, the imaging element and the stacked imaging element of Example 1 are an imaging element and a stacked imaging element of the back illuminated type, and have a structure in which three imaging elements are stacked, the three imaging elements being: a green light imaging element of Example 1 of a first type (hereinafter referred to as a "first imaging element") having sensitivity to green light and including the green light photoelectric conversion layer of the first type for absorbing green light; an existing blue light imaging element of a second type (hereinafter referred to as a "second imaging element") having sensitivity to blue light and including the blue light photoelectric conversion layer of the second type for absorbing blue light; and an existing red light imaging element of a second type (hereinafter referred to as a "third imaging element") having sensitivity to red light and including the red light photoelectric conversion layer of the second type for absorbing red light. Here, the red light imaging element (the third imaging element) 12 and the blue light imaging element (the second imaging element) 11 are provided in the semiconductor substrate 70, and the second imaging element 11 is positioned closer to the light incident side than the third imaging element 12. In addition, the green light imaging element (the first imaging element 10) is provided above the blue light imaging element (the second imaging element 11). The stacked structure of the first imaging element 10, the second imaging element 11, and the third imaging element 12 constitutes one pixel. No color filter layer is provided.

In the first imaging element 10, the first electrode 21 and the charge accumulation electrode 24 are formed at a distance from each other on an interlayer insulating layer 81.

The interlayer insulating layer 81 and the charge accumulation electrode 24 are covered with the insulating layer 82. The inorganic semiconductor material layer 23B and the photoelectric conversion layer 23A are formed on the insulating layer 82, and the second electrode 22 is formed on the photoelectric conversion layer 23A. A protection material layer 83 is formed over the entire surface inclusive of the second electrode 22, and an on-chip microlens 14 is provided on the protection material layer 83. No color filter layer is provided. The first electrode 21, the charge accumulation electrode 24, and the second electrode 22 are configured by transparent electrodes including, for example, ITO (work function: about 4.4 eV). The inorganic semiconductor material layer 23B includes, for example, $Al_{a1}Zn_{a2}Sn_{a3}O_{b1}$. The photoelectric conversion layer 23A includes a layer including a known organic photoelectric conversion material (e.g., an organic material such as rhodamine-based dye, merocyanine-based dye, or quinacridone) having sensitivity to at least green light. The interlayer insulating layer 81, the insulating layer 82, and the protection material layer 83 include a known insulating material (e.g., $SiO_2$ or SiN). The inorganic semiconductor material layer 23B and the first electrode 21 are coupled to each other by a connection section 67 provided at the insulating layer 82. The inorganic semiconductor material layer 23B extends in the connection section 67. That is, the inorganic semiconductor material layer 23B extends in an opening 84 provided in the insulating layer 82, and is coupled to the first electrode 21.

The charge accumulation electrode 24 is coupled to the drive circuit. Specifically, the charge accumulation electrode 24 is coupled to a vertical drive circuit 112 included in the drive circuit, via a connection hole 66, a pad section 64, and a wiring line $V_{OA}$ provided in the interlayer insulating layer 81.

The charge accumulation electrode 24 is larger in size than the first electrode 21. Although not limited, it is preferred to satisfy:

$$4 \le s_1'/s_1$$

where $s_1'$ denotes the area of the charge accumulation electrode 24, and $s_1$ denotes the area of the first electrode 21. For example, in Example 1, $$s_1'/s_1 = 8,$$

holds true, although not limited thereto.

Element separation regions 71 are formed on side of a first surface (front surface) 70A of the semiconductor substrate 70, and an oxide film 72 is formed over the first surface 70A of the semiconductor substrate 70. Further, on side of the first surface of the semiconductor substrate 70, the reset transistor $TR1_{rst}$, the amplification transistor $TR1_{amp}$, and the selection transistor $TR1_{sel}$ included in the control section of the first imaging element 10 are provided, and further, the first floating diffusion layer $FD_1$ is provided.

The reset transistor $TR1_{rst}$ includes a gate section 51, a channel formation region 51A, and source/drain regions 51B and 51C. The gate section 51 of the reset transistor $TR1_{rst}$ is coupled to a reset line $RST_1$, the one source/drain region 51C of the reset transistor $TR1_{rst}$ also serves as the first floating diffusion layer $FD_1$, and another source/drain region 51B is coupled to a power supply $V_{DD}$.

The first electrode 21 is coupled to the one source/drain region 51C (the first floating diffusion layer $FD_1$) of the reset transistor $TR1_{rst}$, via a connection hole 65 and a pad section 63 provided in the interlayer insulating layer 81, and a contact hole section 61 formed in the semiconductor substrate 70 and an interlayer insulating layer 76, and the wiring layer 62 formed in the interlayer insulating layer 76.

The amplification transistor $TR1_{amp}$ includes a gate section 52, a channel formation region 52A, and source/drain regions 52B and 52C. The gate section 52 is coupled to the first electrode 21 and the one source/drain region 51C (the first floating diffusion layer $FD_1$) of the reset transistor $TR1_{rst}$ via the wiring layer 62. In addition, the one source/drain region 52B is coupled to the power supply $V_{DD}$.

The selection transistor $TR1_{sel}$ includes a gate section 53, a channel formation region 53A, and source/drain regions 53B and 53C. The gate section 53 is coupled to a selection line $SEL_1$. In addition, the one source/drain region 53B shares a region with another source/drain region 52C included in the amplification transistor $TR1_{amp}$, and another source/drain region 53C is coupled to a signal line (data output line) $VSL_1$ (117).

The second imaging element 11 includes an n-type semiconductor region 41 provided in the semiconductor substrate 70, as a photoelectric conversion layer. A gate section 45 of a transfer transistor $TR2_{trs}$ including a vertical transistor extends to the n-type semiconductor region 41, and is coupled to a transfer gate line $TG_2$. In addition, a second floating diffusion layer $FD_2$ is provided in a region 45C of the semiconductor substrate 70 in the vicinity of the gate section 45 of the transfer transistor $TR2_{trs}$. Electric charge accumulated in the n-type semiconductor region 41 is read out to the second floating diffusion layer $FD_2$ via a transfer channel formed along the gate section 45.

In the second imaging element 11, further, a reset transistor $TR2_{rst}$, an amplification transistor $TR2_{amp}$, and a selection transistor $TR2_{sel}$ included in the control section of the second imaging element 11 are provided on the side of the first surface of the semiconductor substrate 70.

The reset transistor $TR2_{rst}$ includes a gate section, a channel formation region, and source/drain regions. The gate section of the reset transistor $TR2_{rst}$ is coupled to a reset line $RST_2$, one of the source/drain regions of the reset transistor $TR2_{rst}$ is coupled to the power supply $V_{DD}$, and another one of the source/drain regions also serves as the second floating diffusion layer $FD_2$.

The amplification transistor $TR2_{amp}$ includes a gate section, a channel formation region, and source/drain regions. The gate section is coupled to another one of the source/drain regions (the second floating diffusion layer $FD_2$) of the reset transistor $TR2_{rst}$. In addition, one of the source/drain regions is coupled to the power supply $V_{DD}$.

The selection transistor $TR2_{sel}$ includes a gate section, a channel formation region, and source/drain regions. The gate section is coupled to a selection line $SEL_2$. In addition, one of the source/drain regions shares a region with another one of the source/drain regions included in the amplification transistor $TR2_{amp}$, and the other one of the source/drain regions is coupled to a signal line (data output line) $VSL_2$.

The third imaging element 12 includes an n-type semiconductor region 43 provided in the semiconductor substrate 70, as a photoelectric conversion layer. A gate section 46 of a transfer transistor $TR3_{trs}$ is coupled to a transfer gate line $TG_3$. In addition, a third floating diffusion layer $FD_3$ is provided in a region 46C of the semiconductor substrate 70 in the vicinity of the gate section 46 of the transfer transistor TR3$_{trs}$. Electric charge accumulated in the n-type semiconductor region 43 is read out to the third floating diffusion layer FD$_3$ via a transfer channel 46A formed along the gate section 46.

In the third imaging element 12, further, a reset transistor TR3$_{rst}$, an amplification transistor TR3$_{amp}$, and a selection transistor TR3$_{sel}$ included in the control section of the third imaging element 12 are provided on the side of the first surface of the semiconductor substrate 70.

The reset transistor TR3$_{rst}$ includes a gate section, a channel formation region, and source/drain regions. The gate section of the reset transistor TR3$_{rst}$ is coupled to a reset line RST$_3$, one of the source/drain regions of the reset transistor TR3$_{rst}$ is coupled to the power supply V$_{DD}$, and another one of the source/drain regions also serves as the third floating diffusion layer FD$_3$.

The amplification transistor TR3$_{amp}$ includes a gate section, a channel formation region, and source/drain regions. The gate section is coupled to the other one of the source/drain regions (the third floating diffusion layer FD$_3$) of the reset transistor TR3$_{rst}$. In addition, one of the source/drain regions is coupled to the power supply V$_{DD}$.

The selection transistor TR3$_{sel}$ includes a gate section, a channel formation region, and source/drain regions. The gate section is coupled to a selection line SEL$_3$. In addition, one of the source/drain regions shares a region with another one of the source/drain regions included in the amplification transistor TR3$_{amp}$, and another one of the source/drain regions is coupled to a signal line (data output line) VSL$_3$.

The reset lines RST$_1$, RST$_2$, and RST$_3$, the selection lines SEL$_1$, SEL$_2$, and SEL$_3$, and the transfer gate lines TG$_2$ and TG$_3$ are coupled to the vertical drive circuit 112 included in the drive circuit. The signal lines (data output lines) VSL$_1$, VSL$_2$, and VSL$_3$ are coupled to a column signal processing circuit 113 included in the drive circuit.

A p$^+$ layer 44 is provided between the n-type semiconductor region 43 and the front surface 70A of the semiconductor substrate 70, and suppresses generation of a dark current. A p$^+$ layer 42 is formed between the n-type semiconductor region 41 and the n-type semiconductor region 43, and further, a portion of a side surface of the n-type semiconductor region 43 is surrounded by the p$^+$ layer 42. A p$^+$ layer 73 is formed on side of a back surface 70B of the semiconductor substrate 70, and an HfO$_2$ film 74 and an insulating material film 75 are formed in a region extending from the p$^+$ layer 73 to a part inside of the semiconductor substrate 70 where the contact hole section 61 is to be formed. While wiring lines are formed across a plurality of layers in the interlayer insulating layer 76, illustrations thereof are omitted.

The HfO$_2$ film 74 is a film having a negative fixed charge. By providing such a film, it is possible to suppress generation of a dark current. The HfO$_2$ film may be replaced with an aluminum oxide (Al$_2$O$_3$) film, a zirconium oxide (ZrO$_2$) film, a tantalum oxide (Ta$_2$O$_5$) film, a titanium oxide (TiO$_2$) film, a lanthanum oxide (La$_2$O$_3$) film, a praseodymium oxide (Pr$_2$O$_3$) film, a cerium oxide (CeO$_2$) film, a neodymium oxide (Nd$_2$O$_3$) film, a promethium oxide (Pm$_2$O$_3$) film, a samarium oxide (Sm$_2$O$_3$) film, an europium oxide (Eu$_2$O$_3$) film, a gadolinium oxide ((Gd$_2$O$_3$) film, a terbium oxide (Tb$_2$O$_3$) film, a dysprosium oxide (Dy$_2$O$_3$) film, a holmium oxide (H$_{o2}$O$_3$) film, a thulium oxide (Tm$_2$O$_3$) film, a ytterbium oxide (Yb$_2$O$_3$) film, a lutetium oxide (Lu$_2$O$_3$) film, a yttrium oxide (Y$_2$O$_3$) film, a hafnium nitride film, an aluminum nitride film, a hafnium oxynitride film, or an aluminum oxynitride film. Examples of the film-forming method for these films include a CVD method, a PVD method, and an ALD method.

In the following, description is given of an operation of the stacked imaging element (the first imaging element 10) including the charge accumulation electrode of Example 1 with reference to FIGS. 5 and 6A. The imaging element of Example 1 further includes a control section provided in the semiconductor substrate 70 and including a drive circuit. The first electrode 21, the second electrode 22, and the charge accumulation electrode 24 are coupled to the drive circuit. Here, the potential of the first electrode 21 is made higher than the potential of the second electrode 22. That is, for example, the first electrode 21 is set to a positive potential and the second electrode 22 is set to a negative potential. Then, electrons generated by photoelectric conversion in the photoelectric conversion layer 23A are read out to the floating diffusion layer. The same applies also to other examples.

Figure 20:
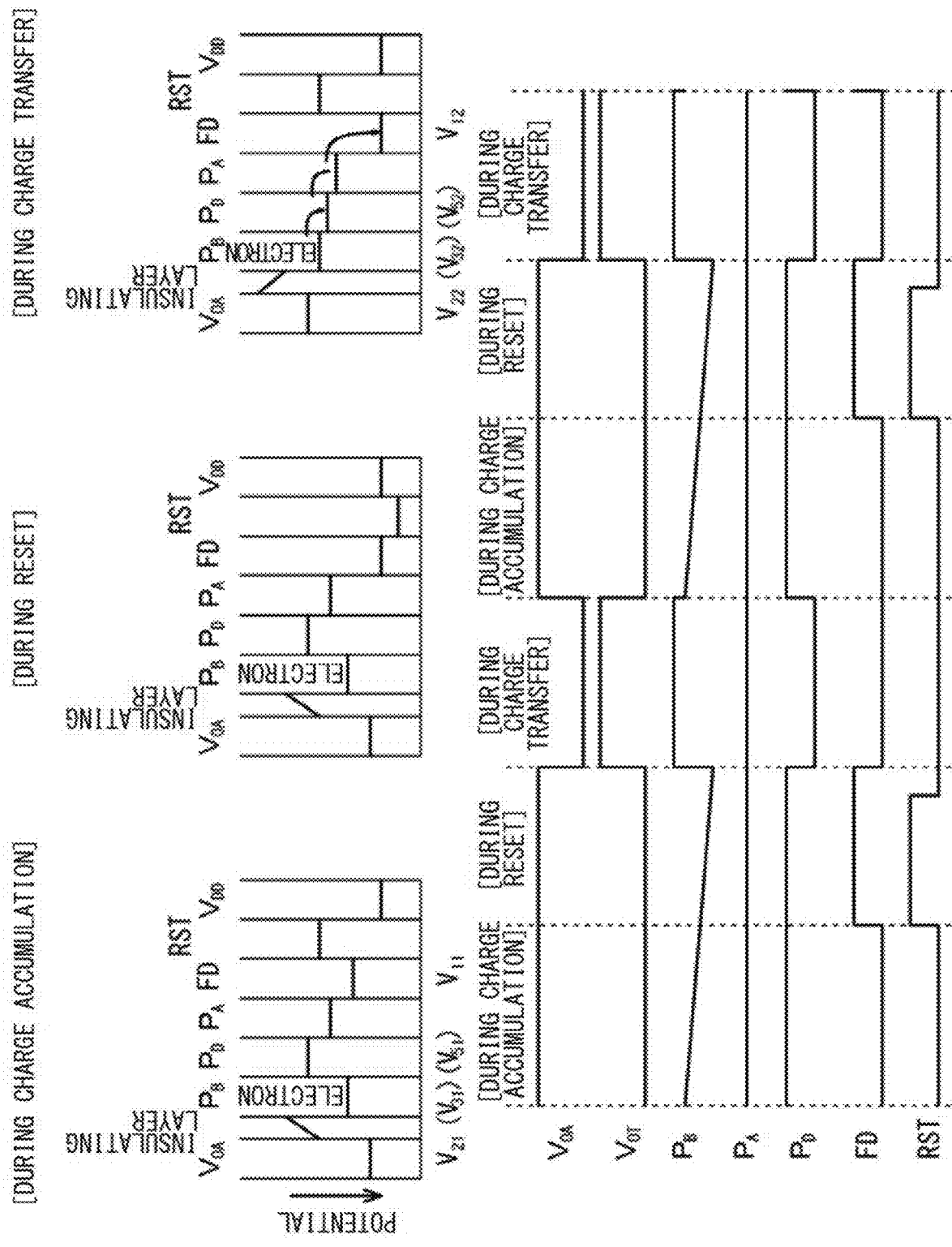
FIG. 20 schematically illustrates a state of potential at each part during operation of the imaging element of Example 4.
Figure 21:
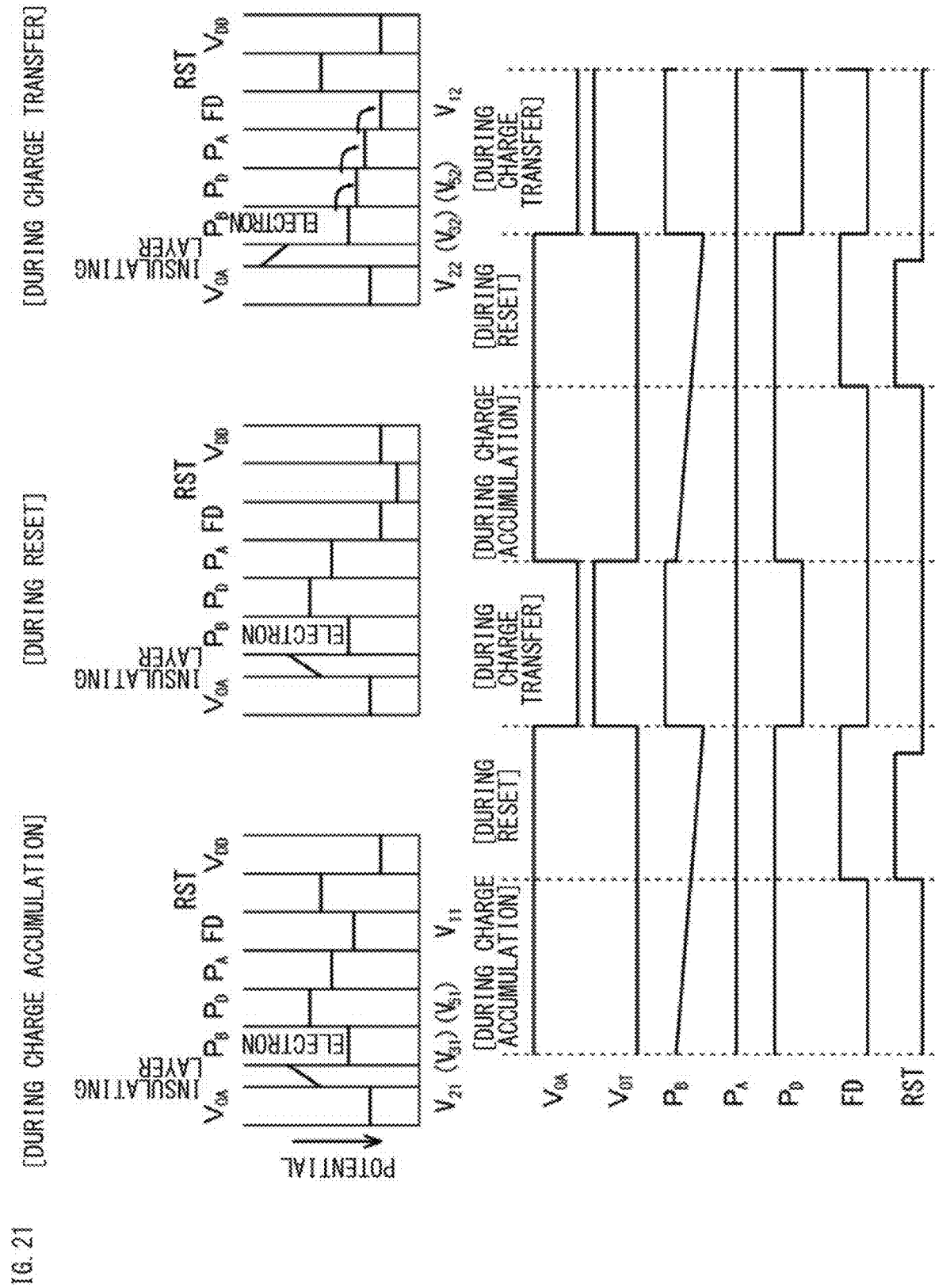
FIG. 21 schematically illustrates a state of potential at each part during another operation of the imaging element of Example 4.

Reference numerals used in FIG. 5; FIGS. 20 and 21 in Example 4 described later; and FIGS. 32 and 33 in Example 6 are as follows.

P$_A$: Potential at point P$_A$ in a region of the inorganic semiconductor material layer 23B opposed to a region positioned intermediate between the charge accumulation electrode 24 or a transfer control electrode (charge transfer electrode) 25 and the first electrode 21

P$_B$: Potential at point P$_B$ in a region of the inorganic semiconductor material layer 23B opposed to the charge accumulation electrode 24

P$_{C1}$: Potential at point P$_{C1}$ in a region of the inorganic semiconductor material layer 23B opposed to a charge accumulation electrode segment 24A P$_{C2}$: Potential at point P$_{C2}$ in a region of the inorganic semiconductor material layer 23B opposed to a charge accumulation electrode segment 24B P$_{C3}$: Potential at point P$_{C3}$ in a region of the inorganic semiconductor material layer 23B opposed to a charge accumulation electrode segment 24C P$_D$: Potential at point P$_D$ in a region of the inorganic semiconductor material layer 23B opposed to the transfer control electrode (charge transfer electrode) 25

FD: Potential at the first floating diffusion layer FD$_1$

V$_{OA}$: Potential at the charge accumulation electrode 24

V$_{OA-A}$: Potential at the charge accumulation electrode segment 24A

V$_{OA-B}$: Potential at the charge accumulation electrode segment 24B

V$_{OA-C}$: Potential at the charge accumulation electrode segment 24C

V$_{OT}$: Potential at the transfer control electrode (charge transfer electrode) 25

RST: Potential at the gate section 51 of the reset transistor TR1$_{rst}$

V$_{DD}$: Potential of the power supply

VSL$_1$: Signal line (data output line) VSL$_1$

TR1$_{rst}$: Reset transistor TR1$_{rst}$

TR1$_{amp}$: Amplification transistor TR1$_{amp}$

TR1$_{sel}$: Selection transistor TR1$_{sel}$

During a charge accumulation period, from the drive circuit, the potential V$_{11}$ is applied to the first electrode 21 and the potential V$_{31}$ is applied to the charge accumulation electrode 24. Light having entered the photoelectric conversion layer 23A generates photoelectric conversion in the photoelectric conversion layer 23A. Holes generated by the photoelectric conversion are sent from the second electrode 22 to the drive circuit via a wiring line V$_{OU}$. Meanwhile, because the potential of the first electrode 21 is higher than the potential of the second electrode 22, i.e., because a positive potential is to be applied to the first electrode 21 and a negative potential is to be applied to the second electrode 22, $V_{31} \geq V_{11}$ holds true, and preferably, $V_{31} > V_{11}$ holds true. This causes electrons generated by the photoelectric conversion to be attracted to the charge accumulation electrode 24, and to remain in a region of the inorganic semiconductor material layer 23B, or the inorganic semiconductor material layer 23B and the photoelectric conversion layer 23A (hereinafter, these layers are collectively referred to as an "inorganic semiconductor material layer 23B or the like"), opposed to the charge accumulation electrode 24. That is, electric charge is accumulated in the inorganic semiconductor material layer 23B or the like. Because $V_{31} > V_{11}$ holds true, the electrons generated inside of the photoelectric conversion layer 23A would not move toward the first electrode 21. With the passage of time of photoelectric conversion, the potential in the region of the inorganic semiconductor material layer 23B or the like opposed to the charge accumulation electrode 24 has a more negative value.

A reset operation is performed later in the charge accumulation period. This resets the potential of the first floating diffusion layer $FD_1$, and the potential of the first floating diffusion layer $FD_1$ shifts to the potential $V_{DD}$ of the power supply.

After completion of the reset operation, the electric charge is read out. That is, during a charge transfer period, from the drive circuit, the potential $V_{12}$ is applied to the first electrode 21 and the potential $V_{32}$ is applied to the charge accumulation electrode 24. Here, $V_{32} < V_{12}$ holds true. This causes the electrons remaining in the region of the inorganic semiconductor material layer 23B or the like opposed to the charge accumulation electrode 24 to be read out to the first electrode 21, and further to the first floating diffusion layer $FD_1$. That is, the electric charge accumulated in the inorganic semiconductor material layer 23B or the like is read out to the control section.

This completes the series of operations including the charge accumulation, the reset operation, and the charge transfer.

The operations of the amplification transistor $TR1_{amp}$ and the selection transistor $TR1_{sel}$ after the electrons are read out to the first floating diffusion layer $FD_1$ are the same as the operations of existing ones of these transistors. In addition, the series of operations including the charge accumulation, the reset operation, and the charge transfer of the second imaging element 11 and the third imaging element 12 are similar to the series of operations including the charge accumulation, the reset operation, and the charge transfer according to existing techniques. In addition, reset noise of the first floating diffusion layer $FD_1$ is removable through a correlated double sampling (CDS, Correlated Double Sampling) process in a similar manner to the existing techniques.

As has been described, in Example 1, the charge accumulation electrode is provided that is disposed at a distance from the first electrode and disposed to be opposed to the photoelectric conversion layer with the insulating layer interposed therebetween. Thus, when the photoelectric conversion layer is irradiated with light and photoelectric conversion occurs in the photoelectric conversion layer, a kind of capacitor is formed by the inorganic semiconductor material layer or the like, the insulating layer, and the charge accumulation electrode, making it possible to accumulate electric charge in the inorganic semiconductor material layer or the like. For this reason, at the time of start of exposure, it is possible to completely deplete the charge accumulation section to thereby eliminate the electric charge. As a result, it is possible to suppress the occurrence of a phenomenon in which kTC noise becomes greater and random noise deteriorates to cause reduction in quality of the captured images. In addition, because it is possible to reset all of the pixels all at once, the so-called global shutter function is achievable.

FIG. 68 illustrates a conceptual diagram of the solid-state imaging device of Example 1. The solid-state imaging device 100 of Example 1 includes an imaging region 111 in which stacked imaging elements 101 are arranged in a two-dimensional array, and, as drive circuits (peripheral circuits) thereof, the vertical drive circuit 112, the column signal processing circuit 113, a horizontal drive circuit 114, an output circuit 115, a drive control circuit 116, and the like. Needless to say, these circuits may be configured of known circuits, or may be configured using other circuit configurations (e.g., various circuits used in existing CCD imaging devices or CMOS imaging devices). In FIG. 68, the representation of a reference numeral "101" for the stacked imaging elements 101 is made in only one row.

On the basis of a vertical synchronization signal, a horizontal synchronization signal, and a master clock, the drive control circuit 116 generates a clock signal and a control signal serving as a reference for operations of the vertical drive circuit 112, the column signal processing circuit 113, and the horizontal drive circuit 114. Then, the clock signal and the control signal thus generated are inputted to the vertical drive circuit 112, the column signal processing circuit 113, and the horizontal drive circuit 114.

The vertical drive circuit 112 includes, for example, a shift register, and selectively scans the stacked imaging elements 101 in the imaging region 111 sequentially in the vertical direction row by row. Then, a pixel signal (image signal) based on a current (signal) generated according to the amount of light reception at each stacked imaging element 101 is sent to the column signal processing circuit 113 via the signal line (data output line) 117 or VSL.

The column signal processing circuit 113 is disposed, for example, for each column of the stacked imaging elements 101, and performs signal processing, including noise removal and signal amplification, on the image signals outputted from one row of the stacked imaging elements 101 for each imaging element in accordance with a signal from a black reference pixel (although not illustrated, formed around the effective pixel region). At an output stage of the column signal processing circuit 113, a horizontal selection switch (not illustrated) is provided to be coupled between the output stage and a horizontal signal line 118.

The horizontal drive circuit 114 includes, for example, a shift register, and sequentially outputs horizontal scan pulses to sequentially select each one of the column signal processing circuits 113, thereby outputting a signal from each of the column signal processing circuits 113 to the horizontal signal line 118.

The output circuit 115 performs signal processing on the signals sequentially supplied from the respective column signal processing circuits 113 through the horizontal signal line 118, and outputs the processed signals.

Figure 9:
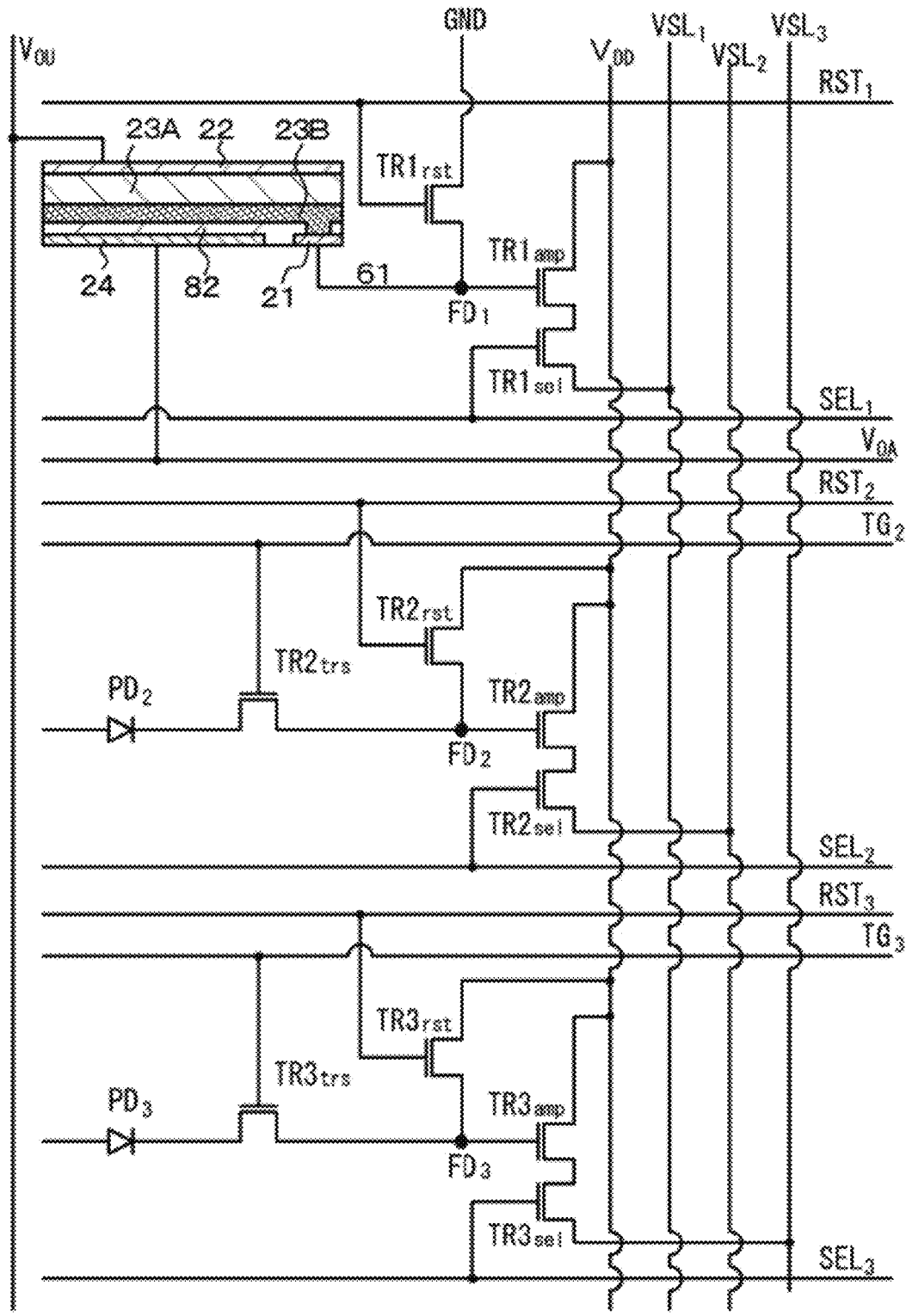
FIG. 9 is an equivalent circuit diagram of a modification example of the imaging element of Example 1.
Figure 10:
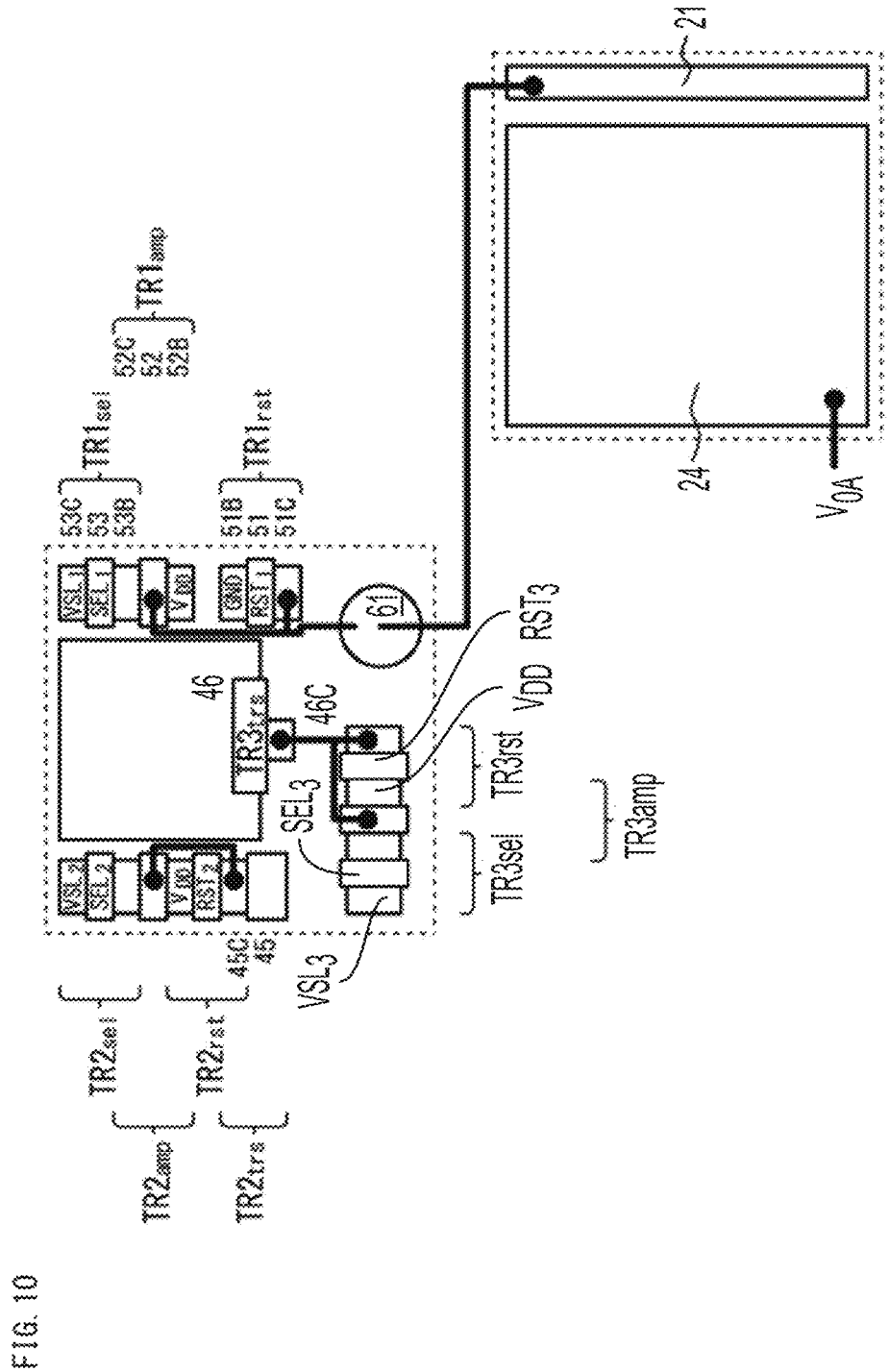
FIG. 10 is a schematic layout diagram of the first electrode and the charge accumulation electrode, and the transistors included in the control section that are included in the modification example of the imaging element of Example 1 illustrated in FIG. 9.

FIG. 9 is an equivalent circuit diagram of a modification example of the imaging element and the stacked imaging element of Example 1, and FIG. 10 is a schematic layout diagram of the first electrode, the charge accumulation electrode, and the transistors included in the control section. As illustrated, the other source/drain region 51B of the reset transistor $TR1_{rst}$ may be grounded, instead of being coupled to the power supply $V_{DD}$.

It is possible to produce the imaging element and stacked imaging element of Example 1 by the following method, for example. That is, an SOI substrate is prepared first. A first silicon layer is then formed on the surface of the SOI substrate on the basis of an epitaxial growth method, and the p+ layer 73 and the n-type semiconductor region 41 are formed on the first silicon layer. Next, a second silicon layer is formed on the first silicon layer on the basis of an epitaxial growth method, and the element separation region 71, the oxide film 72, the p+ layer 42, the n-type semiconductor region 43, and the p+ layer 44 are formed on the second silicon layer. In addition, various transistors and the like included in the control section of the imaging element are formed on the second silicon layer, and the wiring layer 62, the interlayer insulating layer 76, and various wiring lines are further formed thereon. The interlayer insulating layer 76 and a support substrate (not illustrated) are thereafter bonded to each other. Thereafter, the SOI substrate is removed to expose the first silicon layer. The surface of the second silicon layer corresponds to the front surface 70A of the semiconductor substrate 70, and the surface of the first silicon layer corresponds to the back surface 70B of the semiconductor substrate 70. In addition, the first silicon layer and the second silicon layer are collectively expressed as the semiconductor substrate 70. Next, an opening for forming the contact hole section 61 is formed on the side of the back surface 70B of the semiconductor substrate 70, and the HfO$_2$ film 74, the insulating material film 75, and the contact hole section 61 are formed. Further, the pad sections 63 and 64, the interlayer insulating layer 81, the connection holes 65 and 66, the first electrode 21, the charge accumulation electrode 24, and the insulating layer 82 are formed. Next, the connection section 67 is opened, and the inorganic semiconductor material layer 23B, the photoelectric conversion layer 23A, the second electrode 22, the protection material layer 83, and the on-chip microlens 14 are formed. It is possible to obtain the imaging element and the stacked imaging element of Example 1 in the above-described manner.

In addition, although not illustrated, the insulating layer 82 may have a two-layer configuration including an insulating layer or lower layer and an insulating layer or upper layer. That is, it is sufficient that the insulating layer or lower layer is formed at least over the charge accumulation electrode 24 and in a region between the charge accumulation electrode 24 and the first electrode 21 (more specifically, the insulating layer or lower layer may be formed on the interlayer insulating layer 81 including the charge accumulation electrode 24), a planarization process is performed on the insulating layer or lower layer, and thereafter, the insulating layer or upper layer is formed over the insulating layer or lower layer and the charge accumulation electrode 24. This makes it possible to accomplish the planarization of the insulating layer 82 with reliability. It is then sufficient that the connection section 67 is opened in the insulating layer 82 obtained in this way.

Example 2

Figure 11:
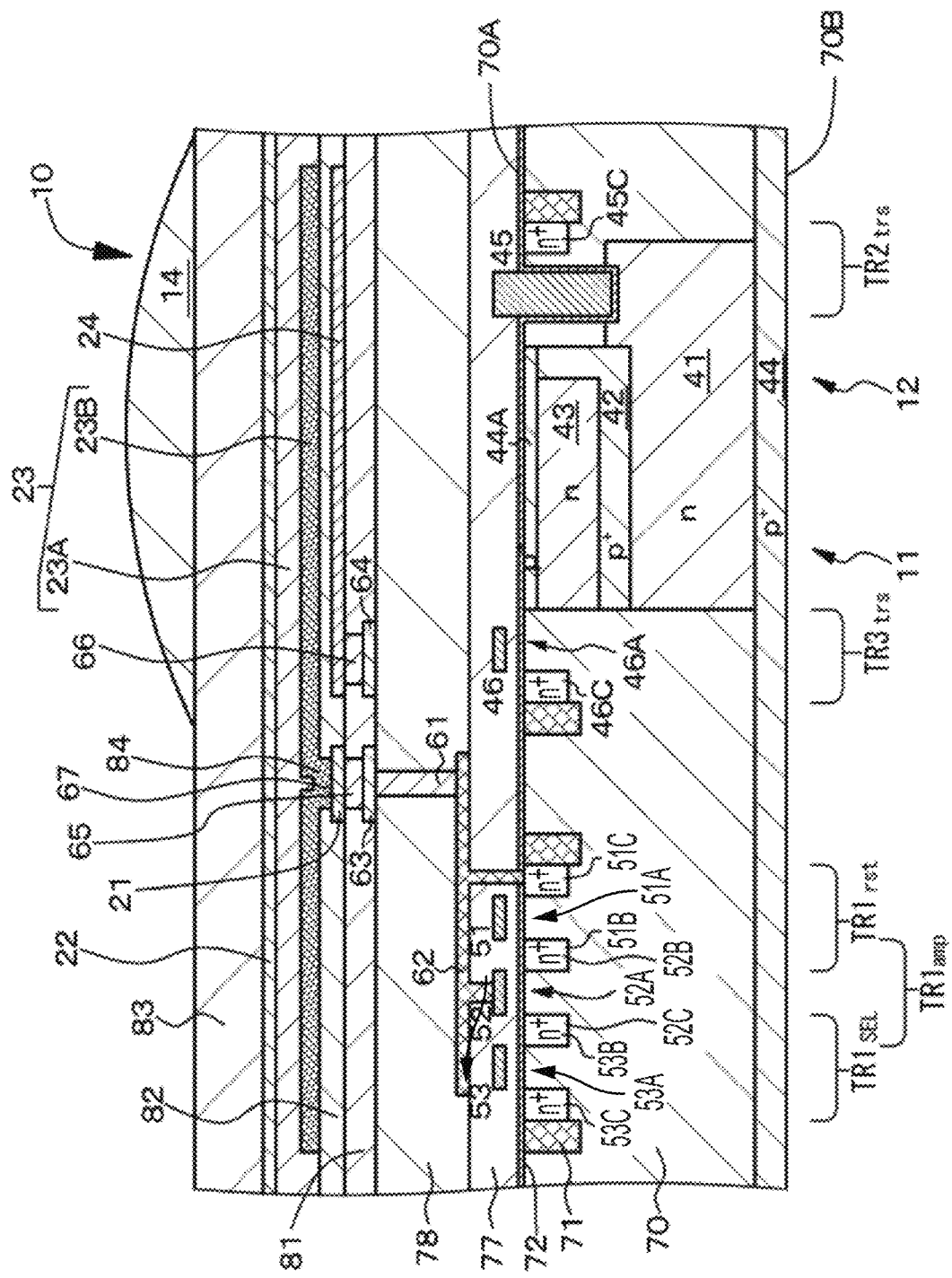
FIG. 11 is a schematic partial cross-sectional view of an imaging element of Example 2.

Example 2 is a modification of Example 1. FIG. 11 is a schematic partial cross-sectional view of an imaging element and a stacked imaging element of Example 2. The imaging element and the stacked imaging element of Example 2 are of the front illuminated type, and have a structure in which three imaging elements are stacked, the three imaging elements being: the green light imaging element of Example 1 of the first type (the first imaging element 10) having sensitivity to green light and including the green light photoelectric conversion layer of the first type for absorbing green light; the existing blue light imaging element of the second type (the second imaging element 11) having sensitivity to blue light and including the blue light photoelectric conversion layer of the second type for absorbing blue light; and the existing red light imaging element of the second type (the third imaging element 12) having sensitivity to red light and including the red light photoelectric conversion layer of the second type for absorbing red light. Here, the red light imaging element (the third imaging element 12) and the blue light imaging element (the second imaging element 11) are provided in the semiconductor substrate 70, and the second imaging element 11 is positioned closer to the light incident side than the third imaging element 12. In addition, the green light imaging element (the first imaging element 10) is provided above the blue light imaging element (the second imaging element 11).

As in Example 1, various transistors included in the control section are provided on side of the front surface 70A of the semiconductor substrate 70. These transistors may have configurations and structures substantially similar to those of the transistors described in Example 1. In addition, while the second imaging element 11 and the third imaging element 12 are provided in the semiconductor substrate 70, these imaging elements may also have configurations and structures substantially similar to those of the second imaging element 11 and the third imaging element 12 described in Example 1.

The interlayer insulating layer 81 is formed above the front surface 70A of the semiconductor substrate 70, and the first electrode 21, the inorganic semiconductor material layer 23B, the photoelectric conversion layer 23A, and the second electrode 22, and also the charge accumulation electrode 24, etc. are provided above the interlayer insulating layer 81, as in the imaging element of Example 1.

In this way, it is possible for the imaging element and the stacked imaging element of Example 2 to have configurations and structures similar to the configurations and structures of the imaging element and the stacked imaging element of Example 1, except for being of the front illuminated type, and the detailed description thereof is thus omitted.

Example 3

Example 3 is a modification of Example 1 and Example 2.

Figure 12:
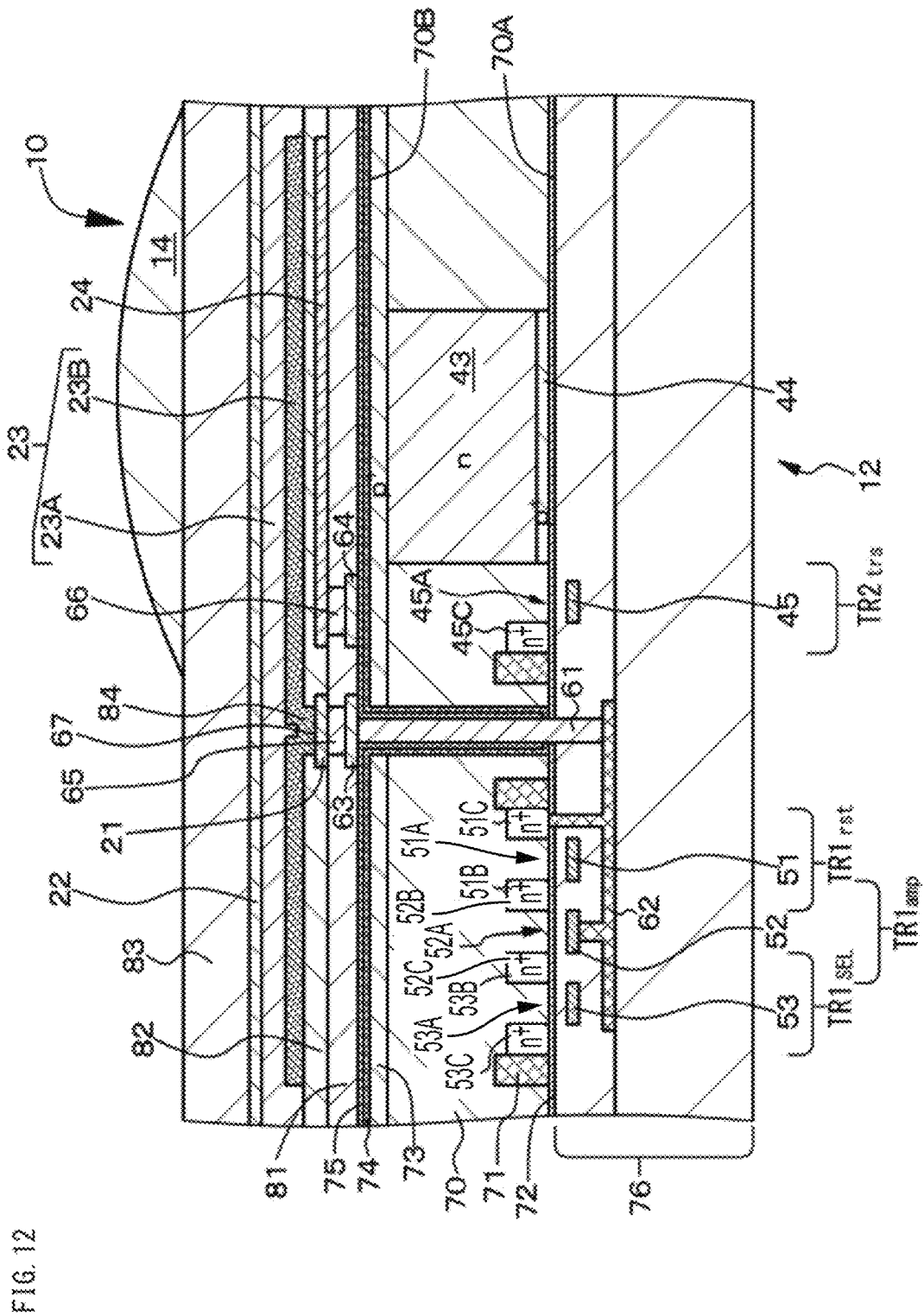
FIG. 12 is a schematic partial cross-sectional view of an imaging element of Example 3.
Figure 13:
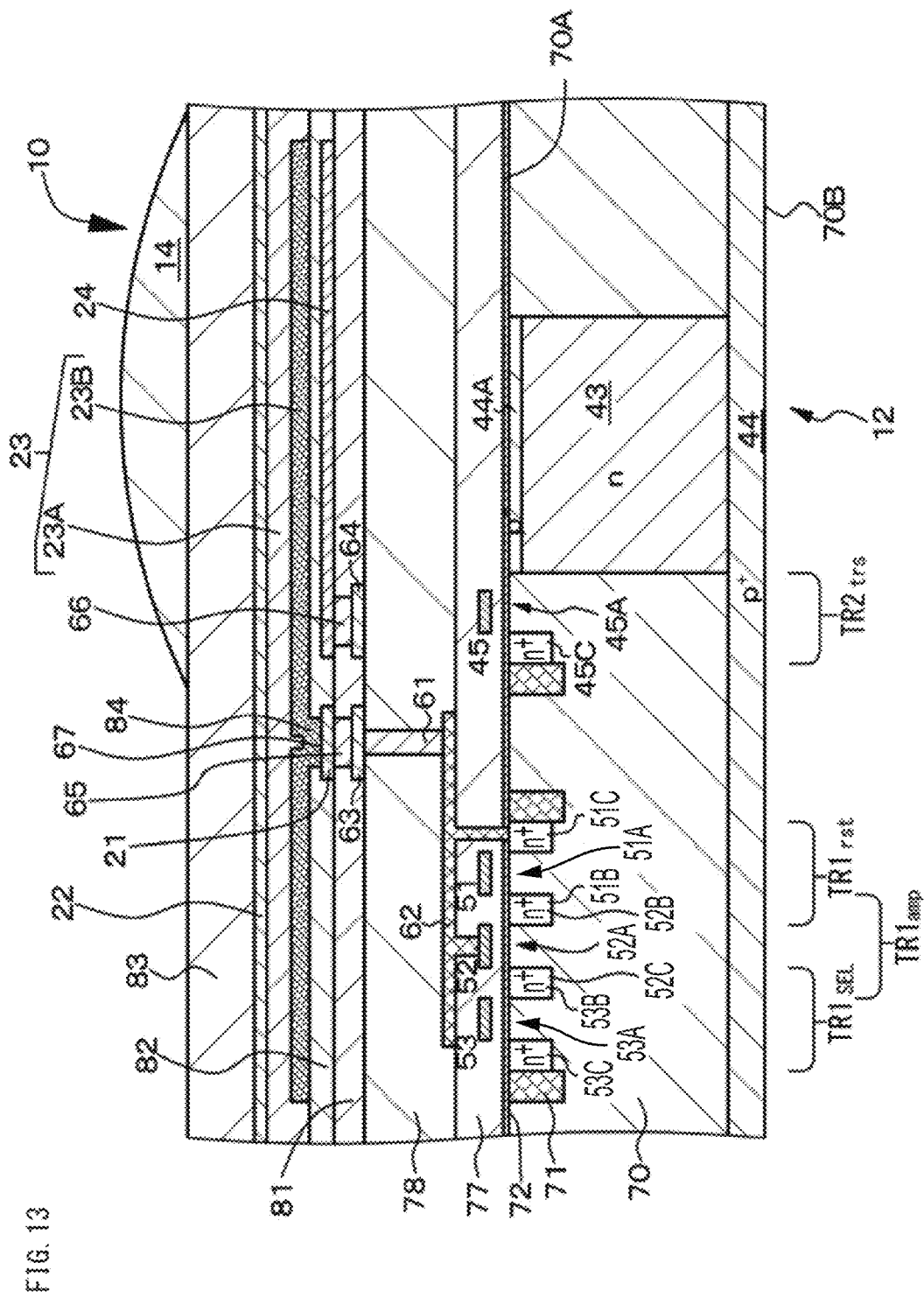
FIG. 13 is a schematic partial cross-sectional view of a modification example of the imaging element of Example 3.

FIG. 12 is a schematic partial cross-sectional view of an imaging element and a stacked imaging element of Example 3. The imaging element and the stacked imaging element of Example 3 are of the back illuminated type, and have a structure in which two imaging elements are stacked, the two imaging elements being the first imaging element 10 of Example 1 of the first type and the third imaging element 12 of the second type. In addition, FIG. 13 is a schematic partial cross-sectional view of a modification example of the imaging element and the stacked imaging element of Example 3. The modification example of the imaging element and the stacked imaging element of Example 3 are of the front illuminated type, and has a structure in which two imaging elements are stacked, the two imaging elements being the first imaging element 10 of Example 1 of the first type and the third imaging element 12 of the second type. Here, the first imaging element 10 absorbs light in primary colors, and the third imaging element 12 absorbs light in complementary colors. Alternatively, the first imaging element 10 absorbs white light, and the third imaging element 12 absorbs infrared rays.

Figure 14:
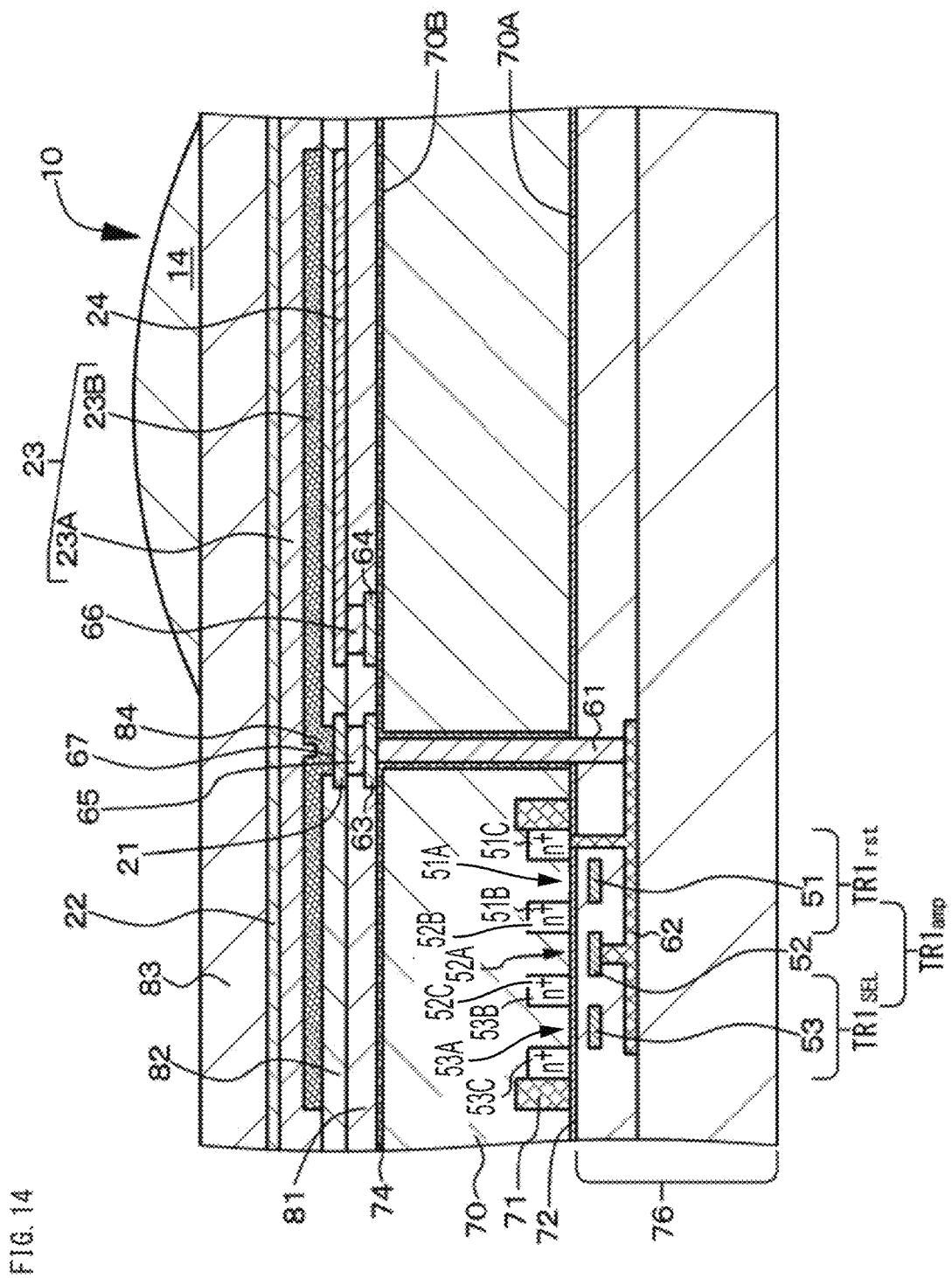
FIG. 14 is a schematic partial cross-sectional view of another modification example of the imaging element of Example 3.
Figure 15:
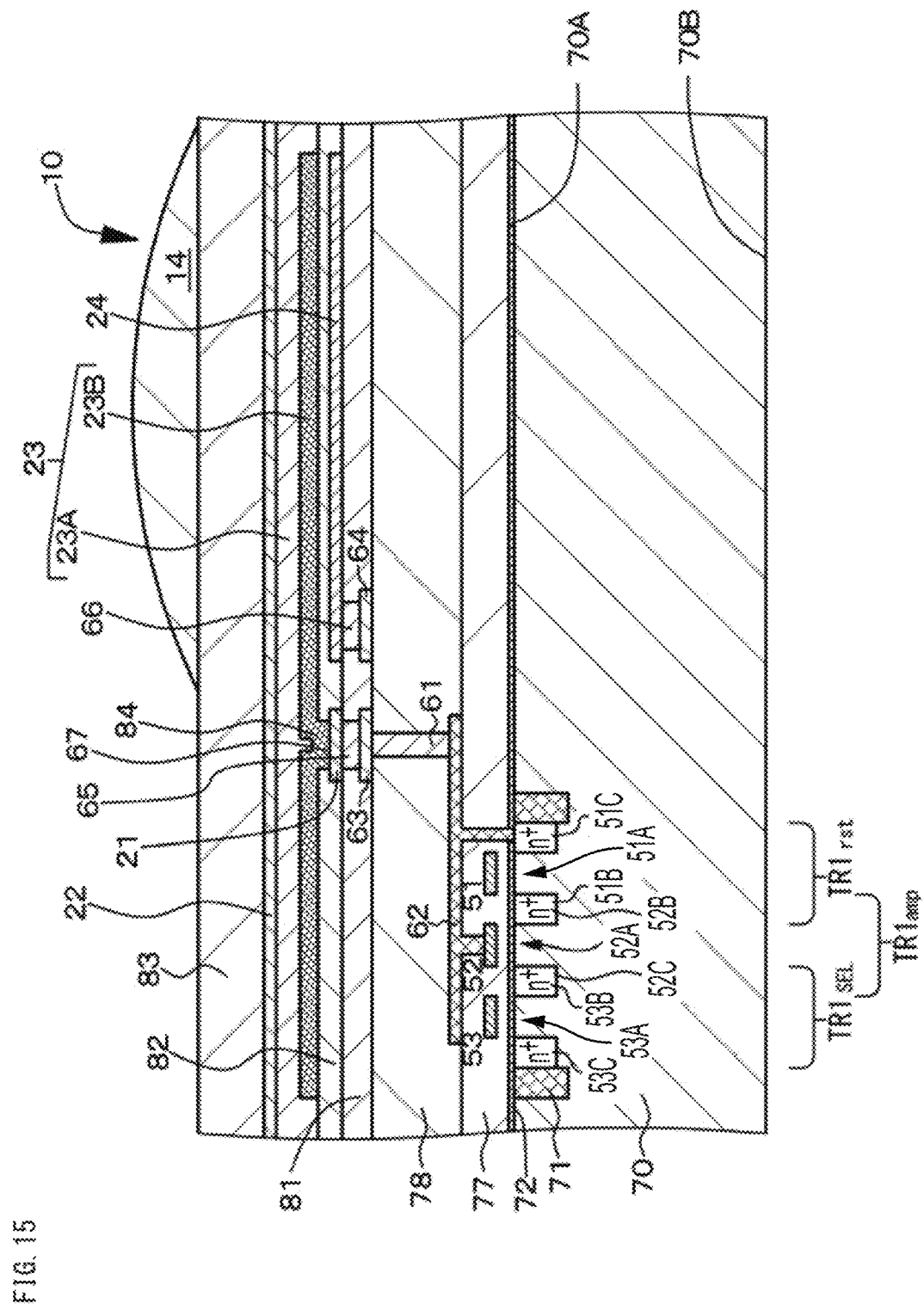
FIG. 15 is a schematic partial cross-sectional view of still another modification example of the imaging element of Example 3.

FIG. 14 is a schematic partial cross-sectional view of a modification example of the imaging element of Example 3. The modification example of the imaging element of Example 3 is of the back illuminated type, and includes the first imaging element 10 of Example 1 of the first type. In addition, FIG. 15 is a schematic partial sectional view of a modification example of the imaging element of Example 3. The modification example of the imaging element of Example 3 is of the front illuminated type, and includes the first imaging element 10 of Example 1 of the first type. Here, the first imaging element 10 includes three kinds of imaging elements, i.e., an imaging element that absorbs red light, an imaging element that absorbs green light, and an imaging element that absorbs blue light. Further, a plurality of ones of these imaging elements are included in the solid-state imaging device according to the first aspect of the present disclosure. Examples of arrangement of the plurality of ones of these imaging elements include a Bayer arrangement. Color filter layers for performing blue, green, and red spectral separation are disposed on the light incident side of the imaging elements as necessary.

Instead of providing one imaging element of Example 1 of the first type, two may be provided in a stacked mode (i.e., a mode in which two photoelectric conversion sections are stacked, and control sections for the two photoelectric conversion sections are provided in the semiconductor substrate), or alternatively, three may be provided in a stacked mode (i.e., a mode in which three photoelectric conversion sections may be stacked, and control sections for the three photoelectric conversion sections are provided in the semiconductor substrate). The following table illustrates examples of the stacked structures of the imaging element of the first type and the imaging element of the second type.

|  | First type | Second type |
| --- | --- | --- |
| Back illuminated type and front illuminated type | 1<br>Green<br>1<br>Primary color<br>1<br>White<br>1<br>Blue, Green, or Red<br>2<br>Green + Infrared<br>2<br>Green + Blue<br>2<br>White + Infrared<br>3<br>Green + Blue + Red<br>3<br>Green + Blue + Red<br>3<br>Blue + Green + Red | 2<br>Blue + Red<br>1<br>Complementary color<br>1<br>Infrared<br>0<br><br>2<br>Blue + Red<br>1<br>Red<br>0<br><br>2<br>Blue-Green (Emerald) + Infrared<br>1<br>Infrared<br>0 |

Example 4

Figure 6B:
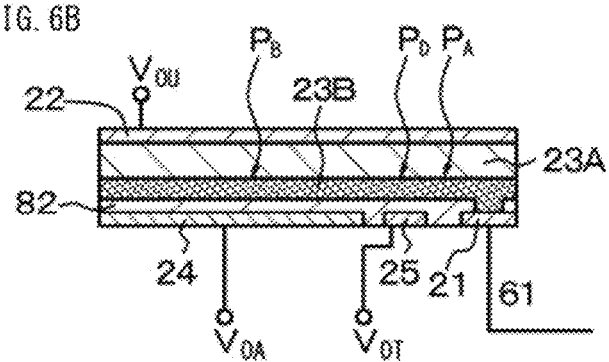
Figure 16:
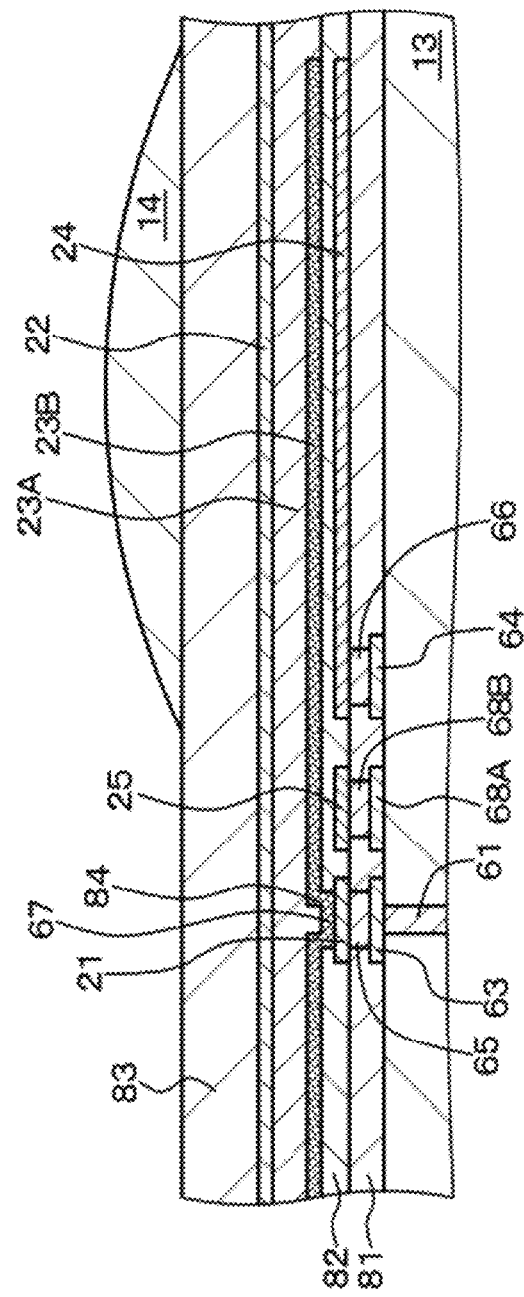
FIG. 16 is a schematic partial cross-sectional view of a portion of the imaging element of Example 4.
Figure 17:
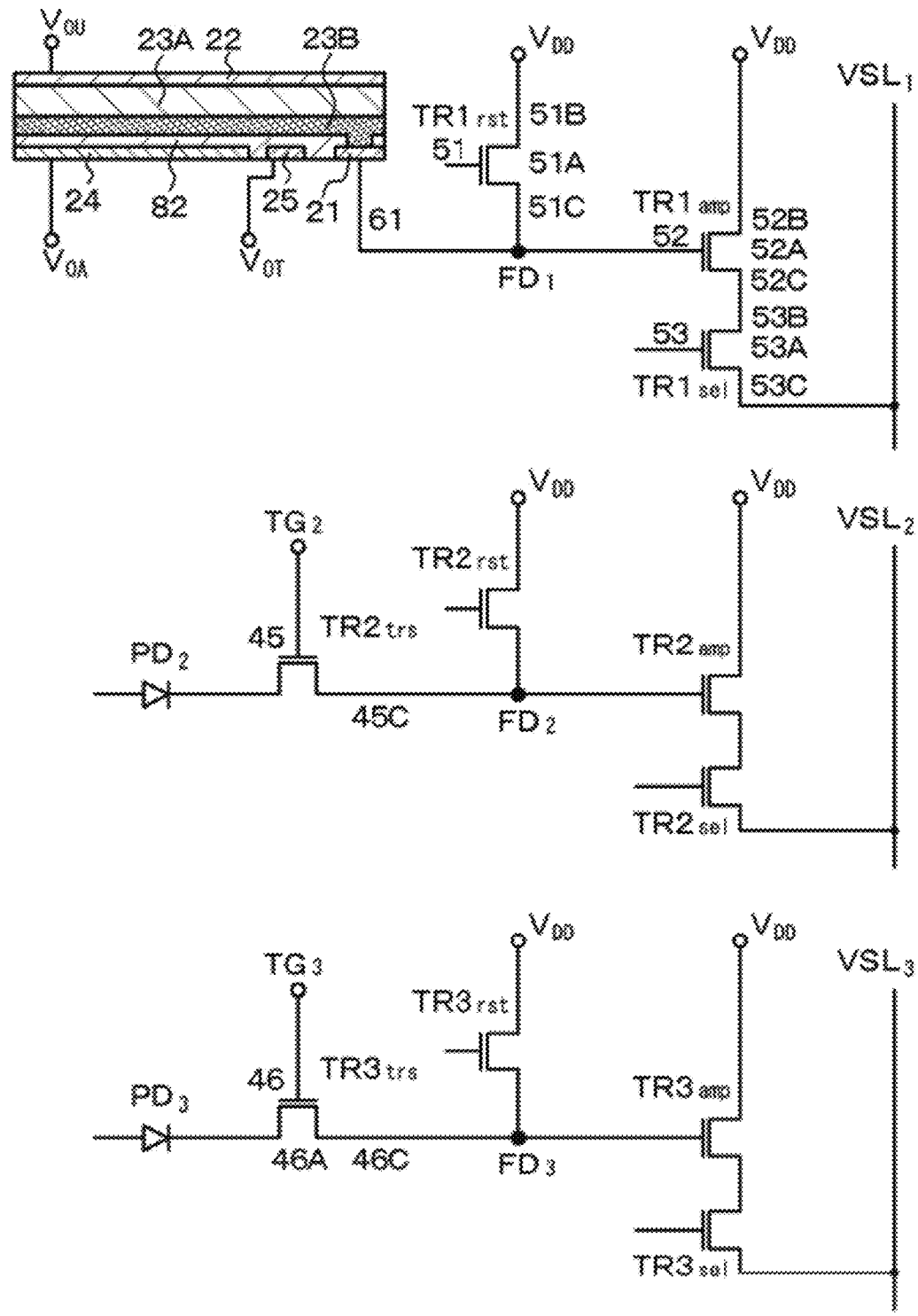
FIG. 17 is an equivalent circuit diagram of the imaging element of Example 4.
Figure 18:
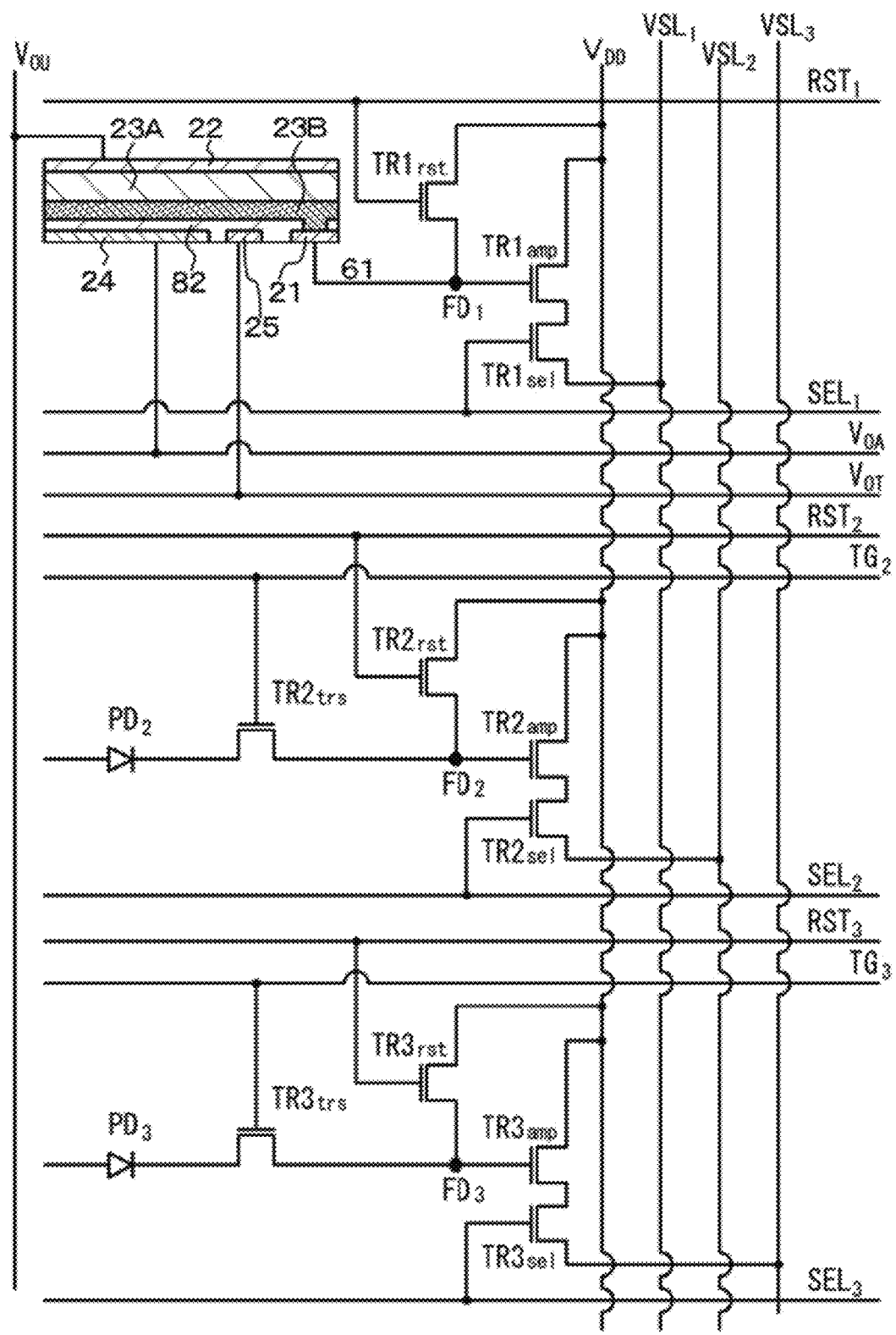
FIG. 18 is an equivalent circuit diagram of the imaging element of Example 4.
Figure 19:
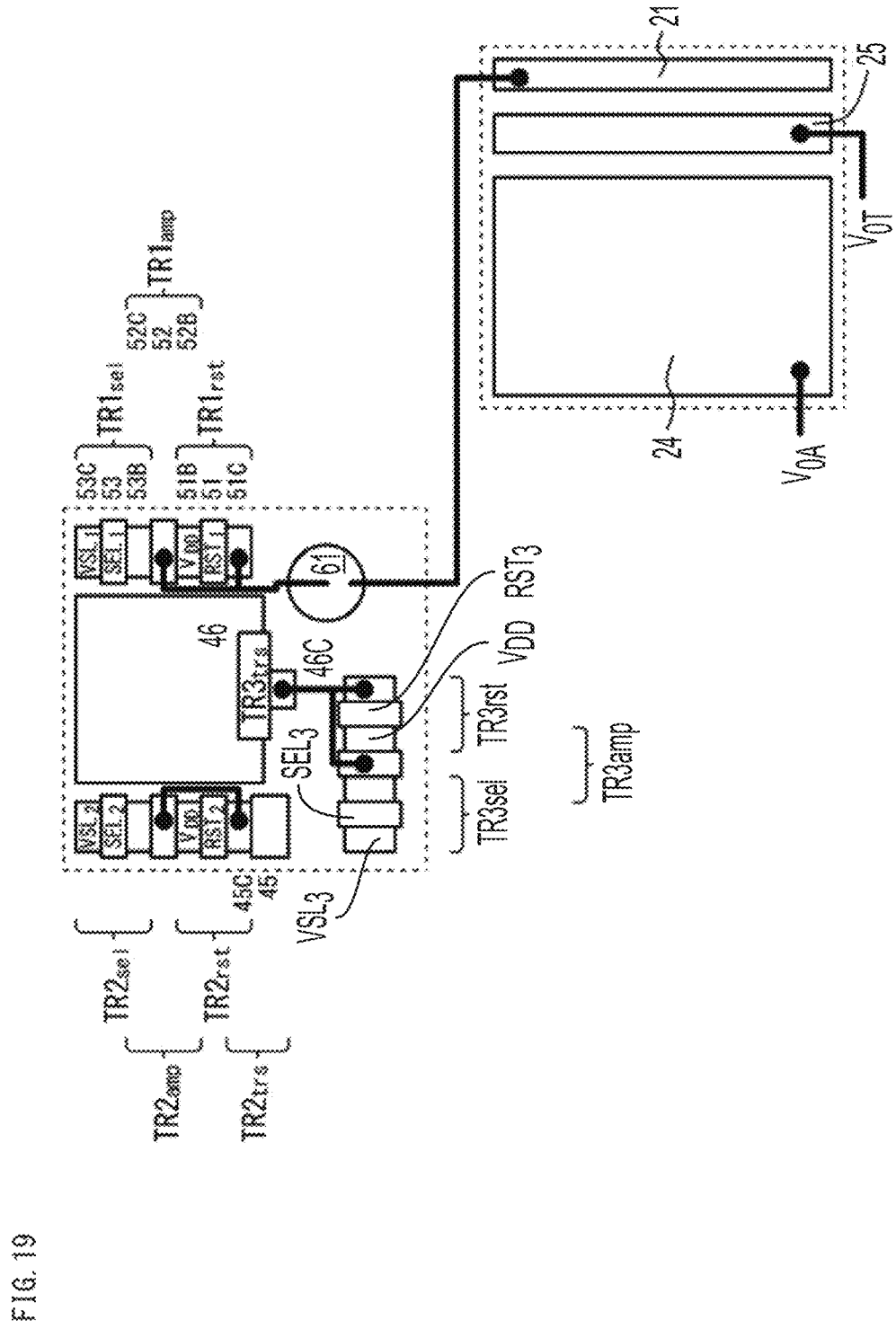
FIG. 19 is a schematic layout diagram of the first electrode, a transfer control electrode, and the charge accumulation electrode, and the transistors included in the control section that are included in the imaging element of Example 4.
Figure 22:
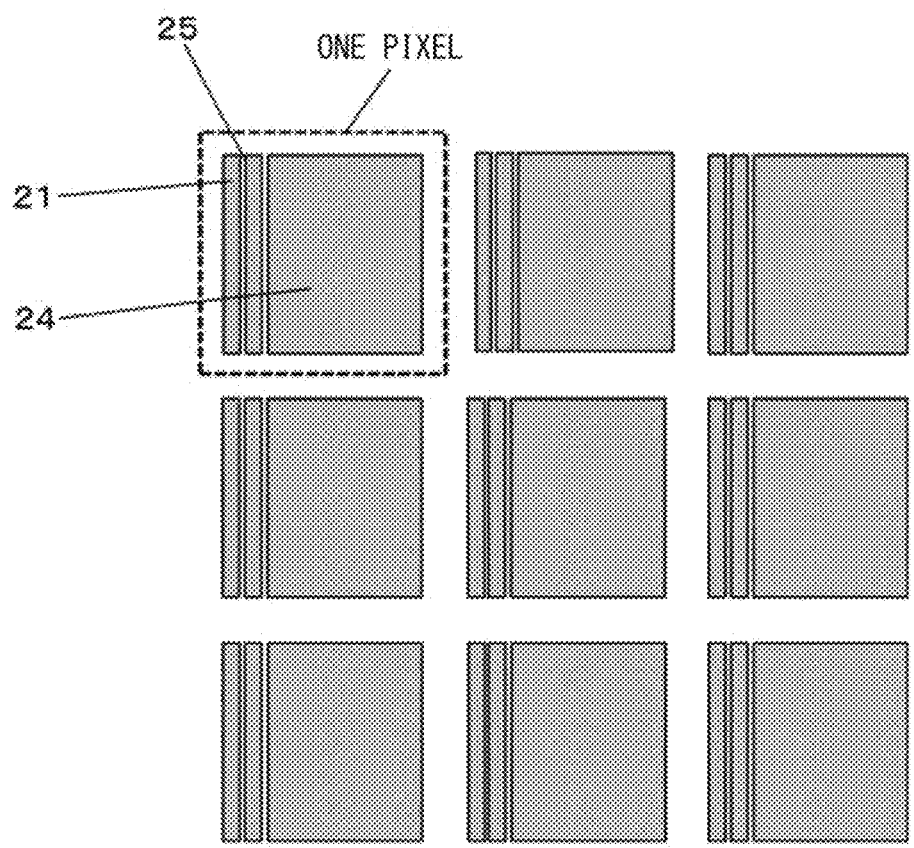
FIG. 22 is a schematic layout diagram of the first electrode, the transfer control electrode, and the charge accumulation electrode included in the imaging element of Example 4.
Figure 23:
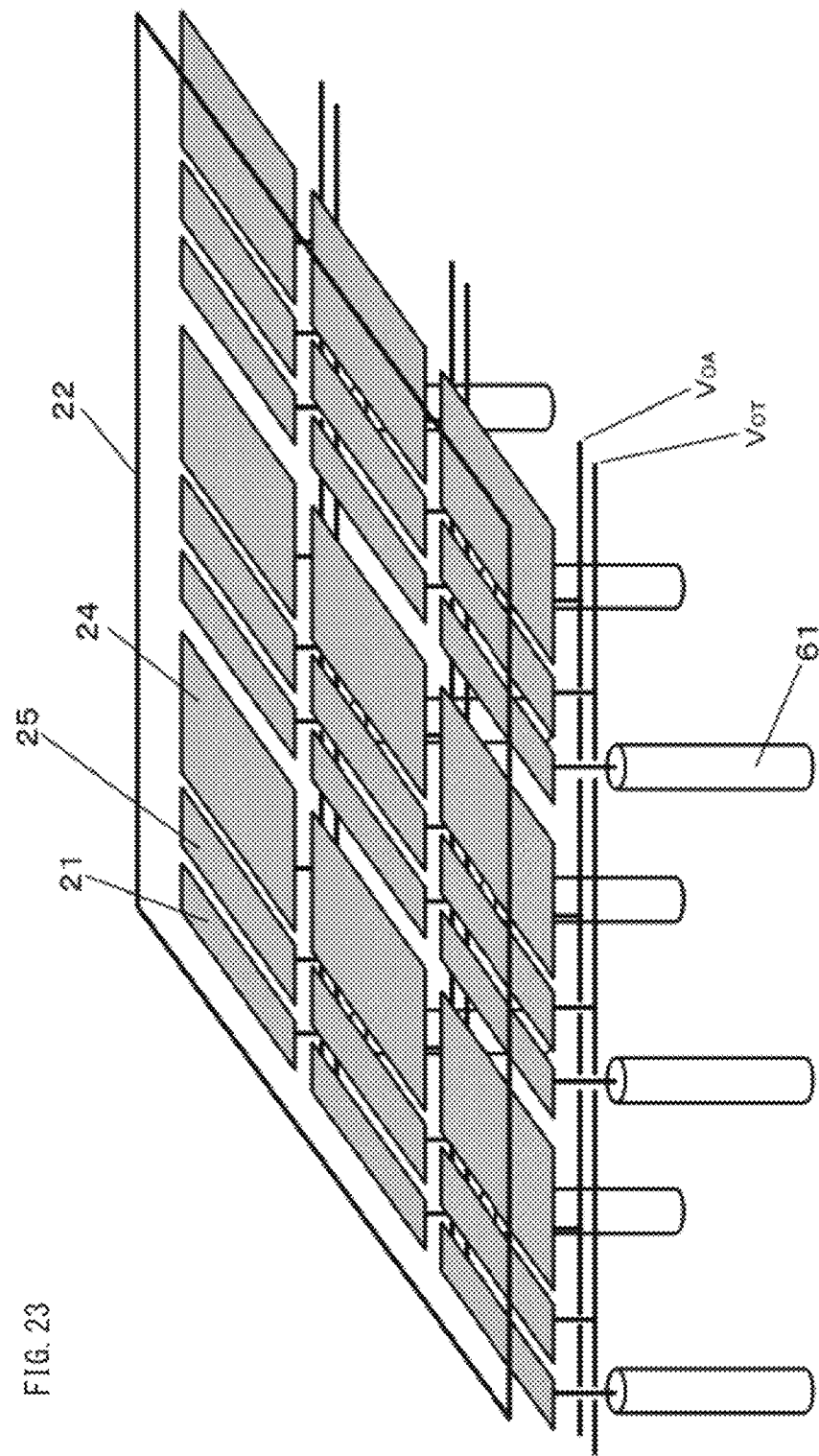
FIG. 23 is a schematic transparent perspective view of the first electrode, the transfer control electrode, the charge accumulation electrode, the second electrode, and the contact hole section included in the imaging element of Example 4.

Example 4 is a modification of Examples 1 to 3, and relates to an imaging element or the like including the transfer control electrode (charge transfer electrode) of the present disclosure. FIG. 16 is a schematic partial cross-sectional view of a portion of an imaging element and a stacked imaging element of Example 4. FIGS. 17 and 18 are equivalent circuit diagrams of the imaging element and the stacked imaging element of Example 4. FIG. 19 is a schematic layout diagram of the first electrode, the transfer control electrode, and the charge accumulation electrode, and transistors included in the control section that are included in the imaging element of Example 4. FIGS. 20 and 21 schematically illustrate a state of potentials at each part during operation of the imaging element of Example 4. FIG. 6B is an equivalent circuit diagram for describing each part of the imaging element of Example 4. In addition, FIG. 22 is a schematic layout diagram of the first electrode, the transfer control electrode, and the charge accumulation electrode included in the photoelectric conversion section of the imaging element of Example 4. FIG. 23 is a schematic transparent perspective view of the first electrode, the transfer control electrode, the charge accumulation electrode, the second electrode, and the contact hole section.

The imaging element and the stacked imaging element of Example 4 further include, between the first electrode 21 and the charge accumulation electrode 24, the transfer control electrode (charge transfer electrode) 25 disposed at a distance from the first electrode 21 and the charge accumulation electrode 24, and disposed to be opposed to the inorganic semiconductor material layer 23B with the insulating layer 82 interposed therebetween. The transfer control electrode 25 is coupled to a pixel drive circuit included in the drive circuit, via a connection hole 68B, a pad section 68A, and a wiring line $V_{OT}$ provided in the interlayer insulating layer 81.

In the following, description is given of an operation of the imaging element (the first imaging element 10) of Example 4 with reference to FIGS. 20 and 21. It is to be noted that, in FIGS. 20 and 21, the values of a potential to be applied to the charge accumulation electrode 24 and a potential at point $P_D$ are different.

During a charge accumulation period, from the drive circuit, the potential $V_{11}$ is applied to the first electrode 21, the potential $V_{31}$ is applied to the charge accumulation electrode 24, and the potential $V_{51}$ is applied to the transfer control electrode 25. Light having entered the photoelectric conversion layer 23A generates photoelectric conversion in the photoelectric conversion layer 23A. Holes generated by the photoelectric conversion are sent from the second electrode 22 to the drive circuit via the wiring line $V_{OU}$. Meanwhile, the potential of the first electrode 21 is higher than the potential of the second electrode 22, i.e., for example, a positive potential is to be applied to the first electrode 21 and a negative potential is to be applied to the second electrode 22. Thus, $V_{31}>V_{51}$ (e.g., $V_{31}>V_{11}>V_{51}$, or $V_{11}>V_{31}>V_{51}$) holds true. This causes electrons generated by the photoelectric conversion to be attracted to the charge accumulation electrode 24, and to remain in the region of the inorganic semiconductor material layer 23B or the like opposed to the charge accumulation electrode 24. That is, electric charge is accumulated in the inorganic semiconductor material layer 23B or the like. Because $V_{31}>V_{51}$ holds true, it is possible to prevent, with reliability, the electrons generated inside of the photoelectric conversion layer 23A from moving toward the first electrode 21. With the passage of time of photoelectric conversion, the potential in the region of the inorganic semiconductor material layer 23B or the like opposed to the charge accumulation electrode 24 has a more negative value.

A reset operation is performed later in the charge accumulation period. This resets the potential of the first floating diffusion layer $FD_1$, and the potential of the first floating diffusion layer $FD_1$ shifts to the potential $V_{DD}$ of the power supply.

After completion of the reset operation, the electric charge is read out. That is, during a charge transfer period, from the drive circuit, the potential $V_{12}$ is applied to the first electrode 21, the potential $V_{32}$ is applied to the charge accumulation electrode 24, and the potential $V_{52}$ is applied to the transfer control electrode 25. Here, $V_{32} \le V_{52} \le V_{12}$ (preferably, $V_{32} < V_{52} < V_{12}$) holds true. This causes the electrons remaining in the region of the inorganic semiconductor material layer 23B or the like opposed to the charge accumulation electrode 24 to be read out to the first electrode 21, and further to the first floating diffusion layer $FD_1$ with reliability. That is, the electric charge accumulated in the inorganic semiconductor material layer 23B or the like is read out to the control section.

This completes the series of operations including the charge accumulation, the reset operation, and the charge transfer.

The operations of the amplification transistor $TR1_{amp}$ and the selection transistor $TR1_{sel}$ after the electrons are read out to the first floating diffusion layer $FD_1$ are the same as the operations of existing ones of these transistors. In addition, for example, the series of operations including the charge accumulation, the reset operation, and the charge transfer of the second imaging element 11 and the third imaging element 12 are similar to the series of operations including the charge accumulation, the reset operation, and the charge transfer according to existing techniques.

Figure 24:
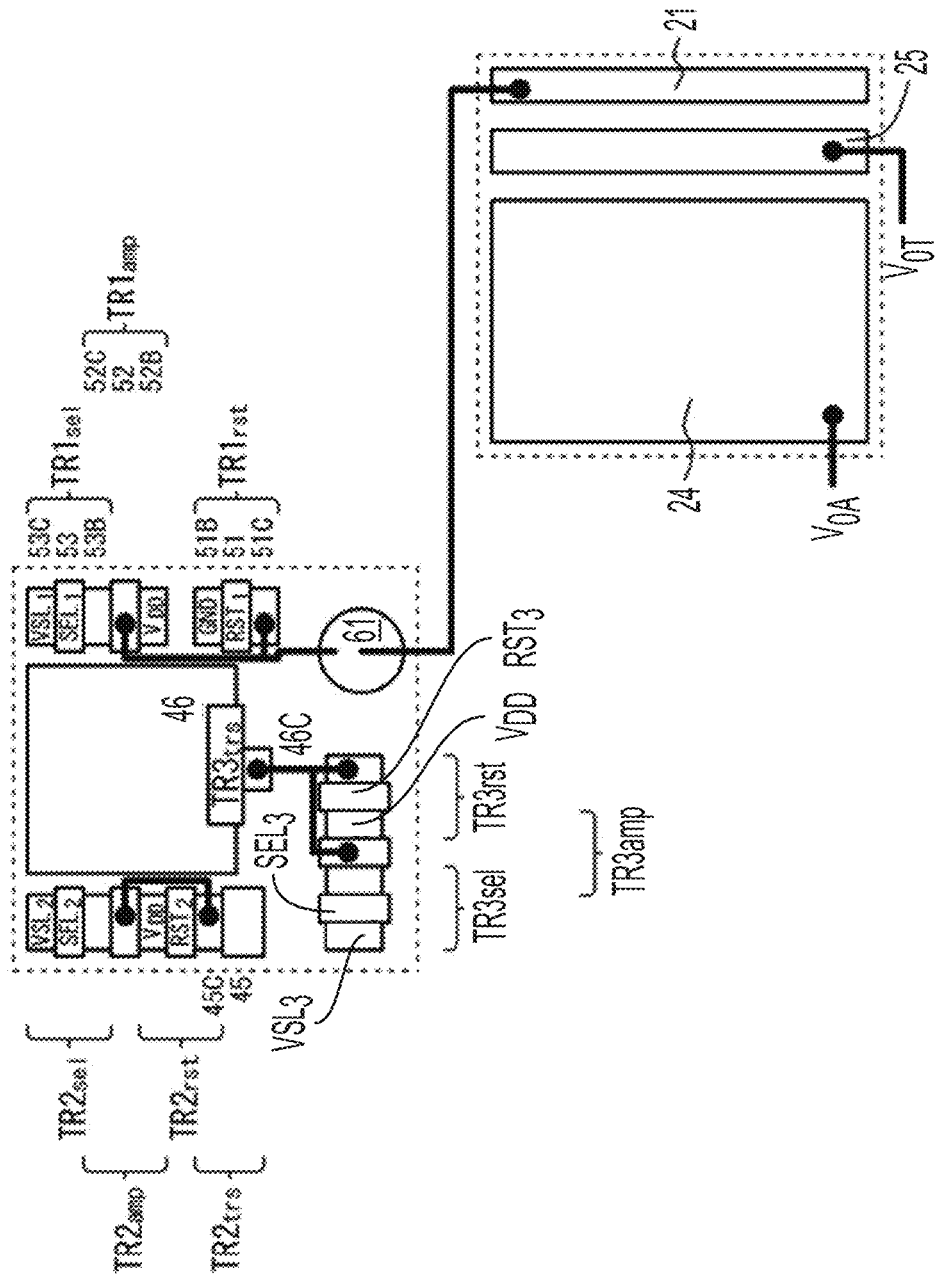
FIG. 24 is a schematic layout diagram of the first electrode, the transfer control electrode and the charge accumulation electrode, and the transistors included in the control section that are included in a modification example of the imaging element of Example 4.

FIG. 24 is a schematic layout diagram of the first electrode and the charge accumulation electrode, and the transistors included in the control section that are included in a modification example of the imaging element of Example 4. As illustrated, the other source/drain region 51B of the reset transistor $TR1_{rst}$ may be grounded, instead of being coupled to the power supply $V_{DD}$.

Example 5

Figure 25:
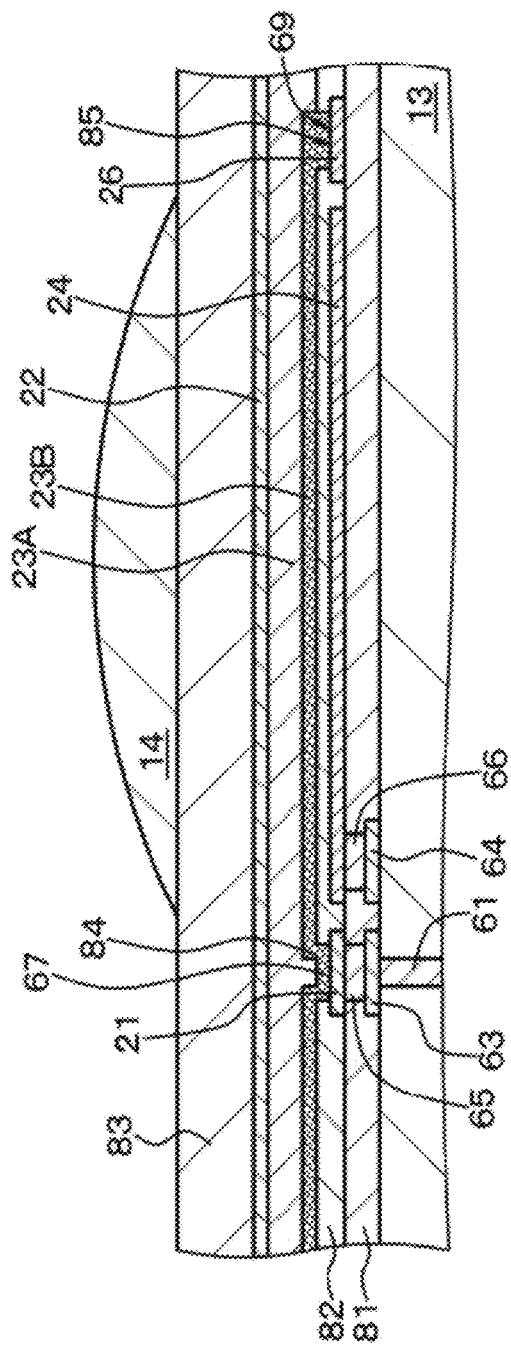
FIG. 25 is a schematic partial cross-sectional view of a portion of an imaging element of Example 5.
Figure 26:
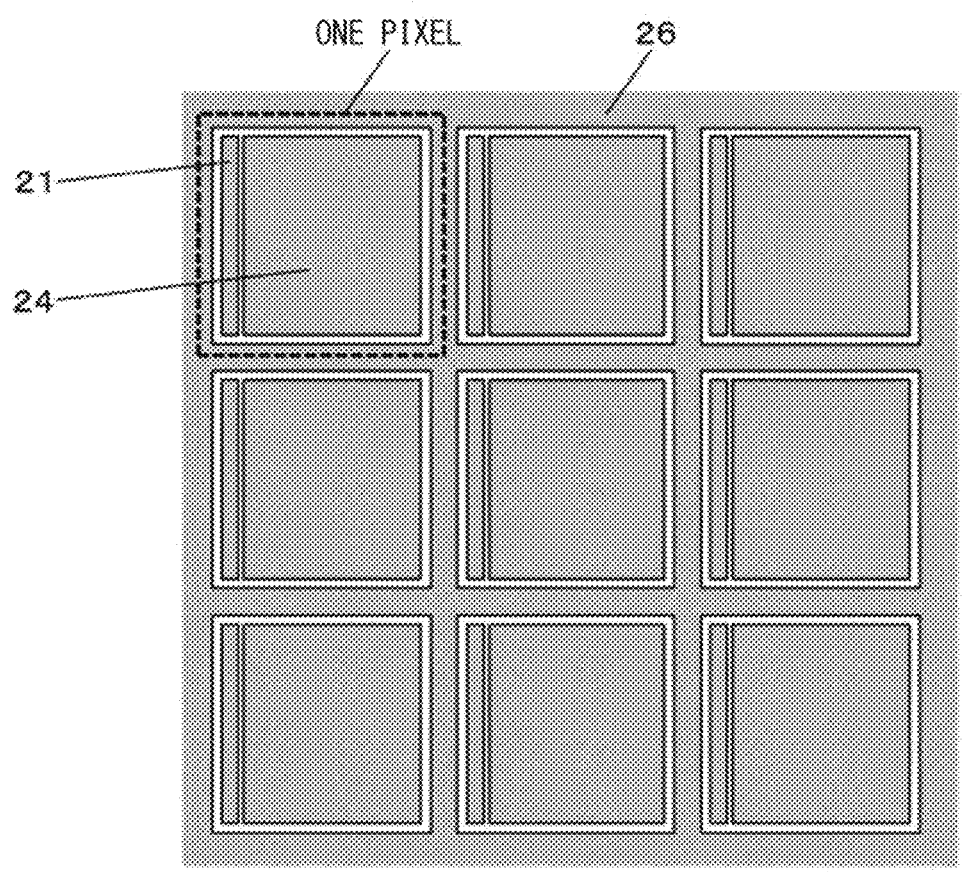
FIG. 26 is a schematic layout diagram of the first electrode, the charge accumulation electrode, and a charge drain electrode included in the imaging element of Example 5.
Figure 27:
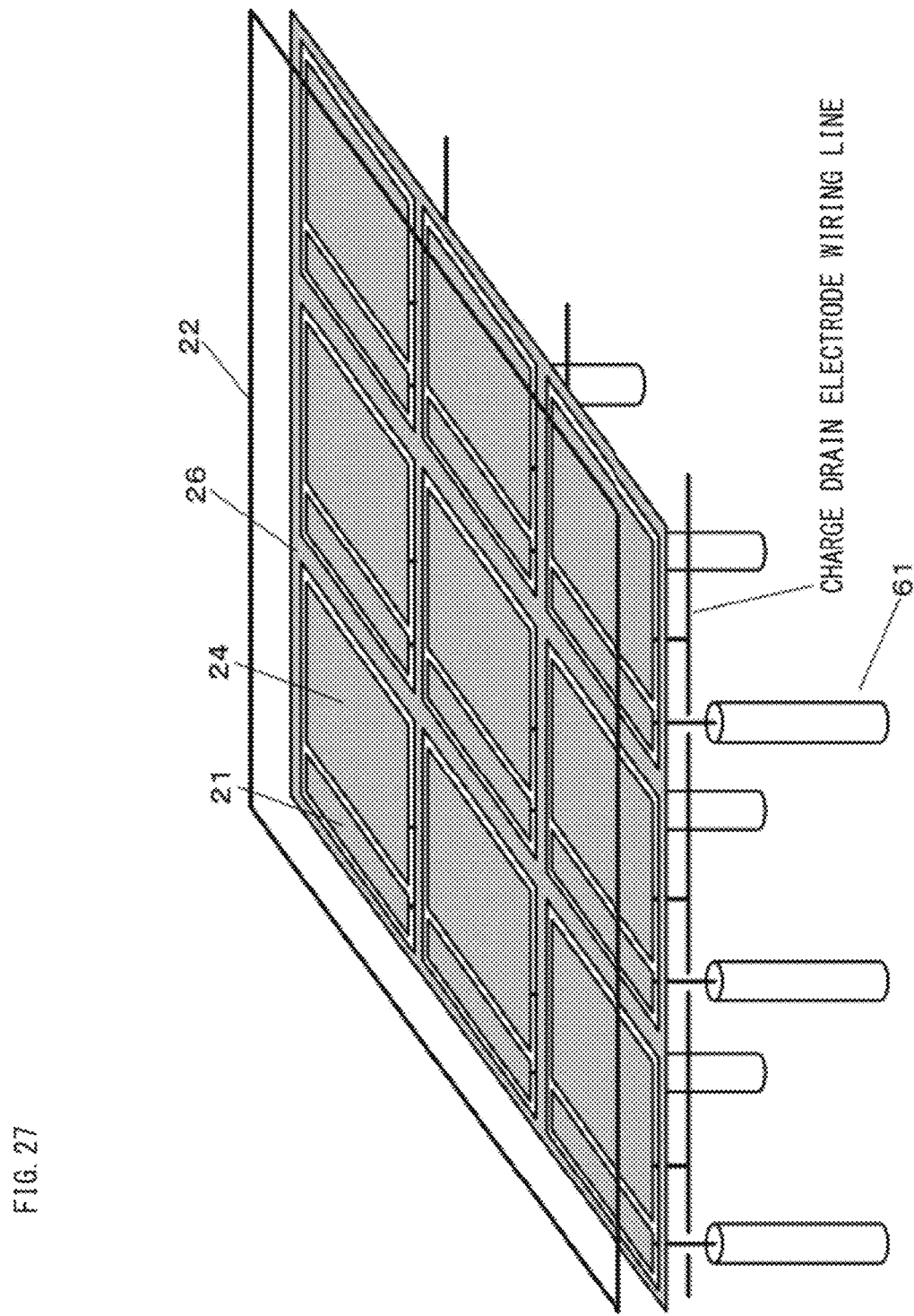
FIG. 27 is a schematic transparent perspective view of the first electrode, the charge accumulation electrode, the charge drain electrode, the second electrode, and the contact hole section included in the imaging element of Example 5.

Example 5 is a modification of Examples 1 to 4, and relates to an imaging element or the like including the charge drain electrode of the present disclosure. FIG. 25 is a schematic partial cross-sectional view of a portion of an imaging element of Example 5. FIG. 26 is a schematic layout diagram of the first electrode, the charge accumulation electrode, and the charge drain electrode included in the photoelectric conversion section including the charge accumulation electrode of the imaging element of Example 5. FIG. 27 is a schematic transparent perspective view of the first electrode, the charge accumulation electrode, the charge drain electrode, the second electrode, and the contact hole section.

The imaging element of Example 5 further includes a charge drain electrode 26 coupled to the inorganic semiconductor material layer 23B via a connection section 69 and disposed at a distance from the first electrode 21 and the charge accumulation electrode 24. Here, the charge drain electrode 26 is disposed to surround the first electrode 21 and the charge accumulation electrode 24 (i.e., in a picture frame form). The charge drain electrode 26 is coupled to the pixel drive circuit included in the drive circuit. The inorganic semiconductor material layer 23B extends in the connection section 69. That is, the inorganic semiconductor material layer 23B extends in a second opening 85 provided in the insulating layer 82, and the inorganic semiconductor material layer 23B is coupled to the charge drain electrode 26. The charge drain electrode 26 is shared by (common to) a plurality of imaging elements. A side surface of the second opening 85 may be sloped to widen the second opening 85 upward. The charge drain electrode 26 is usable as, for example, a floating diffusion or overflow drain of the photoelectric conversion section.

In Example 5, during a charge accumulation period, from the drive circuit, the potential $V_{11}$ is applied to the first electrode 21, the potential $V_{31}$ is applied to the charge accumulation electrode 24, the potential $V_{61}$ is applied to the charge drain electrode 26, and electric charge is accumulated in the inorganic semiconductor material layer 23B or the like. Light having entered the photoelectric conversion layer 23A generates photoelectric conversion in the photoelectric conversion layer 23A. Holes generated by the photoelectric conversion are sent from the second electrode 22 to the drive circuit via the wiring line $V_{OU}$. Meanwhile, the potential of the first electrode 21 is higher than the potential of the second electrode 22, i.e., for example, a positive potential is to be applied to the first electrode 21 and a negative potential is to be applied to the second electrode 22. Thus, $V_{61} > V_{11}$ (e.g., $V_{31} > V_{61} > V_{11}$) holds true. This causes electrons generated by the photoelectric conversion to be attracted to the charge accumulation electrode 24, and to remain in the region of the inorganic semiconductor material layer 23B or the like opposed to the charge accumulation electrode 24. It is thus possible to prevent, with reliability, the electrons from moving toward the first electrode 21. However, electrons that are not sufficiently attracted by the charge accumulation electrode 24 or that have failed to be accumulated in the inorganic semiconductor material layer 23B or the like (so-called overflowing electrons) are sent to the drive circuit via the charge drain electrode 26.

A reset operation is performed later in the charge accumulation period. This resets the potential of the first floating diffusion layer $FD_1$, and the potential of the first floating diffusion layer $FD_1$ shifts to the potential $V_{DD}$ of the power supply.

After completion of the reset operation, the electric charge is read out. That is, during a charge transfer period, from the drive circuit, the potential $V_{12}$ is applied to the first electrode 21, the potential $V_{32}$ is applied to the charge accumulation electrode 24, and the potential $V_{62}$ is applied to the charge drain electrode 26. Here, $V_{62} < V_{12}$ (e.g., $V_{62} < V_{32} < V_{12}$) holds true. This causes the electrons remaining in the region of the inorganic semiconductor material layer 23B or the like opposed to the charge accumulation electrode 24 to be read out to the first electrode 21, and further to the first floating diffusion layer $FD_1$ with reliability. That is, the electric charge accumulated in the inorganic semiconductor material layer 23B or the like is read out to the control section.

This completes the series of operations including the charge accumulation, the reset operation, and the charge transfer.

The operations of the amplification transistor $TR1_{amp}$ and the selection transistor $TR1_{sel}$ after the electrons are read out to the first floating diffusion layer $FD_1$ are the same as the operations of existing ones of these transistors. In addition, for example, the series of operations including the charge accumulation, the reset operation, and the charge transfer of the second imaging element and the third imaging element are similar to the series of operations including the charge accumulation, the reset operation, and the charge transfer according to existing techniques.

In Example 5, because the so-called overflowing electrons are sent to the drive circuit via the charge drain electrode 26, it is possible to suppress leakage into the charge accumulation section of an adjacent pixel, and it is possible to suppress the occurrence of blooming. This makes it possible to improve the imaging performance of the imaging element.

Example 6

Example 6 is a modification of Examples 1 to 5, and relates to an imaging element or the like including a plurality of charge accumulation electrode segments of the present disclosure.

Figure 6C:
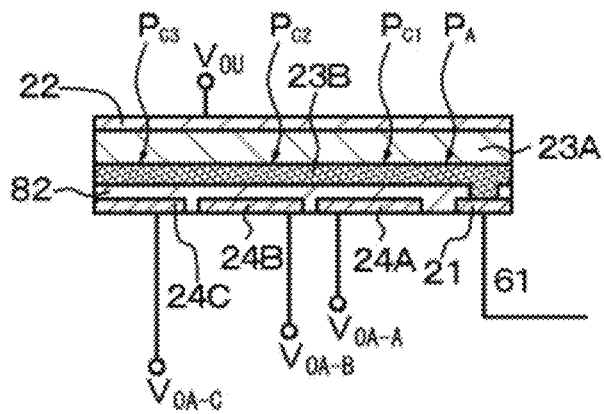
Figure 28:
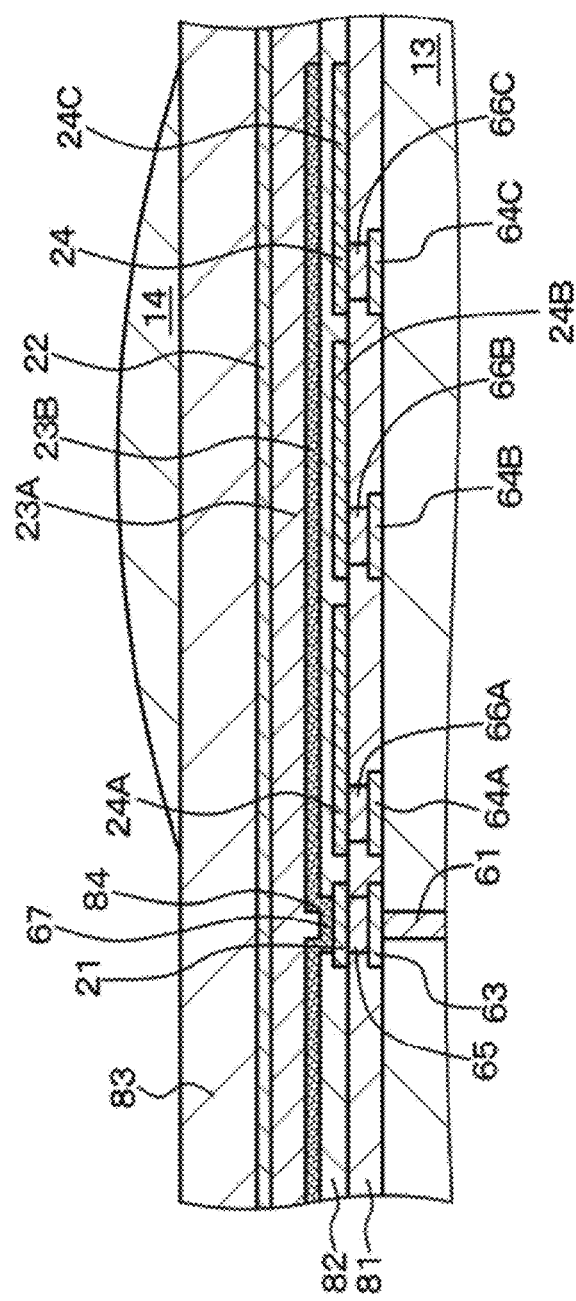
FIG. 28 is a schematic partial cross-sectional view of an imaging element of Example 6.
Figure 29:
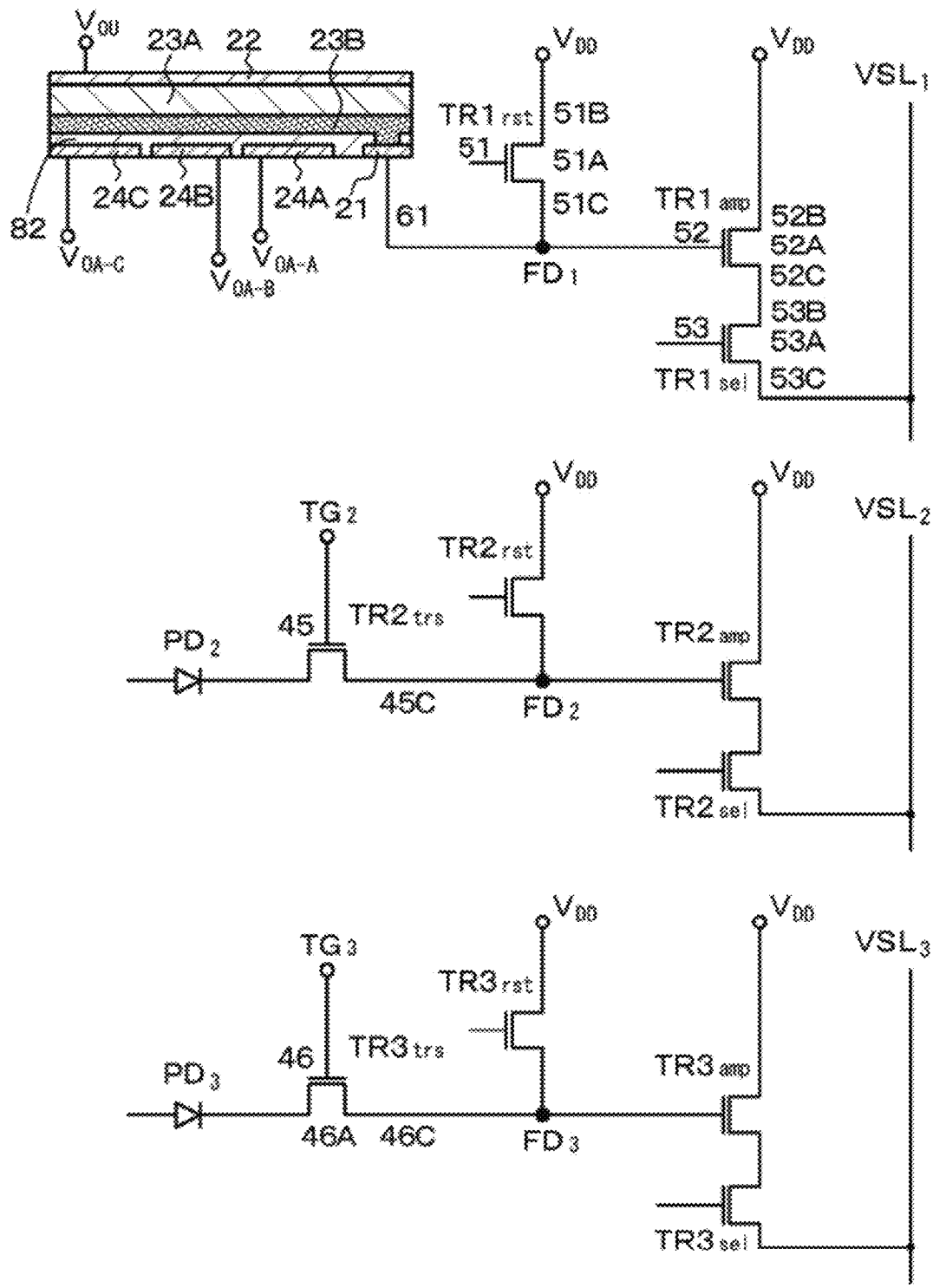
FIG. 29 is an equivalent circuit diagram of the imaging element of Example 6.
Figure 30:
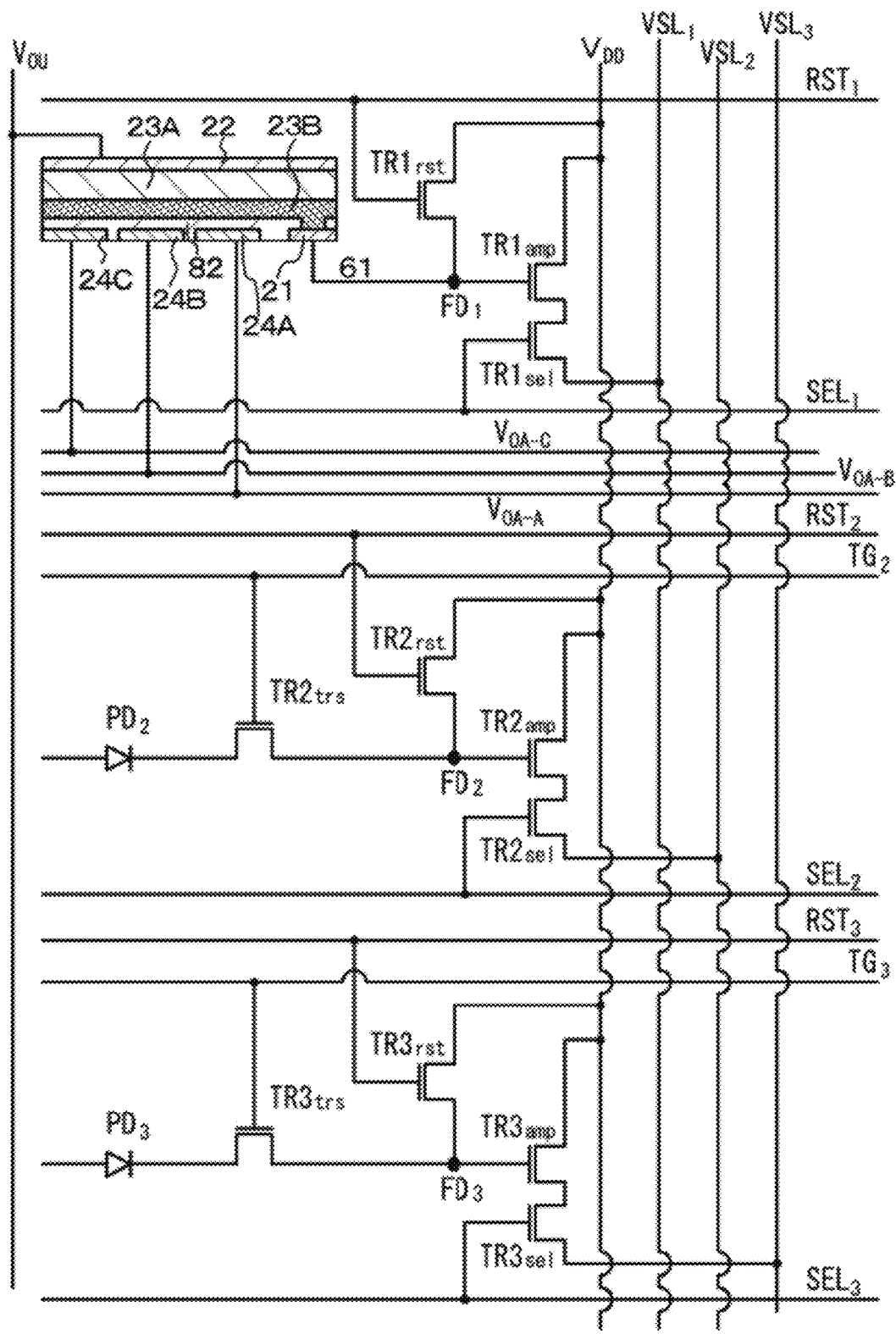
FIG. 30 is an equivalent circuit diagram of the imaging element of Example 6.
Figure 31:
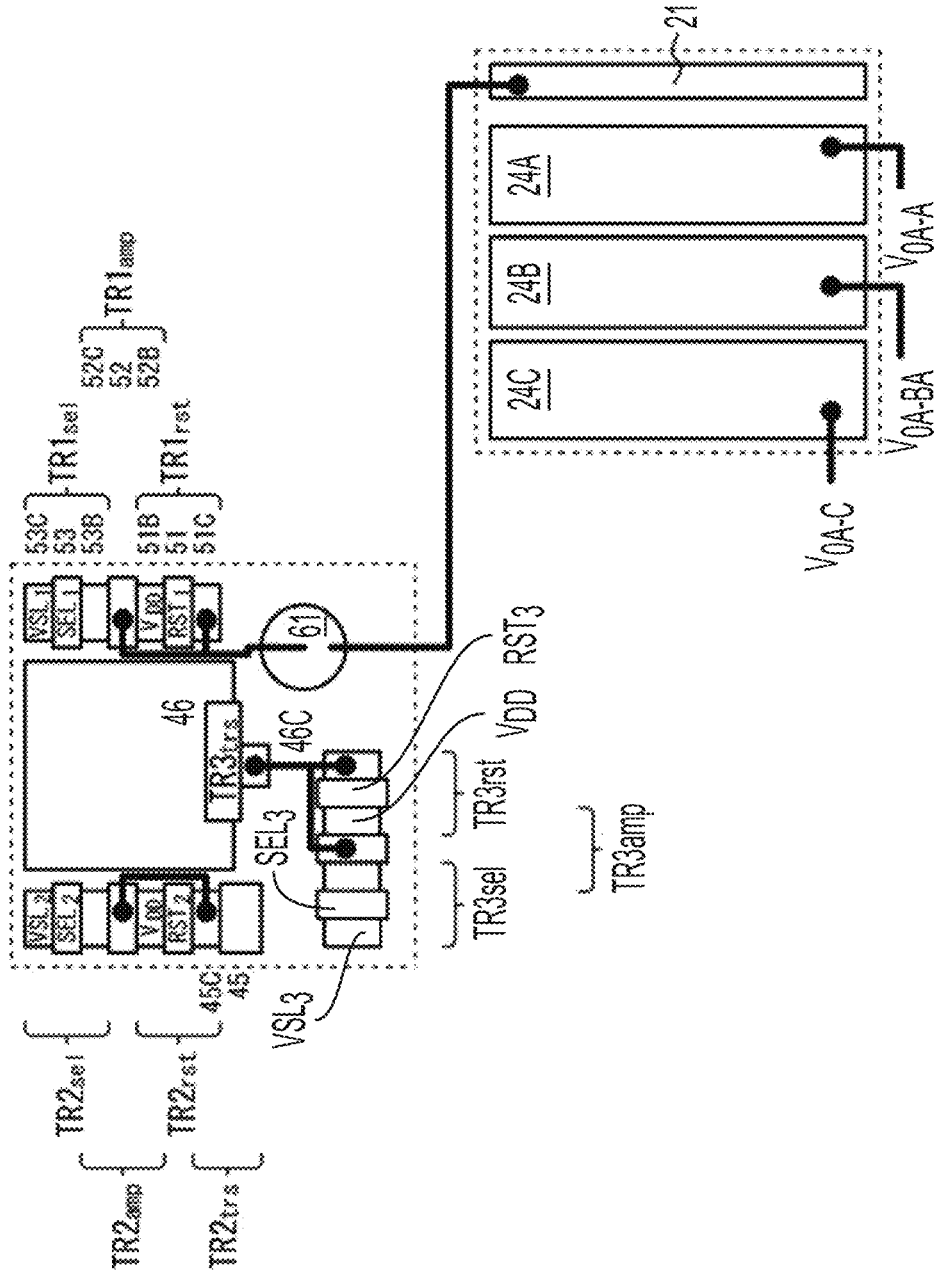
FIG. 31 is a schematic layout diagram of the first electrode and the charge accumulation electrode, and the transistors included in the control section that are included in the imaging element of Example 6.
Figure 32:
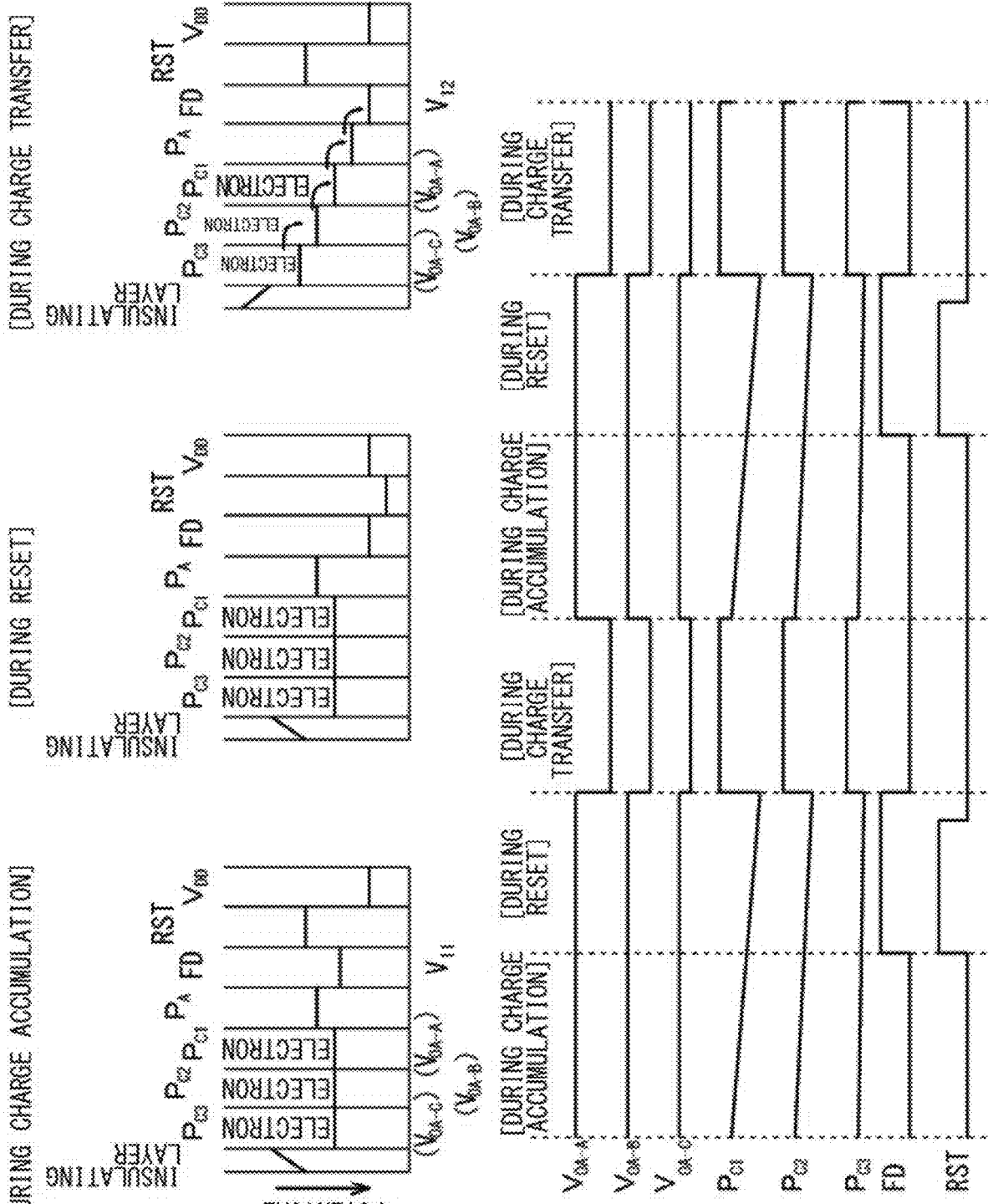
FIG. 32 schematically illustrates a state of potential at each part during operation of the imaging element of Example 6.
Figure 33:
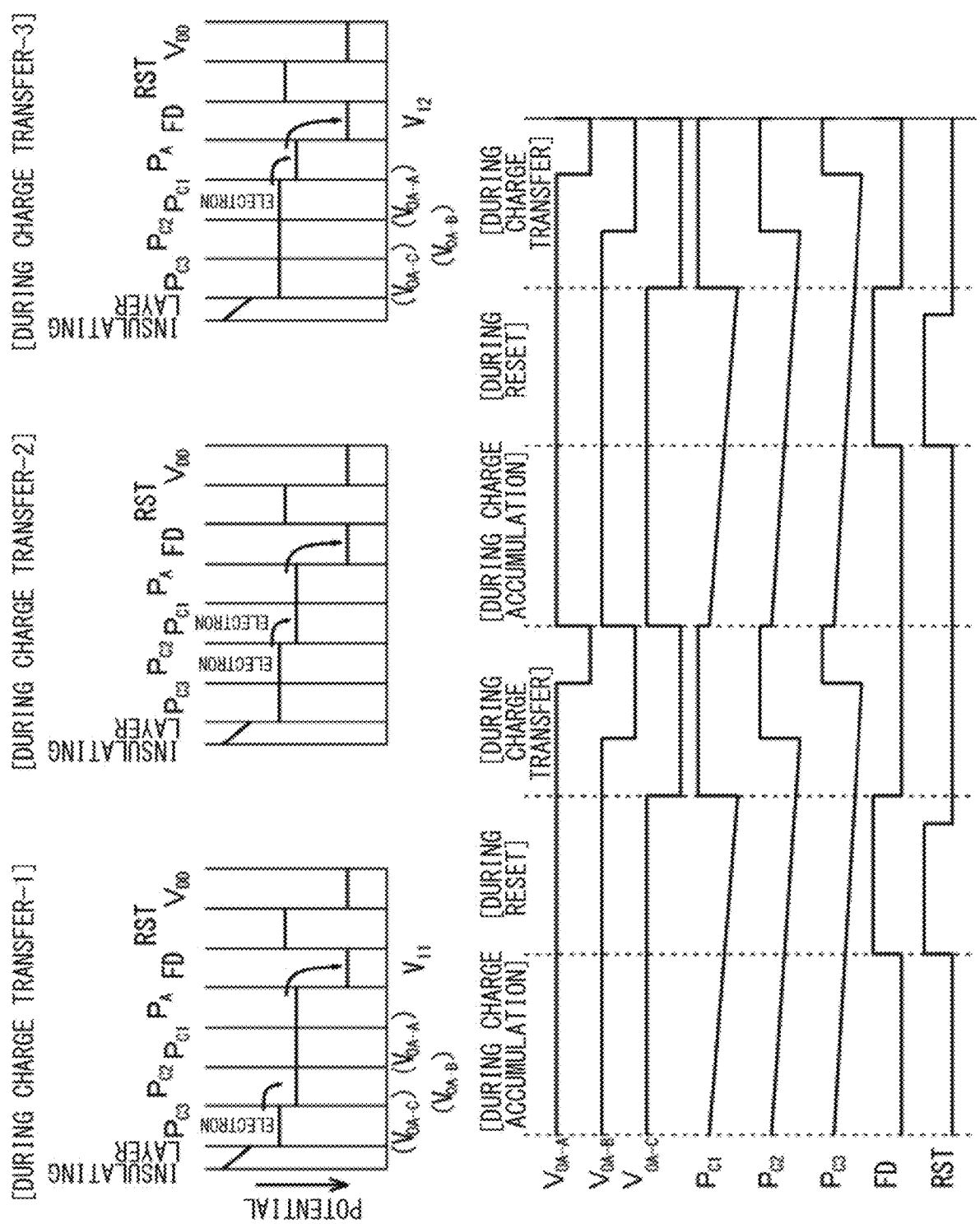
FIG. 33 schematically illustrates a state of potential at each part during another operation (during transfer) of the imaging element of Example 6.
Figure 34:
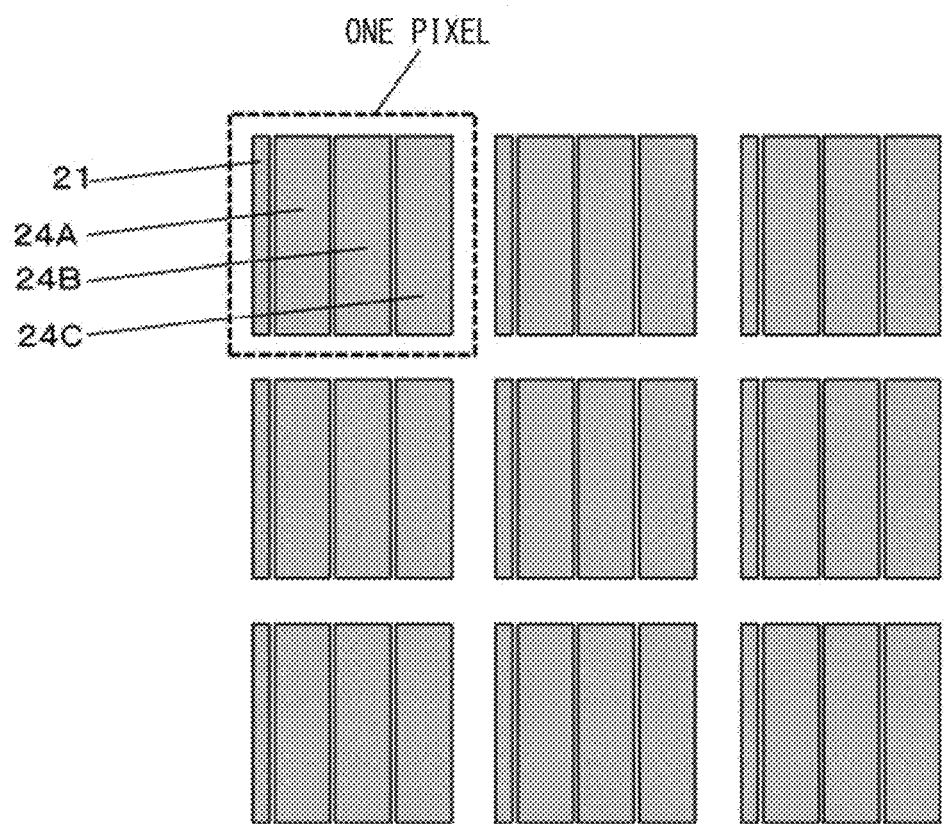
FIG. 34 is a schematic layout diagram of the first electrode and the charge accumulation electrode included in the imaging element of Example 6.
Figure 35:
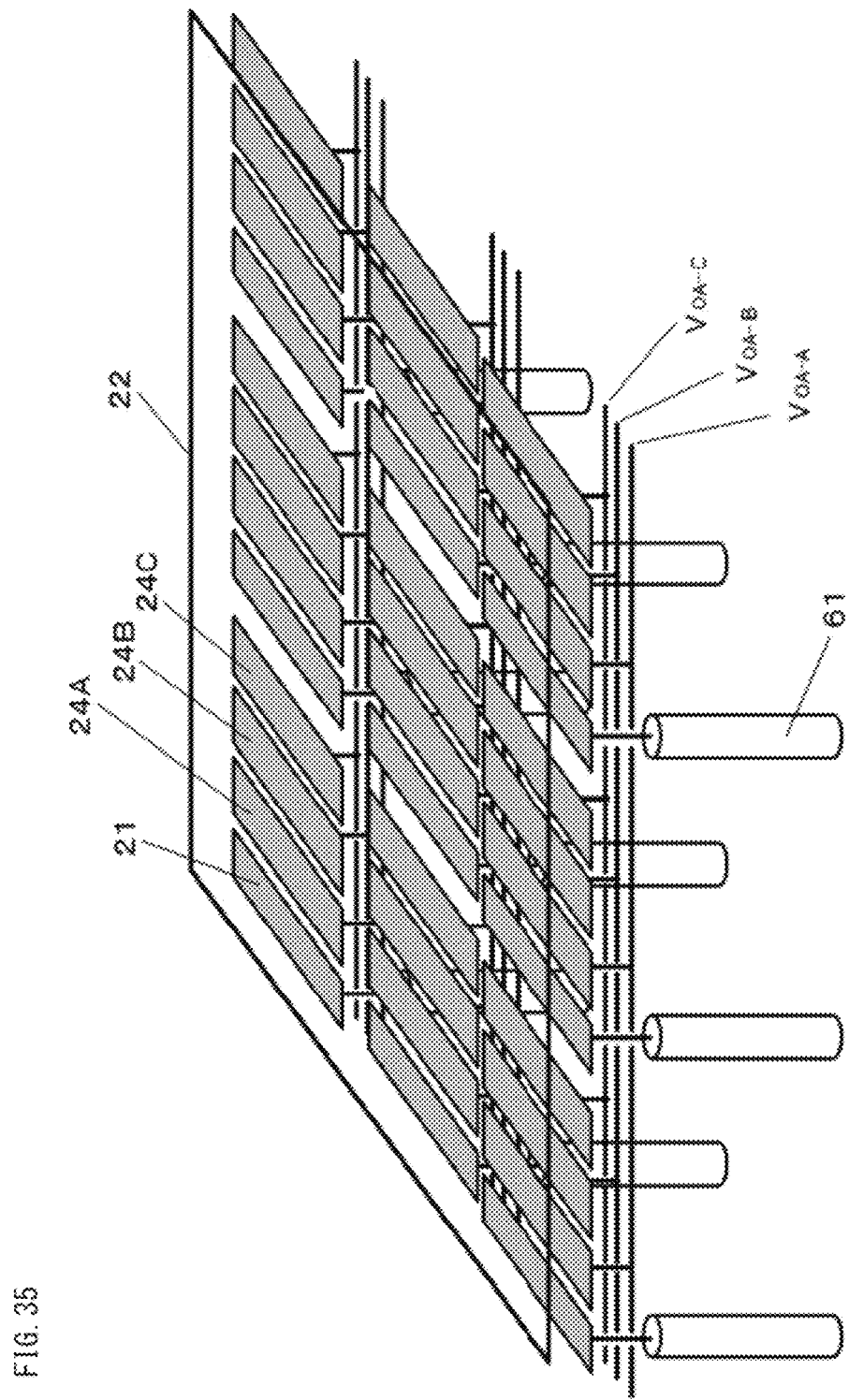
FIG. 35 is a schematic transparent perspective view of the first electrode, the charge accumulation electrode, the second electrode, and the contact hole section included in the imaging element of Example 6.

FIG. 28 is a schematic partial cross-sectional view of a portion of an imaging element of Example 6. FIGS. 29 and 30 are equivalent circuit diagrams of the imaging element of Example 6. FIG. 31 is a schematic layout diagram of the first electrode and the charge accumulation electrode included in the photoelectric conversion section including the charge accumulation electrode, and the transistors included in the control section of the imaging element of Example 6. FIGS. 32 and 33 schematically illustrate a state of potentials at each part during operation of the imaging element of Example 6. FIG. 6C is an equivalent circuit diagram for describing each part of the imaging element of Example 6. In addition, FIG. 34 is a schematic layout diagram of the first electrode and the charge accumulation electrode included in the photoelectric conversion section including the charge accumulation electrode of the imaging element of Example 6. FIG. 35 is a schematic transparent perspective view of the first electrode, the charge accumulation electrode, the second electrode, and the contact hole section.

In Example 6, the charge accumulation electrode 24 includes a plurality of charge accumulation electrode segments 24A, 24B, and 24C. The number of the charge accumulation electrode segments only has to be two or more, and is set to "3" in Example 6. In addition, in the imaging element of Example 6, the potential of the first electrode 21 is higher than the potential of the second electrode 22, i.e., for example, a positive potential is to be applied to the first electrode 21 and a negative potential is to be applied to the second electrode 22. Thus, during the charge transfer period, a potential to be applied to the charge accumulation electrode segment 24A positioned closest to the first electrode 21 is higher than a potential to be applied to the charge accumulation electrode segment 24C positioned farthest from the first electrode 21. By imparting a potential gradient to the charge accumulation electrode 24 in such a manner, the electrons remaining in the region of the inorganic semiconductor material layer 23B or the like opposed to the charge accumulation electrode 24 are read out to the first electrode 21, and further to the first floating diffusion layer $FD_1$ with higher reliability. That is, the electric charge accumulated in the inorganic semiconductor material layer 23B or the like is read out to the control section.

In the example illustrated in FIG. 32, during the charge transfer period, the electrons remaining in the region of the inorganic semiconductor material layer 23B or the like are read out to the first floating diffusion layer $FD_1$ all at once by satisfying: the potential of the charge accumulation electrode segment 24C<the potential of the charge accumulation electrode segment 24B<the potential of the charge accumulation electrode segment 24A. Meanwhile, in the example illustrated in FIG. 33, during the charge transfer period, the potential of the charge accumulation electrode segment 24C, the potential of the charge accumulation electrode segment 24B, and the potential of the charge accumulation electrode segment 24A are changed gradually (i.e., changed stepwise or in a slope-like manner). The electrons remaining in a region of the inorganic semiconductor material layer 23B or the like opposed to the charge accumulation electrode segment 24C are thereby moved to a region of the inorganic semiconductor material layer 23B or the like opposed to the charge accumulation electrode segment 24B, and subsequently, the electrons remaining in the region of the inorganic semiconductor material layer 23B or the like opposed to the charge accumulation electrode segment 24B are moved to a region of the inorganic semiconductor material layer 23B or the like opposed to the charge accumulation electrode segment 24A. Subsequently, the electrons remaining in the region of the inorganic semiconductor material layer 23B or the like opposed to the charge accumulation electrode segment 24A are read out to the first floating diffusion layer $FD_1$ with reliability.

Figure 36:
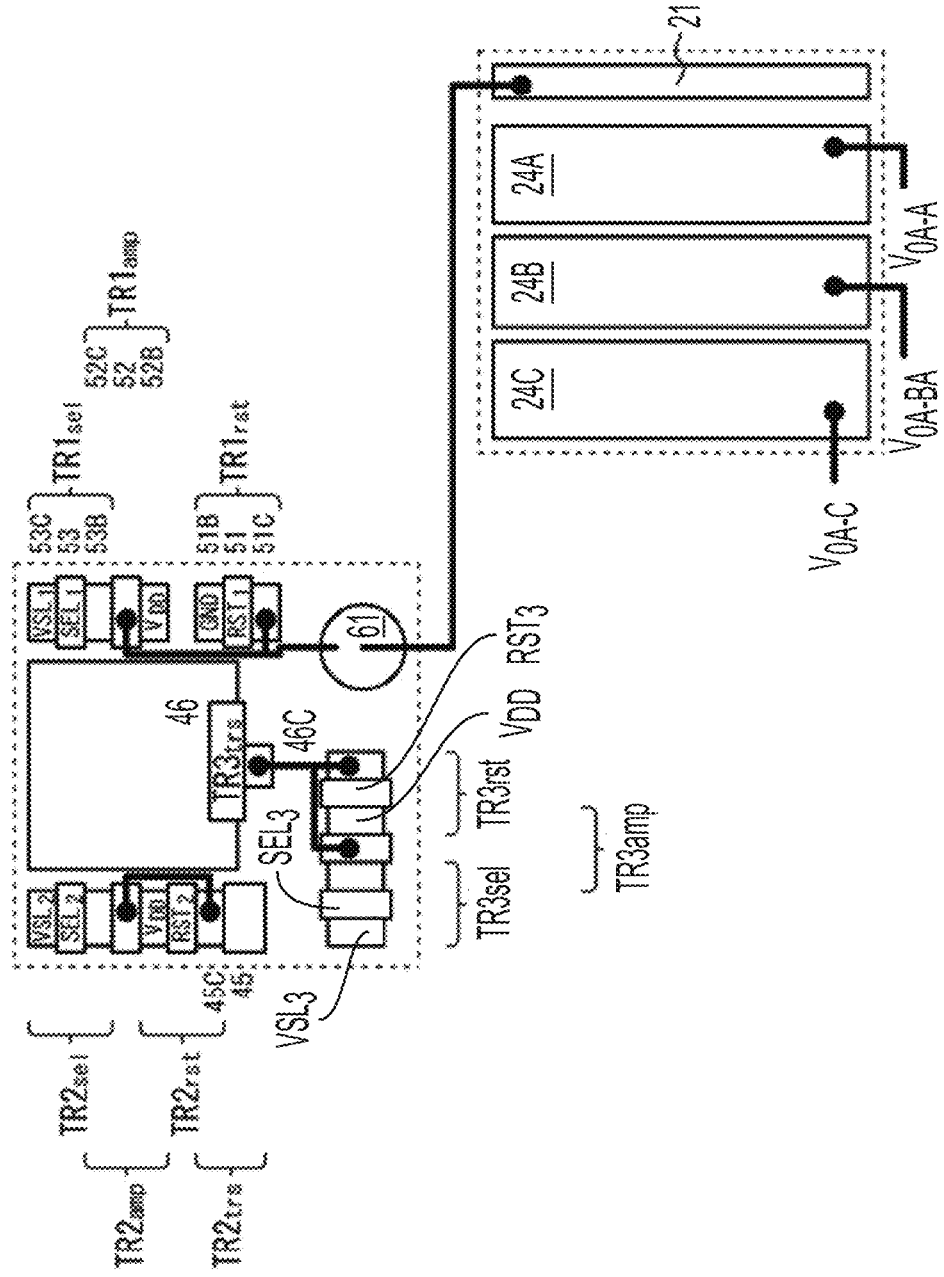
FIG. 36 is a schematic layout diagram of the first electrode and the charge accumulation electrode included in a modification example of the imaging element of Example 6.

FIG. 36 is a schematic layout diagram of the first electrode and the charge accumulation electrode, and the transistors included in the control section that are included in a modification example of the imaging element of Example 6. As illustrated, the other source/drain region 51B of the reset transistor $TR1_{rst}$ may be grounded, instead of being coupled to the power supply $V_{DD}$.

Example 7

Figure 37:
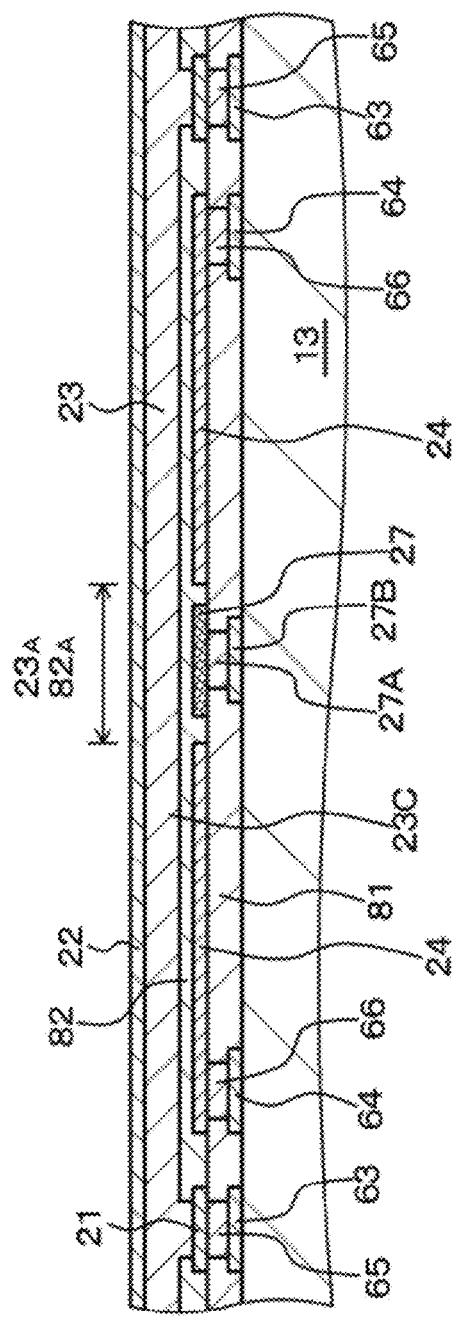
FIG. 37 is a schematic cross-sectional view of a portion of an imaging element of Example 7 (two imaging elements arranged side by side).
Figure 38:
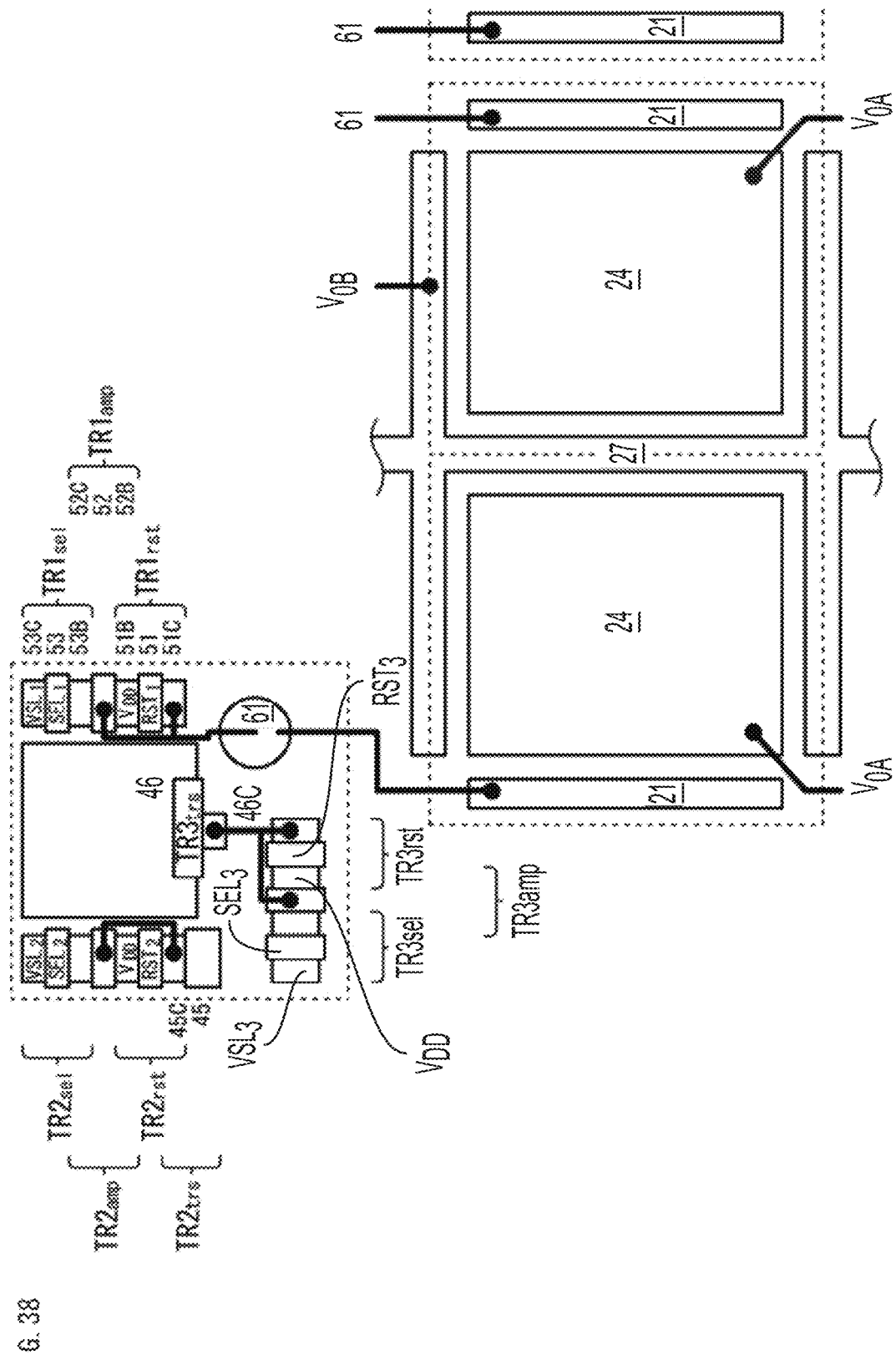
FIG. 38 is a schematic layout diagram of the first electrode and the charge accumulation electrode or the like, and the transistors included in the control section that are included in the imaging element of Example 7.
Figure 39:
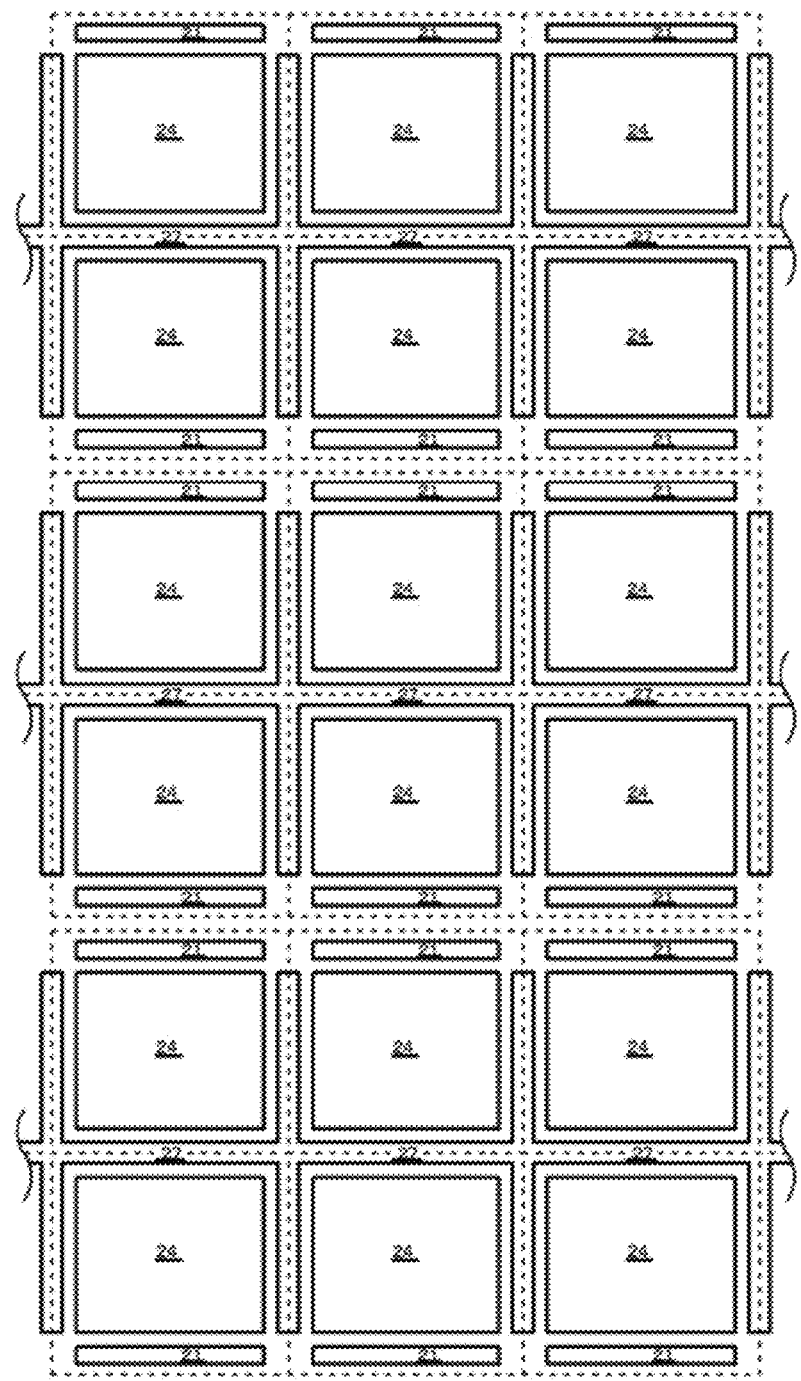
FIG. 39 is a schematic layout diagram of the first electrode and the charge accumulation electrode or the like included in the imaging element of Example 7.
Figure 40:
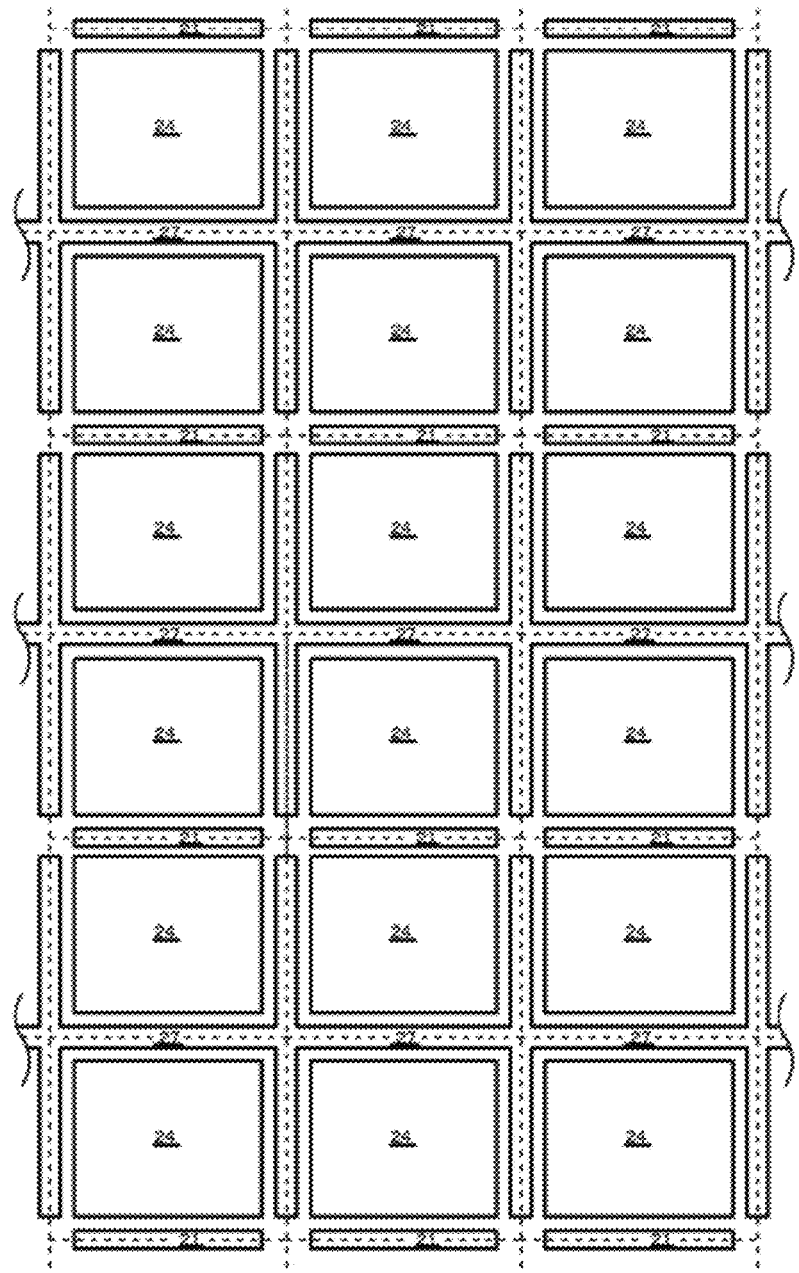
FIG. 40 is a schematic layout diagram of a modification example of the first electrode and the charge accumulation electrode or the like included in the imaging element of Example 7.

Example 7 is a modification of Examples 1 to 6, and relates to an imaging element or the like including the charge movement control electrode of the present disclosure, specifically, an imaging element or the like including the lower charge movement control electrode (lower side/charge movement control electrode) of the present disclosure. FIG. 37 is a schematic partial cross-sectional view of a portion of an imaging element of Example 7. FIG. 38 is a schematic layout diagram of the first electrode, the charge accumulation electrode and the like, and the transistors included in the control section that are included in the imaging element of Example 7. FIGS. 39 and 40 are schematic layout diagrams of the first electrode, the charge accumulation electrode, and the lower charge movement control electrode included in the photoelectric conversion section including the charge accumulation electrode of the imaging element of Example 7.

In the imaging element of Example 7, a lower charge movement control electrode 27 is formed in a region opposed to a region (region-A of the photoelectric conversion layer) $23_A$ of a photoelectric conversion stack 23 positioned between adjacent imaging elements, with the insulating layer 82 interposed therebetween. In other words, the lower charge movement control electrode 27 is formed below a portion $82_A$ of the insulating layer 82 (region-A of the insulating layer 82) in a region (region-a) sandwiched between a charge accumulation electrode 24 and a charge accumulation electrode 24 that are included in respective adjacent imaging elements. The lower charge movement control electrode 27 is provided at a distance from the charge accumulation electrodes 24. Or in other words, the lower charge movement control electrode 27 surrounds the charge accumulation electrodes 24 and is provided at a distance from the charge accumulation electrodes 24, and the lower charge movement control electrode 27 is disposed to be opposed to the region-A ($23_A$) of the photoelectric conversion layer with the insulating layer 82 interposed therebetween. The lower charge movement control electrode 27 is shared by the imaging elements. In addition, the lower charge movement control electrode 27 is also coupled to the drive circuit. Specifically, the lower charge movement control electrode 27 is coupled to the vertical drive circuit 112 included in the drive circuit, via a connection hole 27A, a pad section 27B, and a wiring line $V_{OB}$ provided in the interlayer insulating layer 81. The lower charge movement control electrode 27 may be formed at the same level as the first electrode 21 or the charge accumulation electrode 24, or may be formed at a different level (specifically, a level below the first electrode 21 or the charge accumulation electrode 24). In the former case, it is possible to shorten the distance between the charge movement control electrode 27 and the photoelectric conversion layer 23A, and this makes it easy to control the potential. In contrast, in the latter case, it is possible to shorten the distance between the charge movement control electrode 27 and the charge accumulation electrode 24, and this is advantageous in achieving miniaturization.

In the imaging element of Example 7, when light enters the photoelectric conversion layer 23A to generate photoelectric conversion in the photoelectric conversion layer 23A, the absolute value of the potential applied to the portion of the photoelectric conversion layer 23A opposed to the charge accumulation electrode 24 is larger than the absolute value of the potential applied to the region-A of the photoelectric conversion layer 23A, and therefore, electric charge generated by the photoelectric conversion is strongly attracted to the portion of the inorganic semiconductor material layer 23B opposed to the charge accumulation electrode 24. As a result, it is possible to hinder the electric charge generated by the photoelectric conversion from flowing into an adjacent imaging element. Therefore, no quality degradation occurs in a captured picture (image). In addition, owing to the lower charge movement control electrode 27 formed in a region opposed to the region-A of the photoelectric conversion layer 23A with the insulating layer interposed therebetween, it is possible to control an electric field or potential in the region-A of the photoelectric conversion layer 23A positioned above the lower charge movement control electrode 27. As a result, the lower charge movement control electrode 27 makes it possible to hinder the electric charge generated by the photoelectric conversion from flowing into the adjacent imaging element. Therefore, no quality degradation occurs in a captured picture (image).

Figure 41:
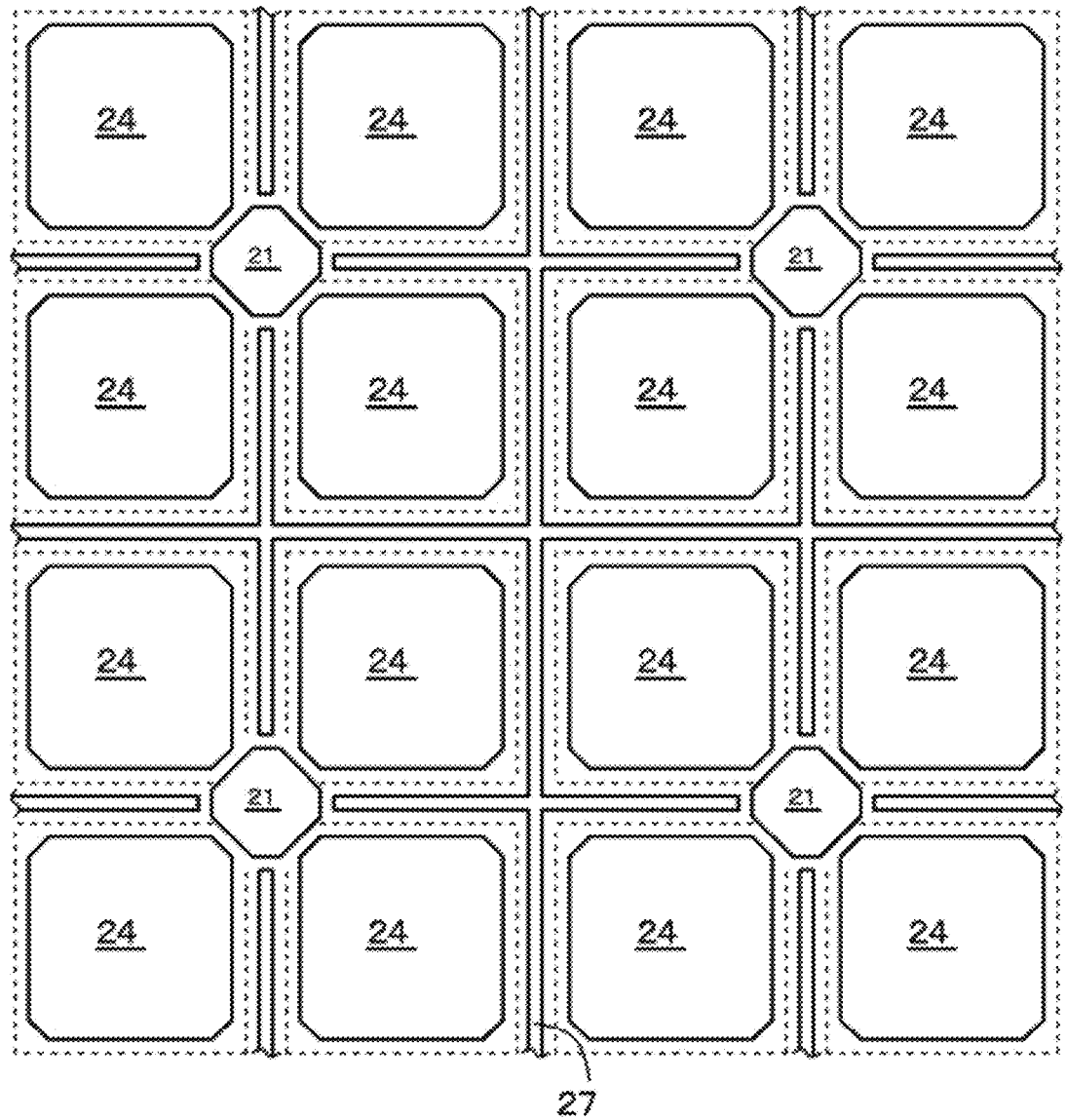
FIG. 41 is a schematic layout diagram of a modification example of the first electrode and the charge accumulation electrode or the like included in the imaging element of Example 7.
Figure 42A:
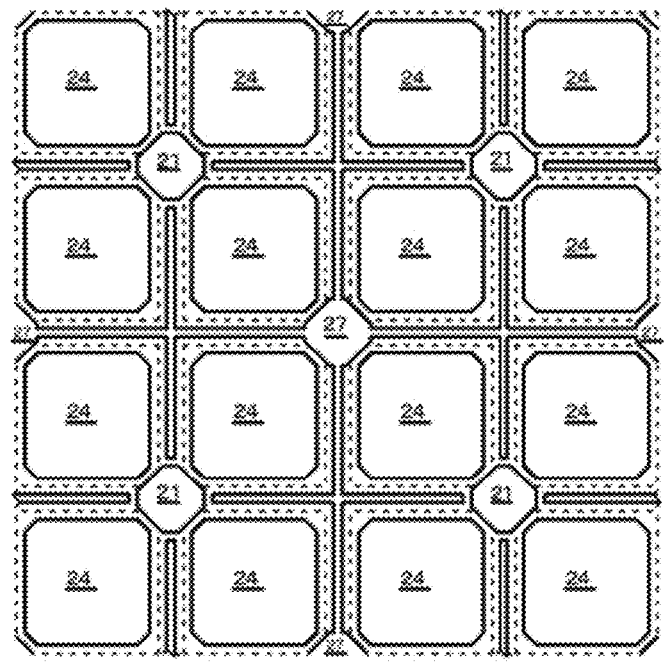
FIGS. 42A and 42B are schematic layout diagrams of modification examples of the first electrode and the charge accumulation electrode or the like included in the imaging element of Example 7.
Figure 42B:
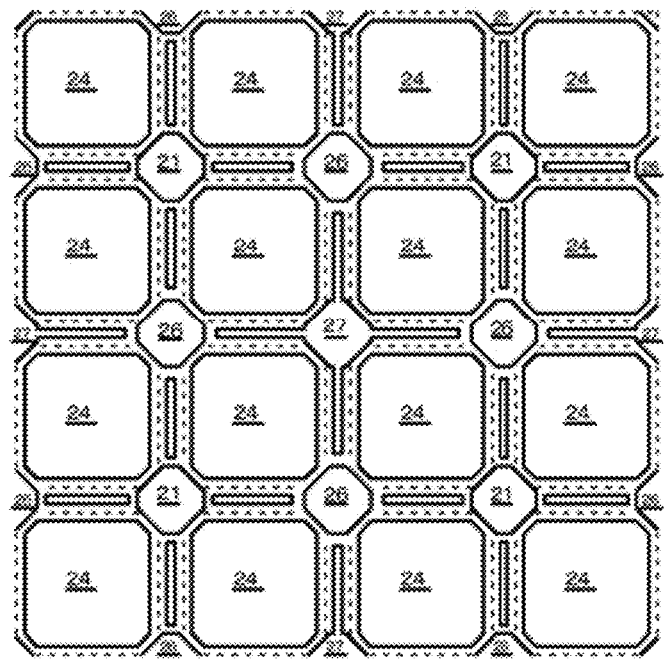

In the examples illustrated in FIGS. 39 and 40, the lower charge movement control electrode 27 is formed below the portion $82_A$ of the insulating layer 82 in the region (region-a) sandwiched between the charge accumulation electrode 24 and the charge accumulation electrode 24. Meanwhile, in the examples illustrated in FIGS. 41, 42A and 42B, the lower charge movement control electrode 27 is formed below a portion of the insulating layer 82 in a region surrounded by four charge accumulation electrodes 24. It is to be noted that the examples illustrated in FIGS. 41, 42A, and 42B are also the solid-state imaging devices of the first and second configurations. In four imaging elements, one common first electrode 21 is provided to correspond to the four charge accumulation electrodes 24.

In the example illustrated in FIG. 42B, in the four imaging elements, the one common first electrode 21 is provided to correspond to the four charge accumulation electrodes 24, and the lower charge movement control electrode 27 is formed below a portion of the insulating layer 82 in the region surrounded by the four charge accumulation electrodes 24. Further, the charge drain electrode 26 is formed below the portion of the insulating layer 82 in the region surrounded by the four charge accumulation electrodes 24. As described above, the charge drain electrode 26 is usable as a floating diffusion or overflow drain of the photoelectric conversion section, for example.

Example 8

Figure 43:
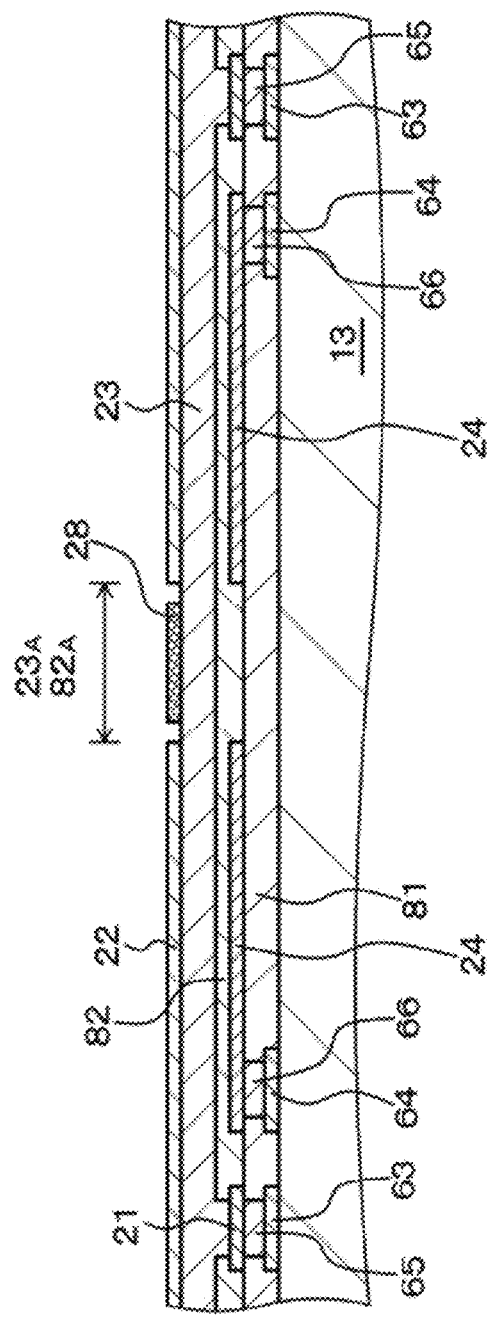
FIG. 43 is a schematic cross-sectional view of a portion of an imaging element of Example 8 (two imaging elements arranged side by side).
Figure 44:
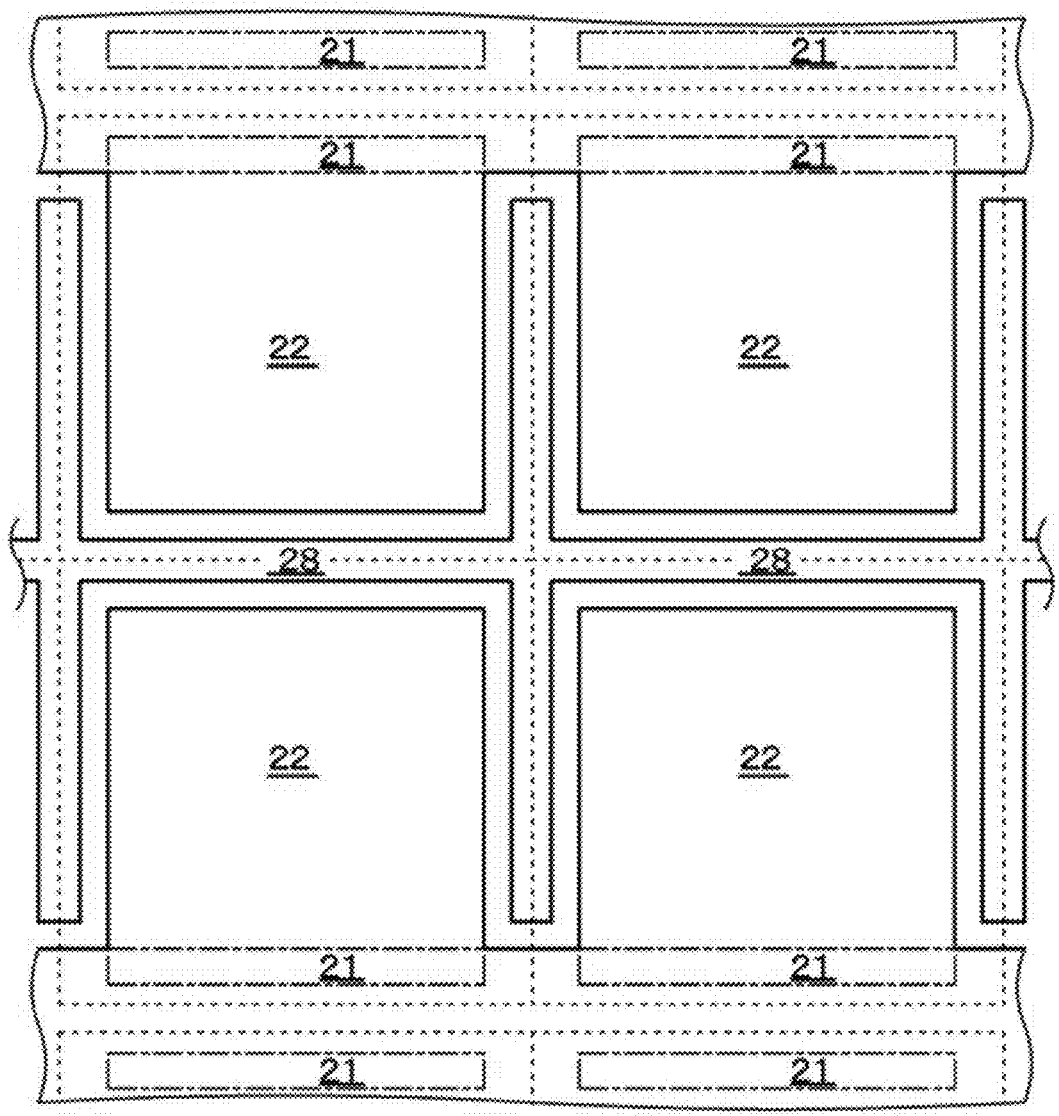
FIG. 44 is a schematic plan view of a portion of the imaging element of Example 8 (2×2 imaging elements arranged side by side).
Figure 45:
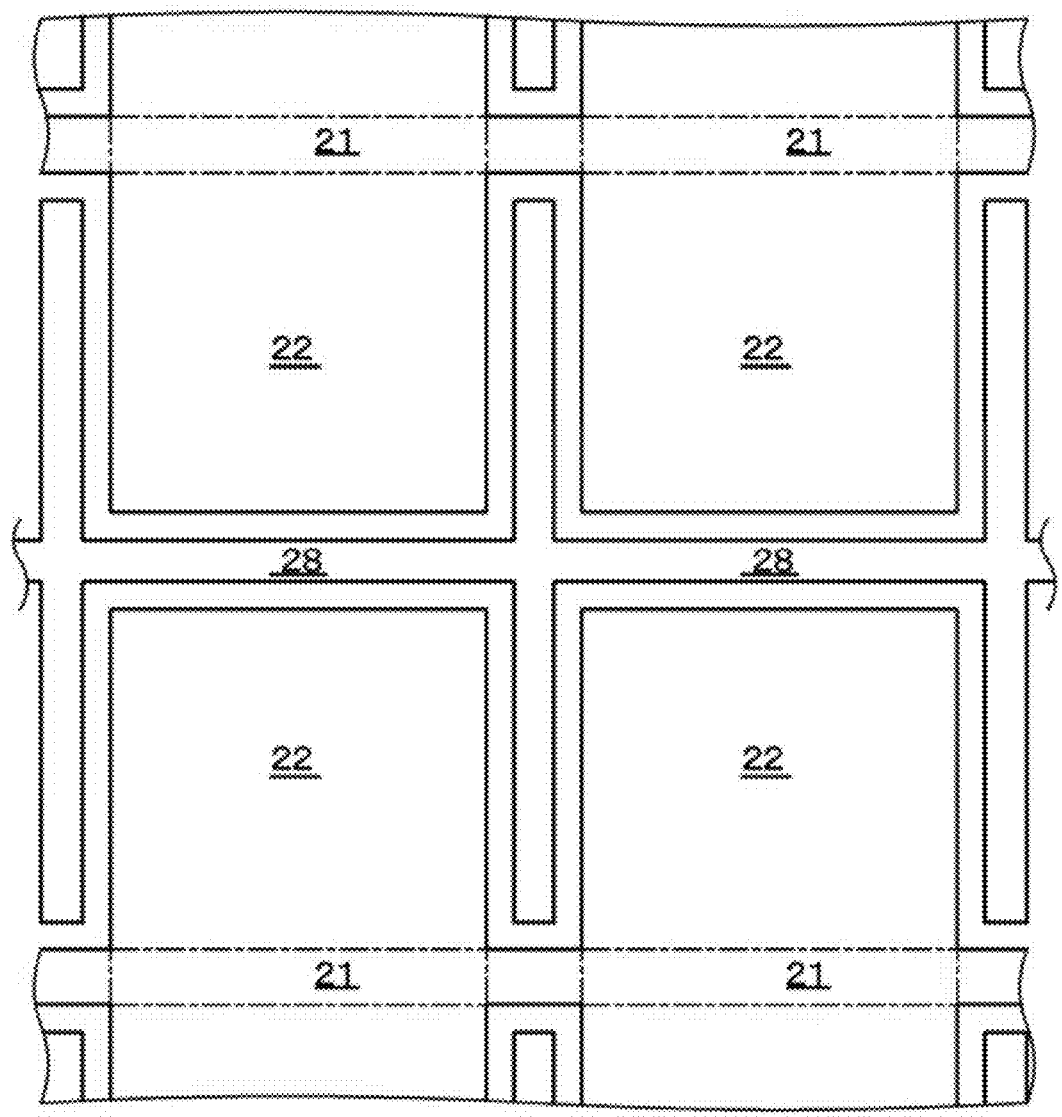
FIG. 45 is a schematic plan view of a portion of a modification example of the imaging element of Example 8 (2×2 imaging elements arranged side by side).

Example 8 is a modification of Example 7, and relates to an imaging element or the like including the upper charge movement control electrode (upper side/charge movement control electrode) of the present disclosure. FIG. 43 is a partial schematic cross-sectional view of an imaging element of Example 8 (two imaging elements arranged side by side). FIGS. 44 and 45 are partial schematic plan views of the imaging element of Example 8 (2×2 imaging elements arranged side by side). In the imaging element of Example 8, an upper charge movement control electrode 28 is formed, instead of the second electrode 22, on a region $23_A$ of the photoelectric conversion stack 23 positioned between adjacent imaging elements. The upper charge movement control electrode 28 is provided at a distance from the second electrode 22. In other words, the second electrode 22 is provided for each imaging element, and the upper charge movement control electrode 28 surrounds at least a portion of the second electrode 22 and is provided, at a distance from the second electrode 22, on the region-A of the photoelectric conversion stack 23. The upper charge movement control electrode 28 is formed at the same level as the second electrode 22.

It is to be noted that, in the example illustrated in FIG. 44, in one imaging element, one charge accumulation electrode 24 is provided to correspond to one first electrode 21. Meanwhile, in a modification example illustrated in FIG. 45, in two imaging elements, one common first electrode 21 is provided to correspond to the two charge accumulation electrodes 24. The partial schematic cross-sectional view of the imaging element of Example 8 (two imaging elements arranged side by side) illustrated in FIG. 43 corresponds to FIG. 45.

In addition, FIG. 46A is a partial schematic cross-sectional view of the imaging element of Example 8 (two imaging elements arranged side by side). As illustrated, the second electrode 22 may be divided into a plurality of ones, and different potentials may be applied to the divided individual second electrodes 22. Further, as illustrated in FIG. 46B, the upper charge movement control electrode 28 may be provided between the second electrode 22 and the second electrode 22 thus divided.

In Example 8, the second electrode 22 positioned on the light incident side is shared by the imaging elements arranged in the lateral direction on the sheet of FIG. 44, and shared by a pair of imaging elements arranged in the up-and-down direction on the sheet of FIG. 44. In addition, the upper charge movement control electrode 28 is also shared by the imaging elements arranged in the lateral direction on the sheet of FIG. 44, and shared by a pair of imaging elements arranged in the up-and-down direction on the sheet of FIG. 44. The second electrode 22 and the upper charge movement control electrode 28 are obtainable by forming a material layer to configure the second electrode 22 and the upper charge movement control electrode 28 on the photoelectric conversion stack 23 and thereafter patterning the material layer. The second electrode 22 and the upper charge movement control electrode 28 are coupled to respective wiring lines (not illustrated) independently of each other, and these wiring lines are coupled to the drive circuit. The wiring line coupled to the second electrode 22 is shared by a plurality of imaging elements. The wiring line coupled to the upper charge movement control electrode 28 is also shared by a plurality of imaging elements.

In the imaging element of Example 8, during a charge accumulation period, from the drive circuit, the potential $V_{21}$ is applied to the second electrode 22, the potential $V_{41}$ is applied to the upper charge movement control electrode 28, and electric charge is accumulated in the photoelectric conversion stack 23. During a charge transfer period, from the drive circuit, the potential $V_{22}$ is applied to the second electrode 22, the potential $V_{42}$ is applied to the upper charge movement control electrode 28, and the electric charge accumulated in the photoelectric conversion stack 23 is read out to the control section via the first electrode 21. Here, the potential of the first electrode 21 is higher than the potential of the second electrode 22, and therefore, $$V_{21} \geq V_{41} \text{ and } V_{22} \geq V_{42}$$

hold true.

As described above, in the imaging element of Example 8, the charge movement control electrode is formed, instead of the second electrode, on the region of the photoelectric conversion layer positioned between adjacent imaging elements. The charge movement control electrode thus makes it possible to hinder the electric charge generated by photoelectric conversion from flowing into the adjacent imaging element, and therefore no quality degradation occurs in a captured picture (image).

Figure 48A:
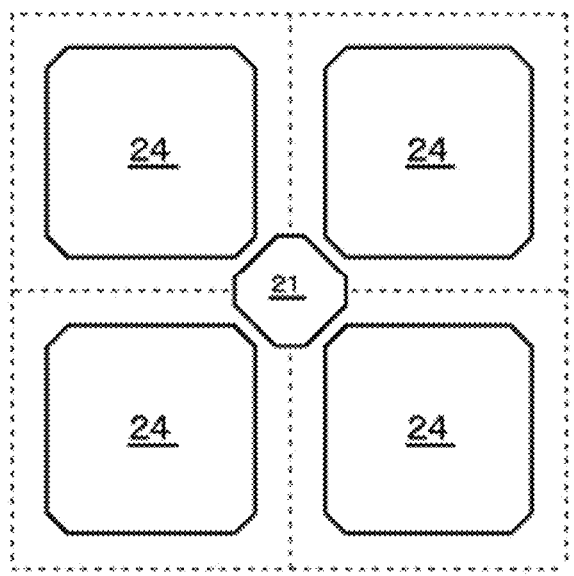
FIGS. 48A and 48B are schematic plan views of portions of the modification examples of the imaging element of Example 8.
Figure 48B:
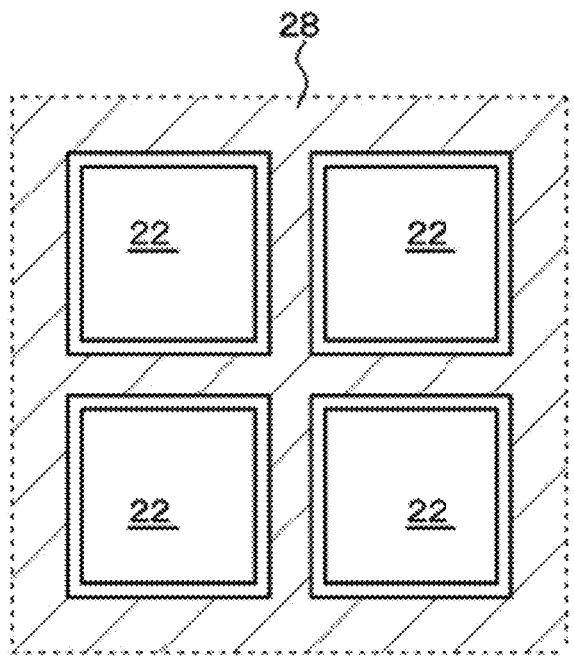

FIG. 47A is a partial schematic cross-sectional view of a modification example of the imaging element of Example 8 (two imaging elements arranged side by side), and FIGS. 48A and 48B are partial schematic plan views thereof. In this modification example, the second electrode 22 is provided for each imaging element, the upper charge movement control electrode 28 surrounds at least a portion of the second electrode 22 and is provided at a distance from the second electrode 22, and a portion of the charge accumulation electrode 24 is present below the upper charge movement control electrode 28. The second electrode 22 is provided, above the charge accumulation electrode 24, in a size smaller than that of the charge accumulation electrode 24.

Figure 49A:
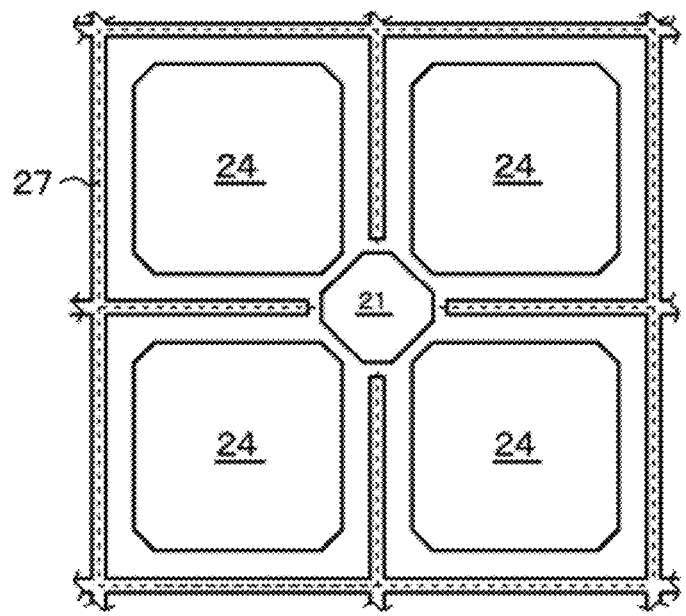
FIGS. 49A and 49B are schematic plan views of portions of the modification examples of the imaging element of Example 8.
Figure 49B:
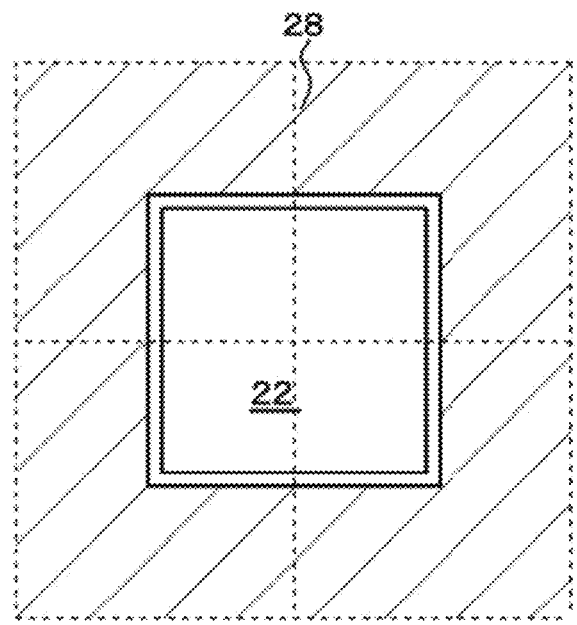

FIG. 47B is a partial schematic cross-sectional view of a modification example of the imaging element of Example 8 (two imaging elements arranged side by side), and FIGS. 49A and 49B are partial schematic plan views thereof. In this modification example, the second electrode 22 is provided for each imaging element, the upper charge movement control electrode 28 surrounds at least a portion of the second electrode 22 and is provided at a distance from the second electrode 22, a portion of the charge accumulation electrode 24 is present below the upper charge movement control electrode 28, and furthermore, the lower charge movement control electrode (lower side/charge movement control electrode) 27 is provided below the upper charge movement control electrode (upper side/charge movement control electrode) 28. The size of the second electrode 22 is smaller than that in the modification example illustrated in FIG. 47A. That is, the region of the second electrode 22 opposed to the upper charge movement control electrode 28 is positioned closer to the first electrode 21 than the region of the second electrode 22 opposed to the upper charge movement control electrode 28 in the modification example illustrated in FIG. 47A. The charge accumulation electrode 24 is surrounded by the lower charge movement control electrode 27.

Example 9

Example 9 relates to the solid-state imaging devices of the first and second configurations.

A solid-state imaging device of Example 9 includes a photoelectric conversion section including the first electrode 21, the inorganic semiconductor material layer 23B, the photoelectric conversion layer 23A, and the second electrode 22 that are stacked, in which the photoelectric conversion section further includes a plurality of imaging elements each including the charge accumulation electrode 24 disposed at a distance from the first electrode 21 and disposed to be opposed to the inorganic semiconductor material layer 23B with the insulating layer 82 interposed therebetween, the plurality of imaging elements constitute an imaging element block, and the first electrode 21 is shared by the plurality of imaging elements constituting the imaging element block.

Alternatively, the solid-state imaging device of Example 9 includes a plurality of imaging elements described in Examples 1 to 8.

In Example 9, one floating diffusion layer is provided for the plurality of imaging elements. Then, appropriately controlling the timing of the charge transfer period makes it possible for the plurality of imaging elements to share the one floating diffusion layer. Then, in this case, it is possible for the plurality of imaging elements to share one contact hole section.

It is to be noted that the solid-state imaging device of Example 9 has a configuration and a structure similar to those of the solid-state imaging devices described in Examples 1 to 8, except that the first electrode 21 is shared by the plurality of imaging elements constituting the imaging element block.

Figure 50:
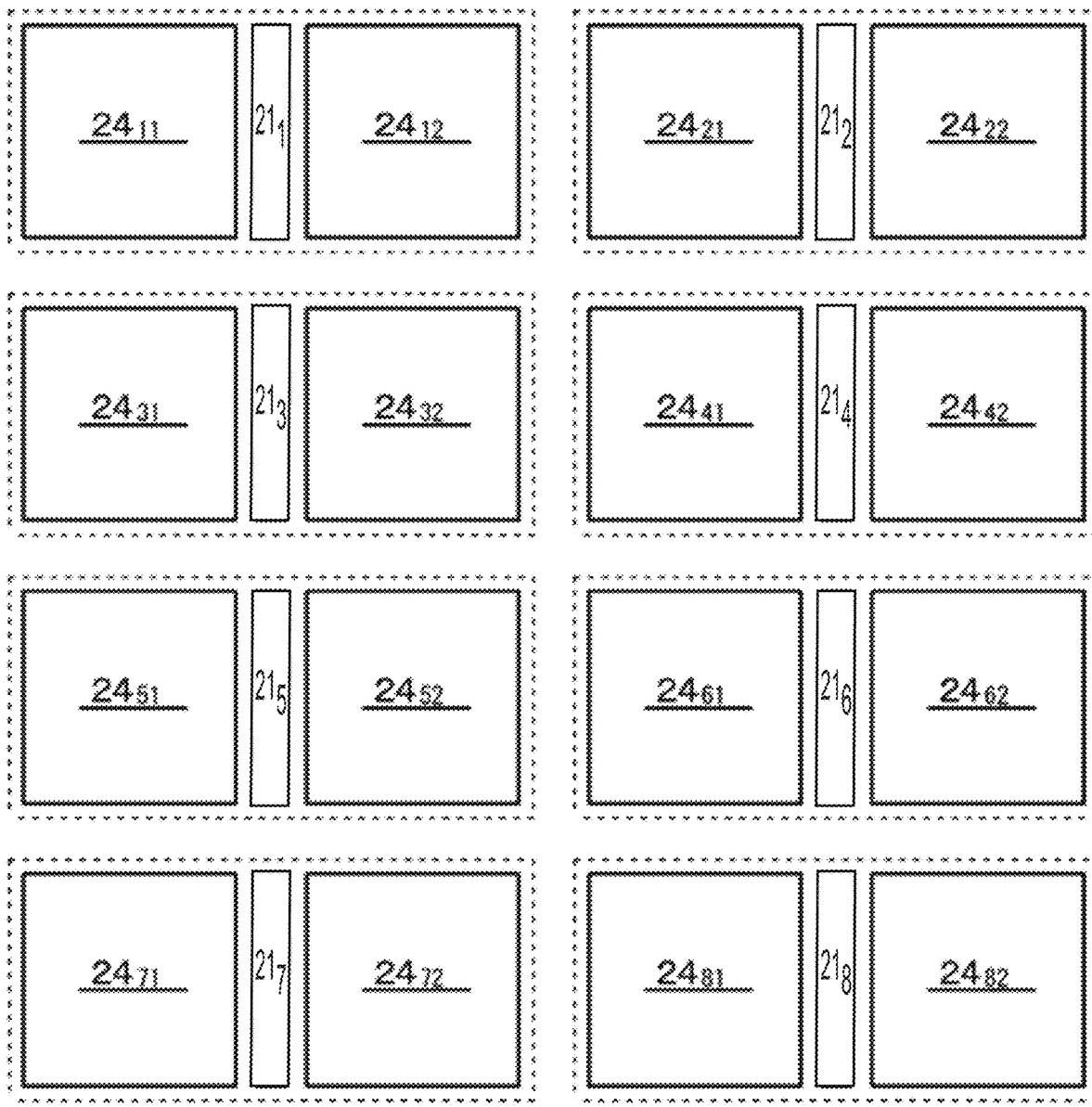
FIG. 50 is a schematic plan view of the first electrodes and charge accumulation electrode segments in a solid-state imaging device of Example 9.
Figure 51:
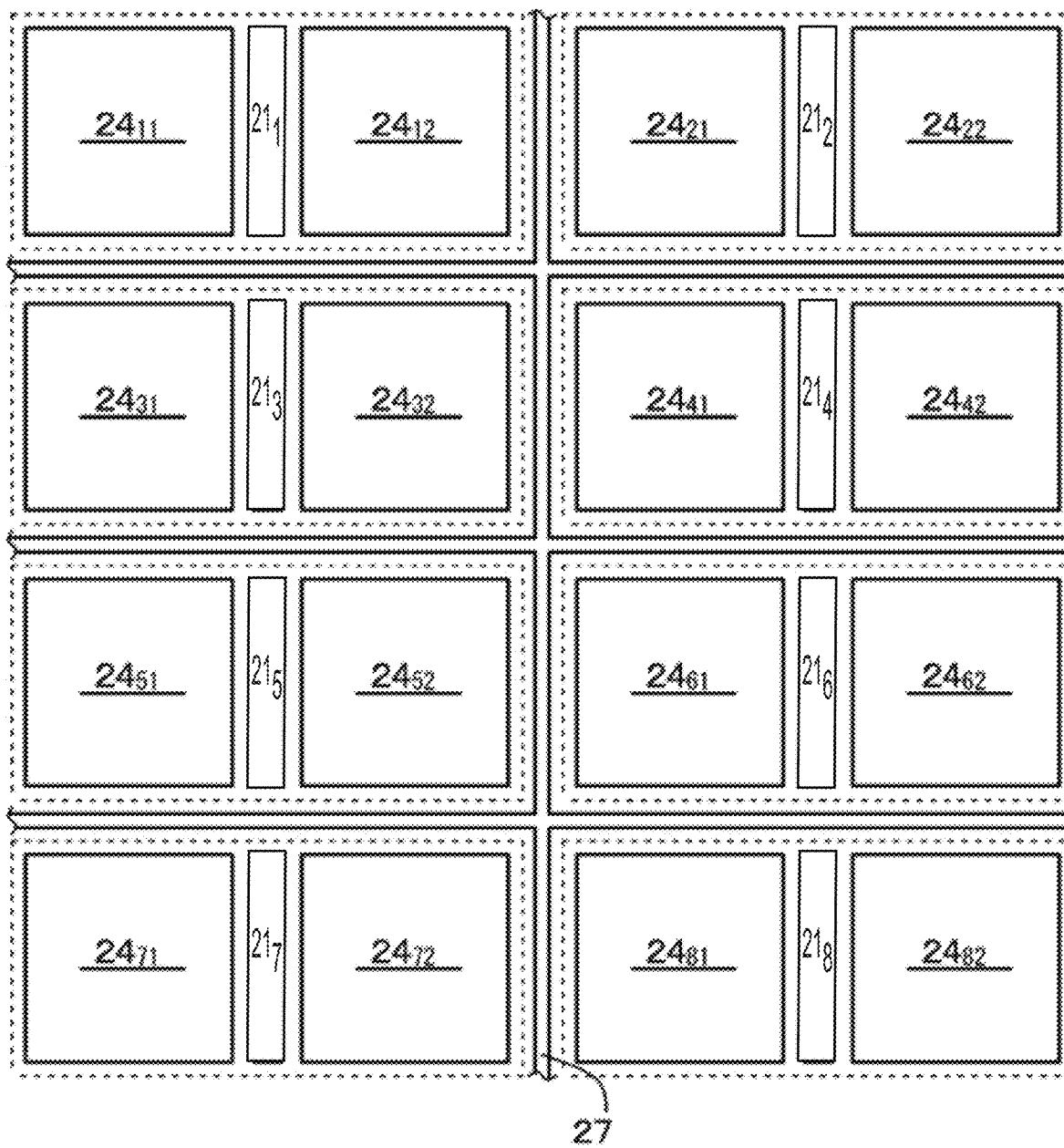
FIG. 51 is a schematic plan view of the first electrodes and the charge accumulation electrode segments in a first modification example of the solid-state imaging device of Example 9.
Figure 52:
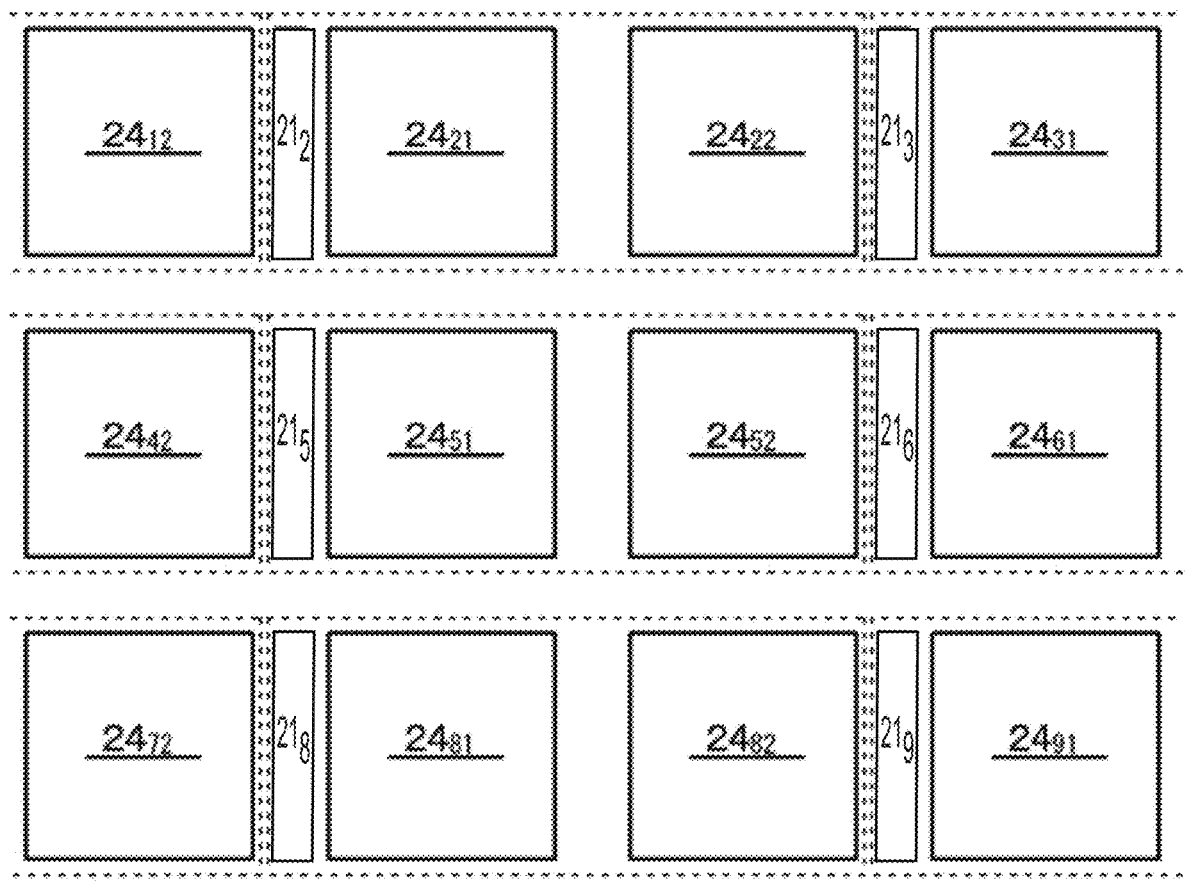
FIG. 52 is a schematic plan view of the first electrodes and the charge accumulation electrode segments in a second modification example of the solid-state imaging device of Example 9.
Figure 53:
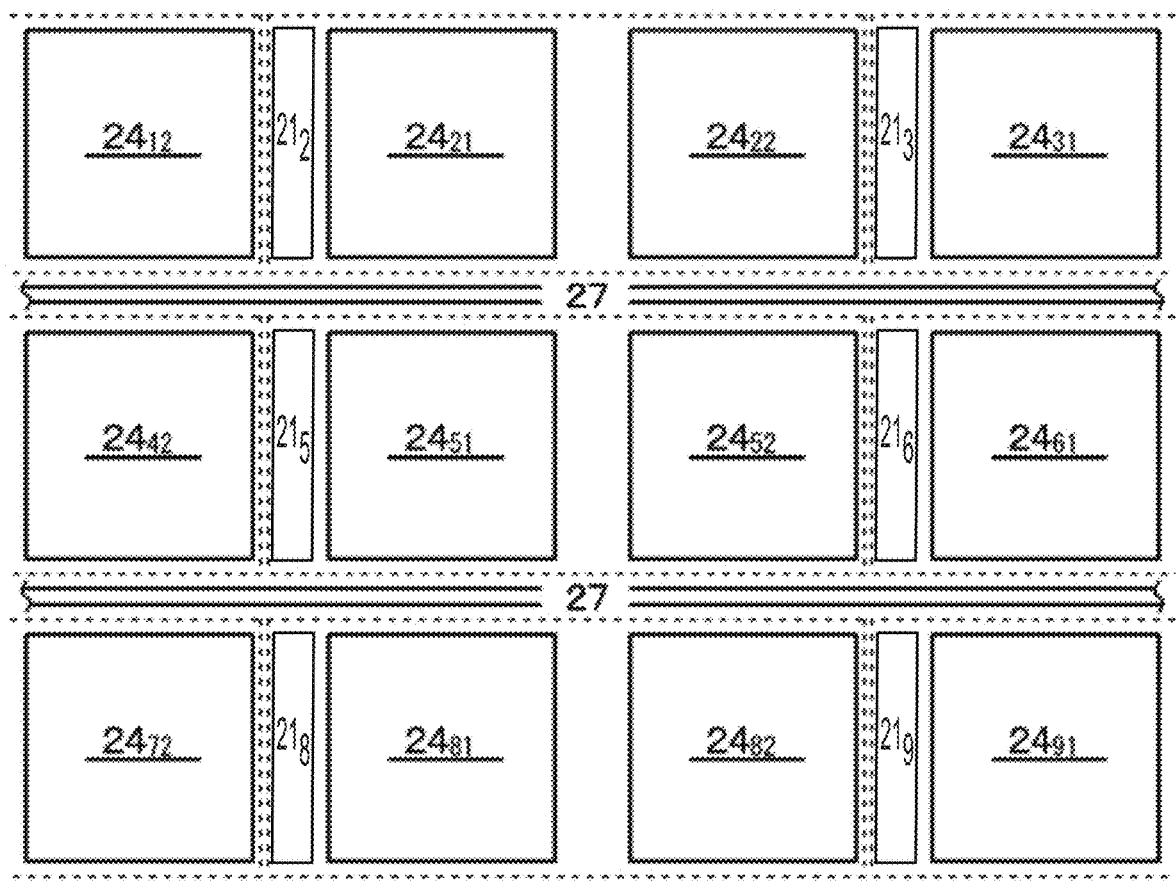
FIG. 53 is a schematic plan view of the first electrodes and the charge accumulation electrode segments in a third modification example of the solid-state imaging device of Example 9.
Figure 54:
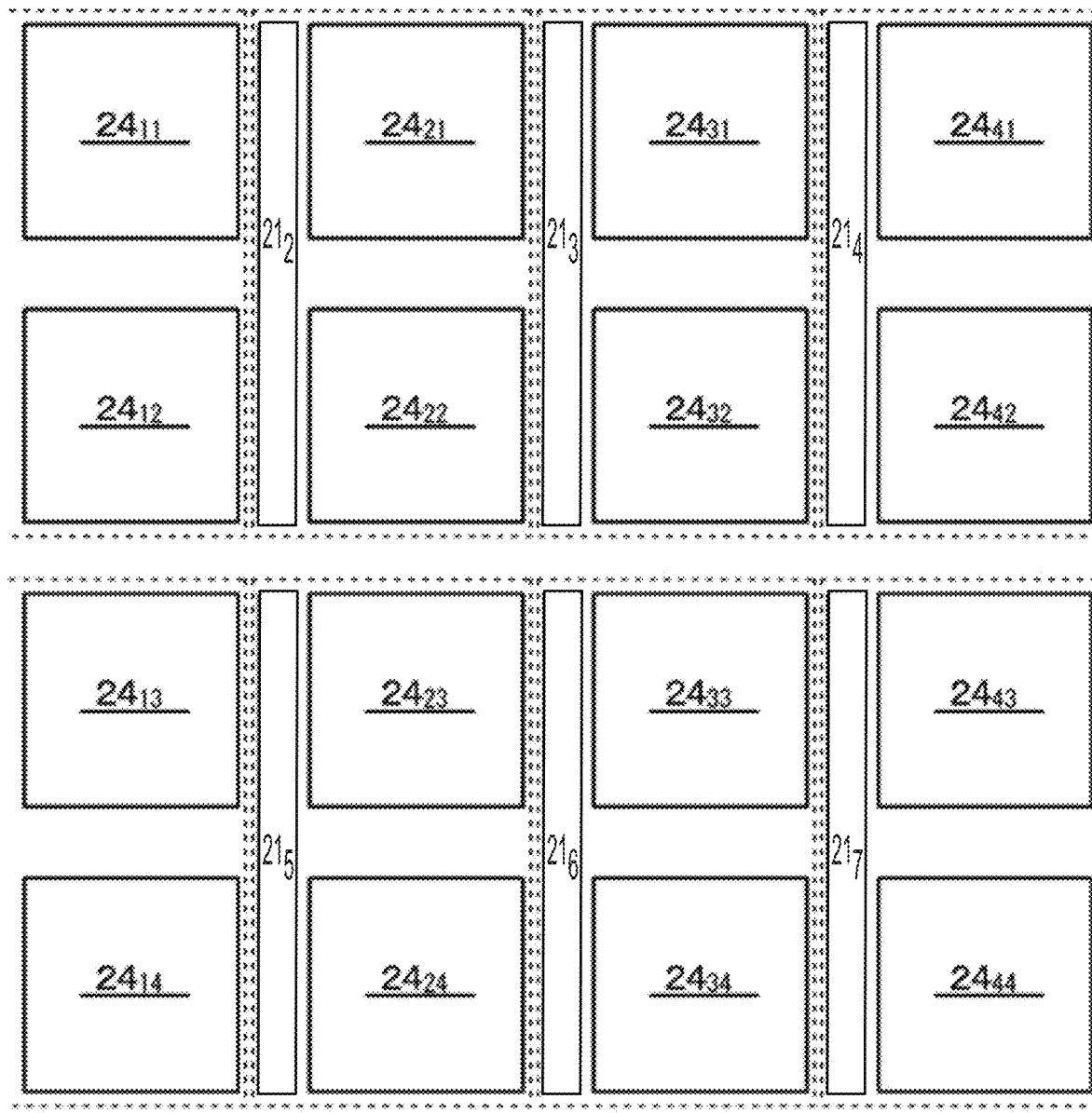
FIG. 54 is a schematic plan view of the first electrodes and the charge accumulation electrode segments in a fourth modification example of the solid-state imaging device of Example 9.
Figure 55:
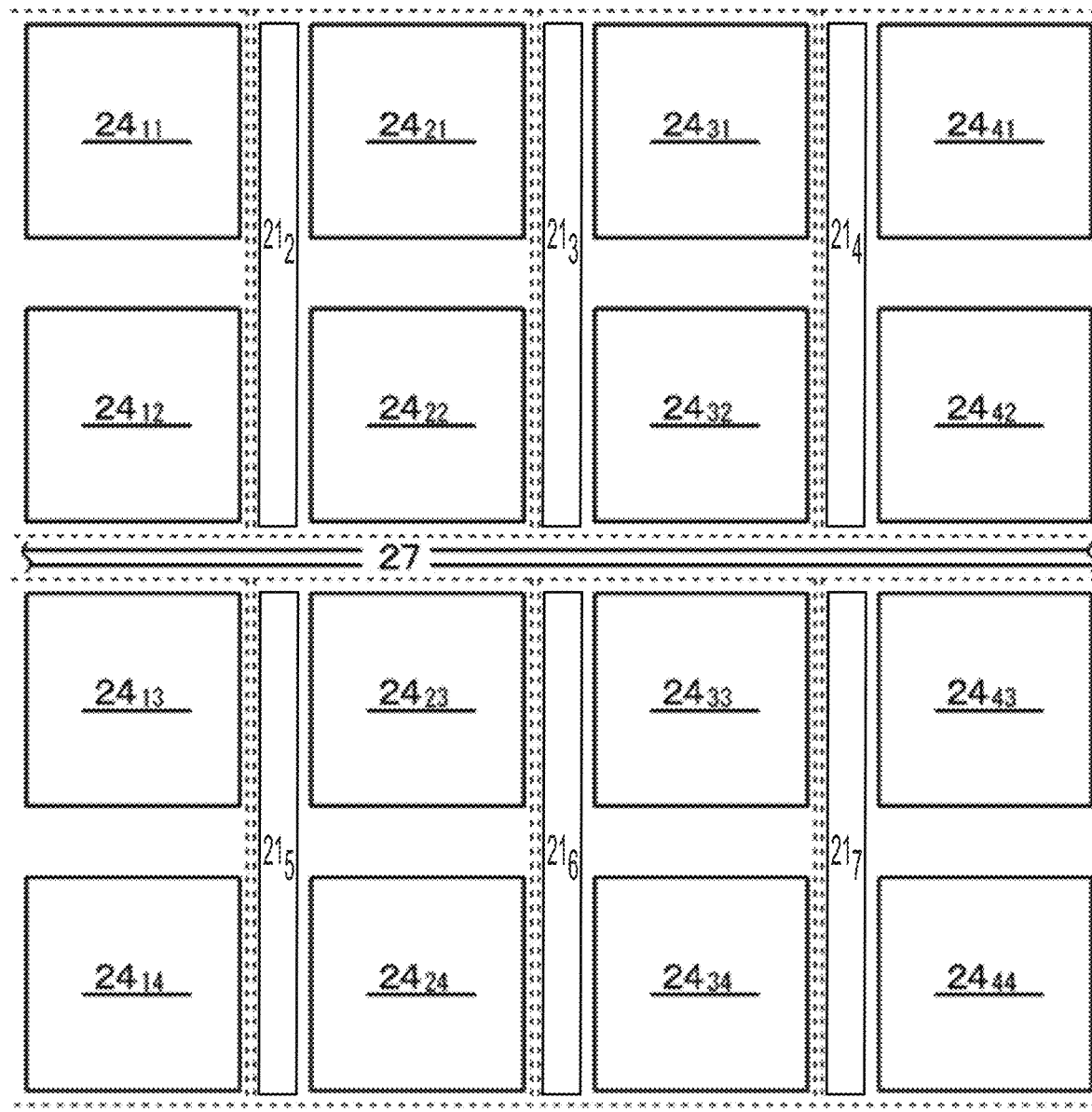
FIG. 55 is a schematic plan view of the first electrodes and the charge accumulation electrode segments in a fifth modification example of the solid-state imaging device of Example 9.

The states of arrangement of the first electrode 21 and the charge accumulation electrode 24 in the solid-state imaging device of Example 9 are schematically illustrated in FIG. 50 (Example 9), FIG. 51 (a first modification example of Example 9), FIG. 52 (a second modification example of Example 9), FIG. 53 (a third modification example of Example 9), and FIG. 54 (a fourth modification example of Example 9). FIGS. 50, 51, 54, and 55 illustrate sixteen imaging elements, and FIGS. 52 and 53 illustrate twelve imaging elements. Then, the imaging element block is constituted of two imaging elements. The imaging element block is indicated by enclosing with dotted lines. Subscripts attached to the first electrodes 21 and the charge accumulation electrodes 24 are for distinguishing individual first electrodes 21 and individual charge accumulation electrodes 24. The same applies also to the following description. In addition, one on-chip microlens (not illustrated in FIGS. 50 to 57) is disposed above one imaging element. Then, in one imaging element block, two charge accumulation electrodes 24 are disposed with the first electrode 21 therebetween (see FIGS. 50 and 51). Alternatively, one first electrode 21 is disposed to be opposed to two charge accumulation electrodes 24 arranged side by side (see FIGS. 54 and 55). That is, the first electrode is disposed to be adjacent to the charge accumulation electrode of each imaging element. Alternatively, the first electrode is disposed to be adjacent to some of the charge accumulation electrodes of the plurality of imaging elements and not disposed to be adjacent to the rest of the charge accumulation electrodes of the plurality of imaging elements (see FIGS. 52 and 53), in which case the movement of electric charge from the rest of the plurality of imaging elements to the first electrode is a movement via some of the plurality of imaging elements. To ensure movement of electric charge from each imaging element to the first electrode, it is preferred that a distance A between a charge accumulation electrode included in an imaging element and a charge accumulation electrode included in an imaging element be longer than a distance B between the first electrode and the charge accumulation electrode in an imaging element adjacent to the first electrode. In addition, it is preferred that the value of the distance A be larger for the imaging element positioned farther from the first electrode. In addition, in the examples illustrated in FIGS. 51, 53, and 55, the charge movement control electrode 27 is disposed between a plurality of imaging elements constituting the imaging element block. By disposing the charge movement control electrode 27, it is possible to suppress, with reliability, the movement of electric charge in the imaging element blocks positioned with the charge movement control electrode 27 therebetween. It is to be noted that it is sufficient that $V_{31} > V_{17}$ holds true, where $V_{17}$ denotes a potential to be applied to the charge movement control electrode 27.

The charge movement control electrode 27 may be formed at the same level as the first electrode 21 or the charge accumulation electrode 24, or may be formed at a different level (specifically, a level below the first electrode 21 or the charge accumulation electrode 24). In the former case, it is possible to shorten the distance between the charge movement control electrode 27 and the photoelectric conversion layer, and this makes it easy to control the potential. In contrast, in the latter case, it is possible to shorten the distance between the charge movement control electrode 27 and the charge accumulation electrode 24, and this is advantageous in achieving miniaturization.

In the following, description is given of an operation of the imaging element block including a first electrode $21_2$ and two charge accumulation electrodes $24_{21}$ and $24_{22}$.

During a charge accumulation period, from the drive circuit, the potential $V_{11}$ is applied to the first electrode $21_2$ and the potential $V_{31}$ is applied to the charge accumulation electrodes $24_{21}$ and $24_{22}$. Light having entered the photoelectric conversion layer 23A generates photoelectric conversion in the photoelectric conversion layer 23A. Holes generated by the photoelectric conversion are sent from the second electrode 22 to the drive circuit via the wiring line $V_{OU}$. Meanwhile, the potential $V_{11}$ of the first electrode $21_2$ is higher than the potential $V_{21}$ of the second electrode 22, i.e., for example, a positive potential is to be applied to the first electrode $21_2$ and a negative potential is to be applied to the second electrode 22. Thus, $V_{31} \geq V_{11}$ holds true, and preferably, $V_{31} > V_{11}$ holds true. This causes electrons generated by the photoelectric conversion to be attracted to the charge accumulation electrodes $24_{21}$ and $24_{22}$, and to remain in regions of the inorganic semiconductor material layer 23B or the like opposed to the charge accumulation electrodes $24_{21}$ and $24_{22}$. That is, electric charge is accumulated in the inorganic semiconductor material layer 23B or the like. Because $V_{31} \geq V_{11}$ holds true, the electrons generated inside of the photoelectric conversion layer 23A would not move toward the first electrode $21_2$. With the passage of time of photoelectric conversion, the potentials in regions of the inorganic semiconductor material layer 23B or the like opposed to the charge accumulation electrodes $24_{21}$ and $24_{22}$ have more negative values.

A reset operation is performed later in the charge accumulation period. This resets the potential of the first floating diffusion layer, and the potential of the first floating diffusion layer shifts to the potential $V_{DD}$ of the power supply.

After completion of the reset operation, the electric charge is read out. That is, during a charge transfer period, from the drive circuit, the potential $V_{21}$ is applied to the first electrode $21_2$, a potential $V_{32-A}$ is applied to the charge accumulation electrode $24_{21}$, and a potential $V_{32-B}$ is applied to the charge accumulation electrode $24_{22}$. Here, $V_{32-A} < V_{21} < V_{32-B}$ holds true. This causes the electrons remaining in the region of the inorganic semiconductor material layer 23B or the like opposed to the charge accumulation electrode $24_{21}$ to be read out to the first electrode $21_2$, and further to the first floating diffusion layer. That is, the electric charge accumulated in the region of the inorganic semiconductor material layer 23B or the like opposed to the charge accumulation electrode $24_{21}$ is read out to the control section. Once the reading has been completed, $V_{32-B} \leq V_{32-A} < V_{21}$ holds true. It is to be noted that, in the examples illustrated in FIGS. 54 and 55, $V_{32-B} < V_{21} < V_{32-A}$ may hold true. This causes the electrons remaining in the region of the inorganic semiconductor material layer 23B or the like opposed to the charge accumulation electrode $24_{22}$ to be read out to the first electrode $21_2$, and further to the first floating diffusion layer. In addition, in the examples illustrated in FIGS. 52 and 53, the electrons remaining in the region of the inorganic semiconductor material layer 23B or the like opposed to the charge accumulation electrode $24_{22}$ may be read out to the first floating diffusion layer via a first electrode 213 to which the charge accumulation electrode $24_{22}$ is adjacent. In this way, the electric charge accumulated in the region of the inorganic semiconductor material layer 23B or the like opposed to the charge accumulation electrode $24_{22}$ is read out to the control section. It is to be noted that, once the reading of the electric charge accumulated in the region of the inorganic semiconductor material layer 23B or the like opposed to the charge accumulation electrode $24_{21}$ to the control section has been completed, the potential of the first floating diffusion layer may be reset.

Figure 58A:
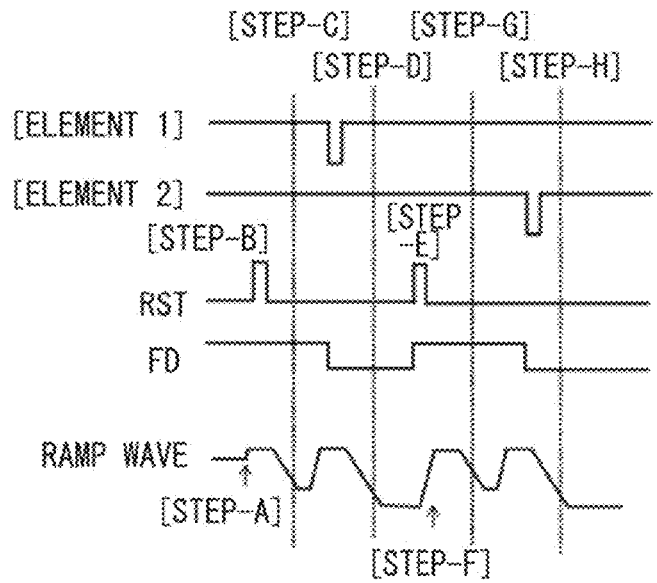
FIGS. 58A, 58B, and 58C are charts illustrating examples of reading and driving in an imaging element block of Example 9.

FIG. 58A illustrates an example of reading and driving in the imaging element block of Example 9.

Step-A

Inputting auto zero signal to comparator

Step-B

Reset operation of one shared floating diffusion layer

Step-C

P-phase reading in imaging element corresponding to charge accumulation electrode $24_{21}$ and movement of electric charge to first electrode $21_2$ Step-D D-phase reading in imaging element corresponding to charge accumulation electrode $24_{21}$ and movement of electric charge to first electrode $21_2$ Step-E Reset operation of one shared floating diffusion layer Step-F Inputting auto zero signal to comparator Step-G P-phase reading in imaging element corresponding to charge accumulation electrode $24_{22}$ and movement of electric charge to first electrode $21_2$ Step-H D-phase reading in imaging element corresponding to charge accumulation electrode $24_{22}$ and movement of electric charge to first electrode $21_2$ In accordance with the above flow, signals from two imaging elements corresponding to the charge accumulation electrode $24_{21}$ and the charge accumulation electrode $24_{22}$ are read out. On the basis of a correlated double sampling (CDS) process, a difference between the P-phase reading in [Step-C] and the D-phase reading in [Step-D] is a signal from the imaging element corresponding to the charge accumulation electrode $24_{21}$, and a difference between the P-phase reading in [Step-G] and the D-phase reading in [Step-H] is a signal from the imaging element corresponding to the charge accumulation electrode $24_{22}$.

Figure 58B:
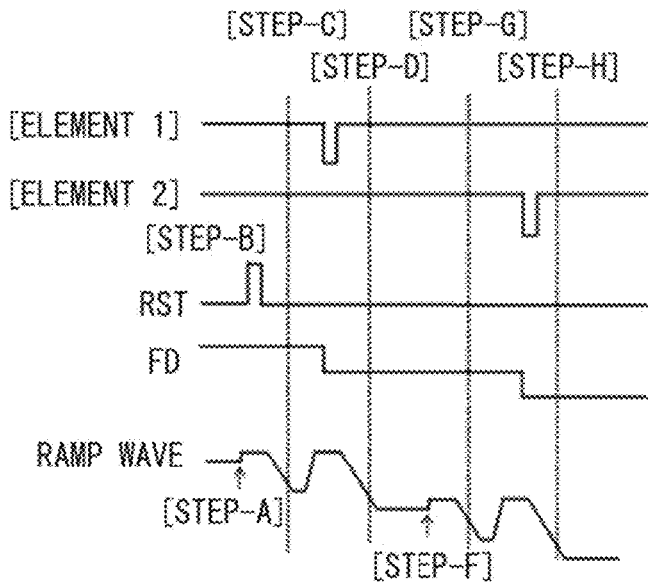
Figure 58C:
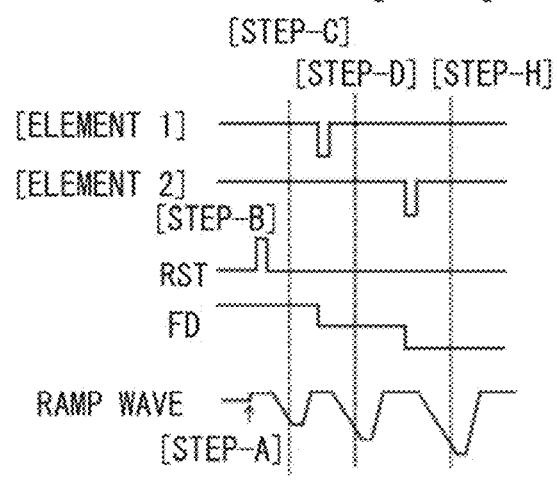
Figure 59:
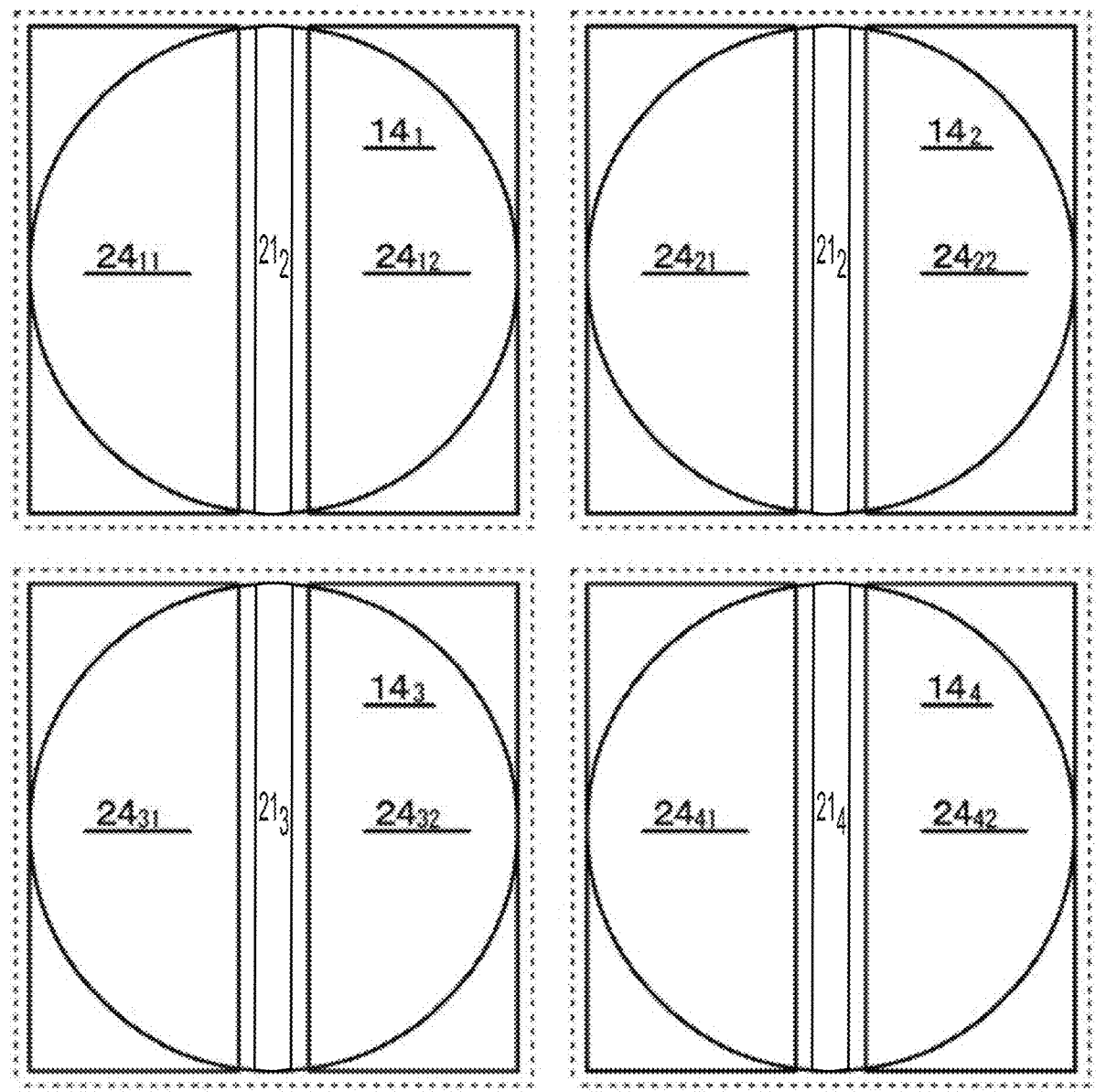
FIG. 59 is a schematic plan view of the first electrodes and the charge accumulation electrode segments in a solid-state imaging device of Example 10.
Figure 60:
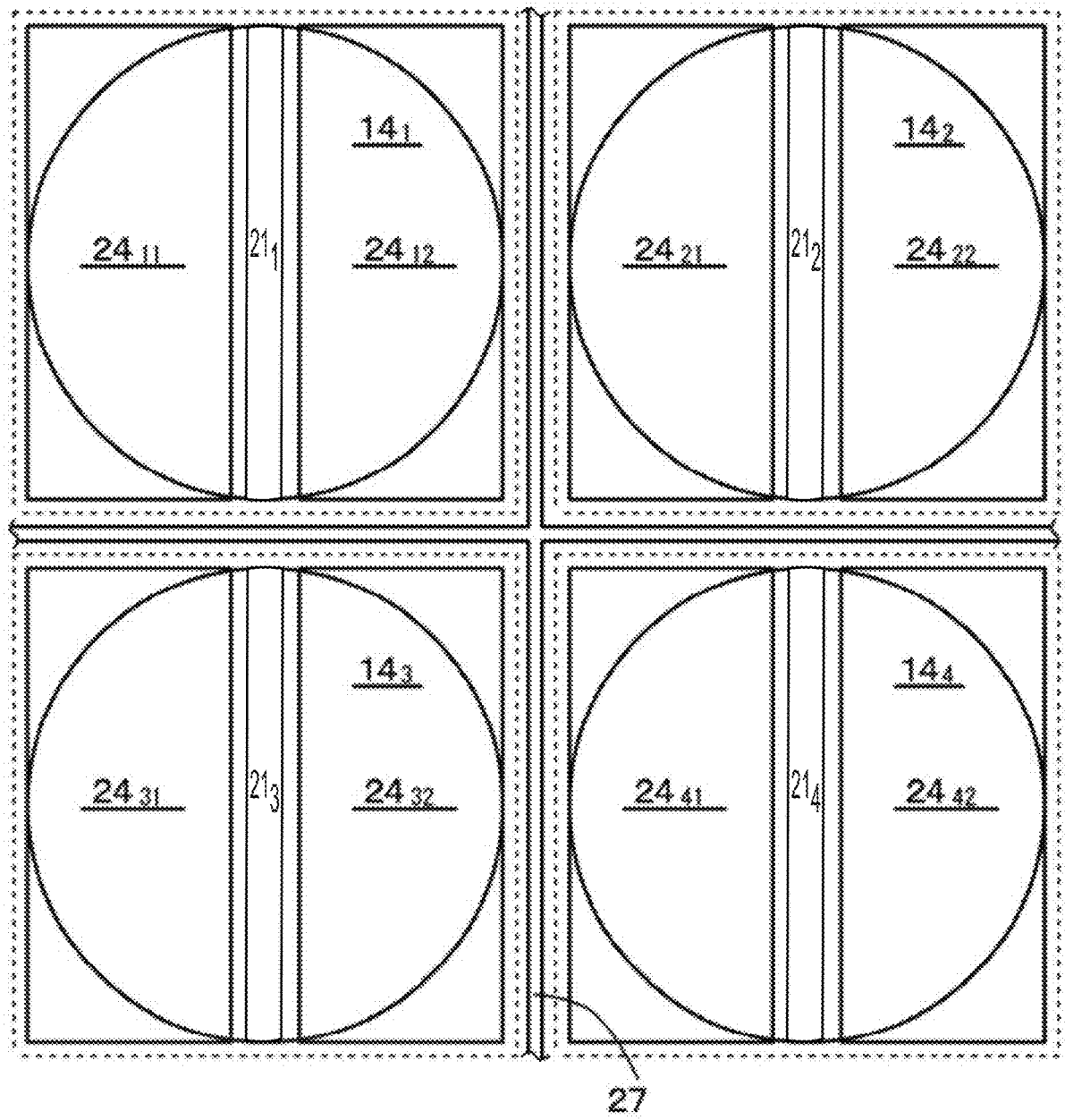
FIG. 60 is a schematic plan view of the first electrodes and the charge accumulation electrode segments in a modification example of the solid-state imaging device of Example 10.
Figure 61:
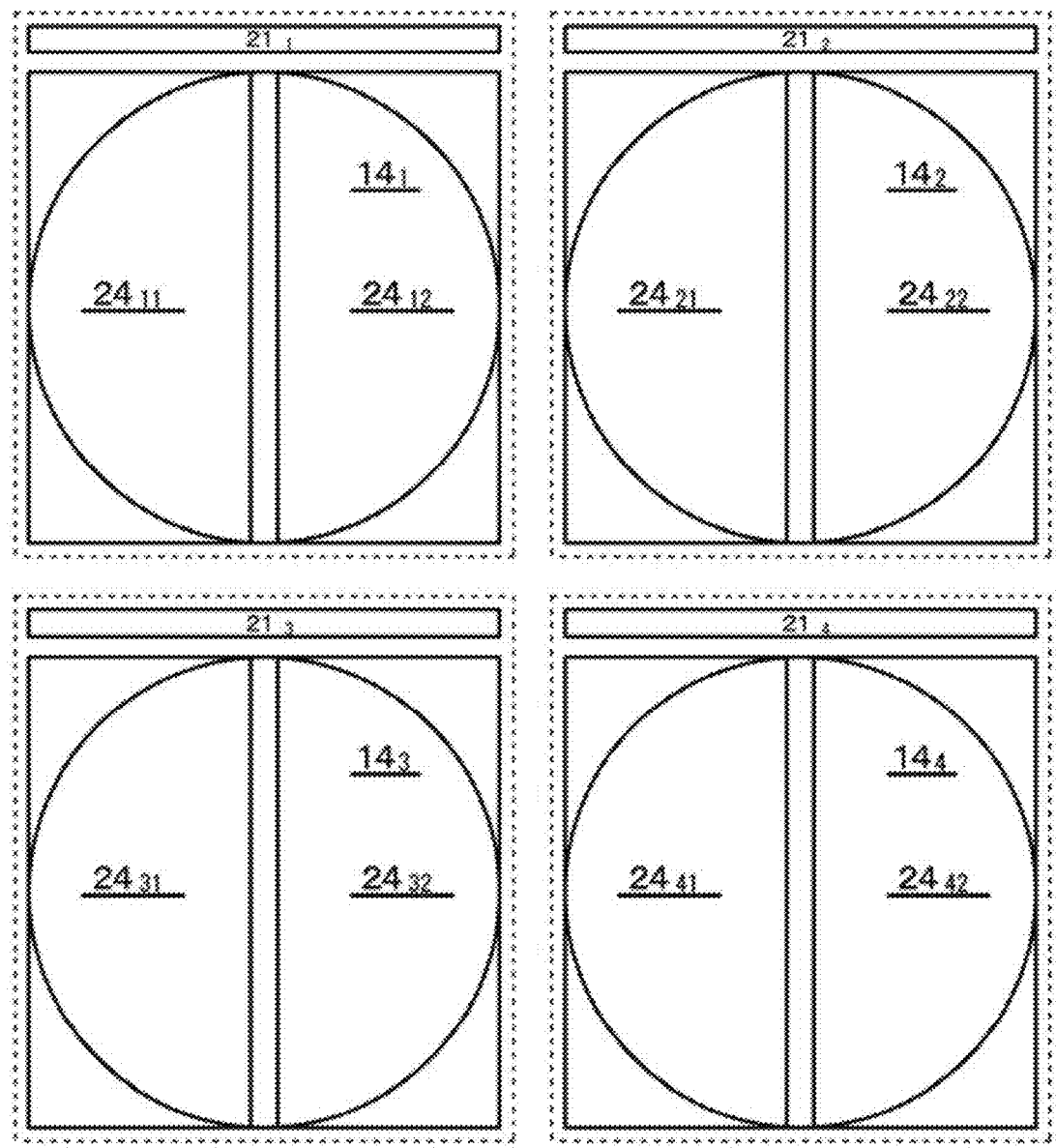
FIG. 61 is a schematic plan view of the first electrodes and the charge accumulation electrode segments in a modification example of the solid-state imaging device of Example 10.
Figure 62:
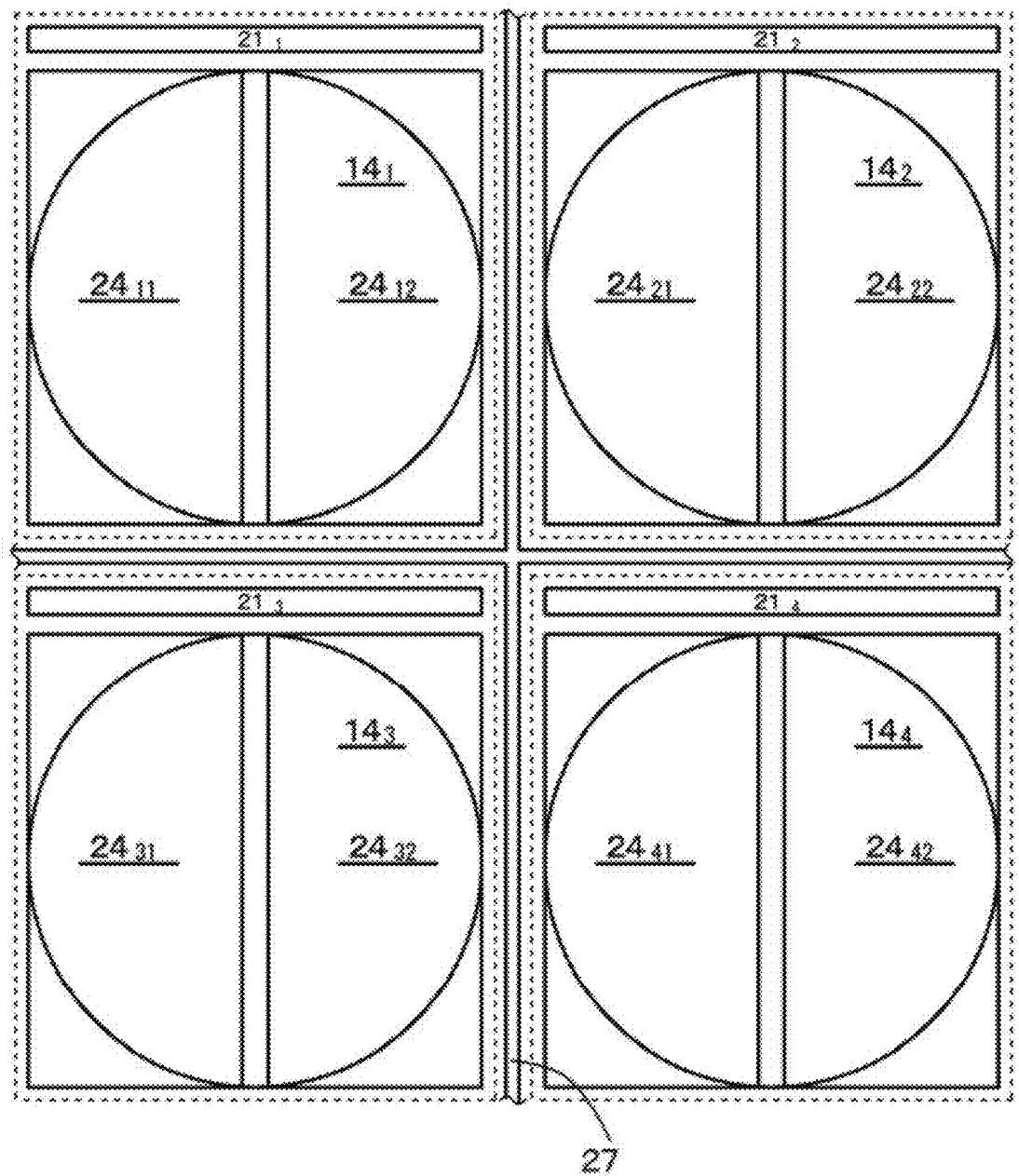
FIG. 62 is a schematic plan view of the first electrodes and the charge accumulation electrode segments in a modification example of the solid-state imaging device of Example 10.

It is to be noted that the operation of [Step-E] may be omitted (see FIG. 58B). In addition, the operation of [Step-F] may be omitted, and in this case, it is possible to further omit [Step-G] (see FIG. 58C); then, a difference between the P-phase reading in [Step-C] and the D-phase reading in [Step-D] is a signal from the imaging element corresponding to the charge accumulation electrode $24_{21}$, and a difference between the D-phase reading in [Step-D] and the D-phase reading in [Step-H] is a signal from the imaging element corresponding to the charge accumulation electrode $24_{22}$.

Figure 56:
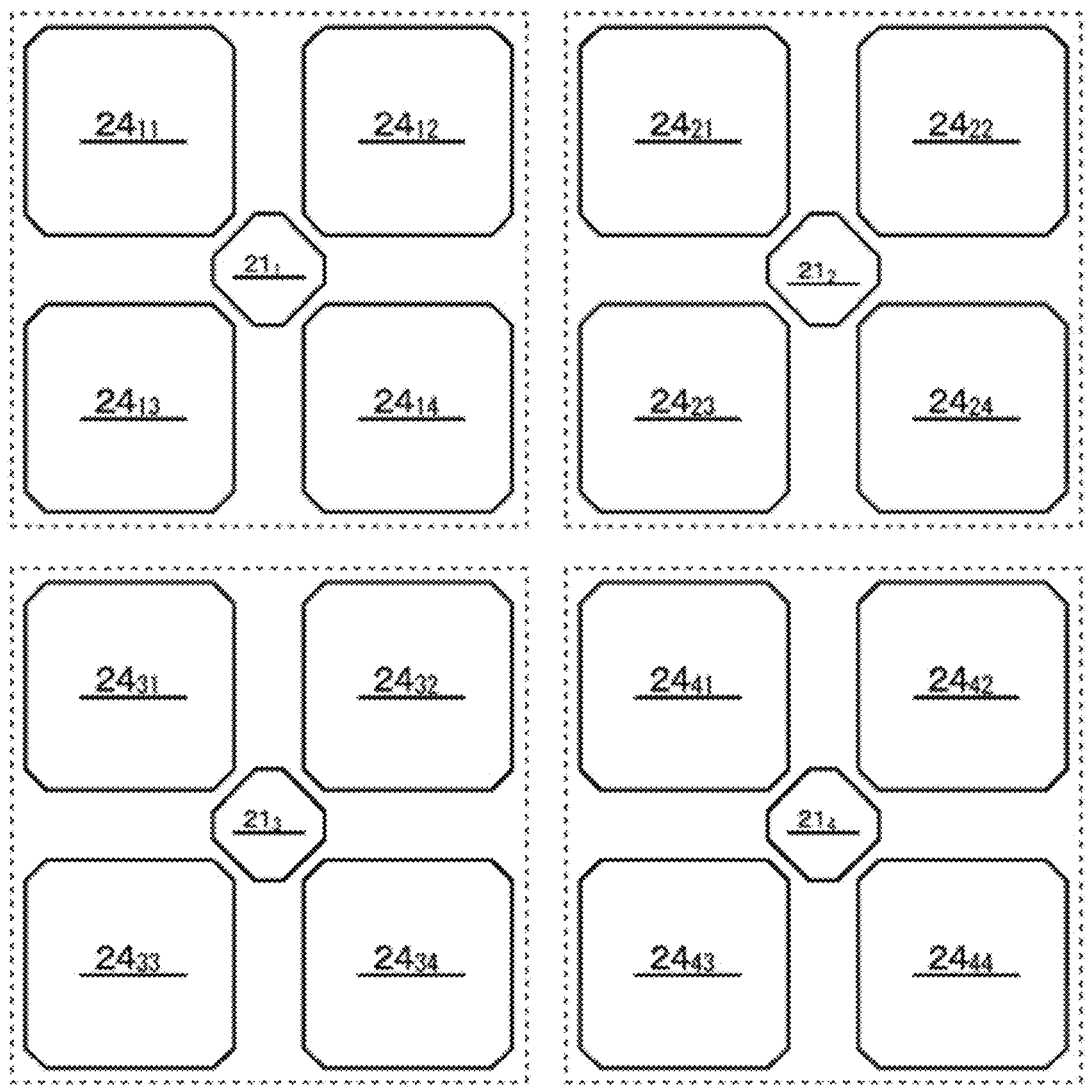
FIG. 56 is a schematic plan view of the first electrodes and the charge accumulation electrode segments in a sixth modification example of the solid-state imaging device of Example 9.
Figure 57:
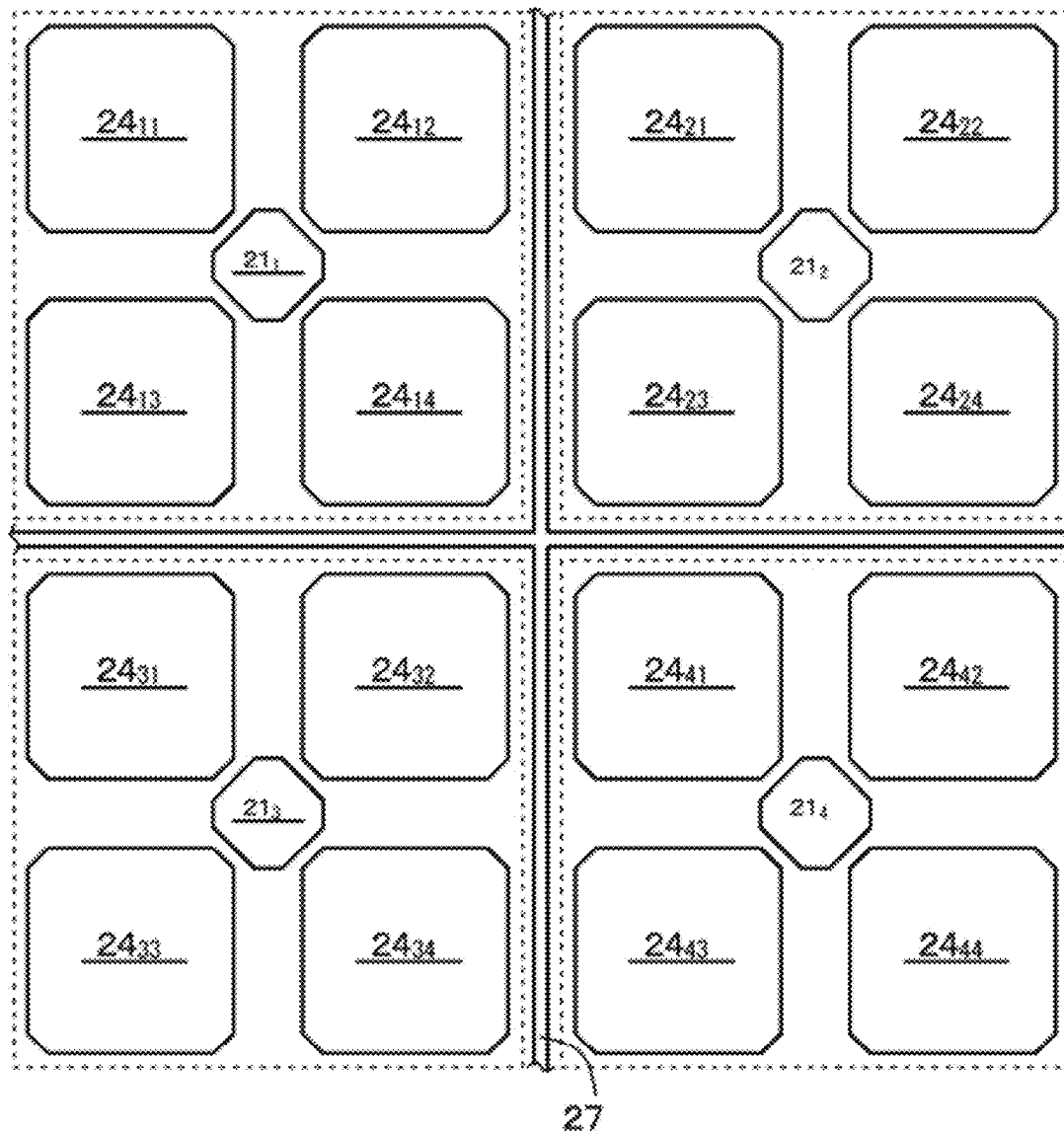
FIG. 57 is a schematic plan view of the first electrodes and the charge accumulation electrode segments in a seventh modification example of the solid-state imaging device of Example 9.

The states of arrangement of the first electrode 21 and the charge accumulation electrode 24 in modification examples are schematically illustrated in FIG. 56 (a sixth modification example of Example 9) and FIG. 57 (a seventh modification example of Example 9). In these modification examples, four imaging elements constitute an imaging element block. Operations of these solid-state imaging devices may be substantially similar to the operations of the solid-state imaging devices illustrated in FIGS. 50 to 55.

In the solid-state imaging device of Example 9, the first electrode is shared by a plurality of imaging elements constituting the imaging element block. It is thus possible to simplify and miniaturize the configuration and structure in the pixel region in which a plurality of imaging elements are arranged. It is to be noted that a plurality of imaging elements provided for one floating diffusion layer may be constituted of a plurality of imaging elements of the first type, or may be constituted of at least one imaging element of the first type and one or two or more imaging elements of the second type.

Example 10

Example 10 is a modification of Example 9. The states of arrangement of the first electrode 21 and the charge accumulation electrode 24 thereof are schematically illustrated in FIGS. 59, 60, 61, and 62. In the solid-state imaging device of Example 10, two imaging elements constitute an imaging element block. In addition, one on-chip microlens 14 is disposed above the imaging element block. It is to be noted that, in the examples illustrated in FIGS. 60 and 62, the charge movement control electrode 27 is disposed between the plurality of imaging elements constituting the imaging element block.

For example, photoelectric conversion layers corresponding to charge accumulation electrodes $24_{11}$, $24_{21}$, $24_{31}$, and $24_{41}$ constituting imaging element blocks have high sensitivity to incident light diagonally from the upper right in the drawing. In addition, photoelectric conversion layers corresponding to charge accumulation electrodes $24_{12}$, $24_{22}$, $24_{32}$, and $24_{42}$ constituting imaging element blocks have high sensitivity to incident light diagonally from the upper left in the drawing. Therefore, for example, combining an imaging element including the charge accumulation electrode $24_{11}$ and an imaging element including the charge accumulation electrode $24_{12}$ makes it possible to acquire an image plane phase difference signal. In addition, by adding up a signal from the imaging element including the charge accumulation electrode $24_{11}$ and a signal from the imaging element including the charge accumulation electrode $24_{12}$, it is possible to configure one imaging element by a combination with these imaging elements. In the example illustrated in FIG. 59, a first electrode $21_1$ is disposed between the charge accumulation electrode $24_{11}$ and the charge accumulation electrode $24_{12}$; however, by disposing one first electrode $21_1$ to be opposed to two charge accumulation electrodes $24_{11}$ and $24_{12}$ arranged side by side as in the example illustrated in FIG. 61, it is possible to achieve further improvement in sensitivity.

While the description has been given above of the present disclosure on the basis of preferred examples, the present disclosure is not limited to these examples. The structures and configurations, manufacturing conditions, manufacturing methods, and materials used of the imaging elements, the stacked imaging elements, and the solid-state imaging devices described in the examples are merely illustrative, and may be modified as appropriate. The imaging elements of the examples may be combined as appropriate. The configuration and structure of the imaging element of the present disclosure are applicable to light emitting elements, e.g., organic EL elements, or channel formation regions of thin-film transistors.

Depending on the case, the floating diffusion layers $FD_1$, $FD_2$, $FD_3$, 51C, 45C, and 46C may also be shared, as has been described.

Figure 63:
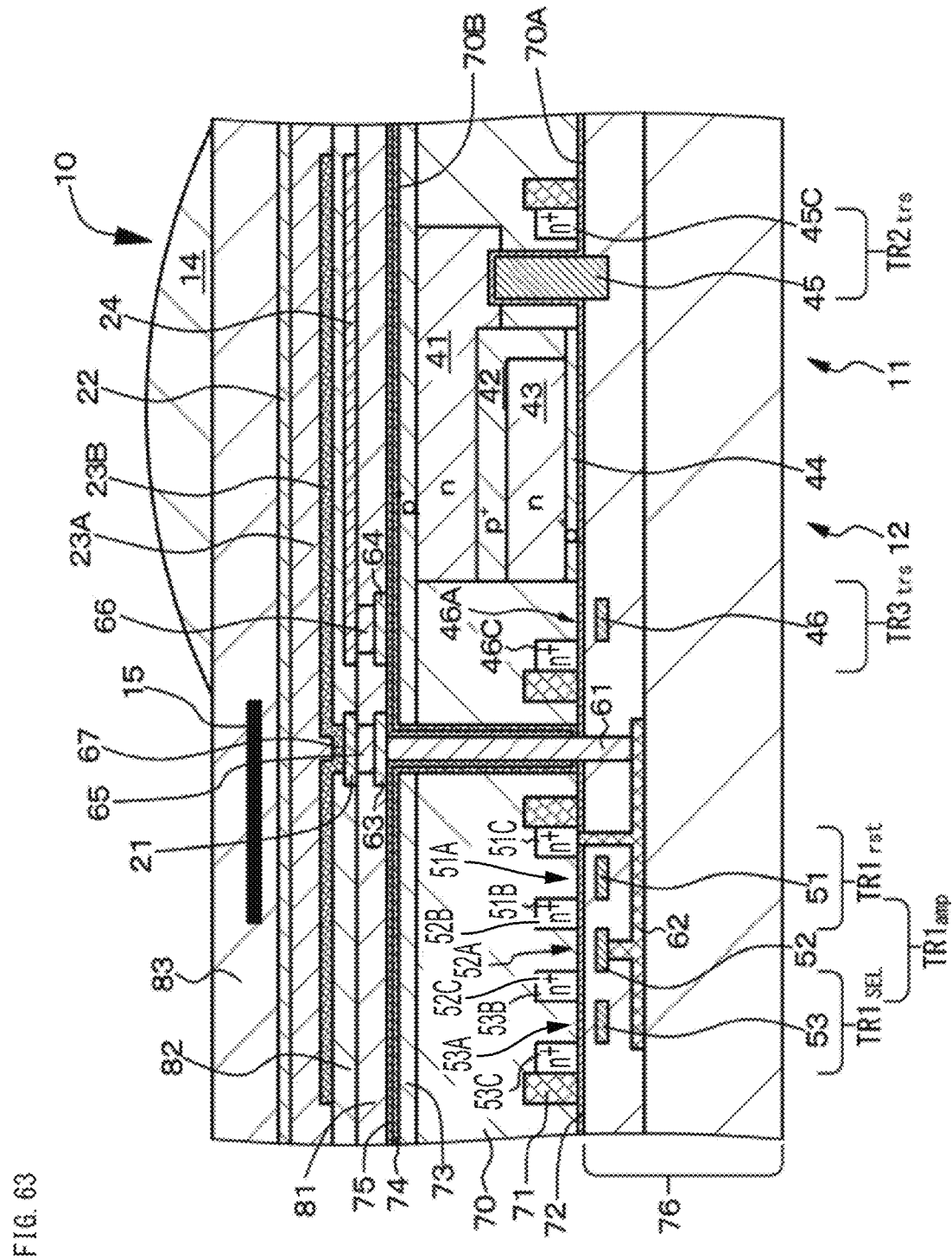
FIG. 63 is a schematic partial cross-sectional view of still another modification example of the imaging element and a stacked imaging element of Example 1.

In addition, FIG. 63 illustrates a modification example of the imaging element and the stacked imaging element described in Example 1. As illustrated, for example, a configuration may be adopted in which light enters from side of the second electrode 22 and a light-blocking layer 15 is formed on the light incident side near the second electrode 22. It is to be noted that various wiring lines provided closer to the light incident side than the photoelectric conversion layer may also serve as a light-blocking layer.

Figure 64:
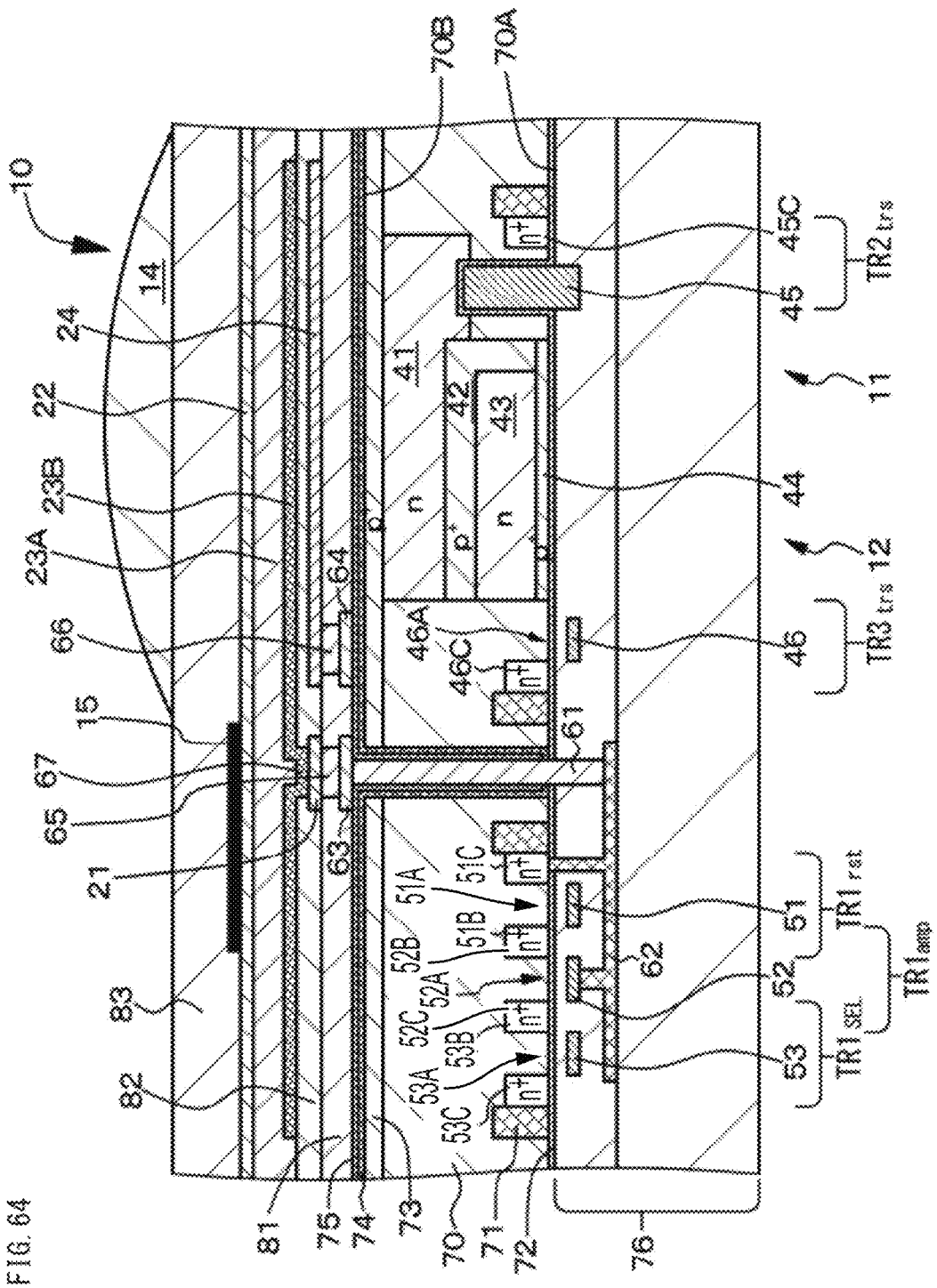
FIG. 64 is a schematic partial cross-sectional view of still another modification example of the imaging element and the stacked imaging element of Example 1.
Figure 65:
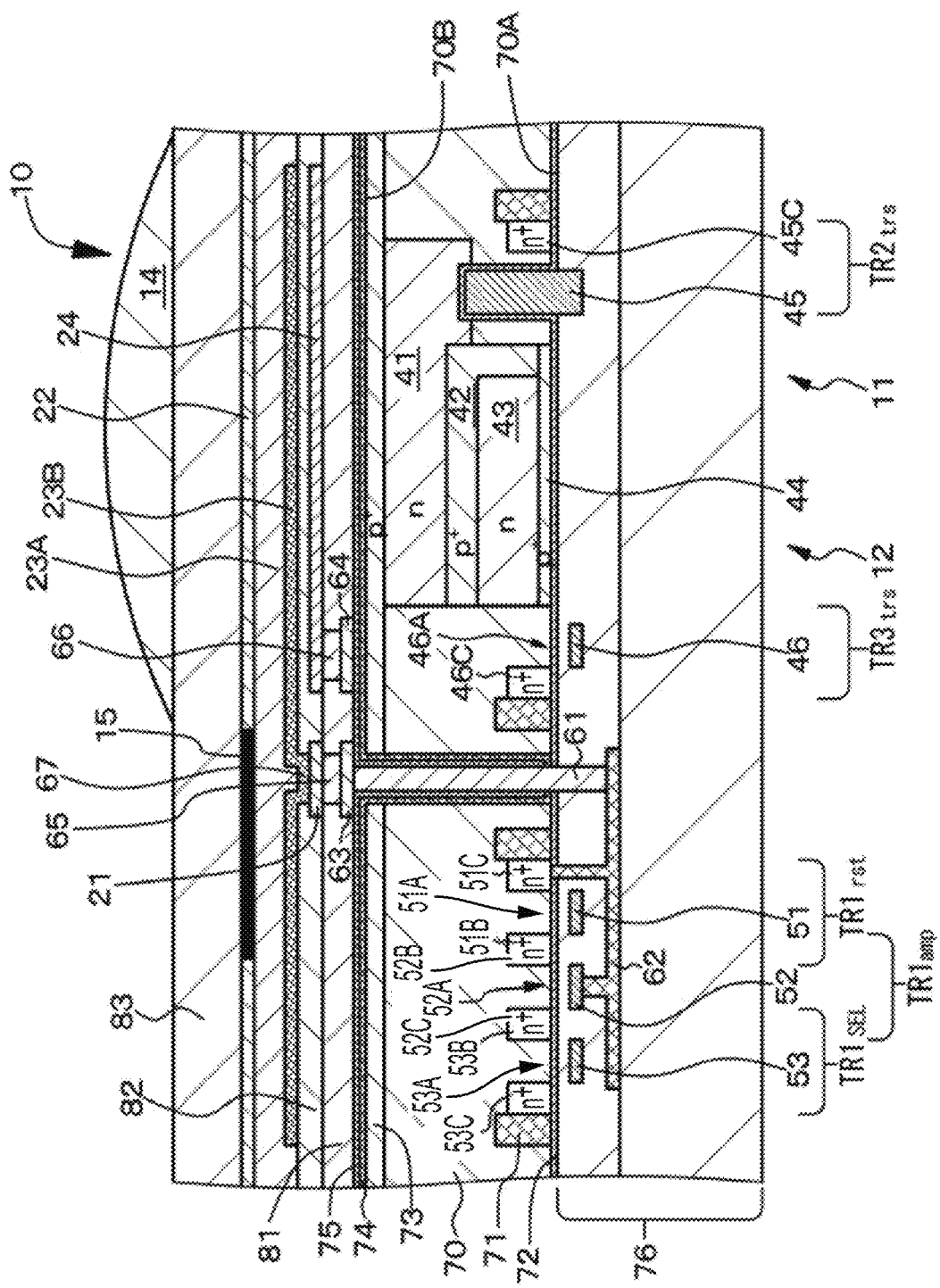
FIG. 65 is a schematic partial cross-sectional view of still another modification example of the imaging element and the stacked imaging element of Example 1.

It is to be noted that, in the example illustrated in FIG. 63, the light-blocking layer 15 is formed above the second electrode 22, i.e., the light-blocking layer 15 is formed on the light incident side near the second electrode 22 and above the first electrode 21; however, as illustrated in FIG. 64, the light-blocking layer 15 may be disposed on a surface of the second electrode 22 on the light incident side. In addition, as illustrated in FIG. 65, the second electrode 22 may be provided with the light-blocking layer 15, depending on the case.

Figure 66:
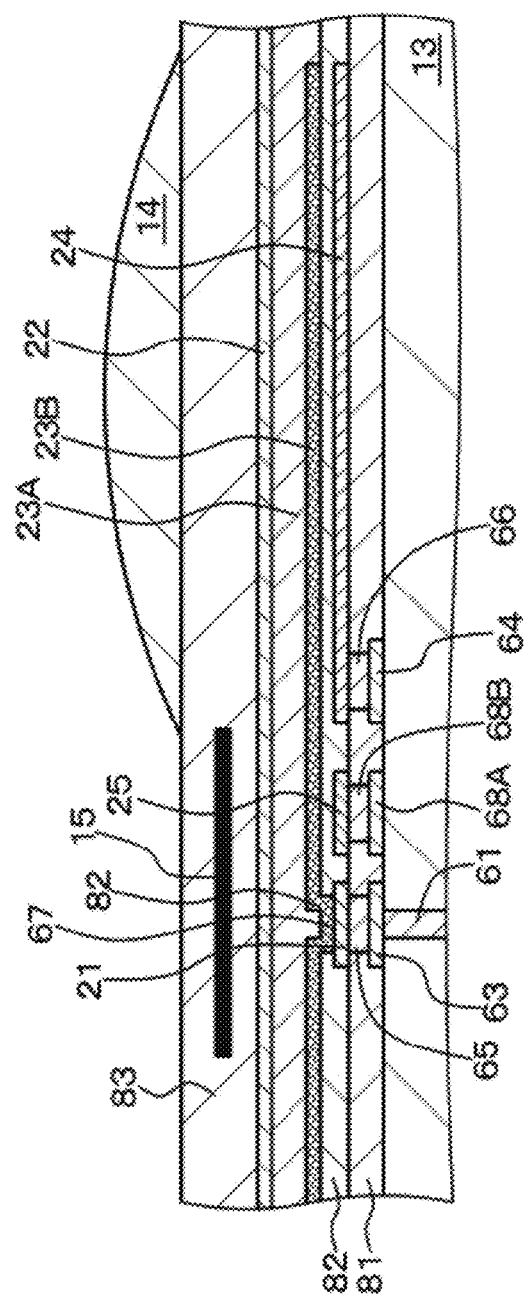
FIG. 66 is a schematic partial cross-sectional view of another modification example of the imaging element and the stacked imaging element of Example 1.
Figure 67:
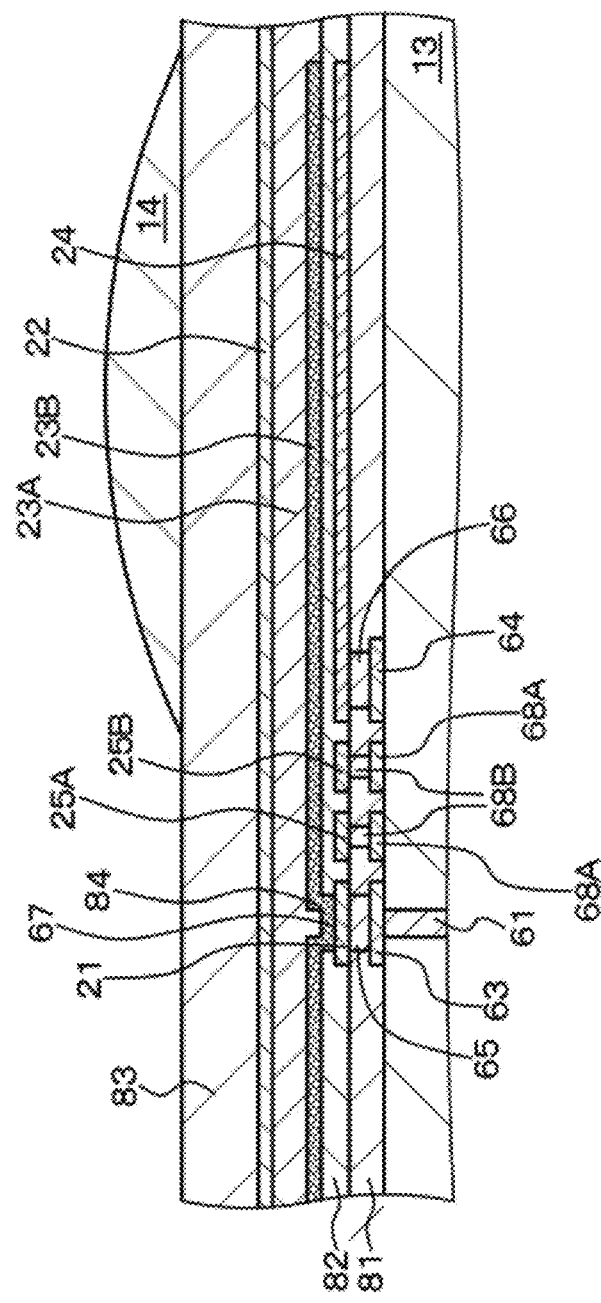
FIG. 67 is a schematic partial cross-sectional view of still another modification example of the imaging element of Example 4.

Alternatively, a structure may be adopted in which light enters from the side of the second electrode 22 and no light enters the first electrode 21. Specifically, as illustrated in FIG. 63, the light-blocking layer 15 is formed on the light incident side near the second electrode 22 and above the first electrode 21. Alternatively, a structure may be adopted in which, as illustrated in FIG. 67, the on-chip microlens 14 is provided above the charge accumulation electrode 24 and the second electrode 22, and light entering the on-chip microlens 14 is condensed onto the charge accumulation electrode 24 and does not reach the first electrode 21. It is to be noted that, as described in Example 4, in the case where the transfer control electrode 25 is provided, a mode may be adopted in which light enters neither of the first electrode 21 and the transfer control electrode 25. Specifically, a structure may be adopted in which, as illustrated in FIG. 66, the light-blocking layer 15 is formed above the first electrode 21 and the transfer control electrode 25. Alternatively, a structure may be adopted in which the light entering the on-chip microlens 14 does not reach the first electrode 21, or reaches neither of the first electrode 21 and the transfer control electrode 25.

By employing these configurations and structures, or by providing the light-blocking layer 15 to allow light to enter only a portion of the photoelectric conversion section positioned above the charge accumulation electrode 24, or by designing the on-chip microlens 14, the portion of the photoelectric conversion section positioned above the first electrode 21 (or above the first electrode 21 and the transfer control electrode 25) becomes unable to contribute to photoelectric conversion, and it is thus possible to reset all the pixels all at once with higher reliability, and to achieve the global shutter function more easily. Thus, in a method of driving a solid-state imaging device including a plurality of imaging elements having these configurations and structures, the following steps are repeated:

draining, in all of the imaging elements, electric charge in the first electrodes 21 out of the system all at once while accumulating electric charge in the inorganic semiconductor material layers 23B or the like, and thereafter transferring, in all of the imaging elements, the electric charge accumulated in the inorganic semiconductor material layers 23B or the like to the first electrodes 21 all at once, and after completion of the transfer, reading out the electric charge transferred to the first electrodes 21 in the respective imaging elements sequentially.

In such a method of driving the solid-state imaging device, each imaging element has a structure in which light having entered from the side of the second electrode does not enter the first electrode and, in all of the imaging elements, the electric charge in the first electrodes is drained out of the system all at once while accumulating electric charge in the inorganic semiconductor material layers or the like. This makes it possible to perform resetting of the first electrodes in all of the imaging elements simultaneously with reliability. Thereafter, in all of the imaging elements, the electric charge accumulated in the inorganic semiconductor material layers or the like is transferred all at once to the first electrodes, and after completion of the transfer, the electric charge transferred to the first electrodes is read out in the imaging elements sequentially. It is thus possible to easily achieve the so-called global shutter function.

In a case where one inorganic semiconductor material layer 23B shared by a plurality of imaging elements is formed, it is desirable that an end part of the inorganic semiconductor material layer 23B be covered with at least the photoelectric conversion layer 23A, from the viewpoint of protection of the end part of the inorganic semiconductor material layer 23B. For the structure of the imaging element in such a case, a structure as illustrated at the right end of the schematic cross-sectional view of the inorganic semiconductor material layer 23B illustrated in FIG. 1 is sufficient.

In addition, as a modification example of Example 4, as illustrated in FIG. 67, a plurality of transfer control electrodes may be provided from a position closest to the first electrode 21 toward the charge accumulation electrode 24. It is to be noted that FIG. 67 illustrates an example in which two transfer control electrodes 25A and 25B are provided. Then, a structure may be adopted in which the on-chip microlens 14 is provided above the charge accumulation electrode 24 and the second electrode 22, so that light entering the on-chip microlens 14 is condensed onto the charge accumulation electrode 24 and reaches none of the first electrode 21 and the transfer control electrodes 25A and 25B.

The first electrode 21 may be configured to extend in the opening 84 provided in the insulating layer 82 and to be coupled to the inorganic semiconductor material layer 23B.

In addition, in Examples, description has been given with reference to, as an example, a case of application to a CMOS type solid-state imaging device in which unit pixels are arranged in matrix for sensing signal charge responsive to the amount of incident light as a physical quantity; however, the application to the CMOS type solid-state imaging device is not limitative, and application to a CCD type solid-state imaging device is also possible. In the latter case, the signal charge is transferred in the vertical direction by a vertical transfer register of a CCD type structure, transferred in the horizontal direction by a horizontal transfer register, and then amplified to thereby cause a pixel signal (image signal) to be outputted. In addition, possible applications are not limited to column-system solid-state imaging devices in general in which pixels are formed in a two-dimensional matrix pattern and a column signal processing circuit is disposed for each pixel column. Further, depending on the case, the selection transistor may be omitted.

Further, the imaging element and the stacked imaging element of the present disclosure are applicable not only to a solid-state imaging device that senses the distribution of incident amount of visible light to capture an image of the distribution, but also to a solid-state imaging device that captures an image of the distribution of incident amount of infrared rays, X-rays, particles, or the like. In addition, in a broad sense, the imaging element and the stacked imaging element of the present disclosure are generally applicable to a solid-state imaging device (physical quantity distribution sensing device) that senses the distribution of other physical quantities, including pressure and capacitance, to capture an image of the distribution, such as a fingerprint detection sensor.

Further, possible applications are not limited to a solid-state imaging device that sequentially scans unit pixels in an imaging region row by row and reads out pixel signals from the unit pixels. Application to an X-Y address type solid-state imaging device is also possible that selects any pixel on a per-pixel basis and reads out a pixel signal from the selected pixel on a per-pixel basis. The solid-state imaging device may be formed in a one-chip form or may be in a modular form with an imaging function in which the imaging region and the drive circuit or the optical system are packaged together.

In addition, possible applications are not limited to a solid-state imaging device, and application to an imaging device is also possible. Here, the imaging device refers to an electronic apparatus having an imaging function, examples of which include camera systems such as a digital still camera or a video camera, mobile phones, etc. In some cases, the imaging device may also be an imaging device in a modular form to be mounted on an electronic apparatus, i.e., a camera module.

Figure 69:
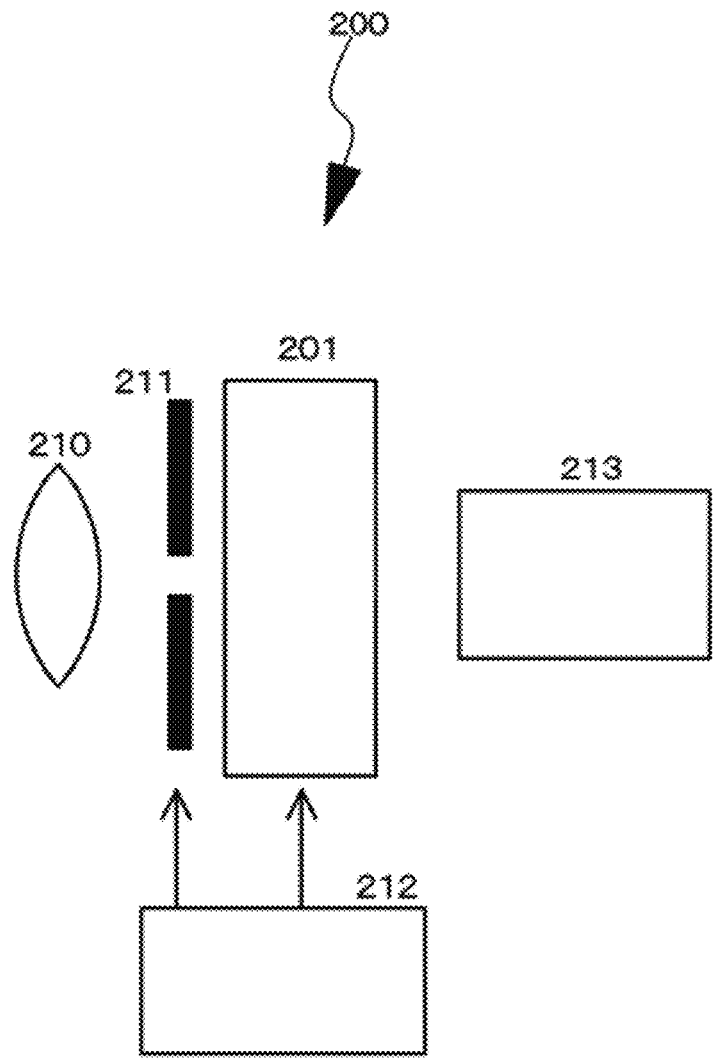
FIG. 69 is a conceptual diagram of an example in which a solid-state imaging device including the imaging element and the stacked imaging element according to any of first and second aspects of the present disclosure is used in an electronic apparatus (camera).

FIG. 69 illustrates, as a conceptual diagram, an example of using a solid-state imaging device 201 including the imaging element and the stacked imaging element of the present disclosure in an electronic apparatus (camera) 200. The electronic apparatus 200 includes the solid-state imaging device 201, an optical lens 210, a shutter device 211, a drive circuit 212, and a signal processing circuit 213. The optical lens 210 focuses image light (incident light) from a subject to form an image on an imaging plane of the solid-state imaging device 201. This causes signal charge to be accumulated in the solid-state imaging device 201 for a predetermined period of time. The shutter device 211 controls a period during which the solid-state imaging device 201 is to be irradiated with light and a period during which the light is to be blocked. The drive circuit 212 supplies drive signals for controlling a transfer operation, etc. of the solid-state imaging device 201 and a shutter operation of the shutter device 211. Signal transfer in the solid-state imaging device 201 is performed in accordance with the drive signals (timing signals) supplied from the drive circuit 212. The signal processing circuit 213 performs various kinds of signal processing. An image signal having undergone the signal processing is stored in a storage medium such as a memory, or is outputted to a monitor. In such an electronic apparatus 200, the solid-state imaging device 201 is able to achieve miniaturization of pixel size and improvement in transfer efficiency, thus making it possible to provide the electronic apparatus 200 with improved pixel characteristics. Examples of the electronic apparatus 200 to which the solid-state imaging device 201 is applicable are not limited to a camera, but includes a digital still camera, a camera module for a mobile apparatus such as a mobile phone, and other imaging devices.

The technology according to the present disclosure (the present technology) is applicable to various products. For example, the technology according to the present disclosure may be implemented as a device to be mounted on any type of mobile body such as an automobile, an electric vehicle, a hybrid electric vehicle, a motorcycle, a bicycle, a personal mobility, an airplane, a drone, a vessel, or a robot.

FIG. 77 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 77, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 77, an audio speaker 12061, a display section 12062, and an instrument panel 12063 are illustrated as the output device. The display section 12062 may, for example, include at least one of an on-board display and a head-up display.

FIG. 78 is a diagram depicting an example of the installation position of the imaging section 12031.

In FIG. 78, a vehicle 12100 includes, as the imaging section 12031, imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front obtained by the imaging sections 12101 and 12105 are used mainly to detect a preceding vehicle, a pedestrian, an obstacle, a signal, a traffic sign, a lane, or the like.

Incidentally, FIG. 78 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In addition, for example, the technology according to the present disclosure may be applied to an endoscopic surgery system.

FIG. 79 is a view depicting an example of a schematic configuration of an endoscopic surgery system to which the technology according to an embodiment of the present disclosure (present technology) can be applied.

In FIG. 79, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU: Camera Control Unit) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes alight source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 80 is a block diagram depicting an example of a functional configuration of the camera head 11102 and the CCU 11201 depicted in FIG. 79.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of the image pickup elements included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of multi-plate type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

It is to be noted that while the description has been given here of the endoscopic surgery system as one example, the technology according to an embodiment of the present disclosure may also be applied to, for example, a micrographic surgery system and the like.

It is to be noted that the present disclosure may also have the following configurations.
[A01] <<Imaging Element>>
An imaging element including a photoelectric conversion section including a first electrode, a photoelectric conversion layer including an organic material, and a second electrode that are stacked, in which
 an inorganic semiconductor material layer is formed between the first electrode and the photoelectric conversion layer, and
 a value ΔEN is less than 1.695, the value ΔEN resulting from subtracting an average value $EN_{cation}$ of electronegativities of cationic species included in the inorganic semiconductor material layer from an average value $EN_{anion}$ of electronegativities of anionic species included in the inorganic semiconductor material layer.
[A02] The imaging element according to [A01], in which the ΔEN is 1.624 or less.
[A03] The imaging element according to [A01] or [A02], in which, when the inorganic semiconductor material layer is represented by $(A^1_{a1}A^2_{a2}A^3_{a3}\ldots A^M_{aM})(B^1_{b1}B^2_{b2}B^3_{b3}\ldots B^N_{bN})$ [where $A^1, A^2, A^3, \ldots,$ and $A^M$ are cationic species, $B^1, B^2, B^3, \ldots,$ and $B^N$ are anionic species, and a1, a2, a3, ..., and aM, and b1, b2, b3, ..., and bN are values corresponding to atomic percentages, with a total thereof being 1.00], $EN_{anion} =$
$(B1 \times b1 + B2 \times b2 + B3 \times b3 \ldots + BN \times bN)/(b1 + b2 + b3 \ldots + bN)$ $EN_{cation} = (A1 \times a1 + A2 \times a2 + A3 \times a3 \ldots + AM \times aM)/$
$(a1 + a2 + a3 \ldots + aM)$ hold true, where B1, B2, B3, ..., and BN are electronegativities of the anionic species $B^1, B^2, B^3 \ldots,$ and $B^N$, and A1, A2, A3, ..., and $A^M$ are electronegativities of the cationic species $A^1, A^2, A^3 \ldots,$ and $A^M$.
[A04] The imaging element according to any one of [A01] to [A03], in which the cationic species include at least one type of cationic species selected from the group consisting of Zn, Ga, Ge, Cd, In, Al, Ti, B, Si, Sn, Hg, Tl, and Pb.
[A05] The imaging element according to any one of [A01] to [A03], in which the cationic species include Ga, In, and Sn, and the anionic species include O.
[A06] The imaging element according to any one of [A01] to [A03], in which the cationic species include Zn, Al, and Sn, and the anionic species include O.
[A07] The imaging element according to any one of [A01] to [A06], in which the photoelectric conversion section further includes an insulating layer, and a charge accumulation electrode disposed at a distance from the first electrode and disposed to be opposed to the inorganic semiconductor material layer with the insulating layer interposed therebetween.
[A08] The imaging element according to any one of [A01] to [A07], in which the following expression:

$E_1 - E_0 \geq 0.1$ eV is satisfied, where $E_0$ denotes a LUMO value of a material included in a portion of the photoelectric conversion layer positioned in a vicinity of the inorganic semiconductor material layer, and $E_1$ denotes a minimum energy value of a conduction band of an inorganic semiconductor material included in the inorganic semiconductor material layer.
[A09] The imaging element according to [A08], in which the following expression:

$E_1 - E_0 > 0.1$ eV

[A10] The imaging element according to any one of [A01] to [A09], in which the inorganic semiconductor material layer included in the inorganic semiconductor material layer has a carrier mobility of 10 cm$^2$/Vs or more.
[A11] The imaging element according to any one of [A01] to [A10], in which the inorganic semiconductor material layer has a carrier density of $1 \times 10^{16}$/cm$^3$ or less.
[A12] The imaging element according to any one of [A01] to [A11], in which the inorganic semiconductor material layer has a thickness of $1 \times 10^{-8}$ m to $1.5 \times 10^{-7}$ m.
[A13] The imaging element according to any one of [A01] to [A12], in which
 light is incident from the second electrode,
 a surface roughness Ra of a surface of the inorganic semiconductor material layer at an interface between the photoelectric conversion layer and the inorganic semiconductor material layer is 1.5 nm or less, and
 a value of a root mean square roughness Rq of the surface of the inorganic semiconductor material layer is 2.5 nm or less.
[A14] The imaging element according to any one of [A01] to [A13], in which, when a composition of the inorganic semiconductor material included in the inorganic semiconductor material layer is expressed by $A^1_{a1}Zn_{a2}Sn_{a3}O_{b1}$ (where a1+a2+a3=1.00 as well as a1>0, a2>0, and a3>0 hold true), $$0.88 \times (a3 - 0.3) > 0.12 \times a1 \qquad (1)$$

is satisfied.
[A15] The imaging element according to any one of [A01] to [A14], in which the inorganic semiconductor material included in the inorganic semiconductor material layer has an optical gap of 2.8 eV or more and 3.2 eV or less.
[A16] The imaging element according to any one of [A01] to [A15], in which, when the composition of the inorganic semiconductor material included in the inorganic semiconductor material layer is expressed by $Al_{a1}Zn_{a2}Sn_{a3}O_{b1}$ (where a1+a2+a3=1.00 as well as a1>0, a2>0, and a3>0 hold true), $$0.36 \times (a3 - 0.62) \leq 0.64 \times a1 \leq 0.36 \times a3 \qquad (2)$$

is satisfied.
[A17] The imaging element according to any one of [A01] to [A16], in which the inorganic semiconductor material included in the inorganic semiconductor material layer has an oxygen deficiency generation energy of 2.6 eV or more.
[A18] The imaging element according to any one of [A01] to [A17], in which, when the composition of the inorganic semiconductor material included in the inorganic semiconductor material layer is expressed by $Al_{a1}Zn_{a2}Sn_{a3}O_{b1}$ (where a1+a2+a3=1.00 as well as a1>0, a2>0, and a3>0 hold true), $$a3 \leq 0.67 \quad (3\text{-}1)$$

and $$0.60 \times (a3 - 0.61) \leq 0.40 \times a1 \quad (3\text{-}2)$$

are satisfied.

[A19] The imaging element according to any one of [A01] to [A18], in which the inorganic semiconductor material included in the inorganic semiconductor material layer has an oxygen deficiency generation energy of 3.0 eV or more.

[A20] The imaging element according to any one of [A01] to [A05] and [A19], in which, when the composition of the inorganic semiconductor material included in the inorganic semiconductor material layer is expressed by $Al_{a1}Zn_{a2}Sn_{a3}O_{b1}$ (where a1+a2+a3=1.00 as well as a1>0, a2>0, and a3>0 hold true), $$a3 \leq 0.53 \quad (3\text{-}1')$$

and $$0.35 \times (a3 - 0.32) \leq 0.65 \times a1 \quad (3\text{-}2')$$

are satisfied.

[A21] The imaging element according to any one of [A01] to [A20], in which, when the composition of the inorganic semiconductor material included in the inorganic semiconductor material layer is expressed by $Al_{a1}Zn_{a2}Sn_{a3}O_{b1}$ (where a1+a2+a3=1.00 as well as a1>0, a2>0, and a3>0 hold true), $$a3 \geq a2 - 0.54 \quad (4)$$

is satisfied.

[A22] The imaging element according to any one of [A01] to [A13], in which, when the composition of the inorganic semiconductor material included in the inorganic semiconductor material layer is expressed by $M_{a1}N_{a2}Sn_{a3}O_{b1}$ (where M denotes an aluminum atom, and N denotes a gallium atom or a zinc atom, or a gallium atom and a zinc atom), $$a1 + a3 + a2 = 1.00$$

$$0.01 \leq a1 \leq 0.04$$

and $$a3 < a2$$

are satisfied.

[A23] The imaging element according to [A22], in which a1<a3<a2 is satisfied.

[A24] The imaging element according to any one of [A01] to [A23], in which electric charge generated in the photoelectric conversion layer moves to the first electrode via the inorganic semiconductor material layer.

[A25] The imaging element according to [A24], in which the electric charge includes an electron.

[B01] The imaging element according to any one of [A01] to [A25], in which
   the inorganic semiconductor material layer includes a first layer and a second layer from side of the first electrode, and $$\rho_1 \geq 5.9 \text{ g/cm}^3$$

and $$\rho_1 - \rho_2 \geq 0.1 \text{ g/cm}^3$$

are satisfied, where $\rho_1$ denotes an average film density of the first layer and $\rho_2$ denotes an average film density of the second layer in a portion extending for 3 nm, preferably 5 nm, or more preferably 10 nm from an interface between the first electrode and the inorganic semiconductor material layer.

[B02] The imaging element according to [B01], in which the first layer and the second layer are identical in composition.

[B03] The imaging element according to any one of [A01] to [A14], in which
   the inorganic semiconductor material layer includes a first layer and a second layer from side of the first electrode,
   the first layer and the second layer are identical in composition, and $$\rho_1 - \rho_2 \geq 0.1 \text{ g/cm}^3$$

is satisfied, where $\rho_1$ denotes an average film density of the first layer and $\rho_2$ denotes an average film density of the second layer in a portion extending for 3 nm, preferably 5 nm, or more preferably 10 nm from an interface between the first electrode and the inorganic semiconductor material layer.

[C01] <<Stacked Imaging Element>>
   A stacked imaging element including at least one imaging element according to any one of [A01] to [B03].

[D01] <<Solid-State Imaging Device . . . First Mode>>
   A solid-state imaging device including a plurality of the imaging elements according to any one of [A01] to [B03].

[D02] <<Solid-State Imaging Device . . . Second Mode>>
   A solid-state imaging device including a plurality of the stacked imaging elements according to [C01].

[E01] <<Method of Manufacturing Imaging Element>>
   A method of manufacturing an imaging element, the method including:
   sequentially forming, on an underlayer in which a first electrode is formed, an inorganic semiconductor material layer, a photoelectric conversion layer including an organic material, and a second electrode, and
   applying an annealing process at 250° C. or less in an atmosphere containing water vapor after the formation of the inorganic semiconductor material layer.

REFERENCE NUMERALS LIST 10 imaging element (stacked imaging element, first imaging element)
11 second imaging element
12 third imaging element 13 various constituent elements of imaging element positioned below interlayer insulating layer
14 on-chip microlens (OCL)
15 light-blocking layer
21 first electrode
22 second electrode
23 photoelectric conversion stack
23A photoelectric conversion layer
23B inorganic semiconductor material layer
24 charge accumulation electrode
24A, 24B, 24C charge accumulation electrode segment
25, 25A, 25B transfer control electrode (charge transfer electrode)
26 charge drain electrode
27 lower charge movement control electrode (lower side/charge movement control electrode)
27A connection hole
27B pad section
28 upper charge movement control electrode (upper side/charge movement control electrode)
41 n-type semiconductor region included in second imaging element
43 n-type semiconductor region included in third imaging element
42, 44, 73 p+ layer
45, 46 gate section of transfer transistor
51 gate section of reset transistor $TR1_{rst}$
51A channel formation region of reset transistor $TR1_{rst}$
51B, 51C source/drain region of reset transistor $TR1_{rst}$
52 gate section of amplification transistor $TR1_{amp}$
52A channel formation region of amplification transistor $TR1_{amp}$
52B, 52C source/drain region of amplification transistor $TR1_{amp}$
53 gate section of selection transistor $TR1_{sel}$
53A channel formation region of selection transistor $TR1_{sel}$
53B, 53C source/drain region of selection transistor $TR1_{sel}$
61 contact hole section
62 wiring layer
63, 64, 68A pad section
65, 68B connection hole
66, 67, 69 connection section
70 semiconductor substrate
70A first surface (front surface) of semiconductor substrate
70B second surface (back surface) of semiconductor substrate
71 element separation region
72 oxide film
74 $HfO_2$ film
75 insulating material film
76, 81 interlayer insulating layer
82 insulating layer
$82_A$ region between adjacent imaging elements (region-a)
83 protection material layer
84 opening
85 second opening
100 solid-state imaging device
101 stacked imaging element
111 imaging region
112 vertical drive circuit
113 column signal processing circuit
114 horizontal drive circuit
115 output circuit
116 drive control circuit
117 signal line (data output line)
118 horizontal signal line
200 electronic apparatus (camera)
201 solid-state imaging device
210 optical lens
211 shutter device
212 drive circuit
213 signal processing circuit
$FD_1$, $FD_2$, $FD_3$, 45C, 46C floating diffusion layer
$TR1_{trs}$, $TR2_{trs}$, $TR3_{trs}$ transfer transistor
$TR1_{rst}$, $TR2_{rst}$, $TR3_{rst}$ reset transistor
$TR1_{amp}$, $TR2_{amp}$, $TR3_{amp}$ amplification transistor
$TR1_{sel}$, $TR3_{sel}$, $TR3_{sel}$ selection transistor
$V_{DD}$ power Supply
$RST_1$, $RST_2$, $RST_3$ reset line
$SEL_1$, $SEL_2$, $SEL_3$ selection line
117, VSL, $VSL_1$, $VSL_2$, $VSL_3$ signal line (data output line)
$TG_2$, $TG_3$ transfer gate line
$V_{OA}$, $V_{OB}$, $V_{OT}$, $V_{OU}$ wiring line

The invention claimed is:

1. An imaging element comprising a photoelectric conversion section including a first electrode, a photoelectric conversion layer including an organic material, and a second electrode that are stacked, wherein
an inorganic semiconductor material layer is formed between the first electrode and the photoelectric conversion layer, and
a value ΔEN is less than 1.695, the value ΔEN resulting from subtracting an average value $EN_{cation}$ of electronegativities of cationic species included in the inorganic semiconductor material layer from an average value $EN_{anion}$ of electronegativities of anionic species included in the inorganic semiconductor material layer.

2. The imaging element according to claim 1, wherein the ΔEN is 1.624 or less.

3. The imaging element according to claim 1, wherein, when the inorganic semiconductor material layer is represented by $(A^1_{a1}A^2_{a2}A^3_{a3}\ldots A^M_{aM})(B^1_{b1}B^2_{b2}B^3_{b3}\ldots B^N_{bN})$ [where $A^1, A^2, A^3, \ldots$, and $A^M$ are cationic species, $B^1, B^2, B^3, \ldots$, and $B^N$ are anionic species, and a1, a2, a3, ..., and aM, and b1, b2, b3, ..., and bN are values corresponding to atomic percentages, with a total thereof being 1.00], $$EN_{anion} = (B1 \times b1 + B2 \times b2 + B3 \times b3 \ldots + BN \times bN)/(b1 + b2 + b3 \ldots + bN)$$

$$EN_{cation} = (A1 \times a1 + A2 \times a2 + A3 \times a3 \ldots + AM \times aM)/(a1 + a2 + a3 \ldots + aM)$$

hold true, where B1, B2, B3, ..., and $B_N$ are electronegativities of the anionic species $B^1, B^2, B^3 \ldots$, and $B^N$, and A1, A2, A3, ..., and $A_M$ are electronegativities of the cationic species $A^1, A^2, A^3 \ldots$, and $A^M$.

4. The imaging element according to claim 1, wherein the cationic species include at least one type of cationic species selected from the group consisting of Zn, Ga, Ge, Cd, In, Al, Ti, B, Si, Sn, Hg, Tl, and Pb.

5. The imaging element according to claim 1, wherein the cationic species include Ga, In, and Sn, and the anionic species include O.

6. The imaging element according to claim 1, wherein the cationic species include Zn, Al, and Sn, and the anionic species include O.

7. The imaging element according to claim 1, wherein the photoelectric conversion section further includes an insulating layer, and a charge accumulation electrode disposed at a distance from the first electrode and disposed to be opposed to the inorganic semiconductor material layer with the insulating layer interposed therebetween.

8. The imaging element according to claim 1, wherein the following expression:

$$E_1 - E_0 \geq 0.1 \text{ eV}$$

is satisfied, where $E_0$ denotes a LUMO value of a material included in a portion of the photoelectric conversion layer positioned in a vicinity of the inorganic semiconductor material layer, and E1 denotes a minimum energy value of a conduction band of an inorganic semiconductor material included in the inorganic semiconductor material layer.

9. The imaging element according to claim 8, wherein the following expression:

$$E_1 - E_0 > 0.1 \text{ eV}$$

is satisfied.

10. The imaging element according to claim 1, wherein the inorganic semiconductor material layer has a carrier mobility of 10 cm²/V·s or more.

11. The imaging element according to claim 1 wherein the inorganic semiconductor material layer has a carrier density of $1 \times 10^{16}$/cm³ or less.

12. The imaging element according to claim 1, wherein the inorganic semiconductor material layer has a thickness of $1 \times 10^{-8}$ m to $1.5 \times 10^{-7}$ m.

13. The imaging element according to claim 1, wherein light is incident from the second electrode,
a surface roughness Ra of a surface of the inorganic semiconductor material layer at an interface between the photoelectric conversion layer and the inorganic semiconductor material layer is 1.5 nm or less, and
a value of a root mean square roughness Rq of the surface of the inorganic semiconductor material layer is 2.5 nm or less.

14. A stacked imaging element comprising at least one imaging element according to claim 1.

15. A solid-state imaging device comprising a plurality of the imaging elements according to claim 1.

16. A solid-state imaging device comprising a plurality of the stacked imaging elements according to claim 14.

17. A method of manufacturing an imaging element, the method comprising:
sequentially forming, on an underlayer in which a first electrode is formed, an inorganic semiconductor material layer, a photoelectric conversion layer including an organic material, and a second electrode; and
applying an annealing process at 250° C. or less in an atmosphere containing water vapor after the formation of the inorganic semiconductor material layer.

* * * * *